US011569845B2

(12) United States Patent
Sheiman

(10) Patent No.: US 11,569,845 B2
(45) Date of Patent: Jan. 31, 2023

(54) POLAR ENCODING AND POLAR DECODING SYSTEMS AND METHODS

(71) Applicant: Intel Corporation, Santa Clara, CA (US)

(72) Inventor: Arthur Sheiman, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/650,291

(22) PCT Filed: Mar. 31, 2018

(86) PCT No.: PCT/US2018/025610
§ 371 (c)(1),
(2) Date: Mar. 24, 2020

(87) PCT Pub. No.: WO2019/133039
PCT Pub. Date: Jul. 4, 2019

(65) Prior Publication Data
US 2021/0306005 A1    Sep. 30, 2021

Related U.S. Application Data

(60) Provisional application No. 62/612,051, filed on Dec. 29, 2017.

(51) Int. Cl.
*H03M 13/00* (2006.01)
*H03M 13/13* (2006.01)
*H03M 13/09* (2006.01)

(52) U.S. Cl.
CPC ....... *H03M 13/13* (2013.01); *H03M 13/6575* (2013.01); *H03M 13/09* (2013.01)

(58) Field of Classification Search
CPC ... G06T 2210/00; G06T 2210/32; G06K 9/36; H03M 13/13; H03M 13/6575;
(Continued)

(56) References Cited

U.S. PATENT DOCUMENTS 4,532,635 A * 7/1985 Mangulis ............... H04B 7/216
                                                 370/316
5,041,831 A * 8/1991 Bohley ................. H03M 1/662
                                                 341/120
(Continued)

OTHER PUBLICATIONS

B. Nath and A. Majumder, "Binary Counter Based Gated Clock Tree for Integrated CPU Chip," 2017 IEEE International Symposium on Nanoelectronic and Information Systems (iNIS), 2017, pp. 229-233, doi: 10.1109/iNIS.2017.54. (Year: 2017).*
(Continued)

*Primary Examiner* — Albert Decady
*Assistant Examiner* — Enamul M Kabir
(74) *Attorney, Agent, or Firm* — Banner & Witcoff Ltd.

(57) ABSTRACT

In encoding systems and methods, data or information is encoded using one or more encoding methodologies to generate encoded data or information corresponding to the data or information. Similarly, in decoding systems and methods, encoded data or information is decoded using one or more decoding methodologies to generate the data or information corresponding to the encoded data or information. The encoding/decoding systems and methods can include polar encoding/decoding systems and methods operable for encoding data or information to generate polar codes and for decoding polar codes to generate the corresponding data or information. The information or data can be control information and application data for communication over networks. The networks can include wireless and wireline networks, and network segments, links or channels, including mixed wireline and wireless networks.

17 Claims, 83 Drawing Sheets

(58) Field of Classification Search
CPC ...... H03M 13/09; H03M 13/00; H04N 19/59; H04N 19/60; H04N 19/64
See application file for complete search history.

(56) References Cited

U.S. PATENT DOCUMENTS

| | | | | |
|---|---|---|---|---|
| 6,202,000 | B1 * | 3/2001 | Rheem | G05B 23/027 |
| | | | | 700/121 |
| 10,187,082 | B1 * | 1/2019 | Tee | H03K 23/005 |
| 2006/0104405 | A1 * | 5/2006 | Lewis | H03K 23/002 |
| | | | | 377/106 |
| 2008/0281891 | A1 * | 11/2008 | Carroll | G06F 17/18 |
| | | | | 708/445 |
| 2013/0212441 | A1 * | 8/2013 | Vilela | G06F 11/1479 |
| | | | | 714/49 |
| 2014/0019820 | A1 * | 1/2014 | Vardy | H03M 13/13 |
| | | | | 714/752 |
| 2017/0214414 | A1 * | 7/2017 | Peng | H03M 13/033 |
| 2017/0338991 | A1 * | 11/2017 | Ko | H04B 7/0413 |
| 2018/0076923 | A1 * | 3/2018 | Wu | H03M 13/29 |

OTHER PUBLICATIONS

PCT International Search Report issued for PCT/US2018/025610, 5 pgs., dated Aug. 8, 2018.

* cited by examiner

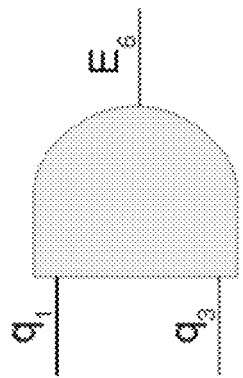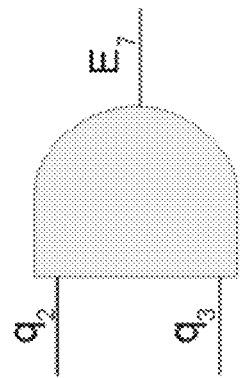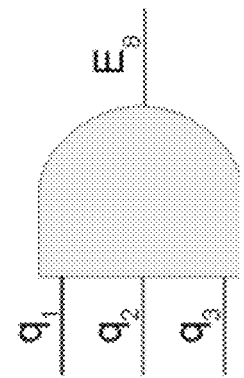
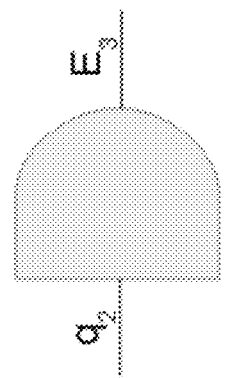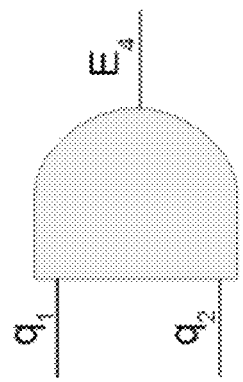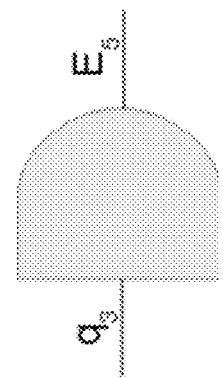
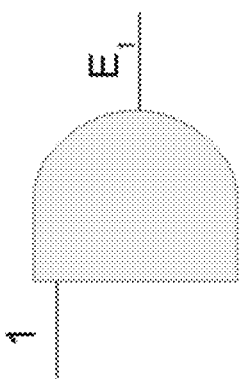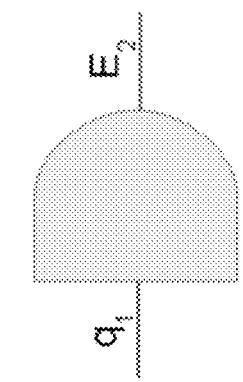
FIG. 103

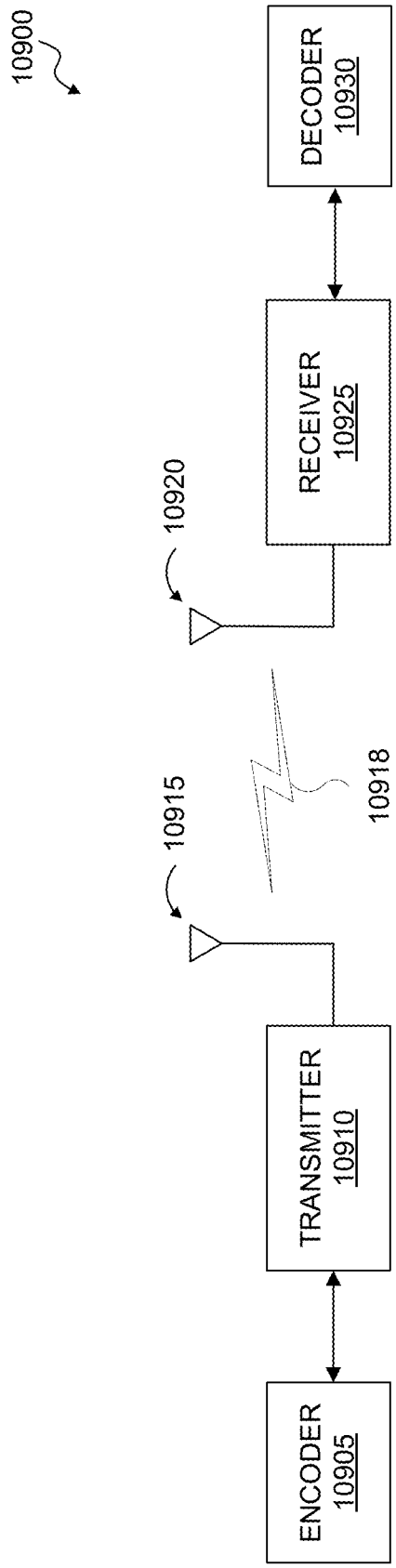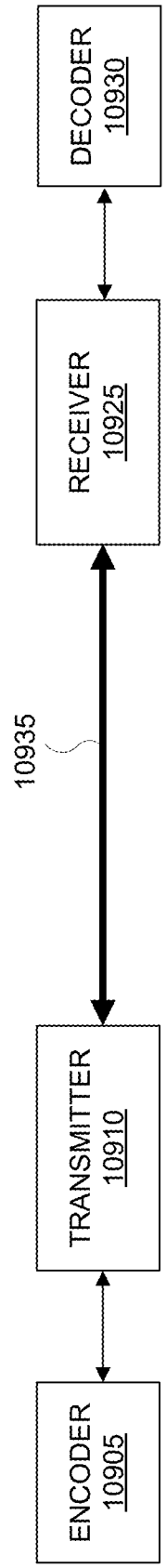
FIG. 109A
FIG. 109B

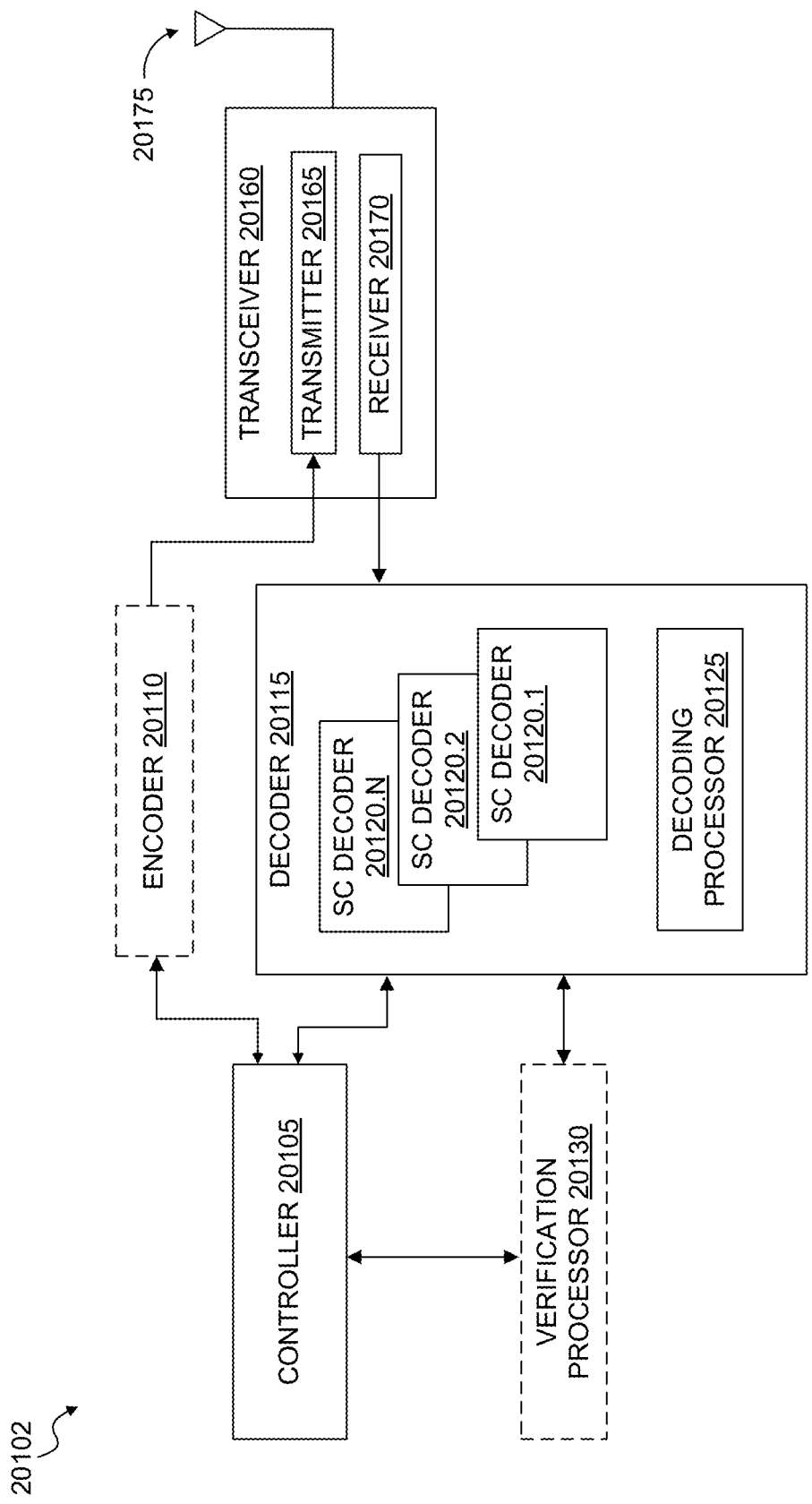

20805
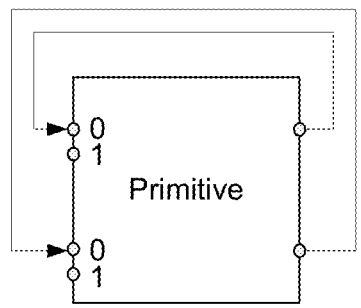
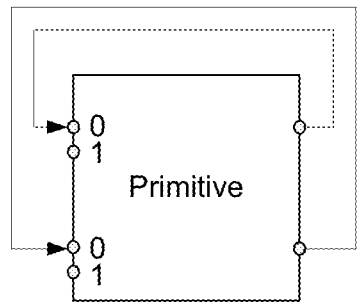
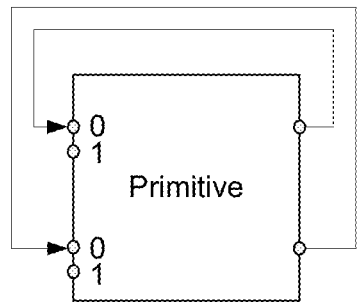
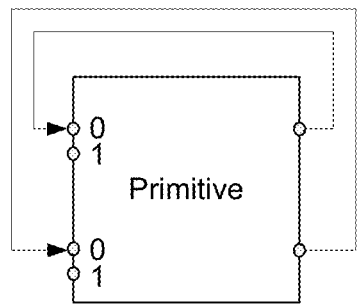
FIG. 208B
Multiplexer Control Signal (e.g. value 0) to select '0' inputs for all multiplexers 20810
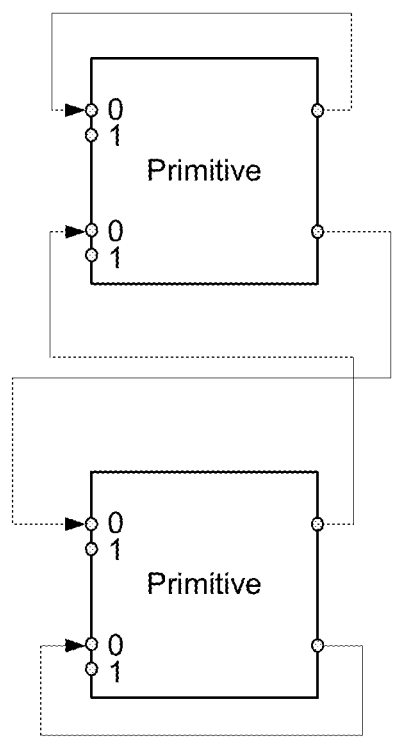
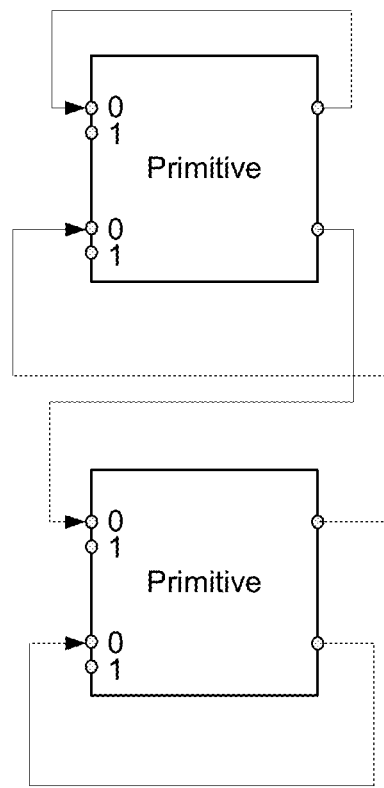
Multiplexer Control Signal (e.g. value 0) to select '0' inputs for all multiplexers
FIG. 208C

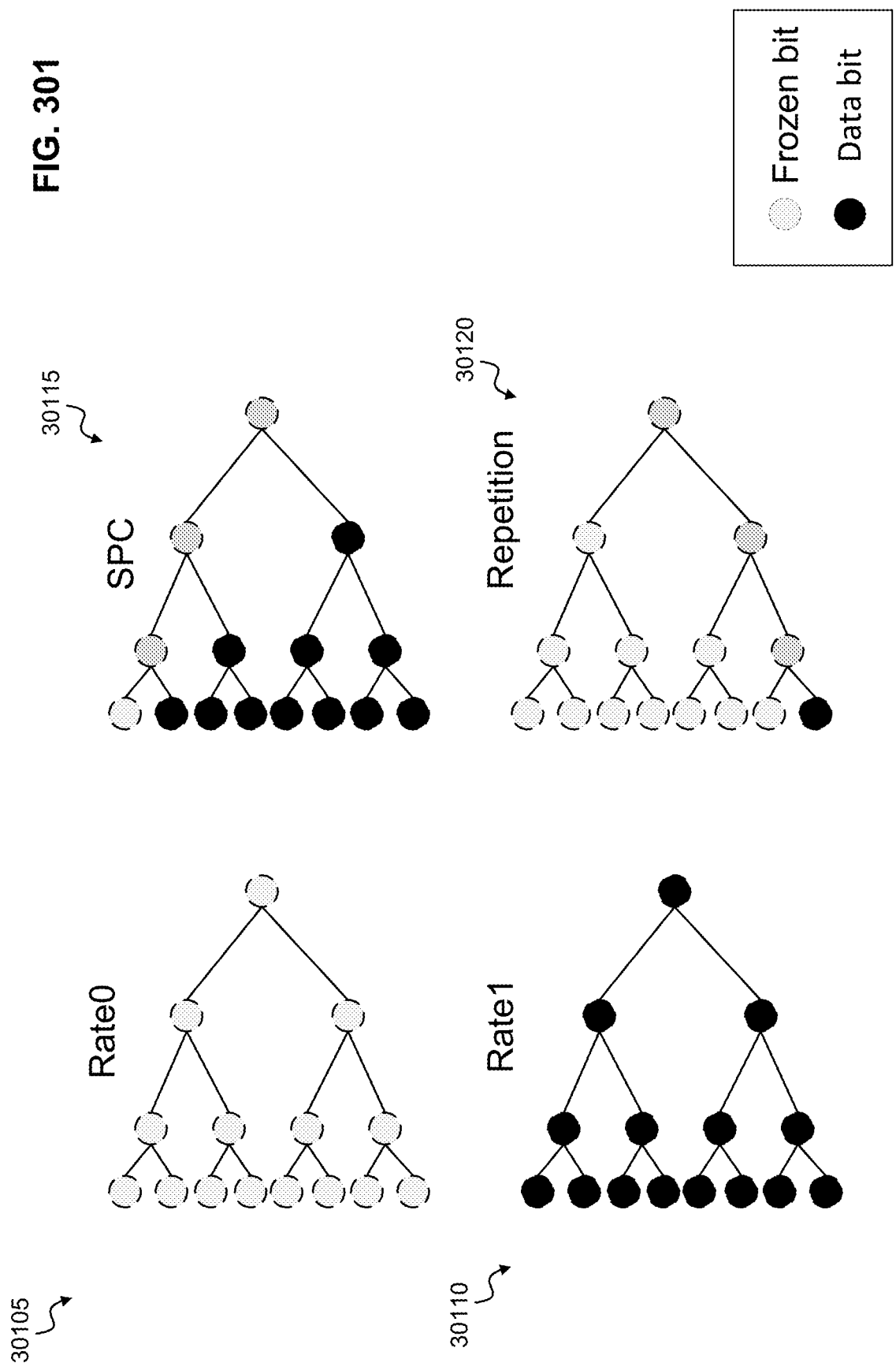

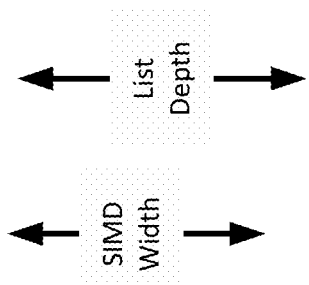
FIG. 502

FIG. 503B
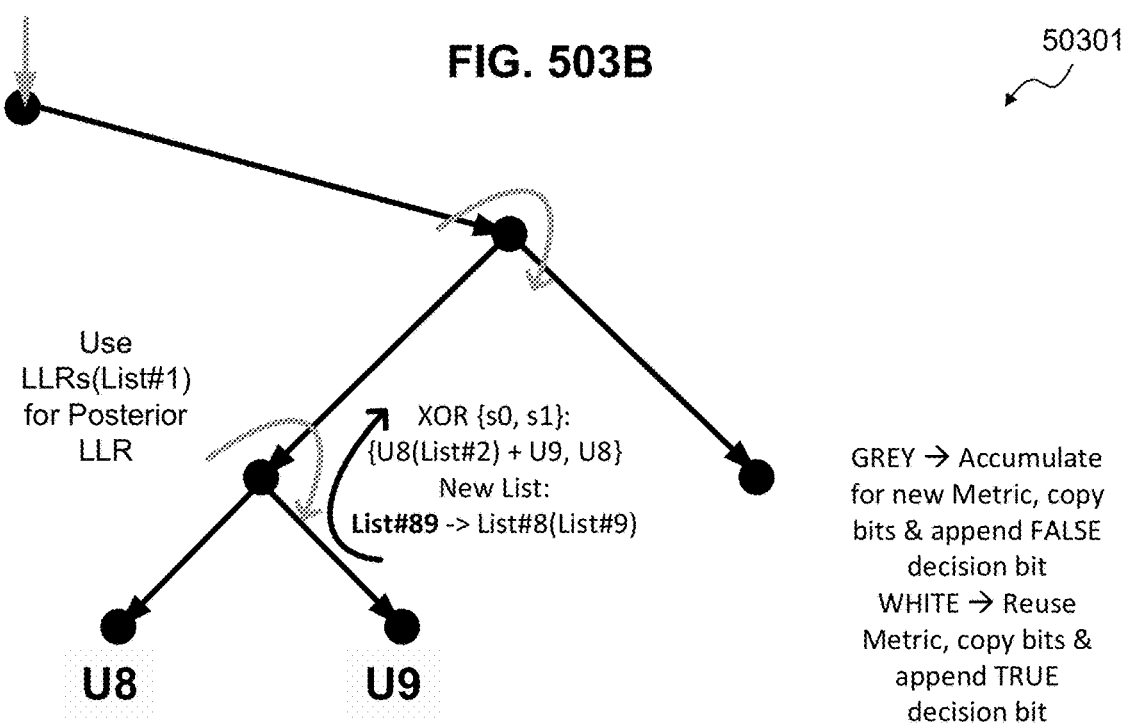
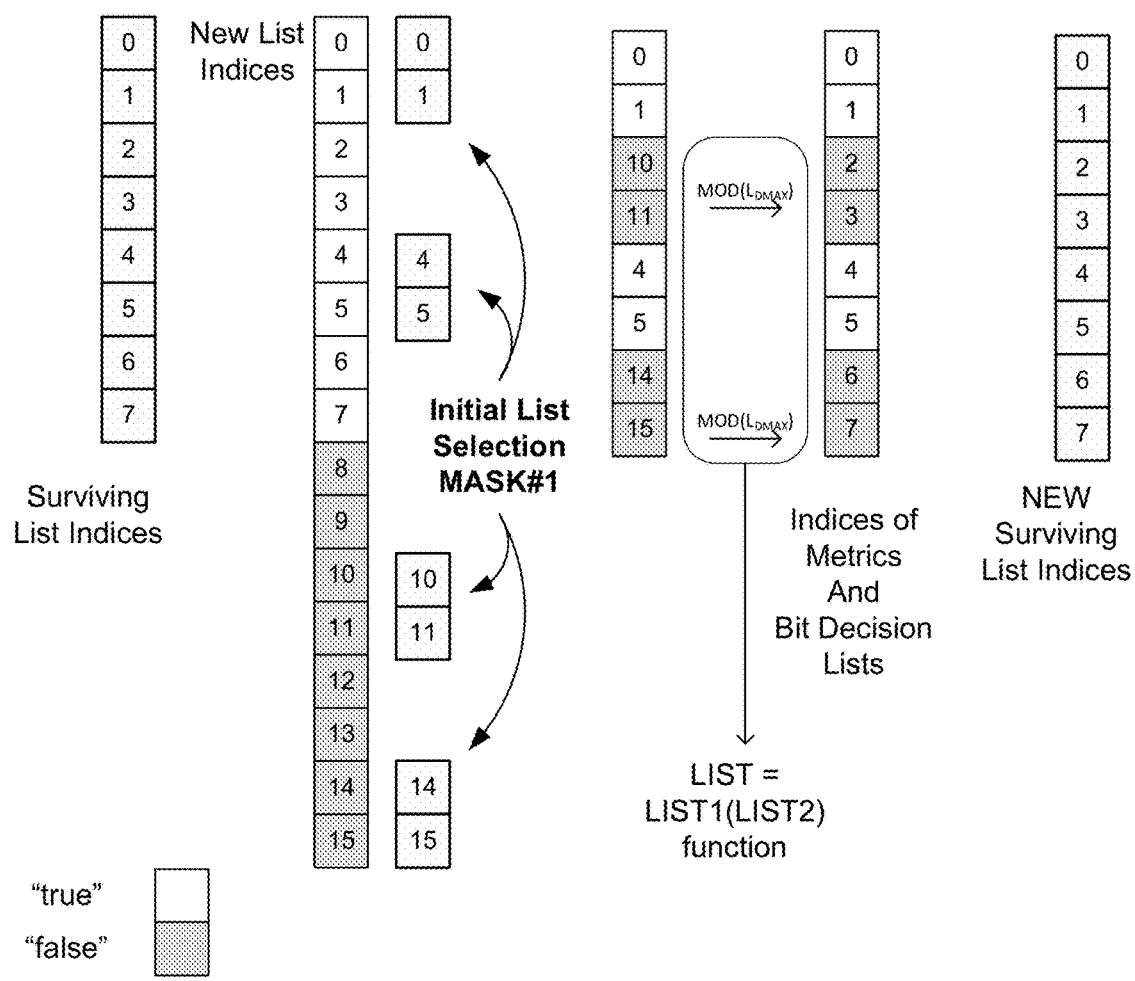

FIG. 503C
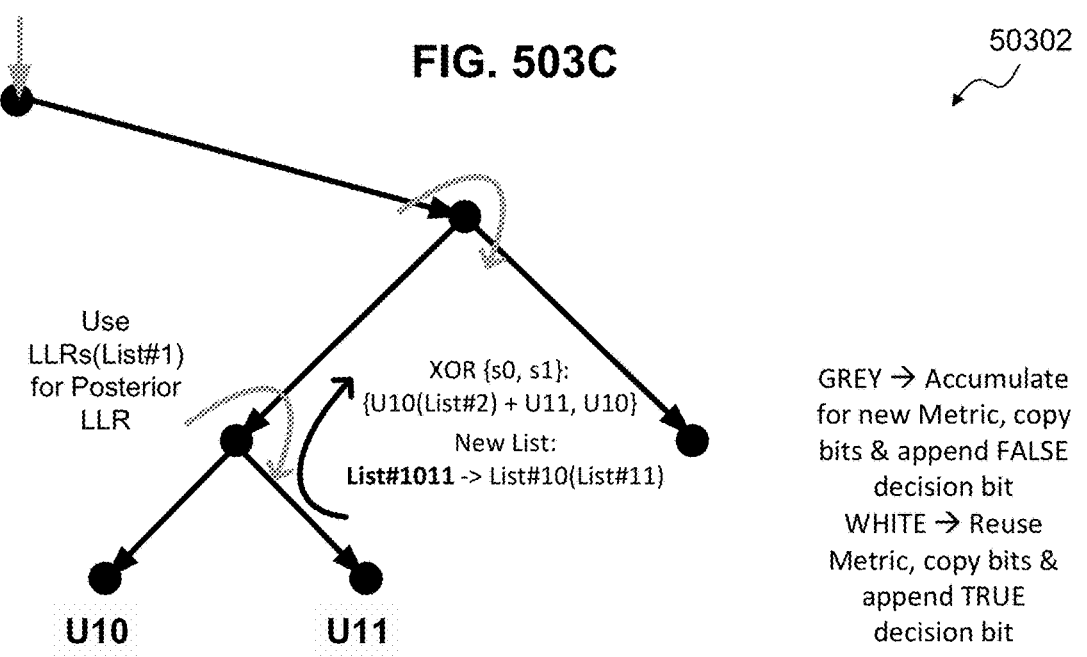
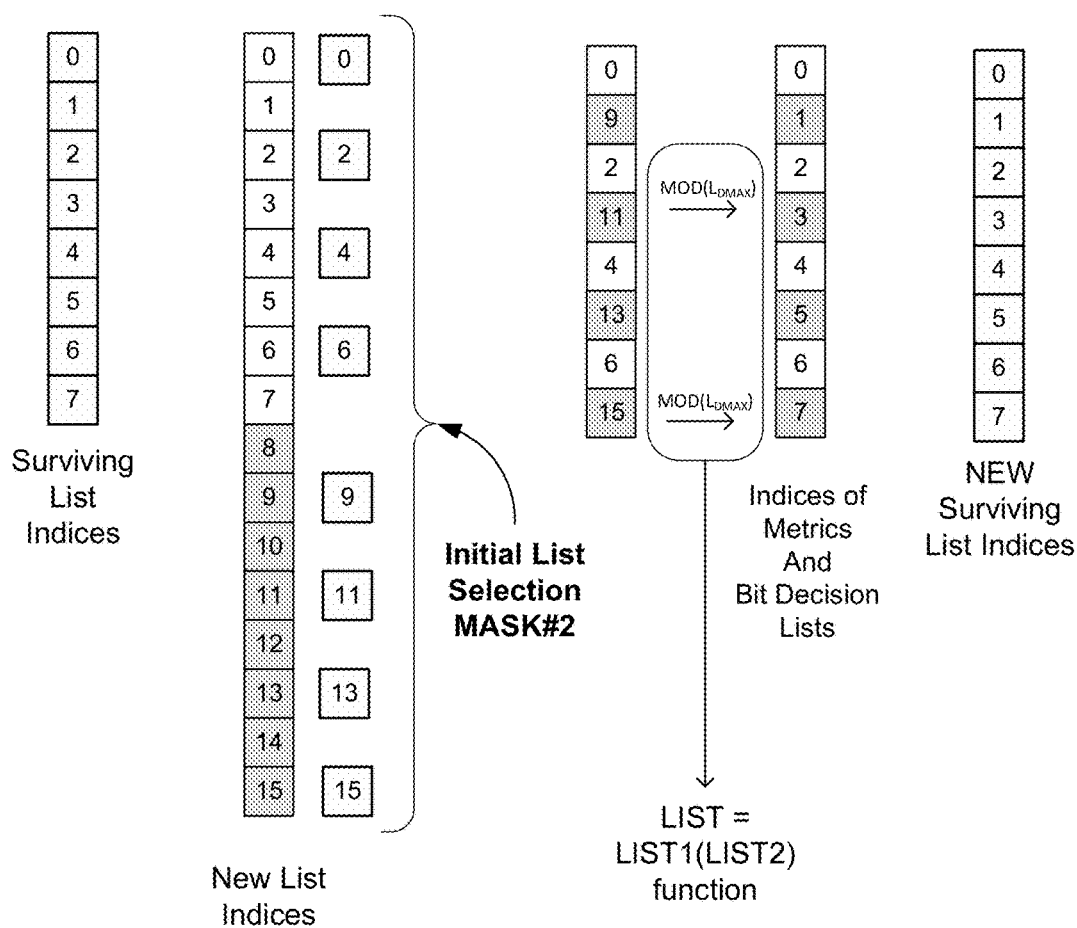

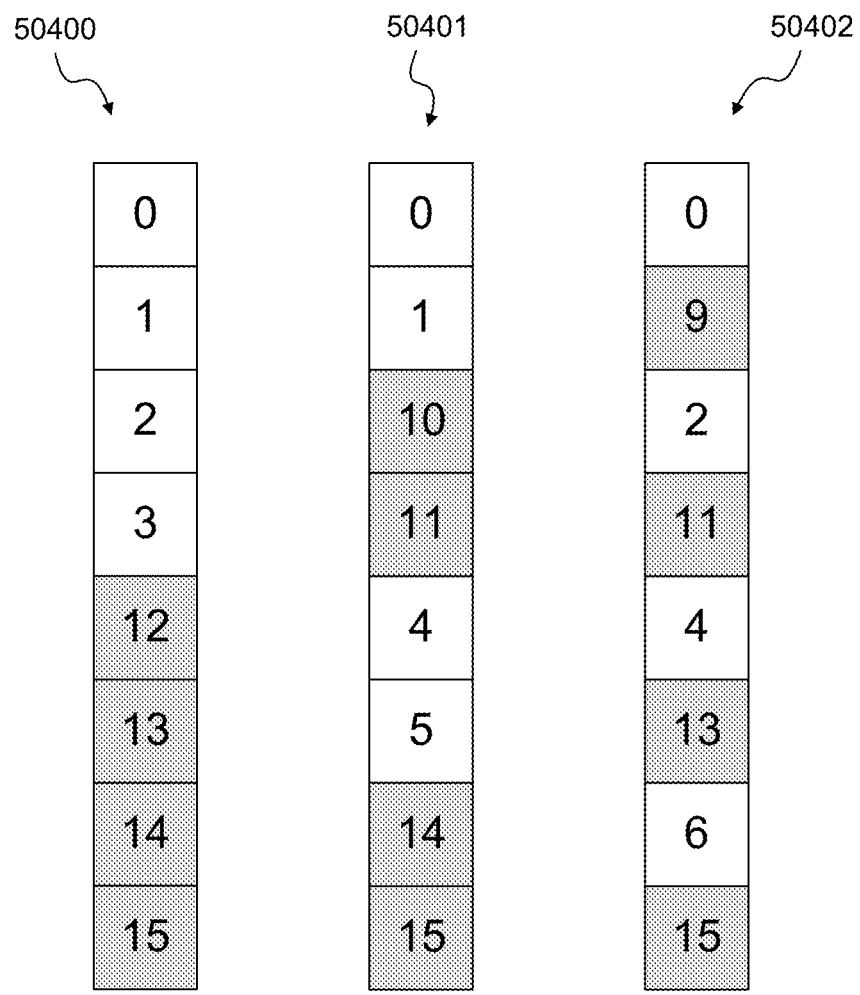
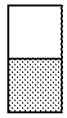
FIG. 504

POLAR ENCODING AND POLAR DECODING SYSTEMS AND METHODS

CROSS REFERENCE TO RELATED APPLICATIONS

This patent application is a United States National Stage (371 application) of International Application No. PCT/US18/25610, filed Mar. 31, 2018, which claims priority to and the benefit of U.S. Provisional Patent Application No. 62/612,051, filed Dec. 29, 2017, each of which is incorporated herein by reference in its entirety.

BACKGROUND

Field

Aspects described herein generally relate to polar encoding and decoding, including Polar Encoding and/or Polar Decoding systems and methods operable for encoding and decoding of information, such as control information and application data for communication over networks. The networks can include wireless and wireline networks, and network segments, links or channels, including mixed wireline and wireless networks

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 103 illustrates a decode enable generator according to an exemplary aspect of the present disclosure.

FIGS. 109A-B illustrate communication systems according to an exemplary aspect of the present disclosure.

Figure 201A:
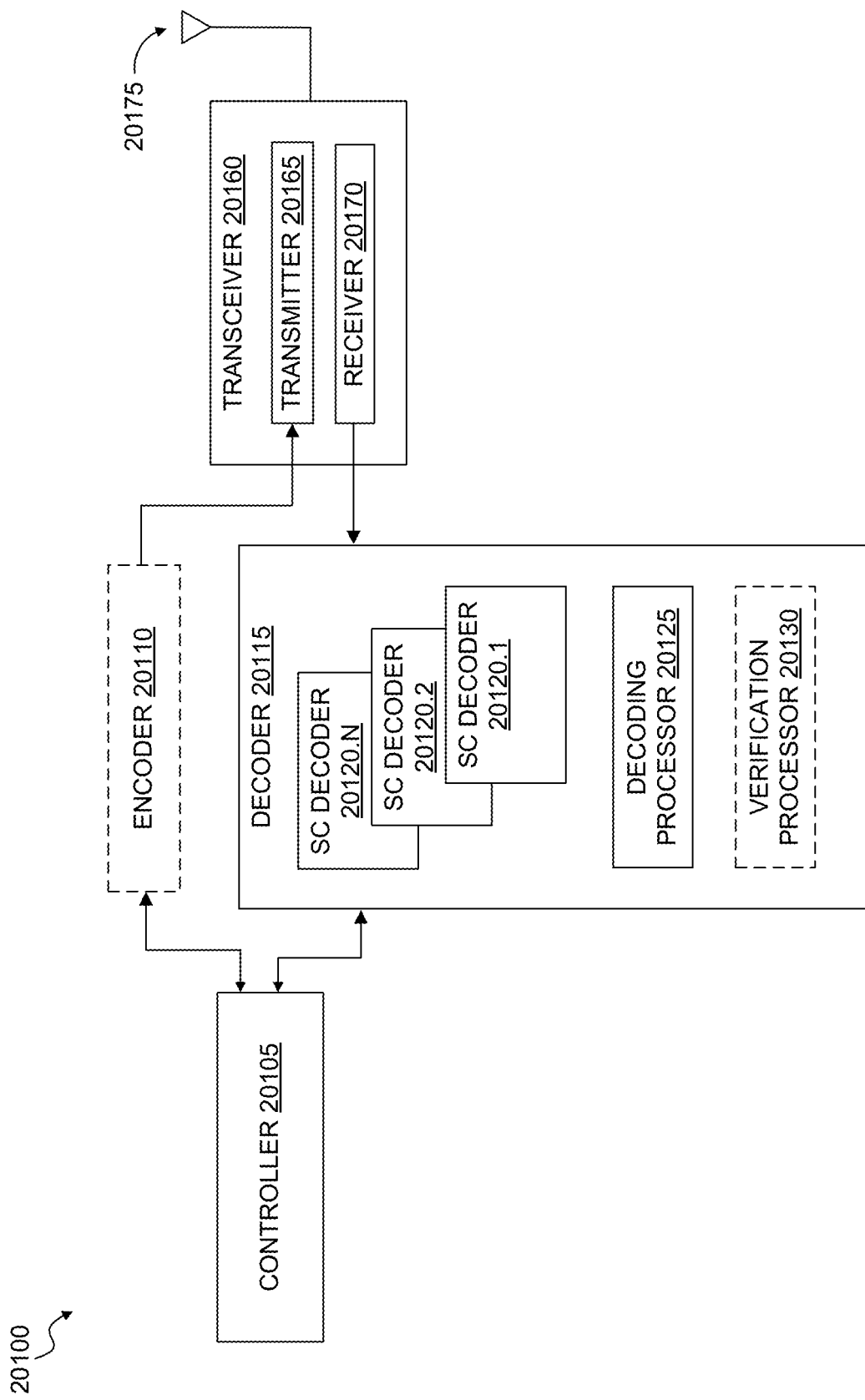
Figure 201B:
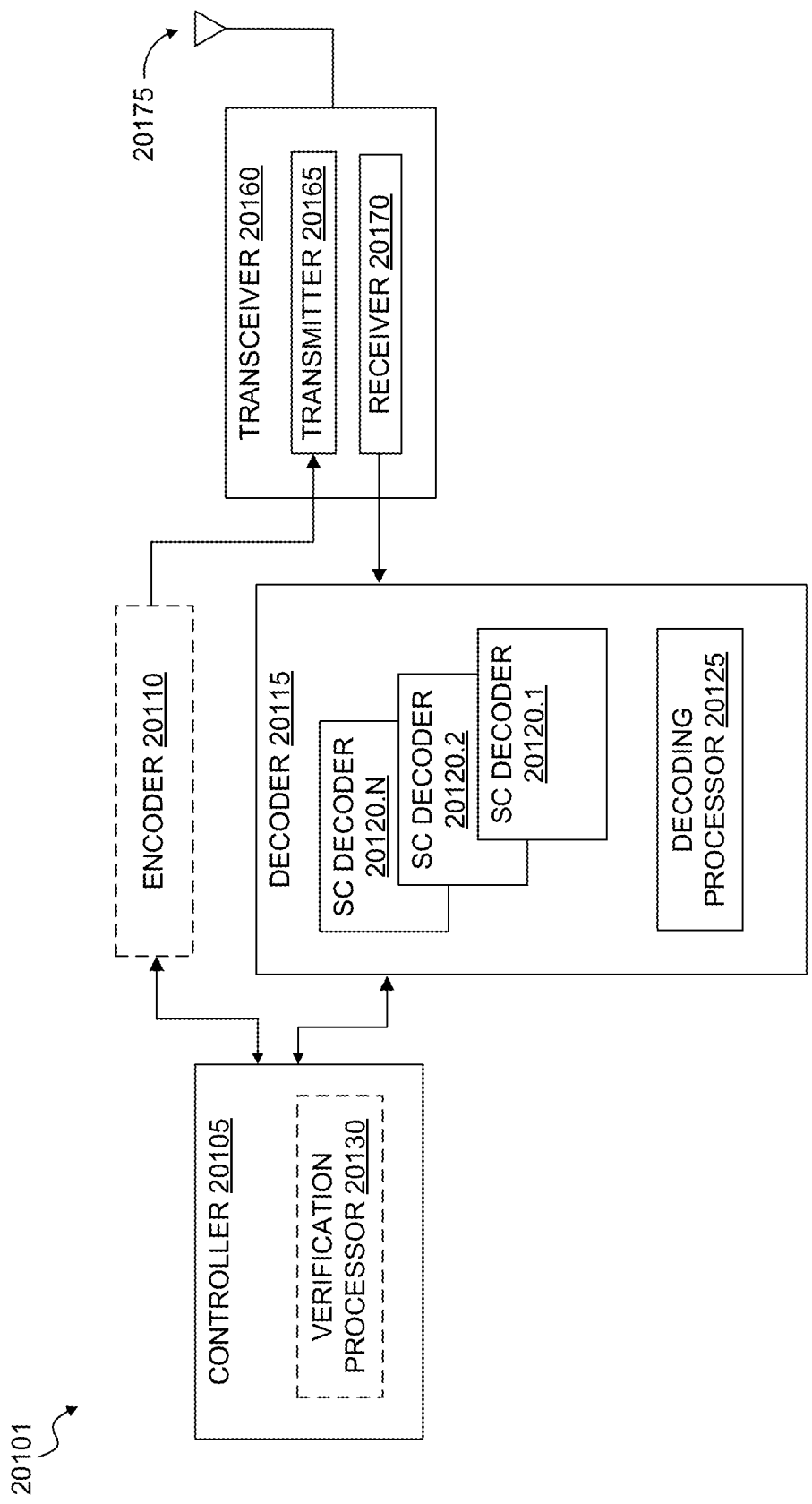

FIGS. 201A-C illustrate decoder systems according to exemplary aspects of the present disclosure.

Figure 202:
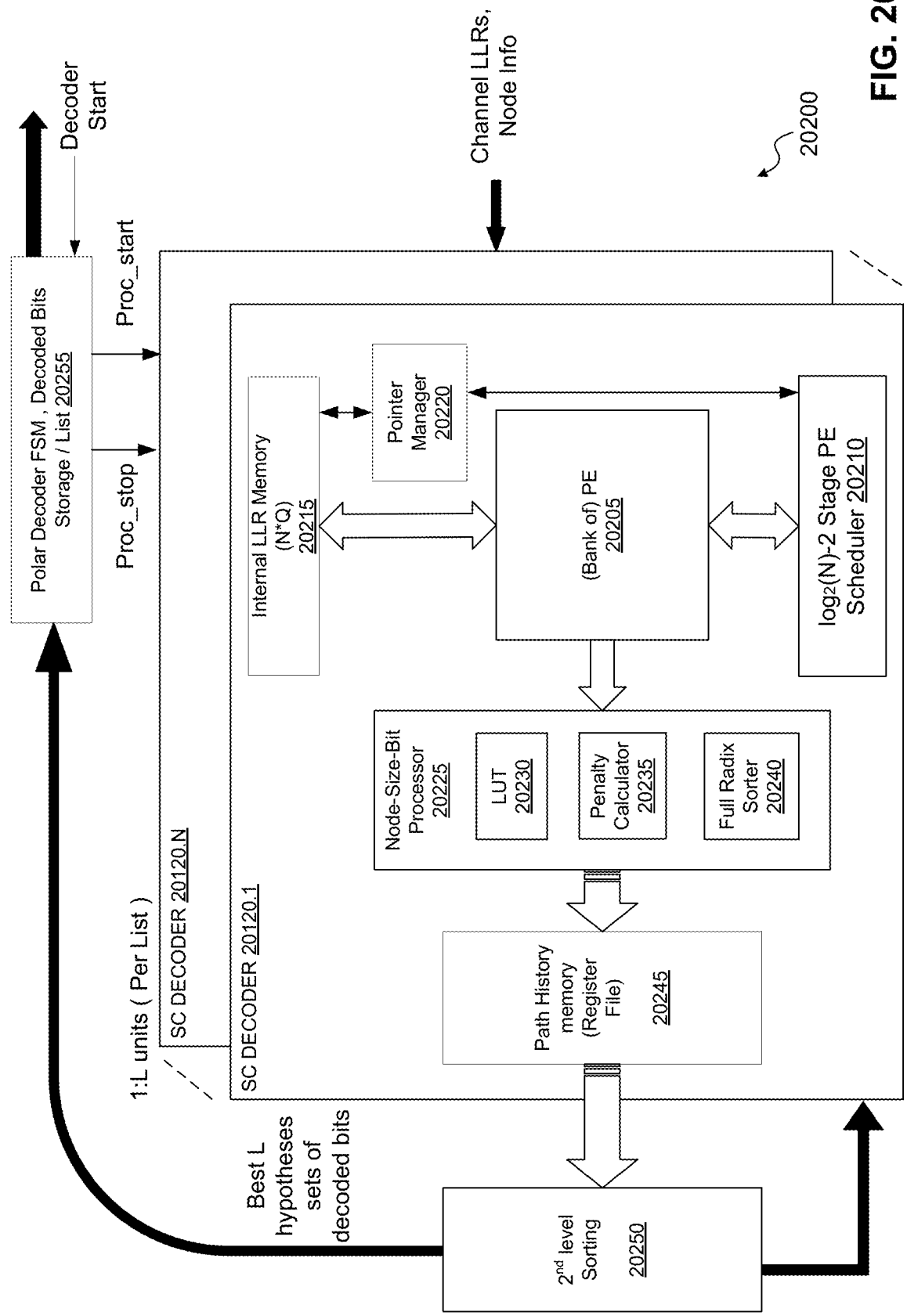

FIG. 202 illustrate a decoder system according to an exemplary aspect of the present disclosure.

Figure 203A:
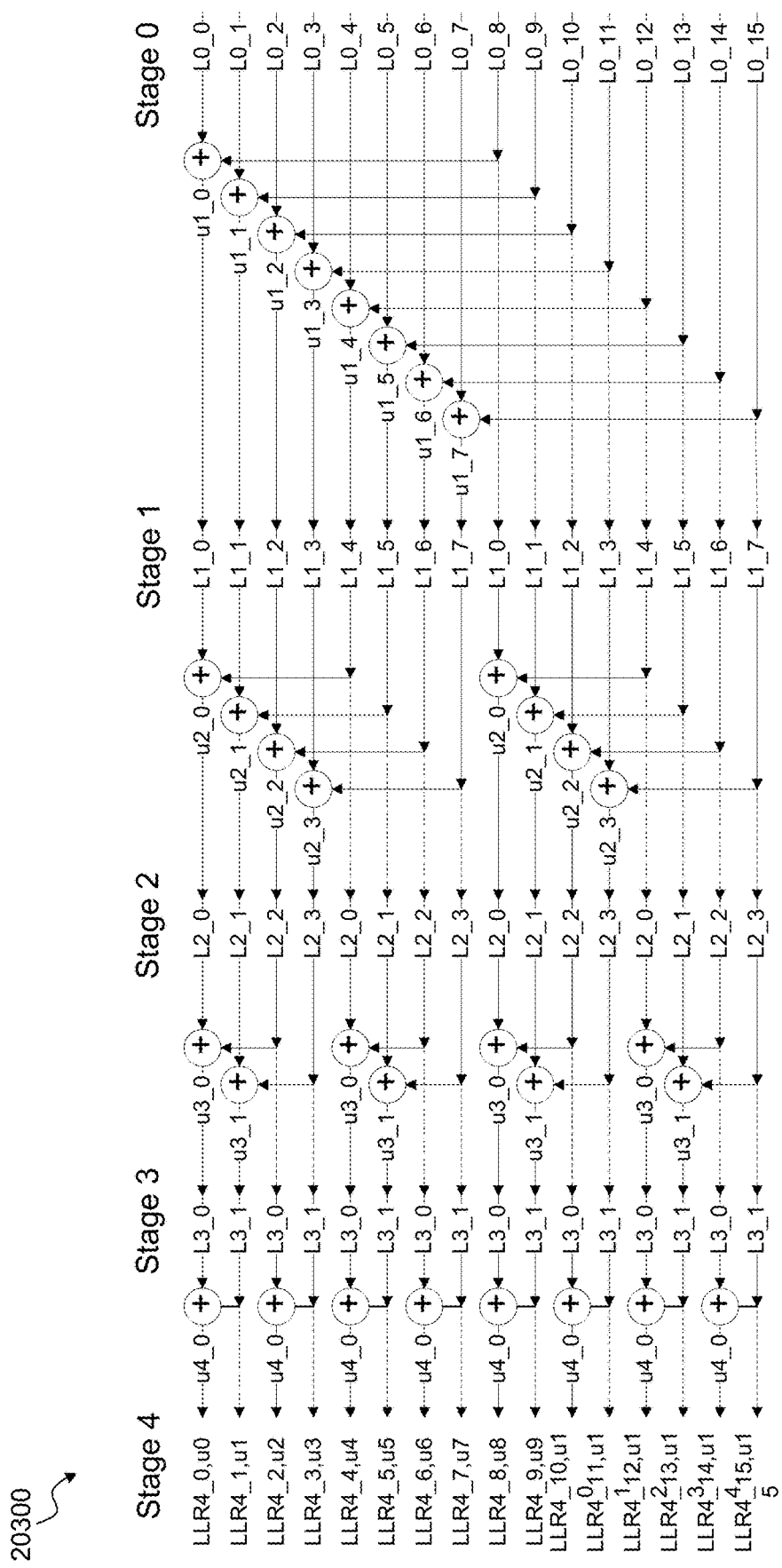

FIG. 203A illustrates code diagram according to an exemplary aspects of the present disclosure.

Figure 203B:
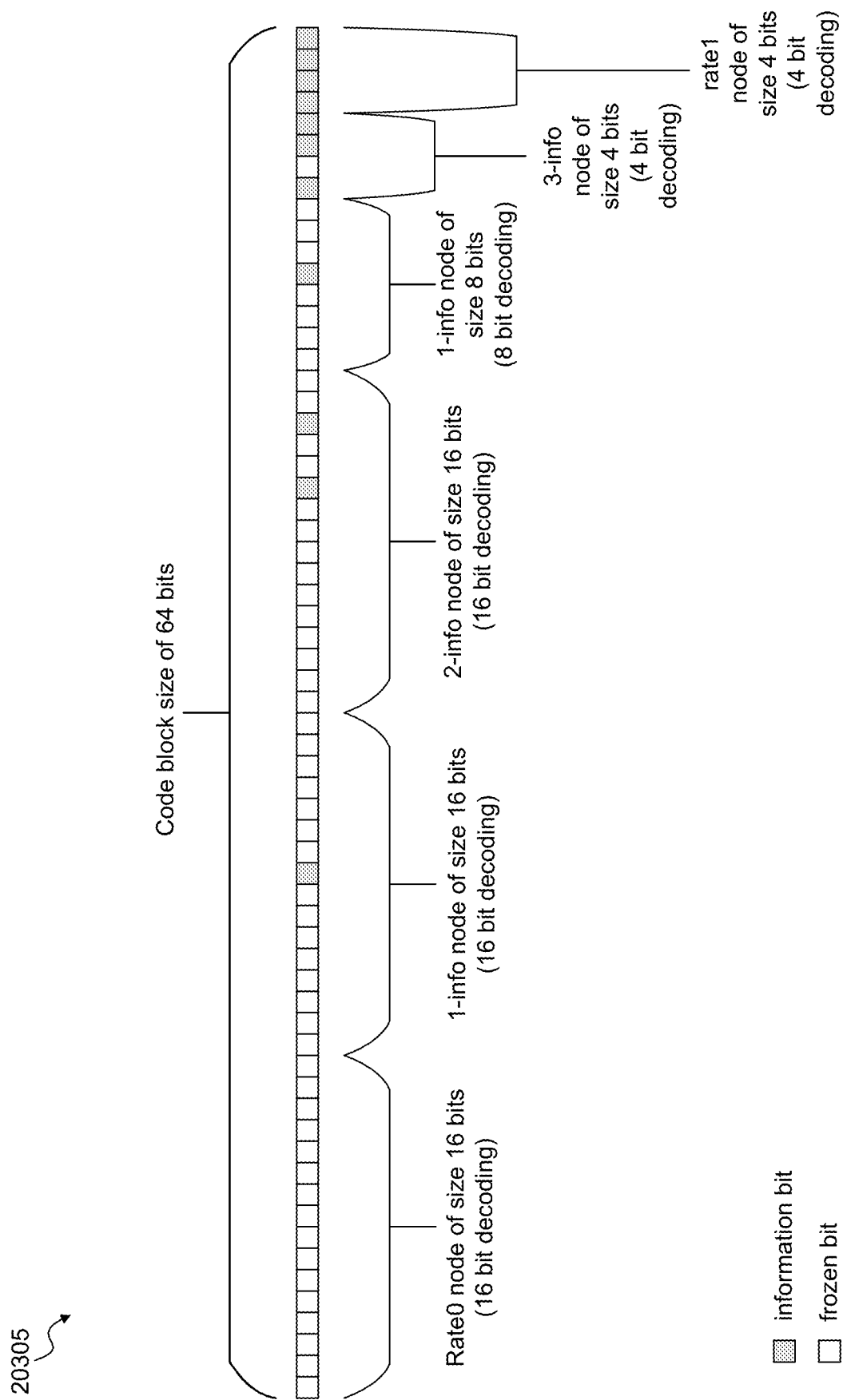

FIG. 203B illustrates a separate codeword based on node types according to an exemplary aspects of the present disclosure.

Figure 204:
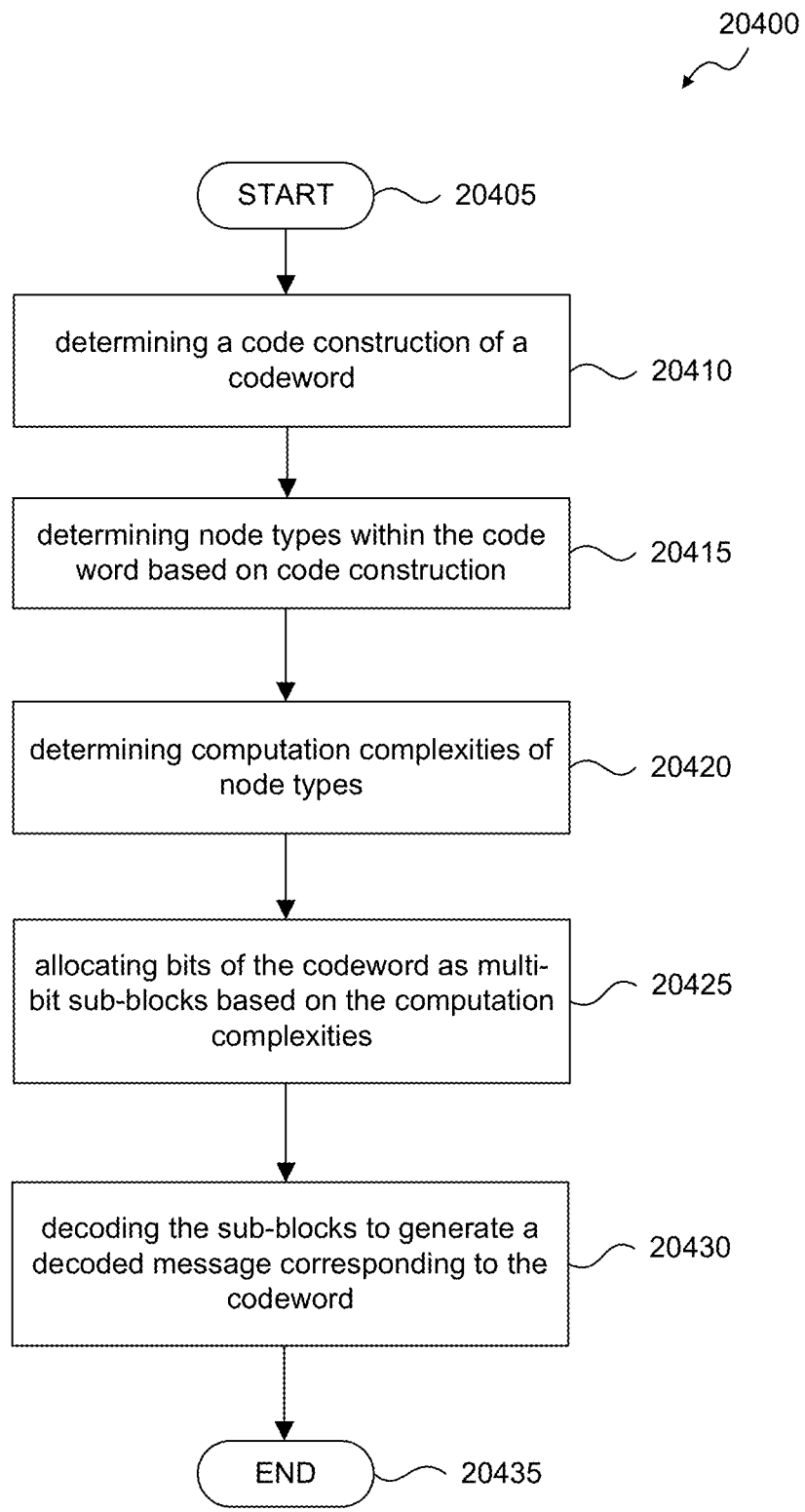

FIG. 204 illustrates a flowchart of a decoding method according to an exemplary aspect of the present disclosure.

Figure 205:
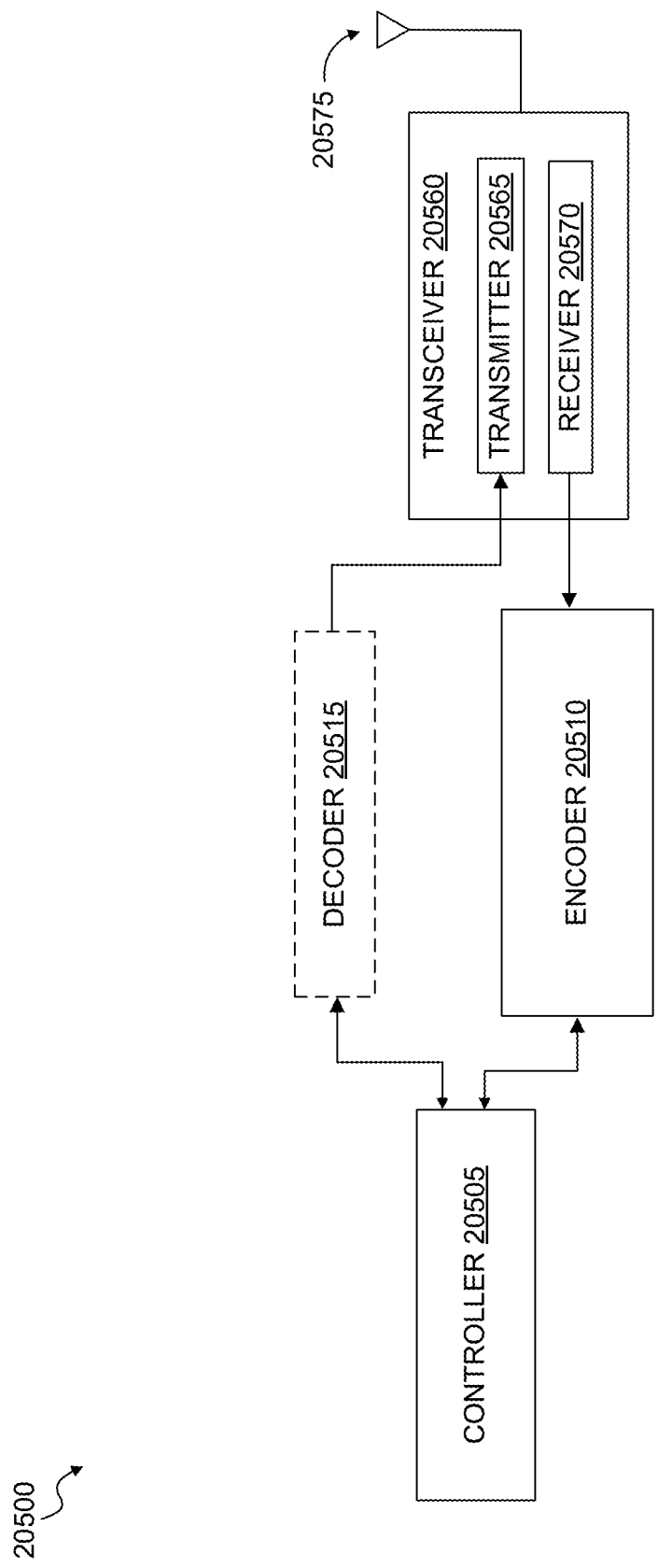

FIG. 205 illustrate an encoder system according to an exemplary aspect of the present disclosure.

Figure 206:
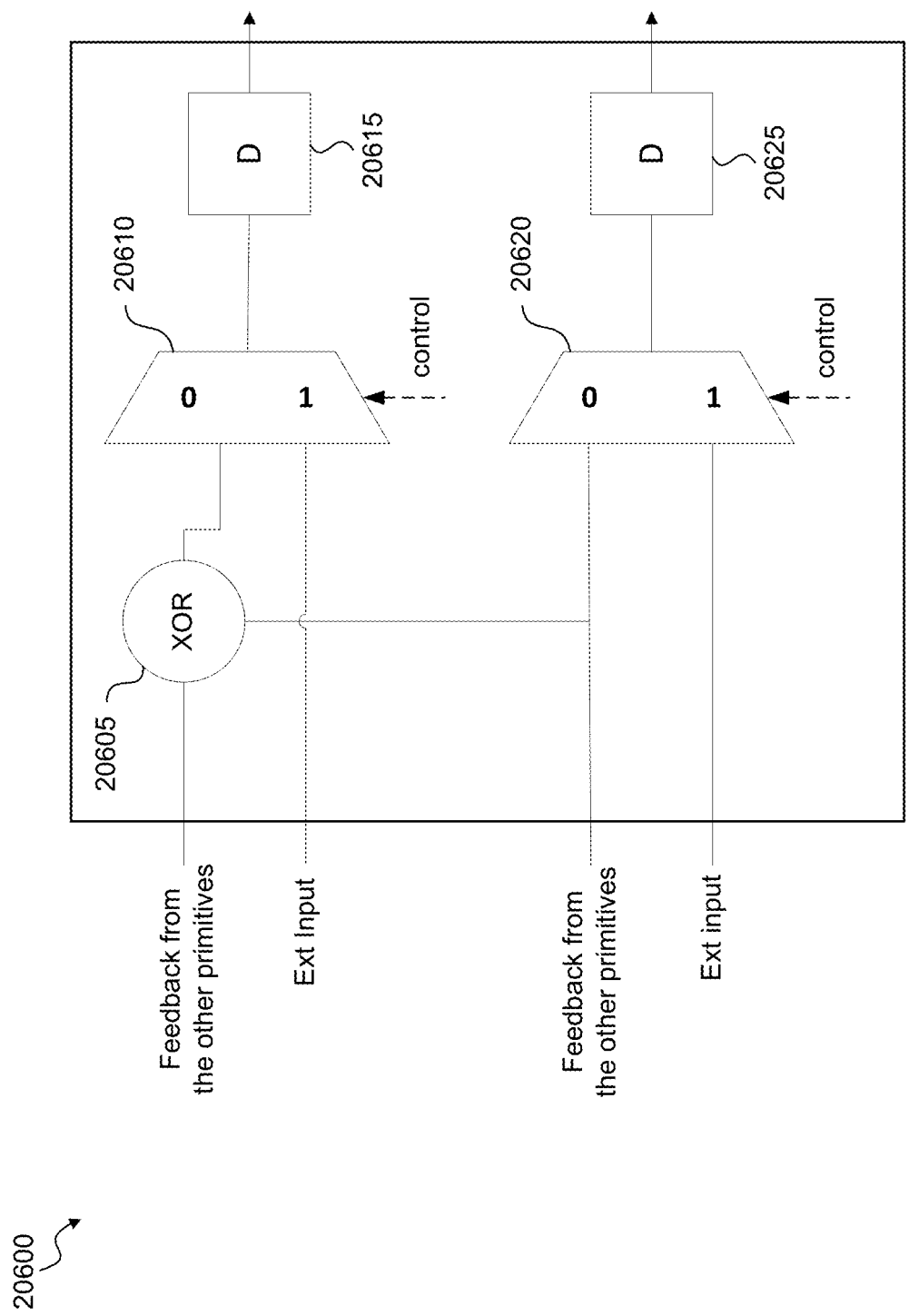

FIG. 206 illustrate an encoding primitive according to an exemplary aspect of the present disclosure.

Figure 207:
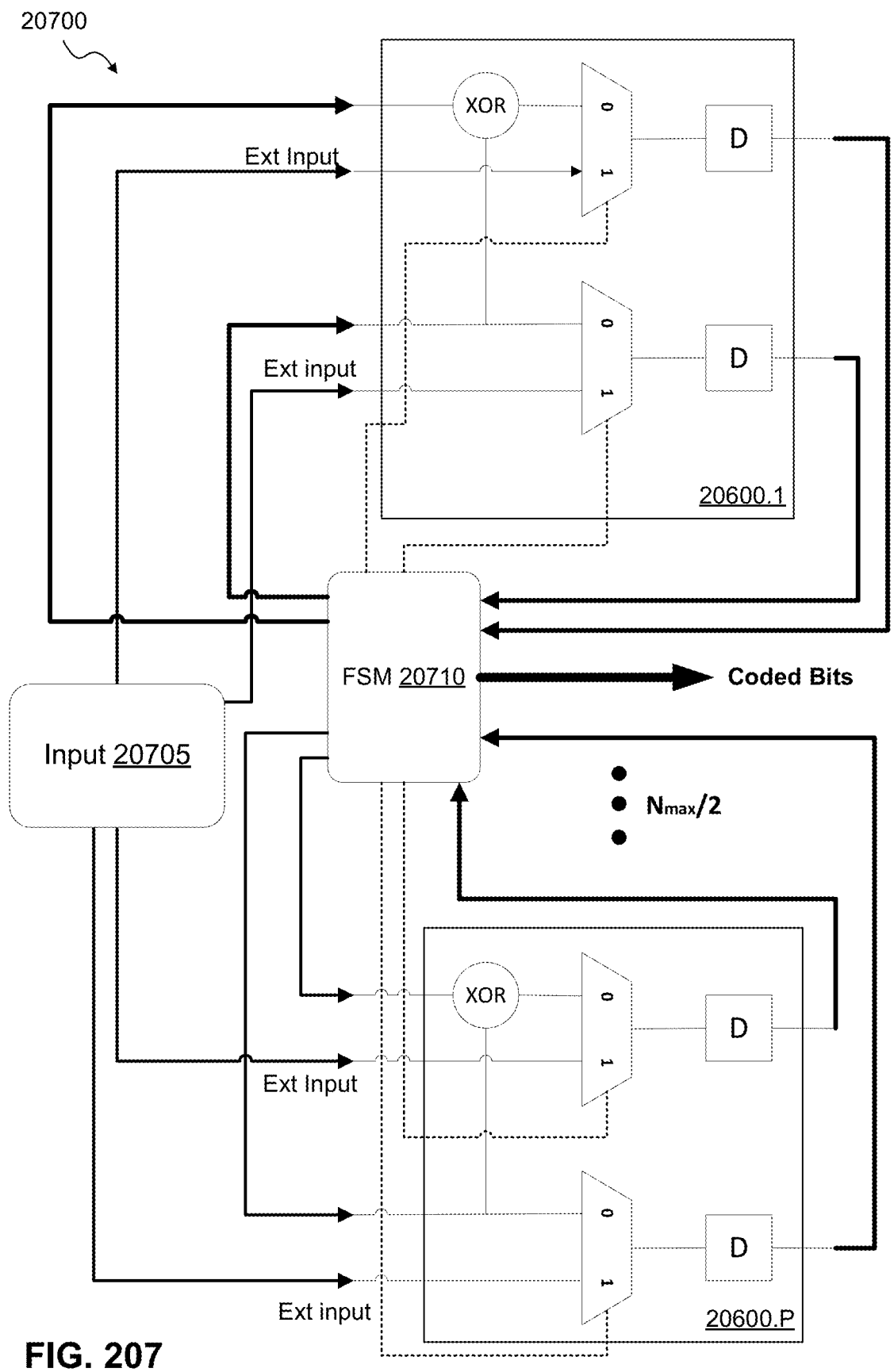

FIG. 207 illustrate a primitive-based encoder system according to an exemplary aspect of the present disclosure.

FIGS. 208A-208D illustrate a primitive reconfiguration method according to an exemplary aspect of the present disclosure.

Figure 209:
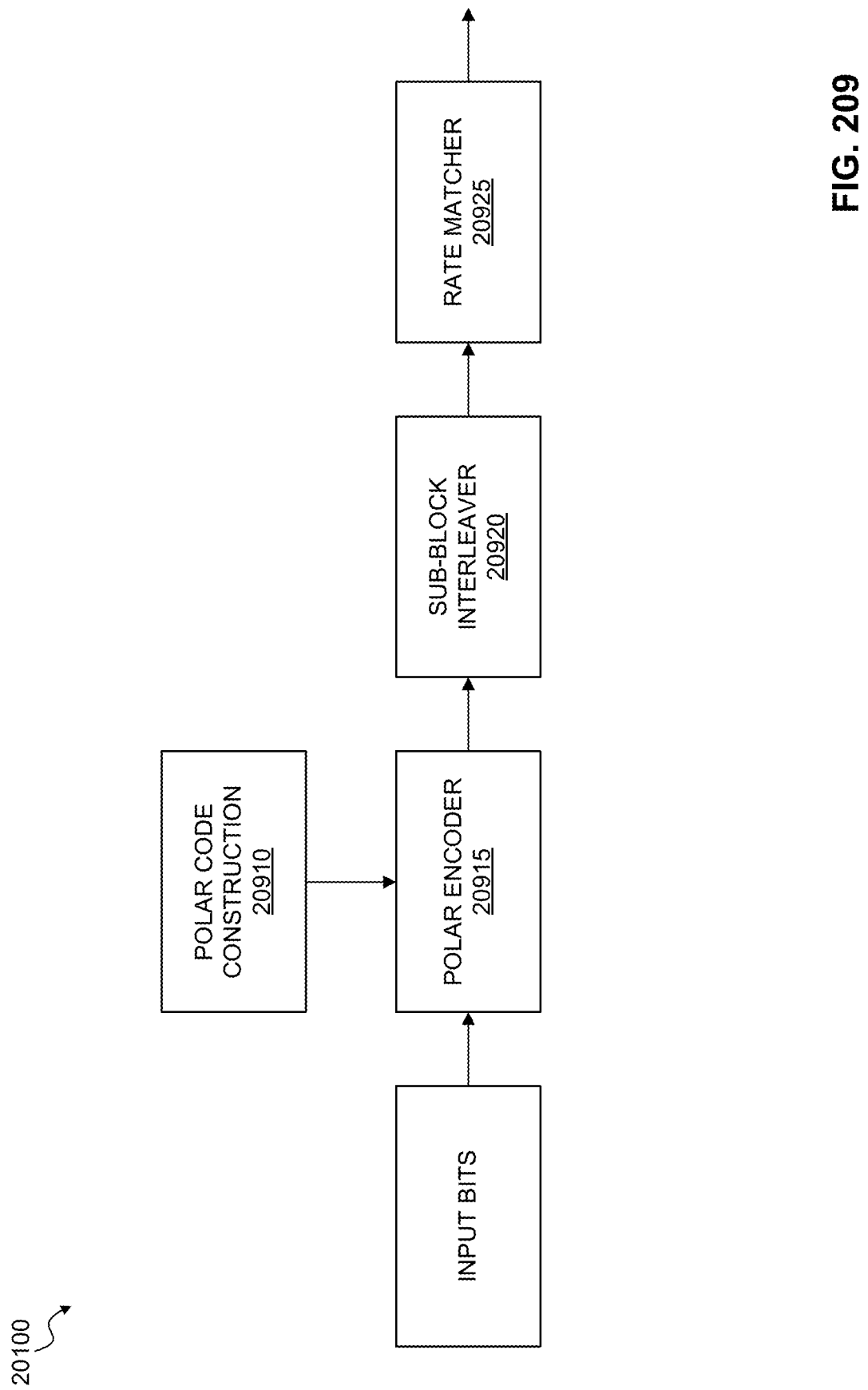

FIG. 209 illustrates a polar encoding and rate-matching operation according to an exemplary aspect of the present disclosure.

Figure 210:
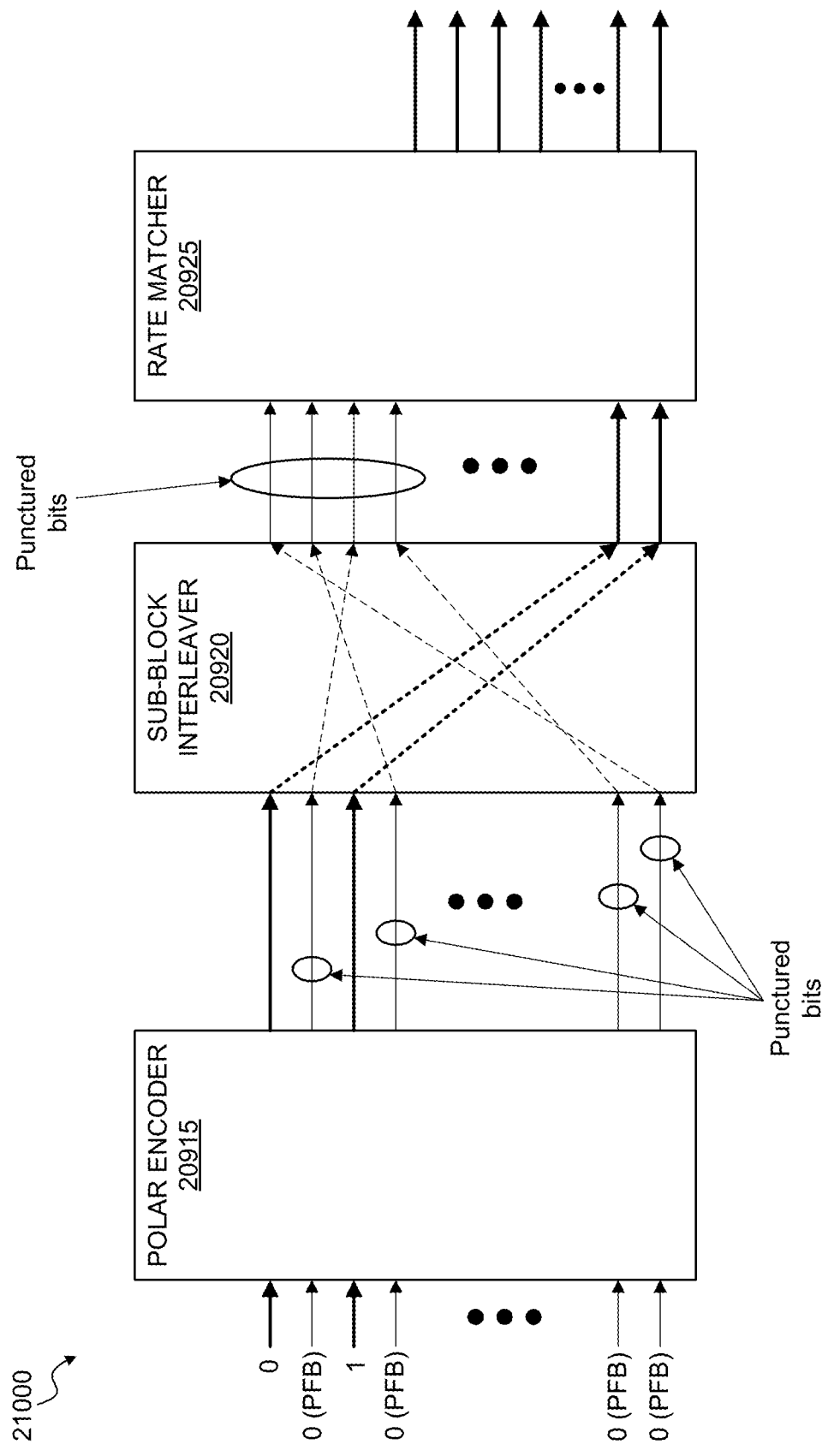

FIG. 210 illustrates a polar encoding and rate-matching operation according to an exemplary aspect of the present disclosure.

Figure 211:
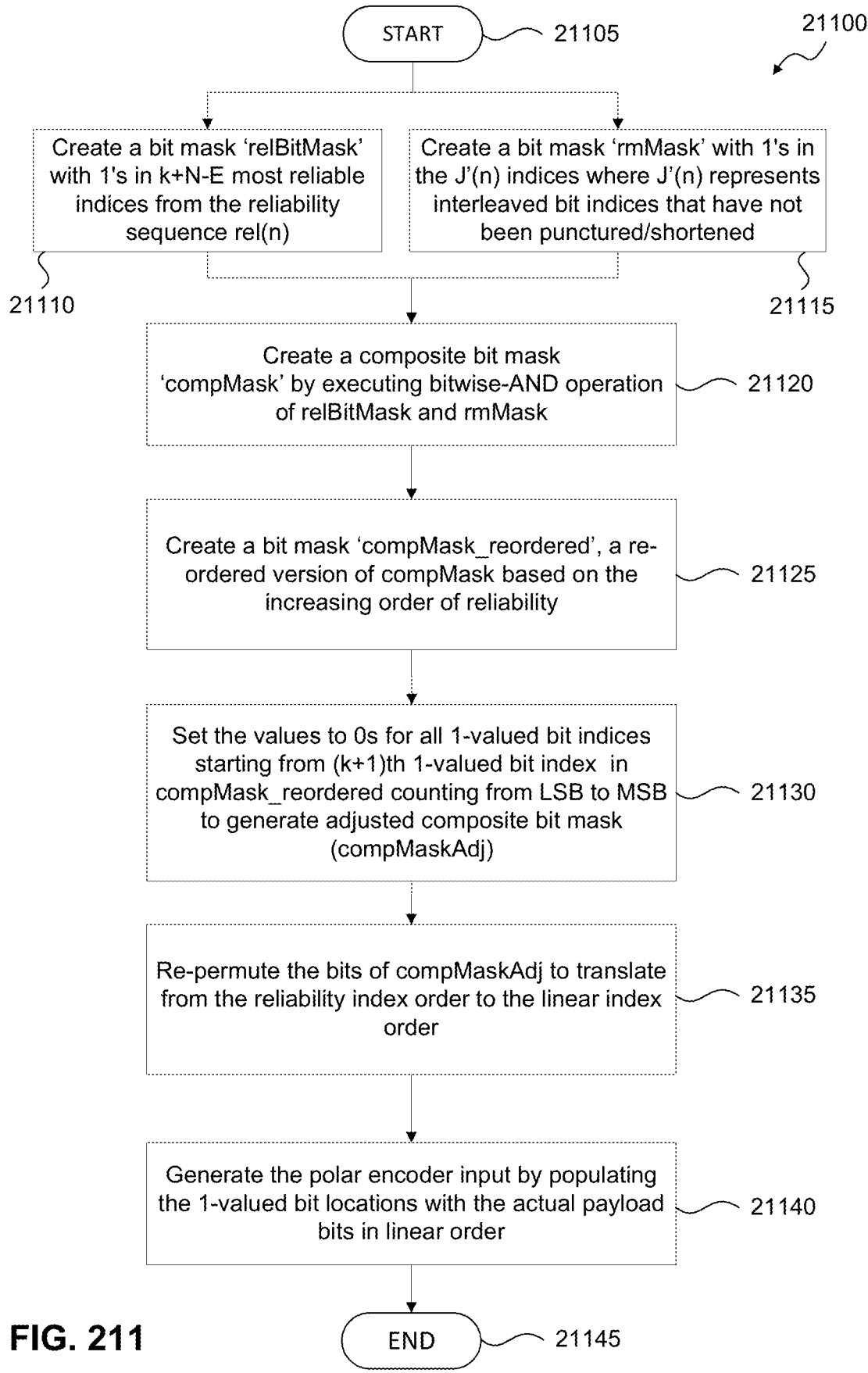

FIG. 211 illustrates a flowchart of an encoding method according to an exemplary aspect of the present disclosure.

FIG. 301 illustrates special nodes according to an exemplary aspect of the present disclosure.

Figure 302:
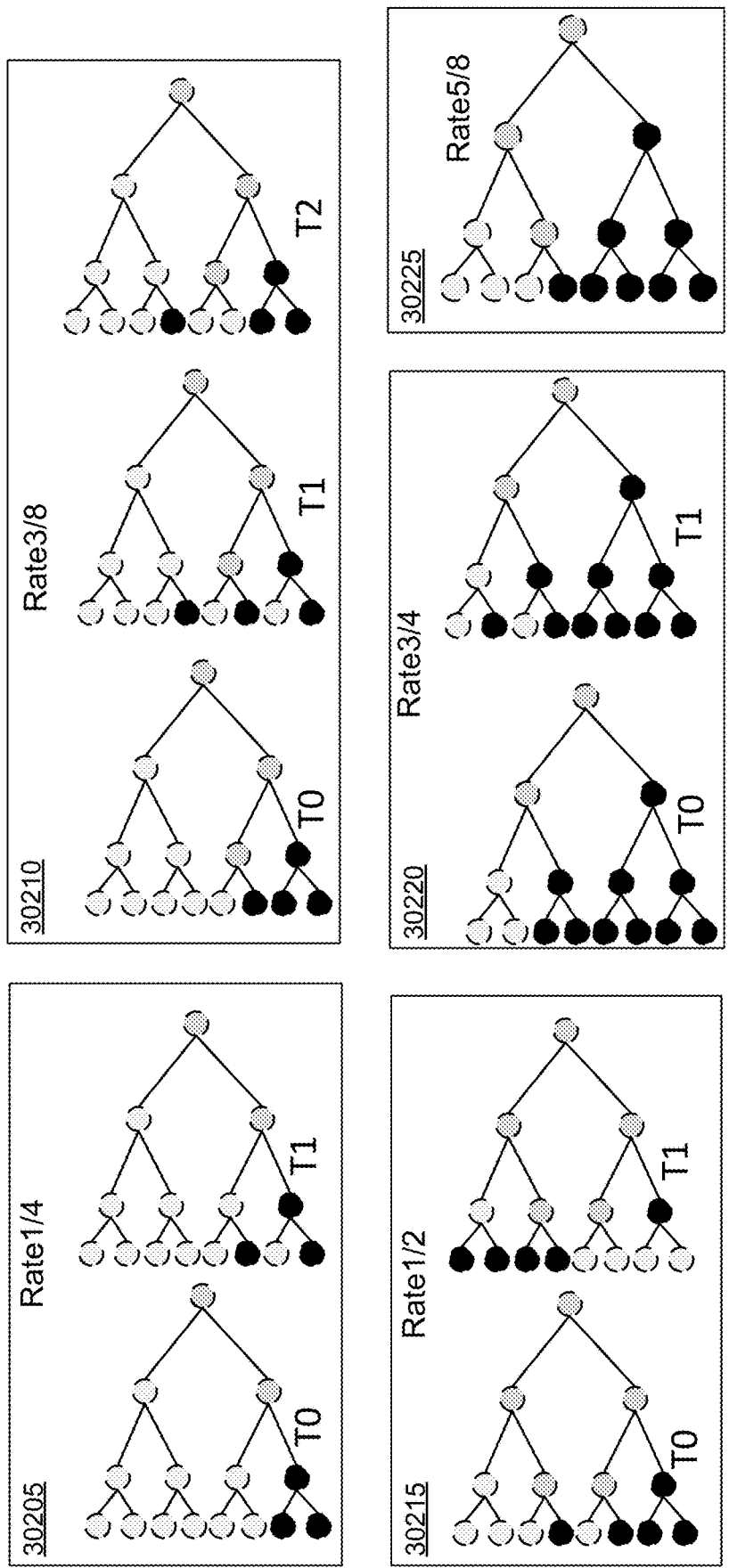

FIG. 302 illustrates special nodes according to an exemplary aspect of the present disclosure.

Figure 303:
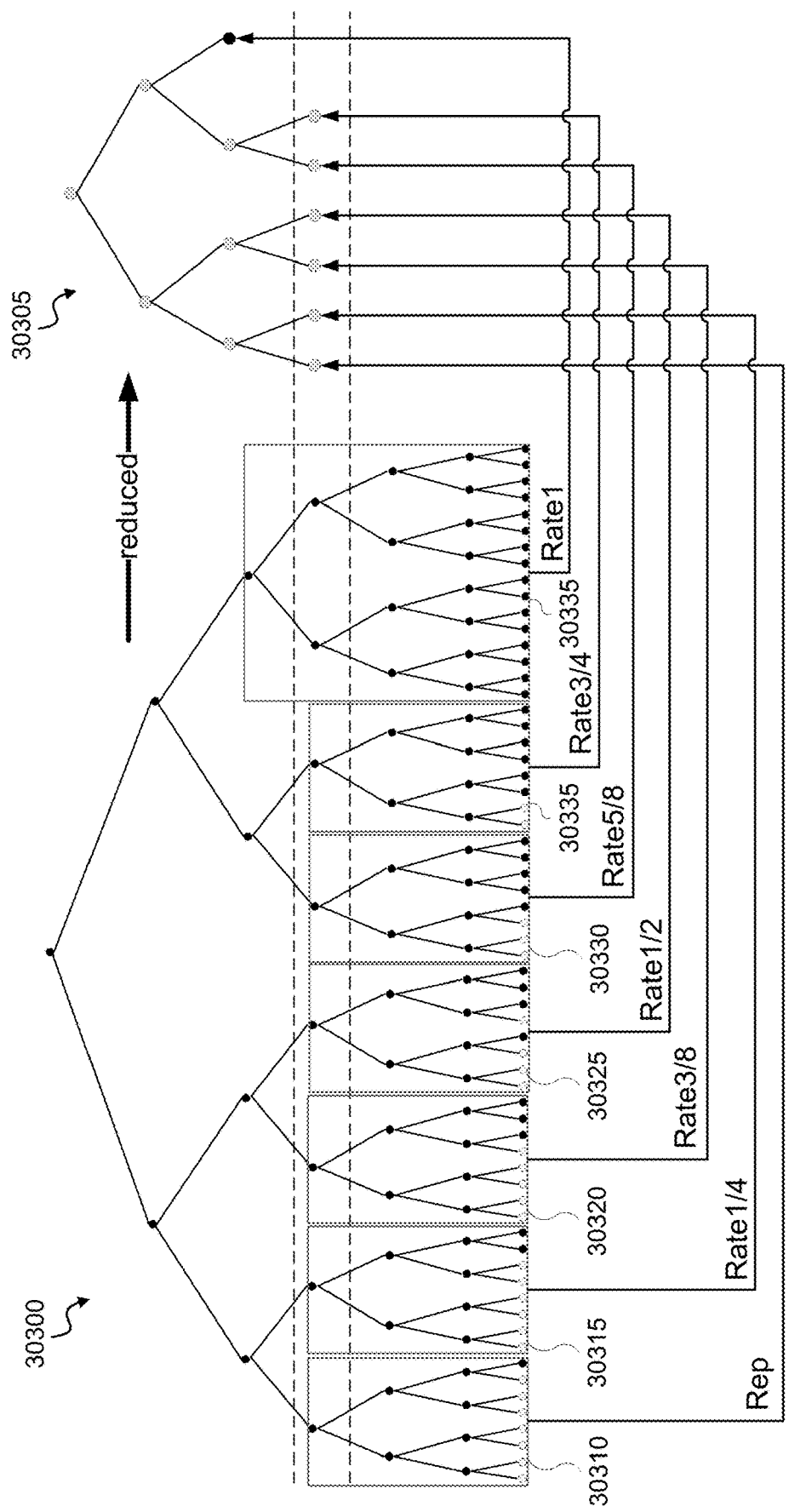

FIG. 303 illustrates a decoding/binary tree reduction according to an exemplary aspect of the present disclosure.

Figure 304:
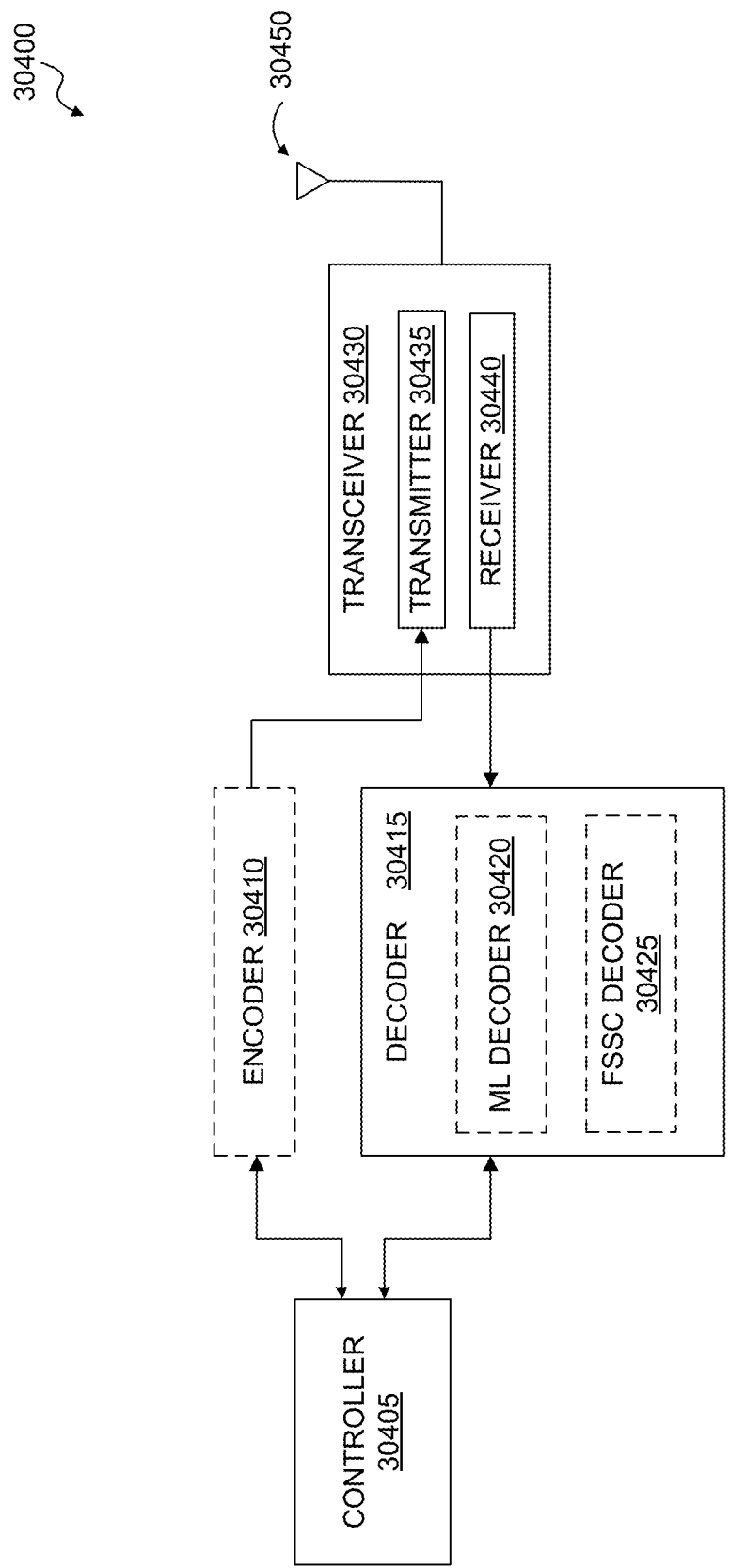

FIG. 304 illustrates a decoder system according to an exemplary aspect of the present disclosure.

Figure 305:
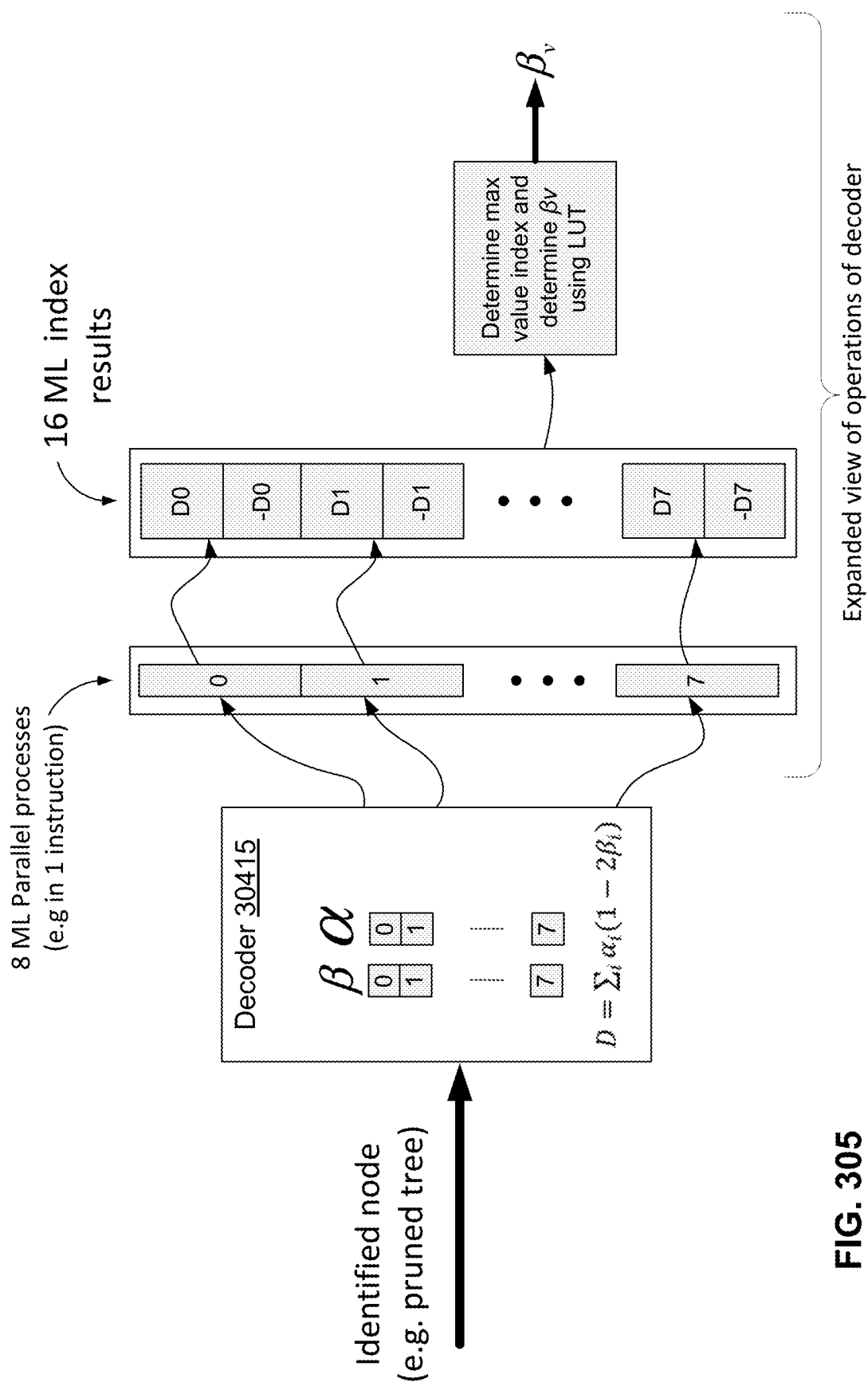

FIG. 305 illustrates an example operation of a decoder according to an exemplary aspect of the present disclosure.

Figure 306:
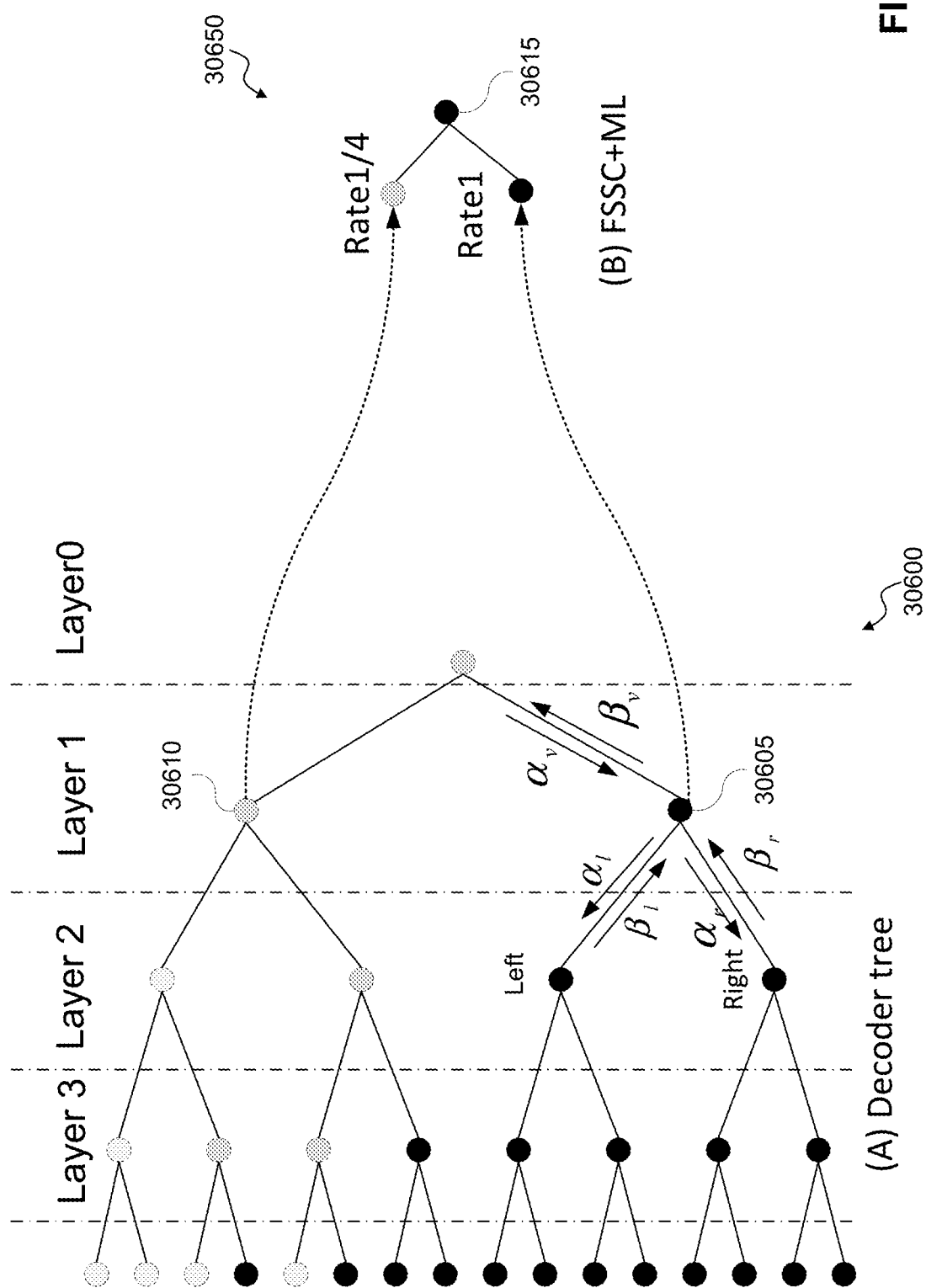

FIG. 306 illustrates a decoding/binary tree reduction according to an exemplary aspect of the present disclosure.

Figure 307:
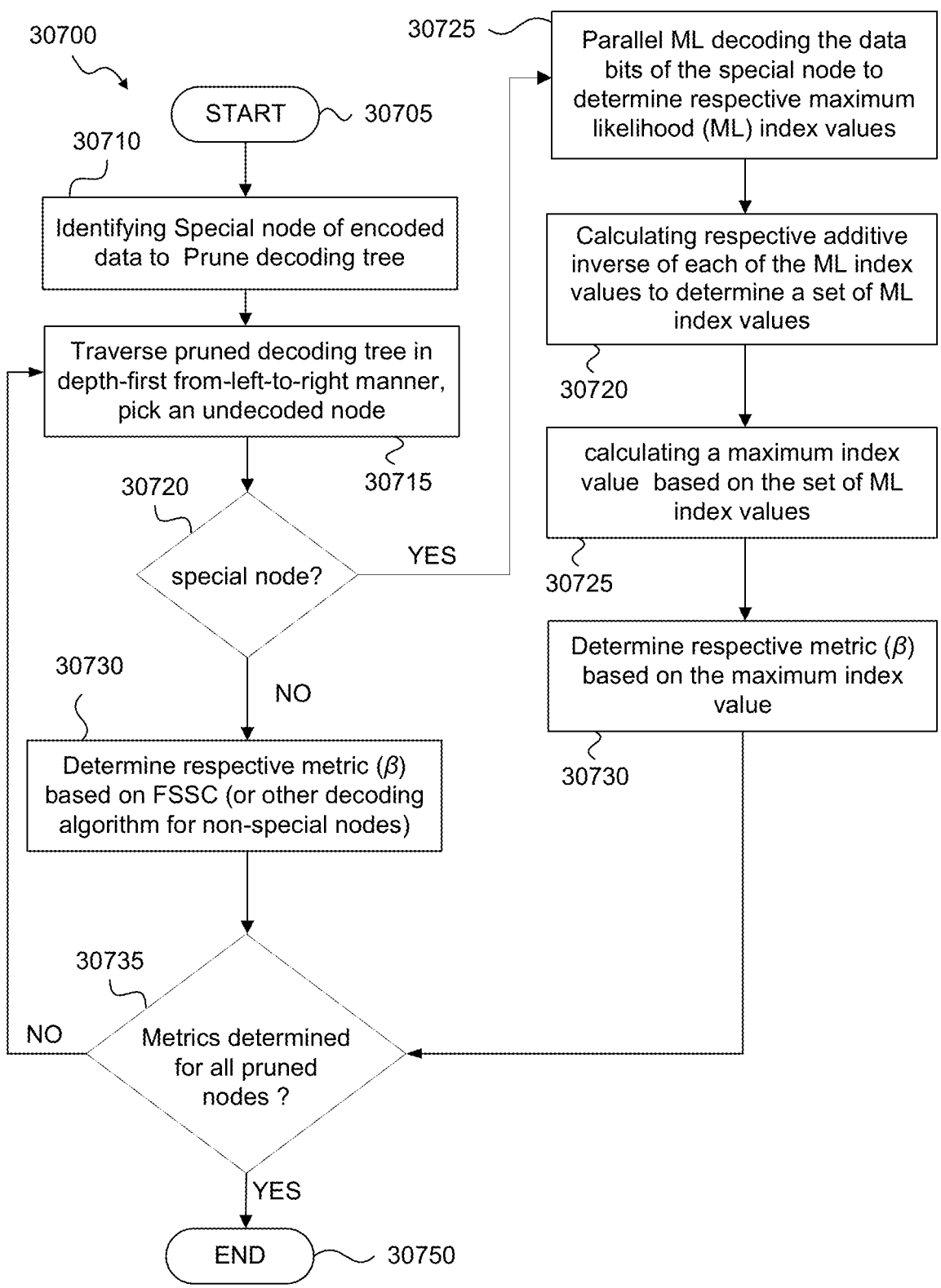

FIG. 307 illustrates flowchart of a decoding method according to an exemplary aspect of the present disclosure.

Figure 401A:
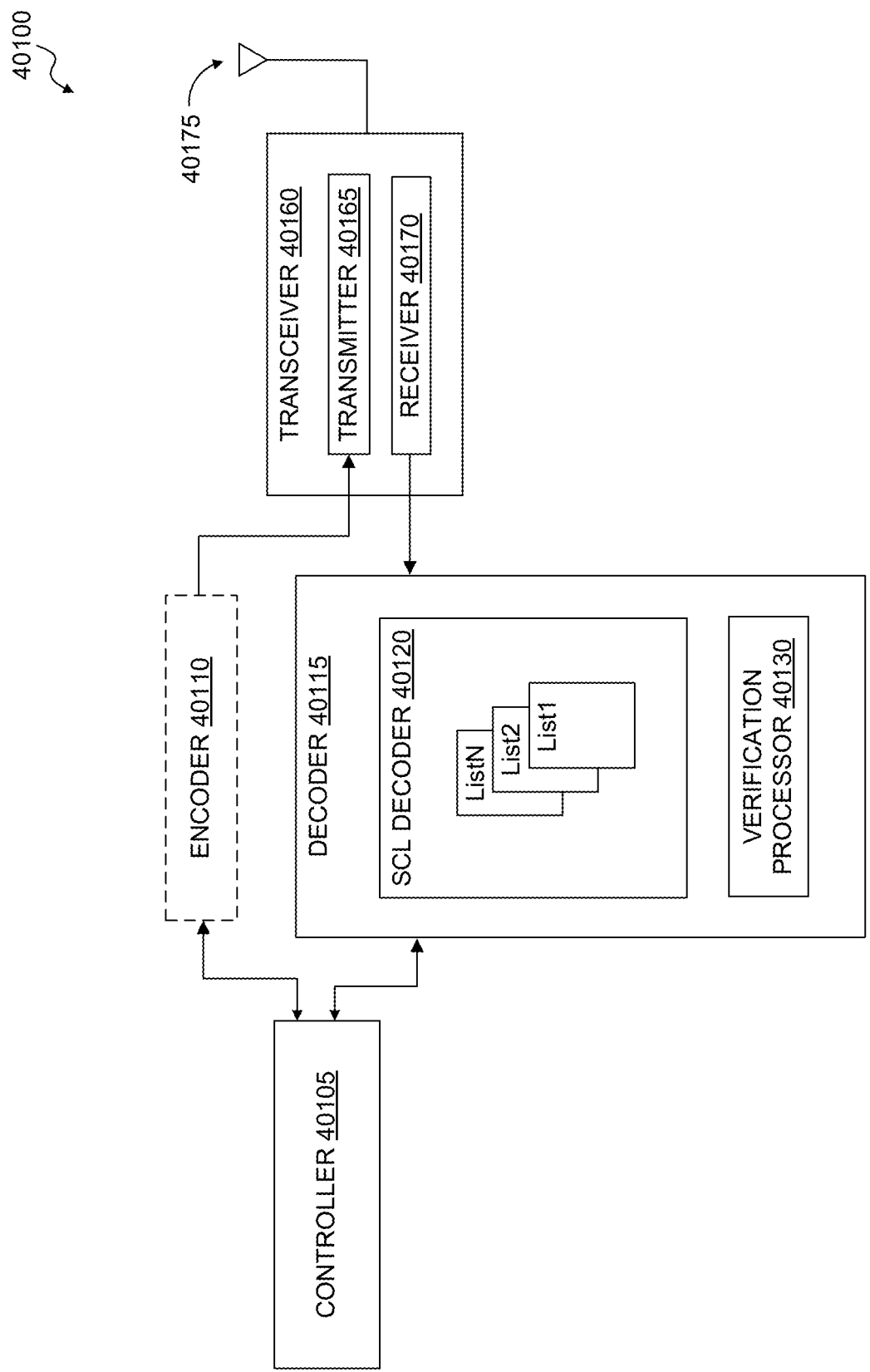
Figure 401B:
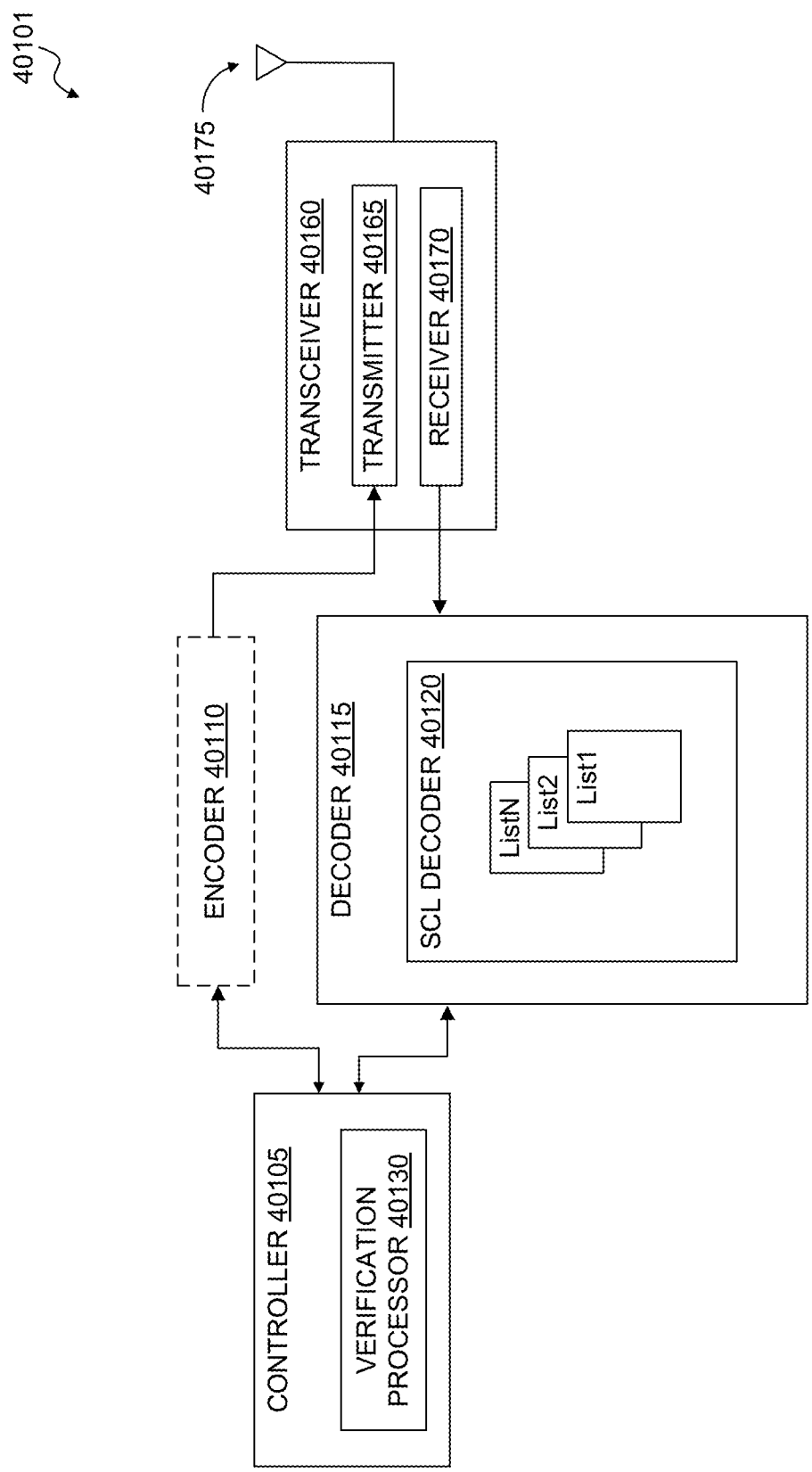
Figure 401C:
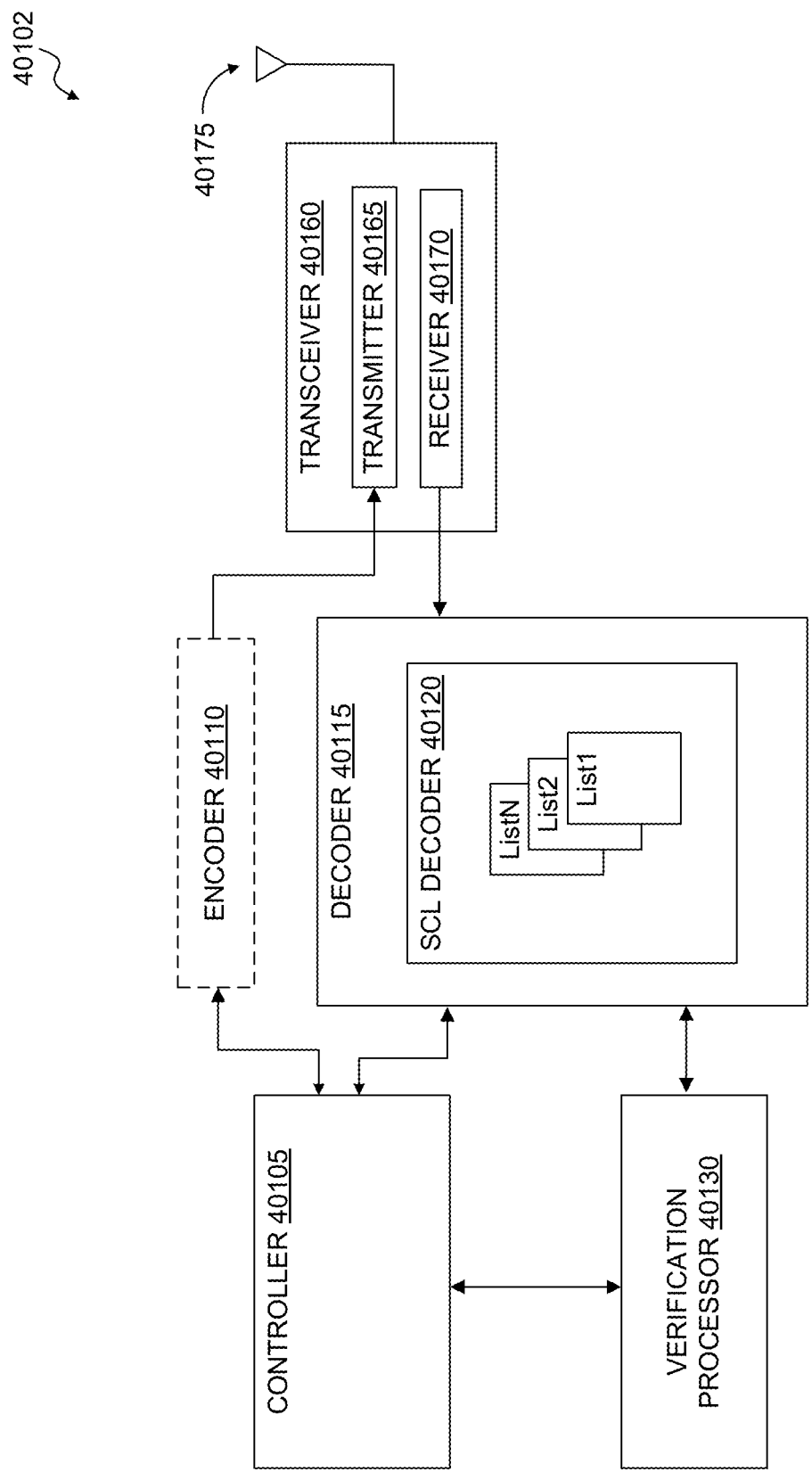

FIGS. 401A-C illustrate decoder systems according to exemplary aspects of the present disclosure.

Figure 402:
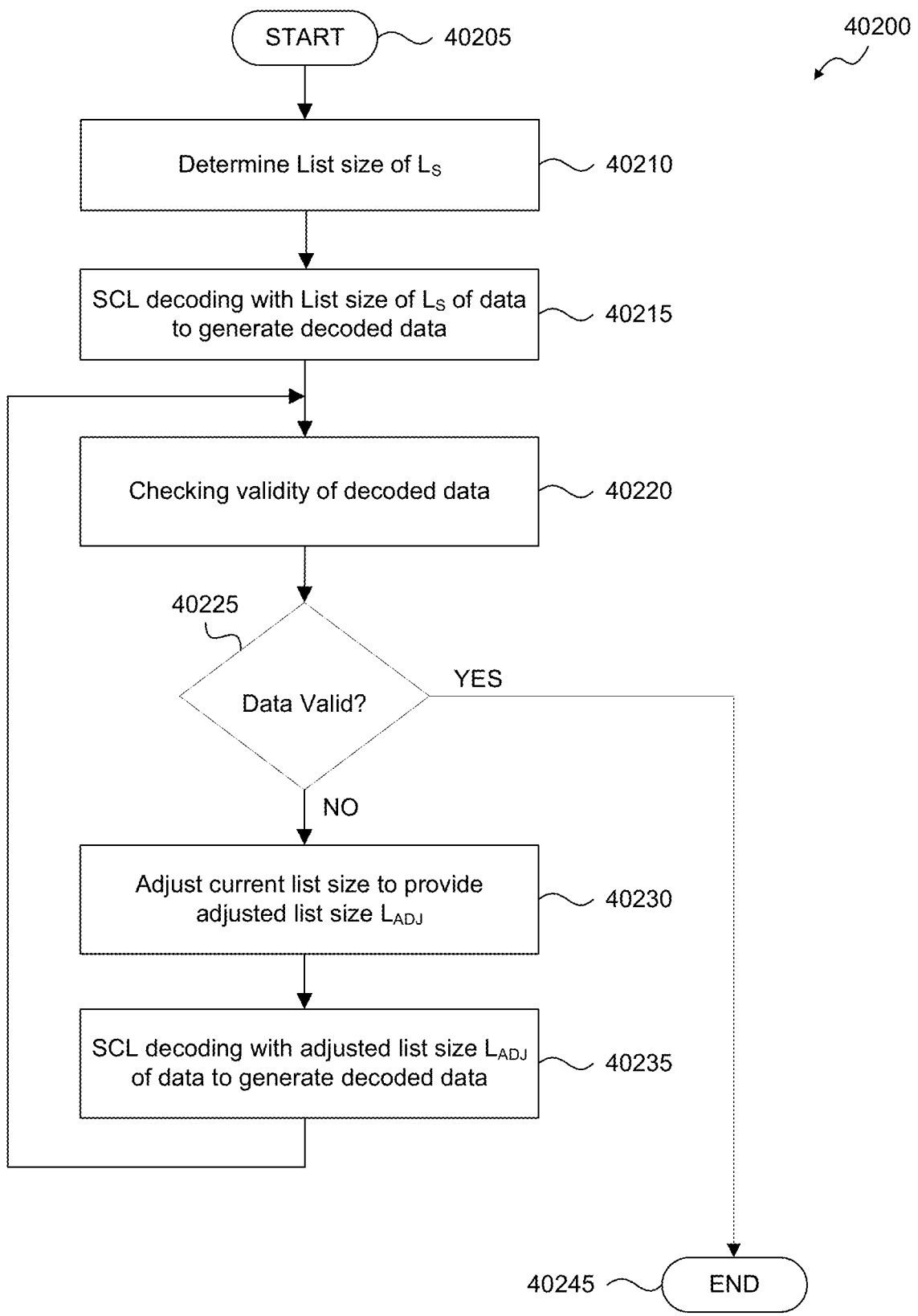

FIG. 402 illustrates a flowchart of a decoding method according to an exemplary aspect of the present disclosure.

Figure 501A:
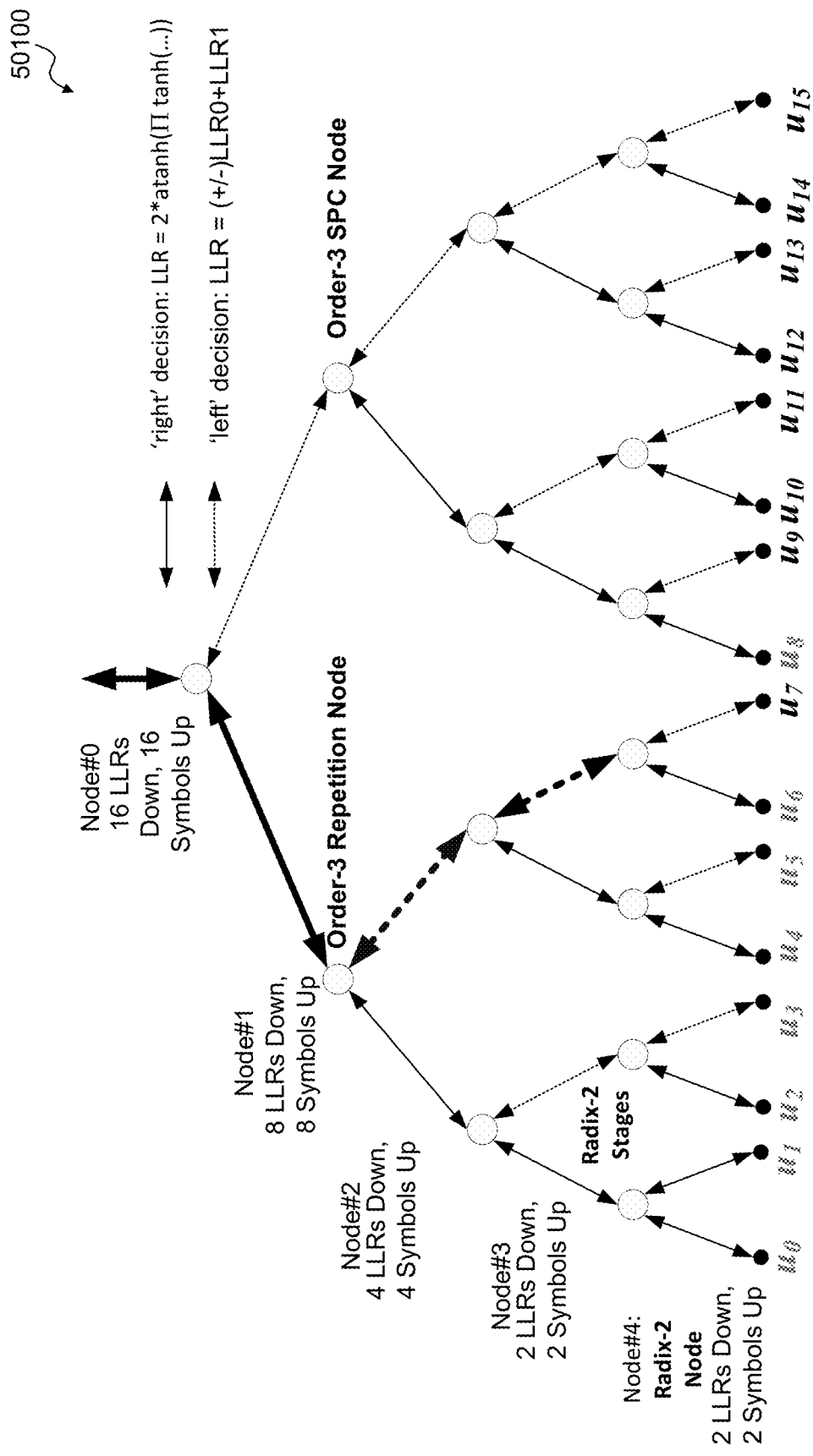

FIG. 501A illustrates a decoding/binary tree according to an exemplary aspect of the present disclosure.

Figure 501B:
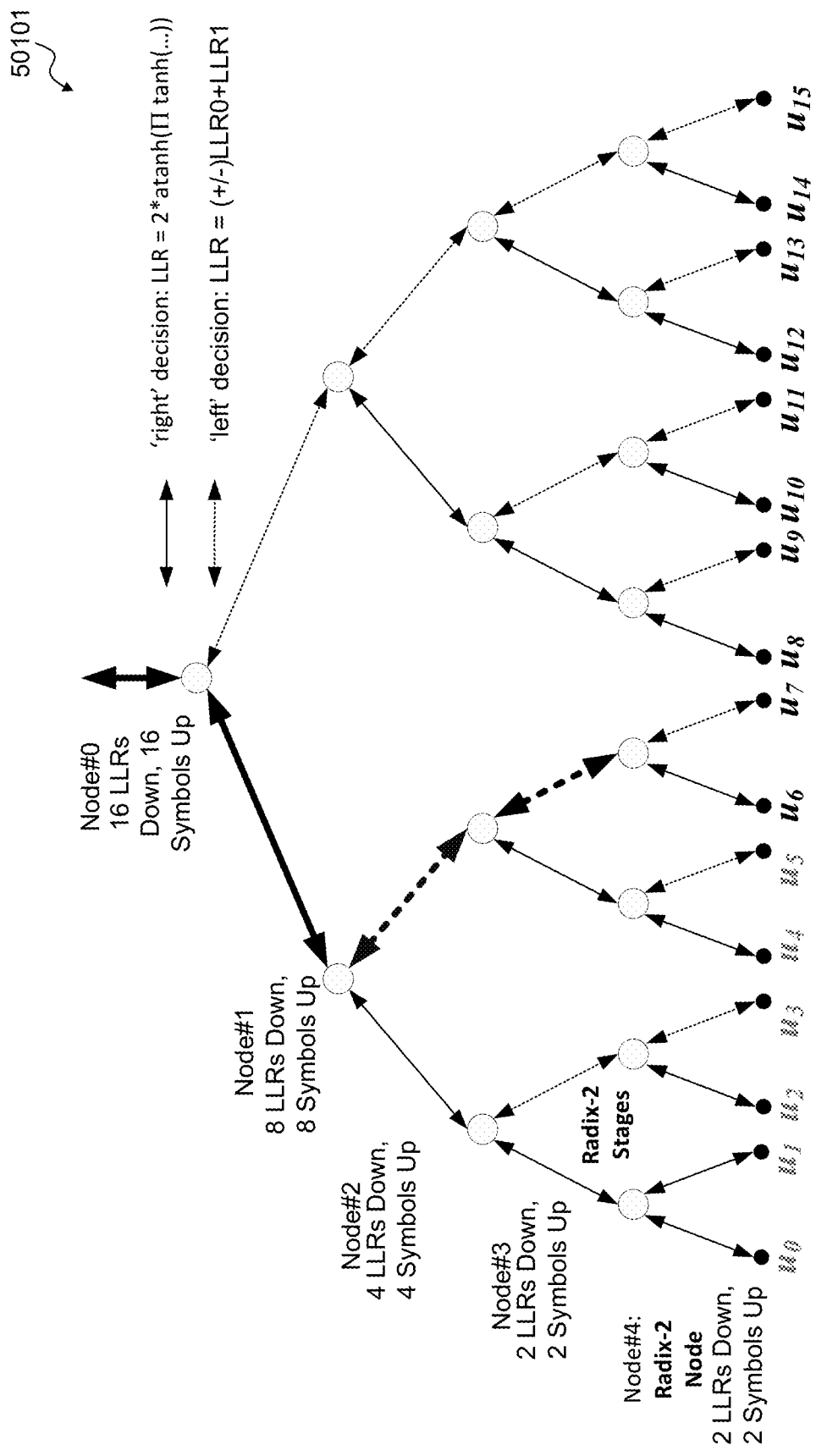

FIG. 501B illustrates a decoding/binary tree according to an exemplary aspect of the present disclosure.

FIG. 502 illustrates an LLR initialization matrix according to an exemplary aspect of the present disclosure.

Figure 503A:
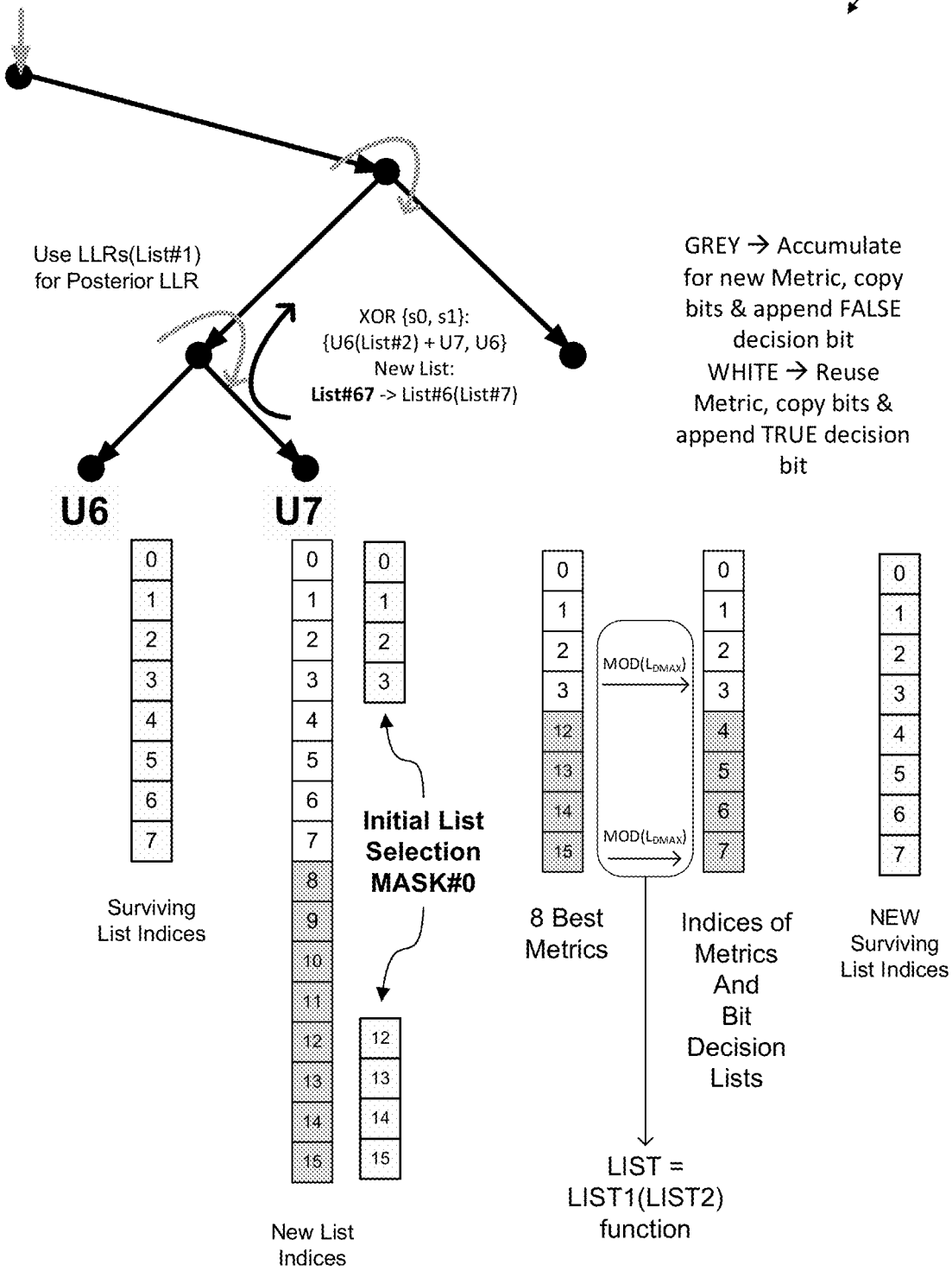

FIGS. 503A-C illustrate a bifurcation and selection operation according to an exemplary aspect of the present disclosure.

FIG. 504 illustrates list selection masks according to an exemplary aspect of the present disclosure.

Figure 505:
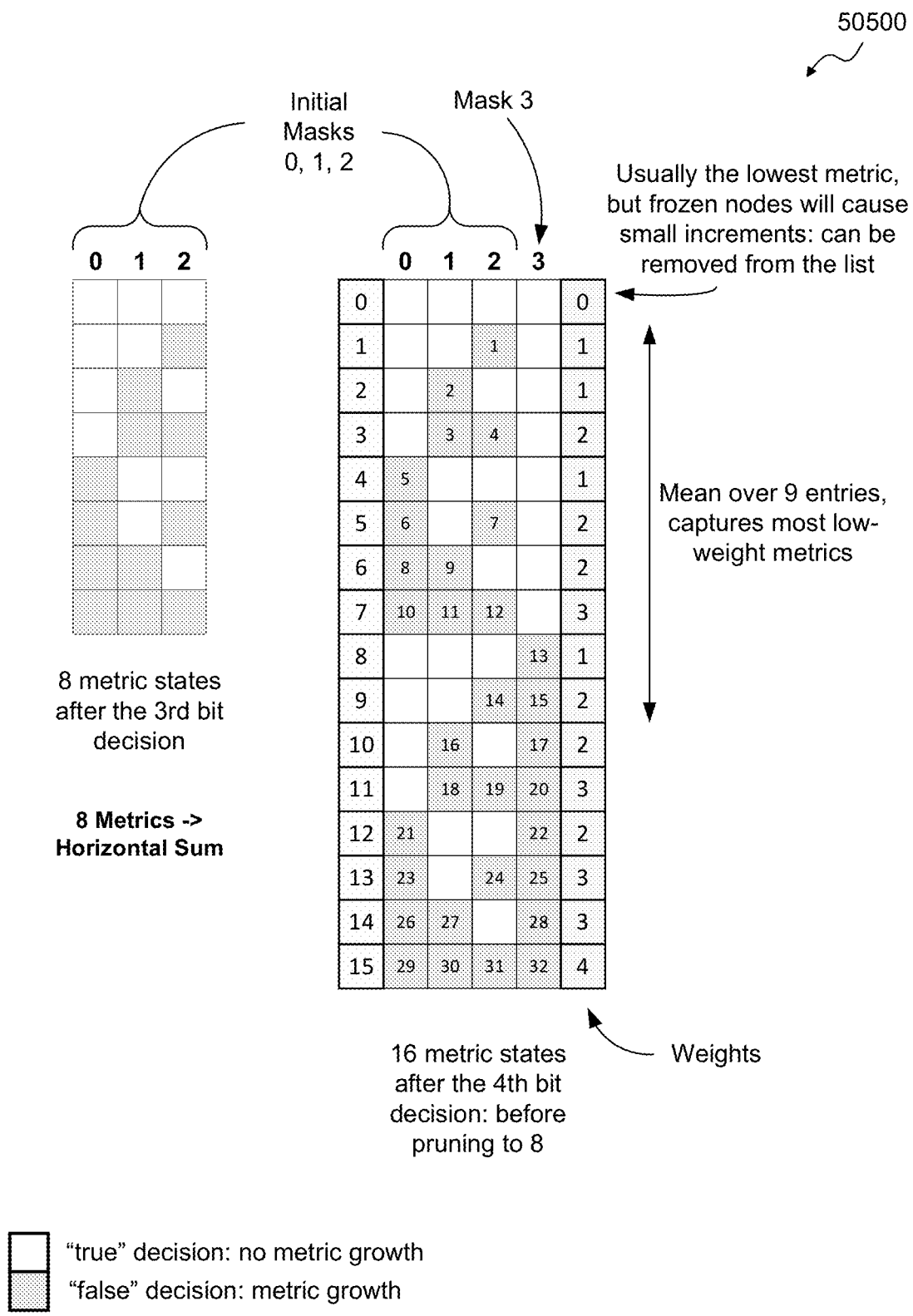

FIG. 505 illustrates a pruning operations according to an exemplary aspect of the present disclosure.

Figure 506A:
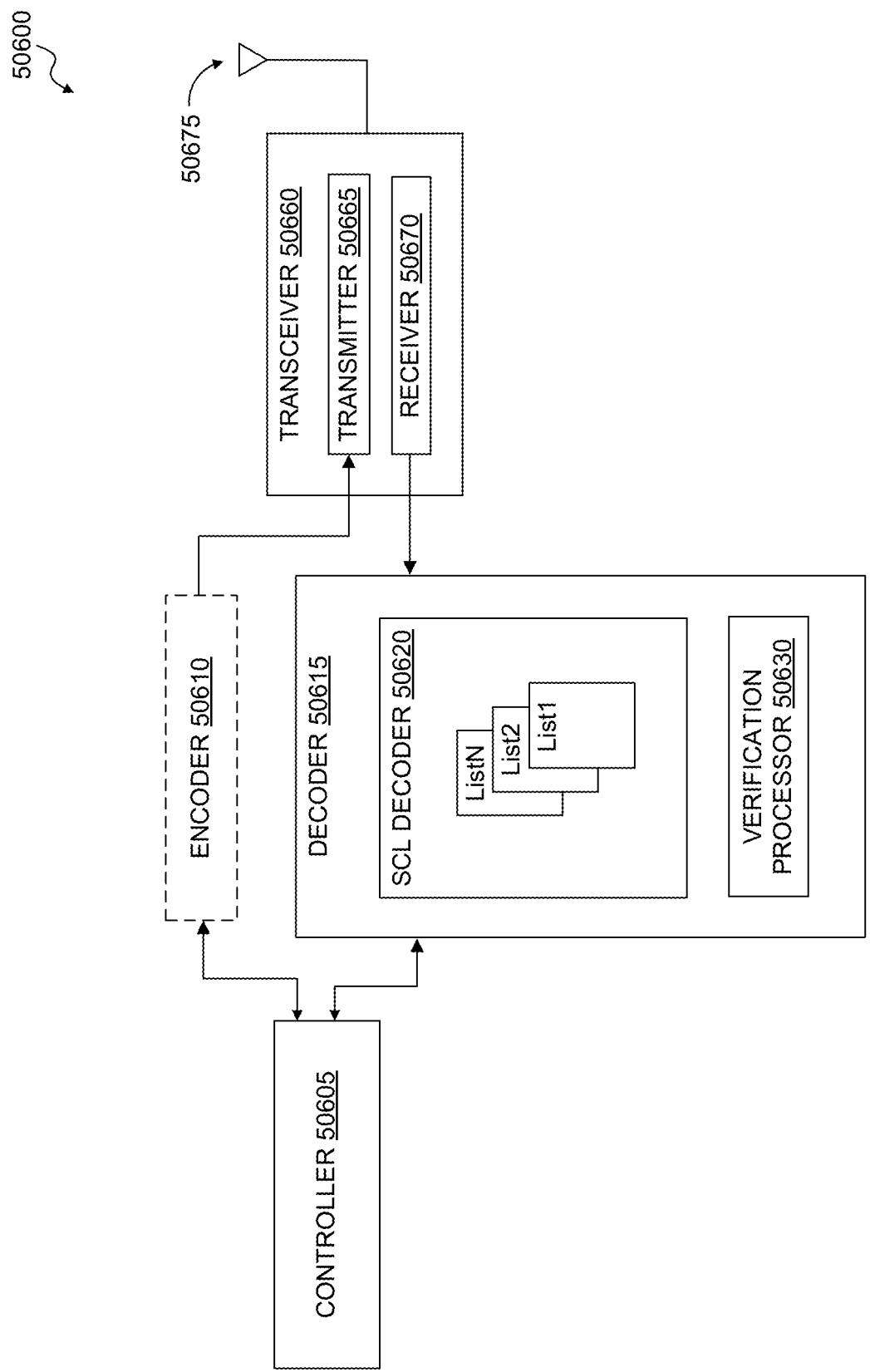
Figure 506B:
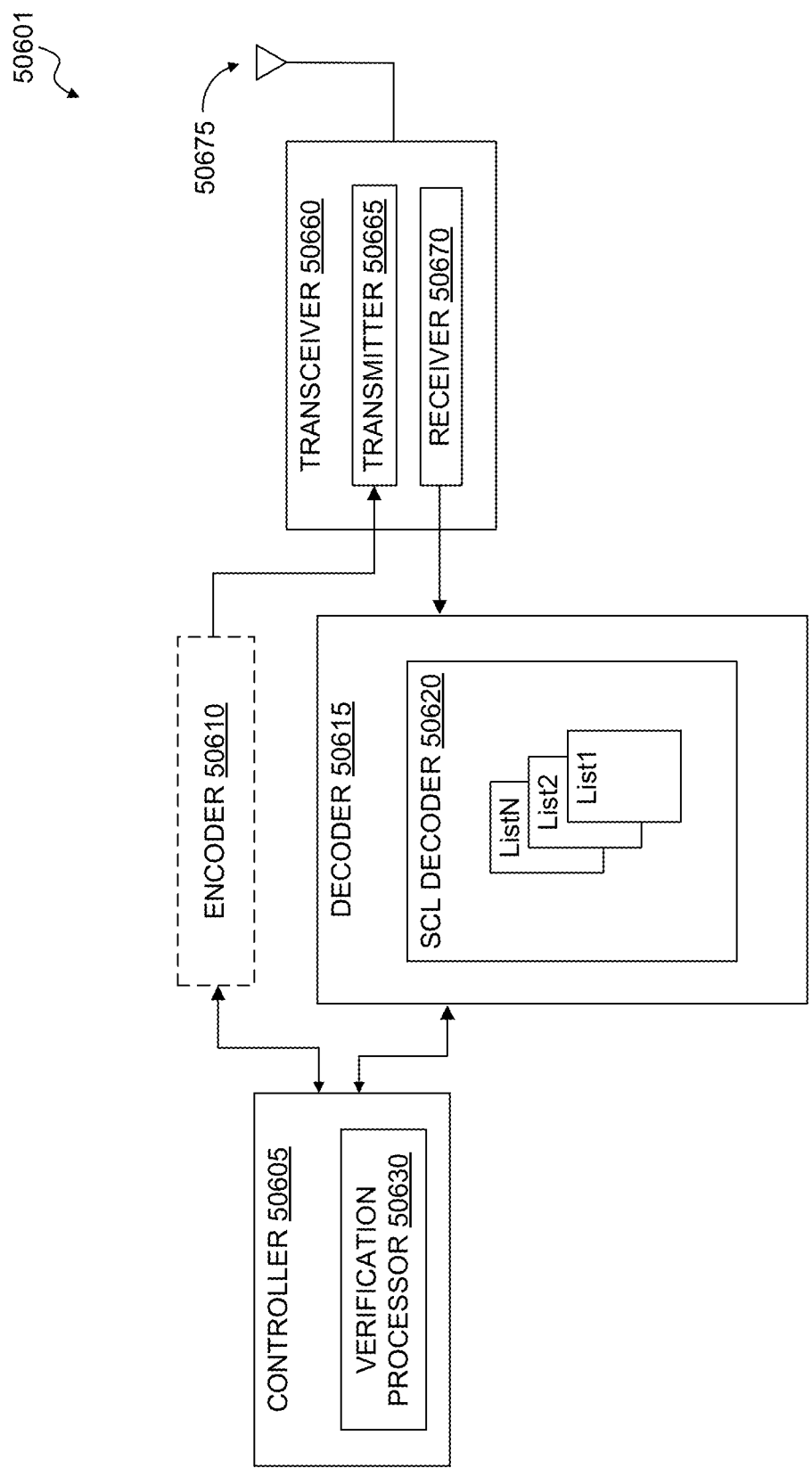
Figure 506C:
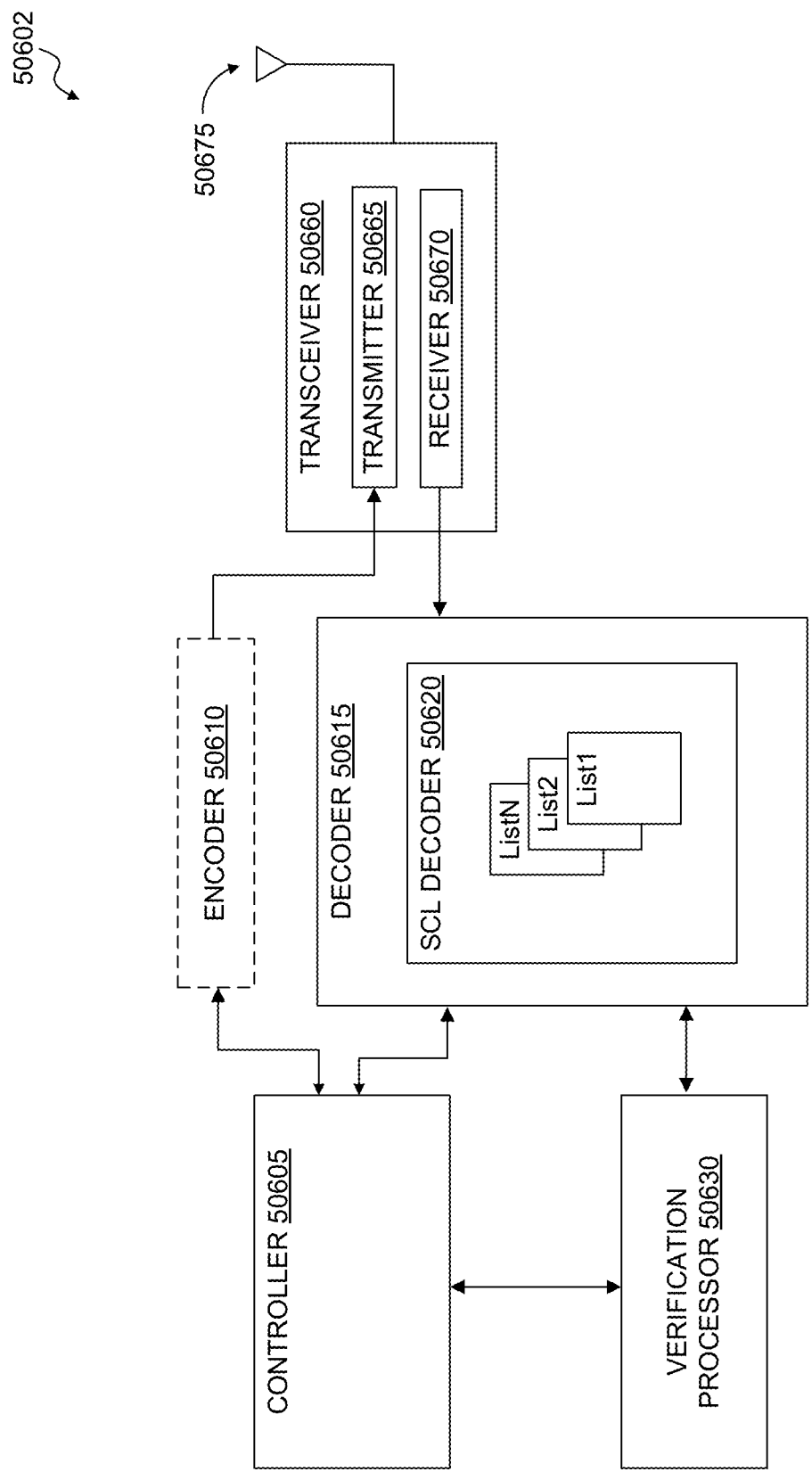

FIGS. 506A-C illustrate decoder systems according to exemplary aspects of the present disclosure.

Figure 507:
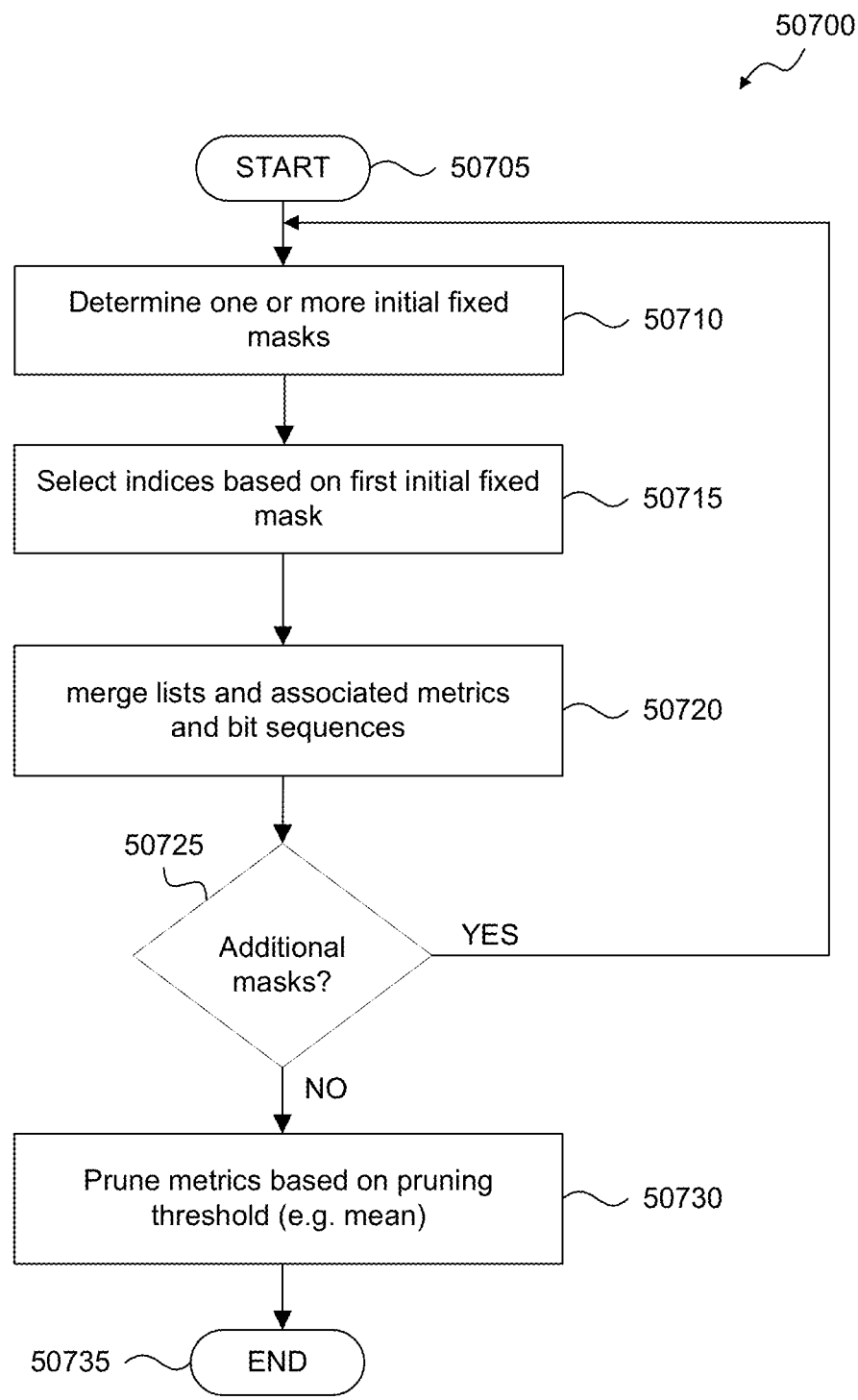

FIG. 507 illustrates a flowchart of a metric selection method according to an exemplary aspect of the present disclosure.

Figure 508:
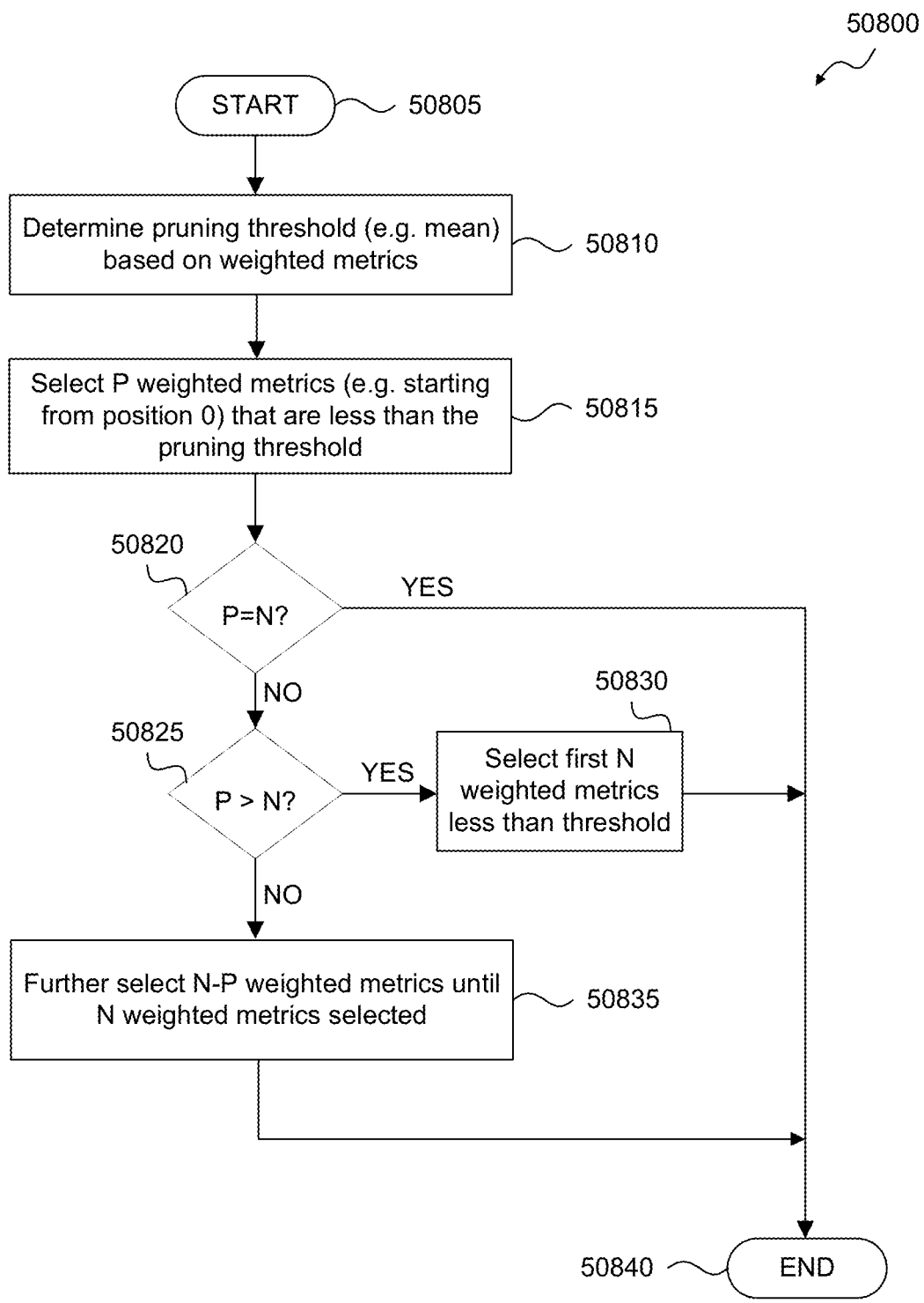

FIG. 508 illustrates a flowchart of a pruning method according to an exemplary aspect of the present disclosure.

Figure 601:
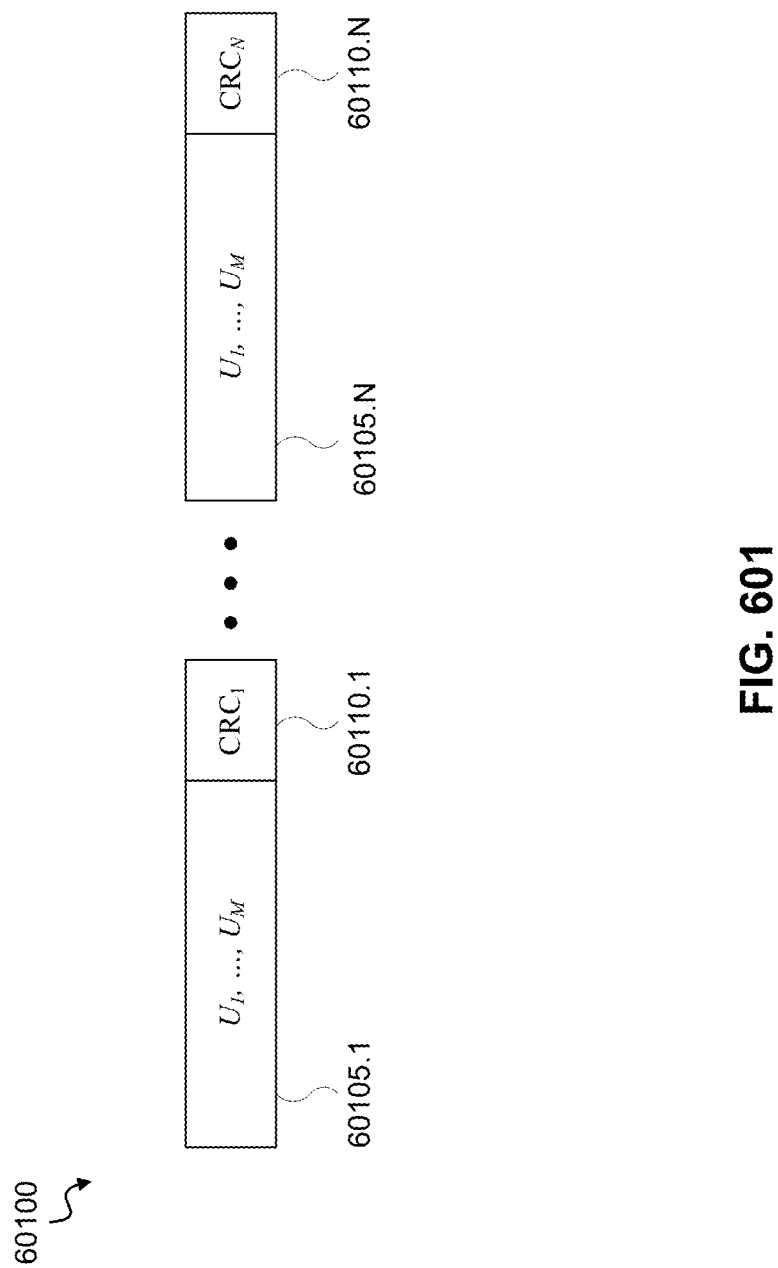

FIG. 601 illustrates message structure according to an exemplary aspect of the present disclosure.

Figure 602A:
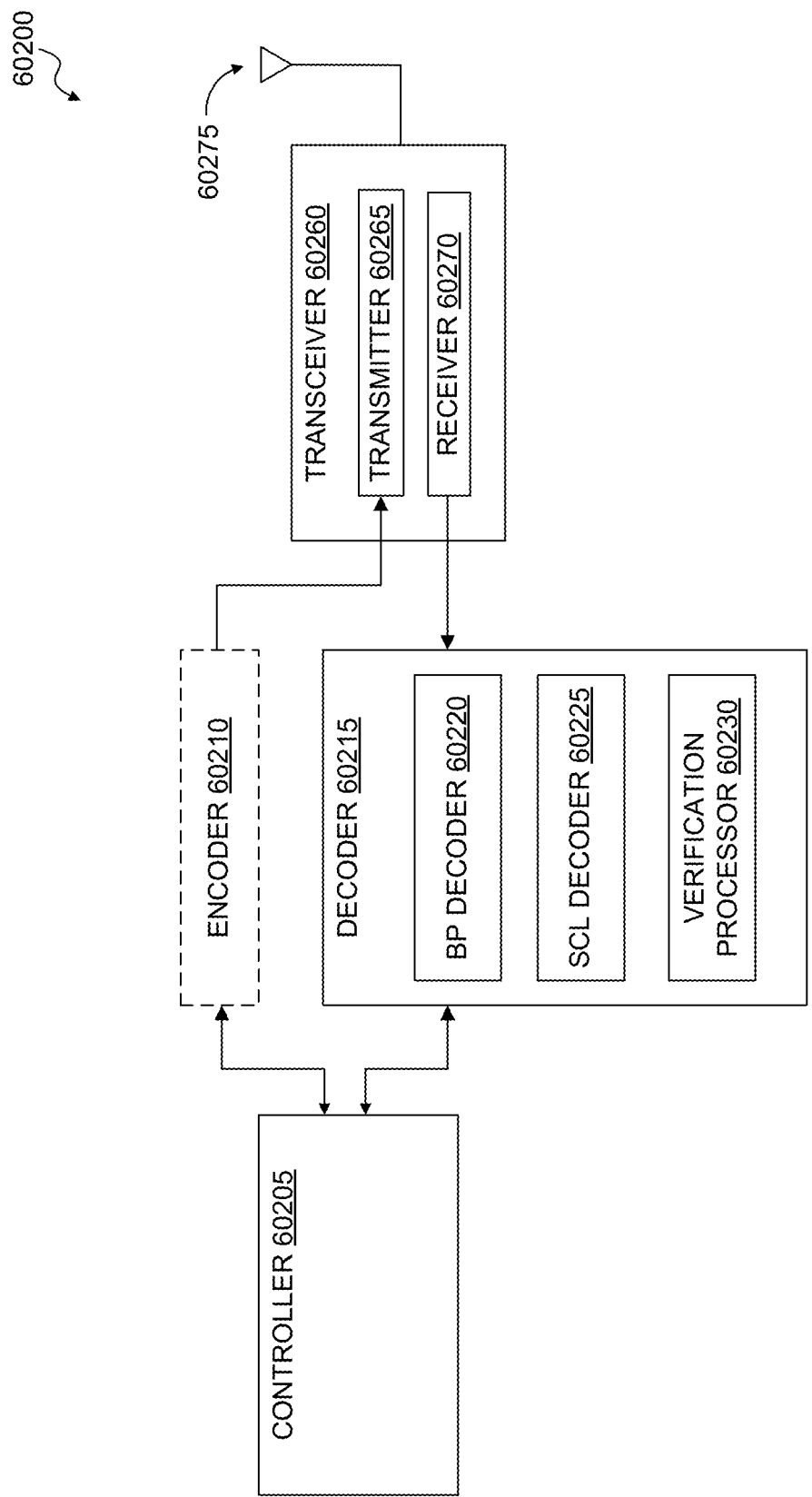
Figure 602B:
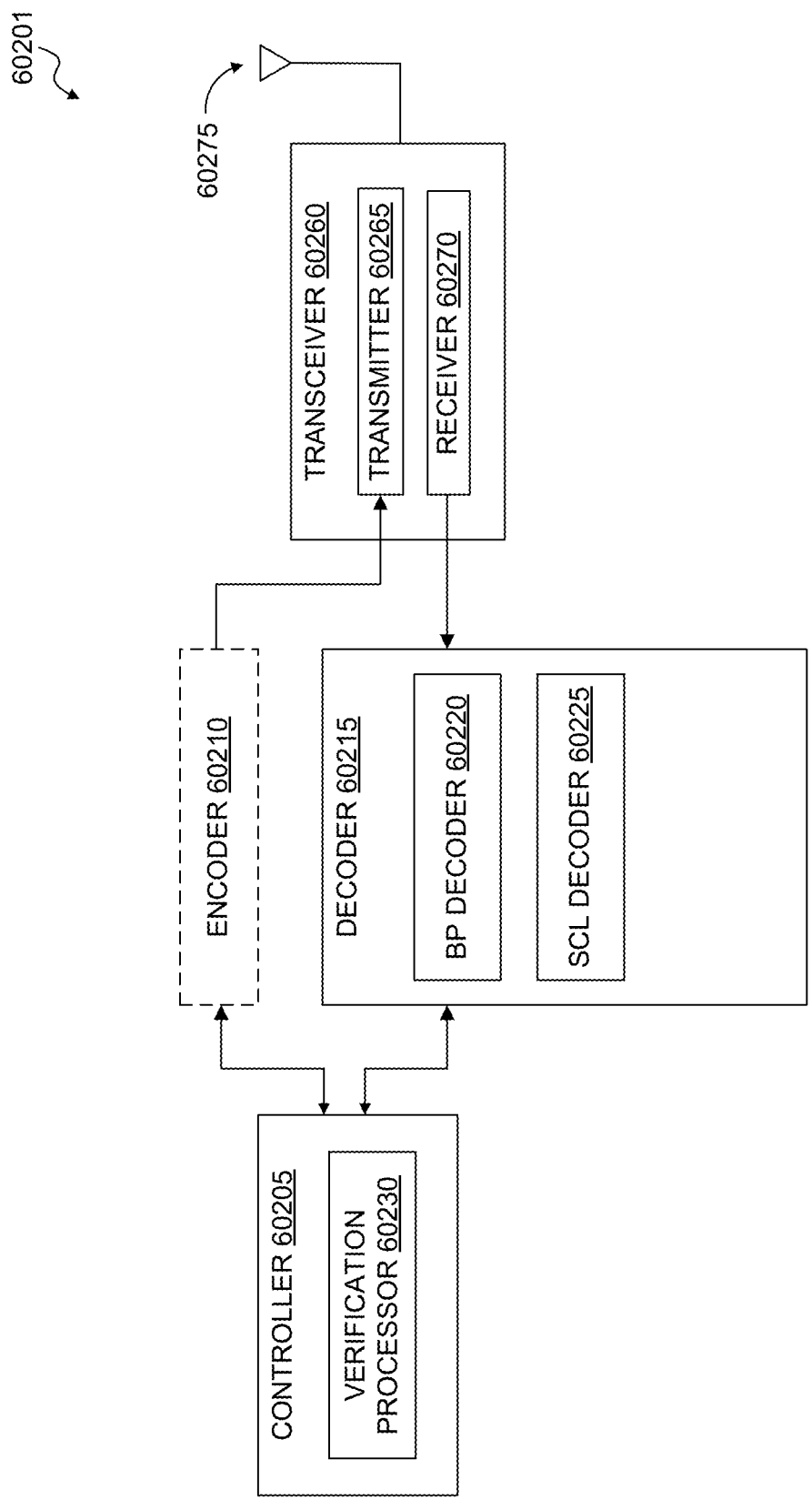

FIGS. 602A-B illustrate decoder systems according to an exemplary aspect of the present disclosure.

Figure 603:
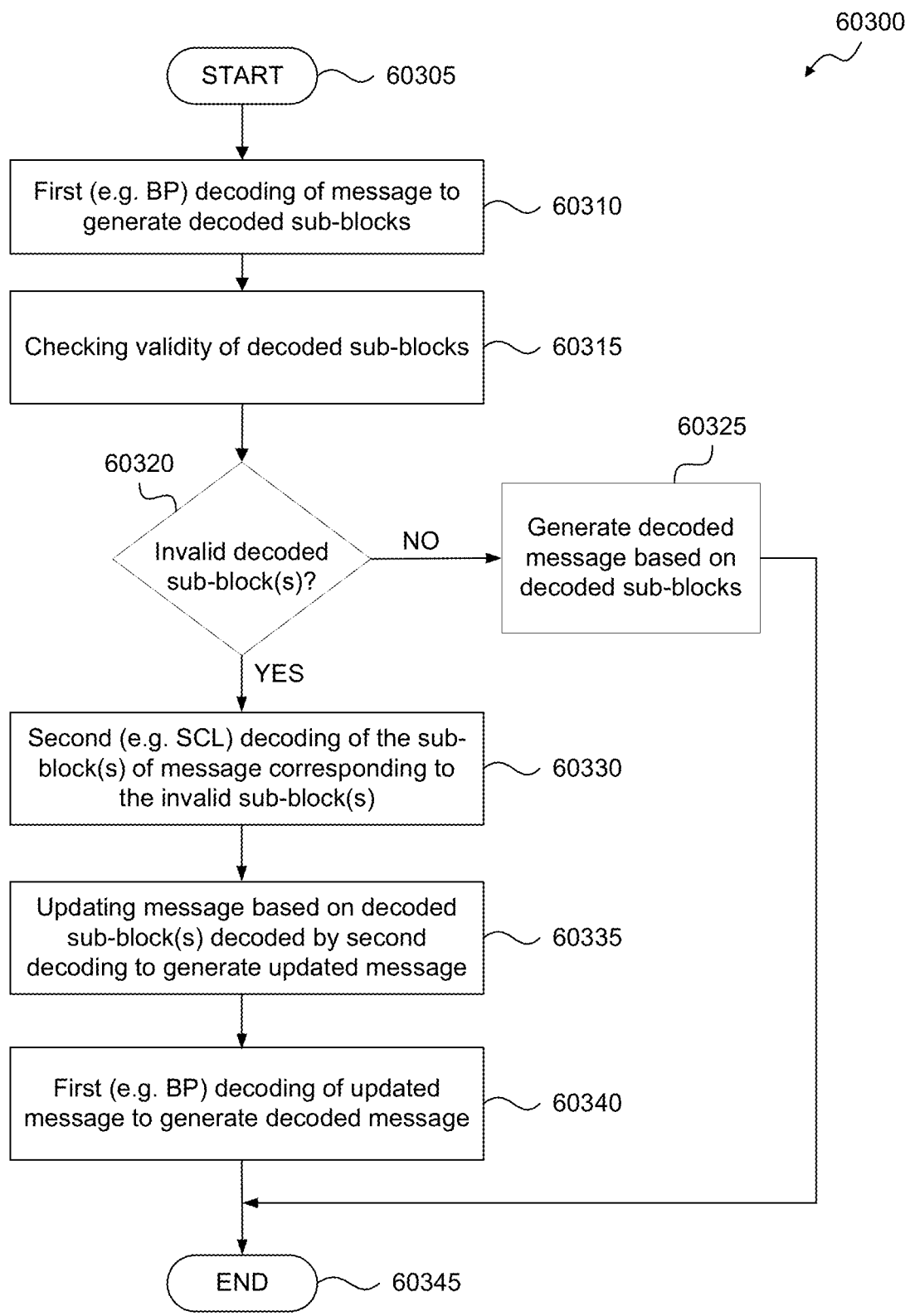

FIG. 603 illustrates flowchart of a decoding method according to an exemplary aspect of the present disclosure.

Figure 604A:
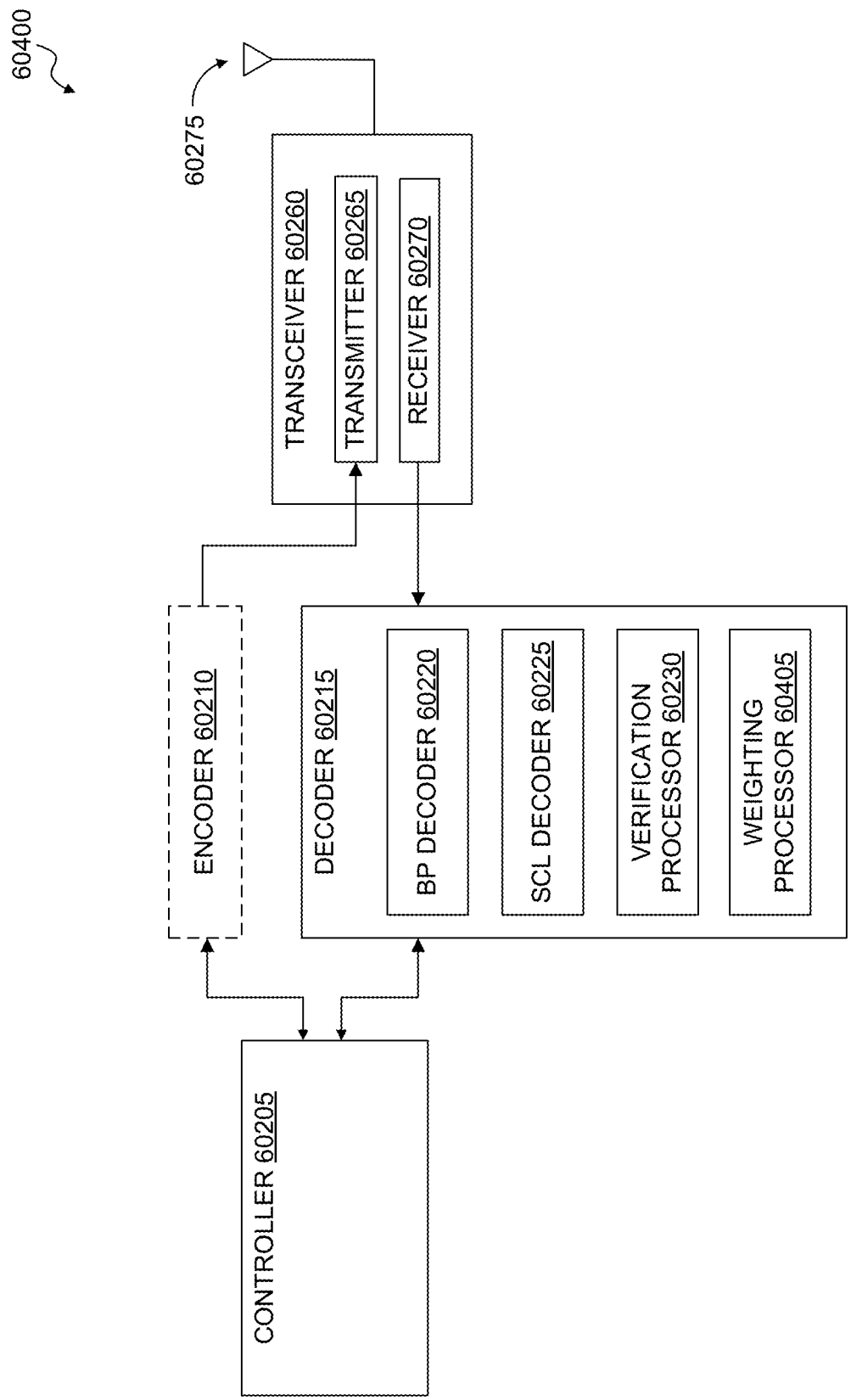
Figure 604B:
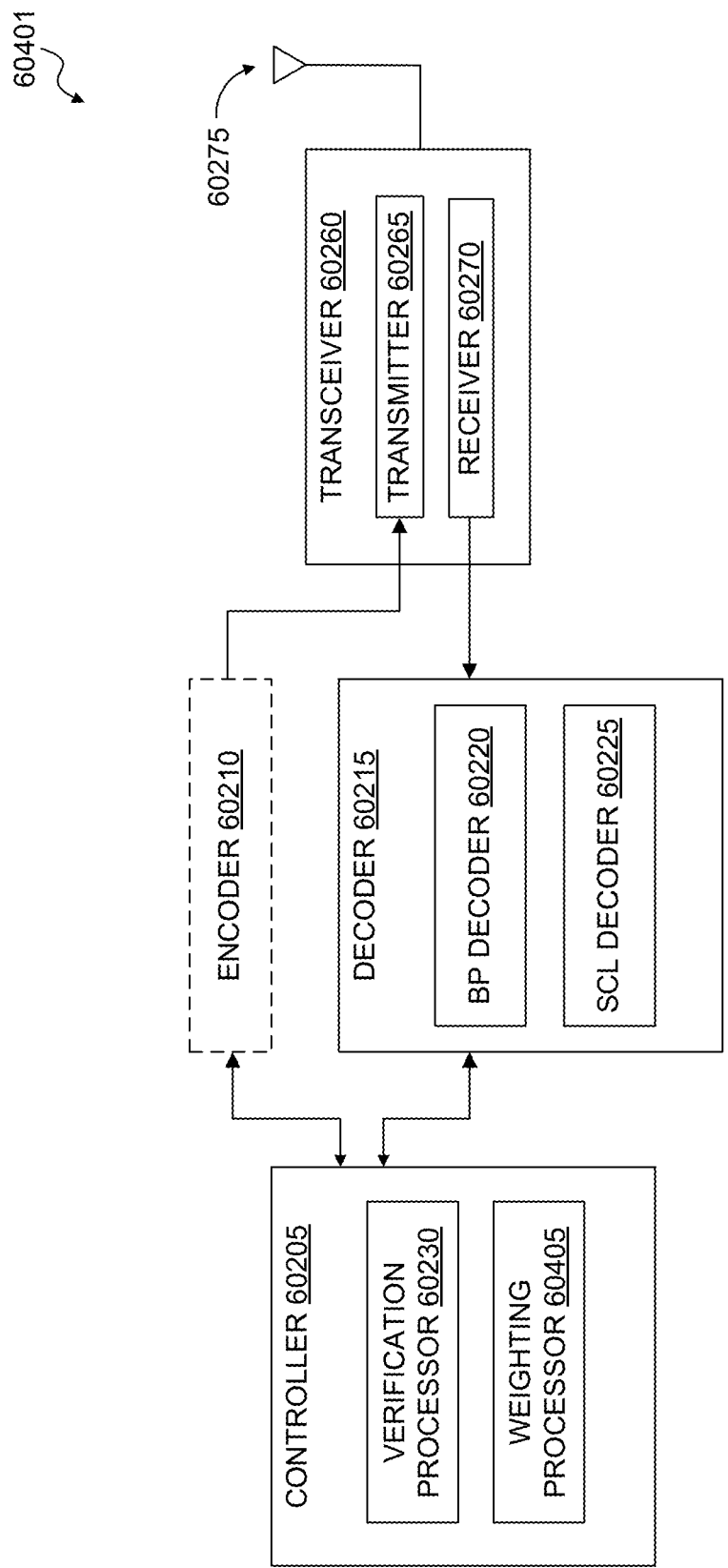

FIGS. 604A-B illustrate decoder systems according to an exemplary aspect of the present disclosure.

Figure 605A:
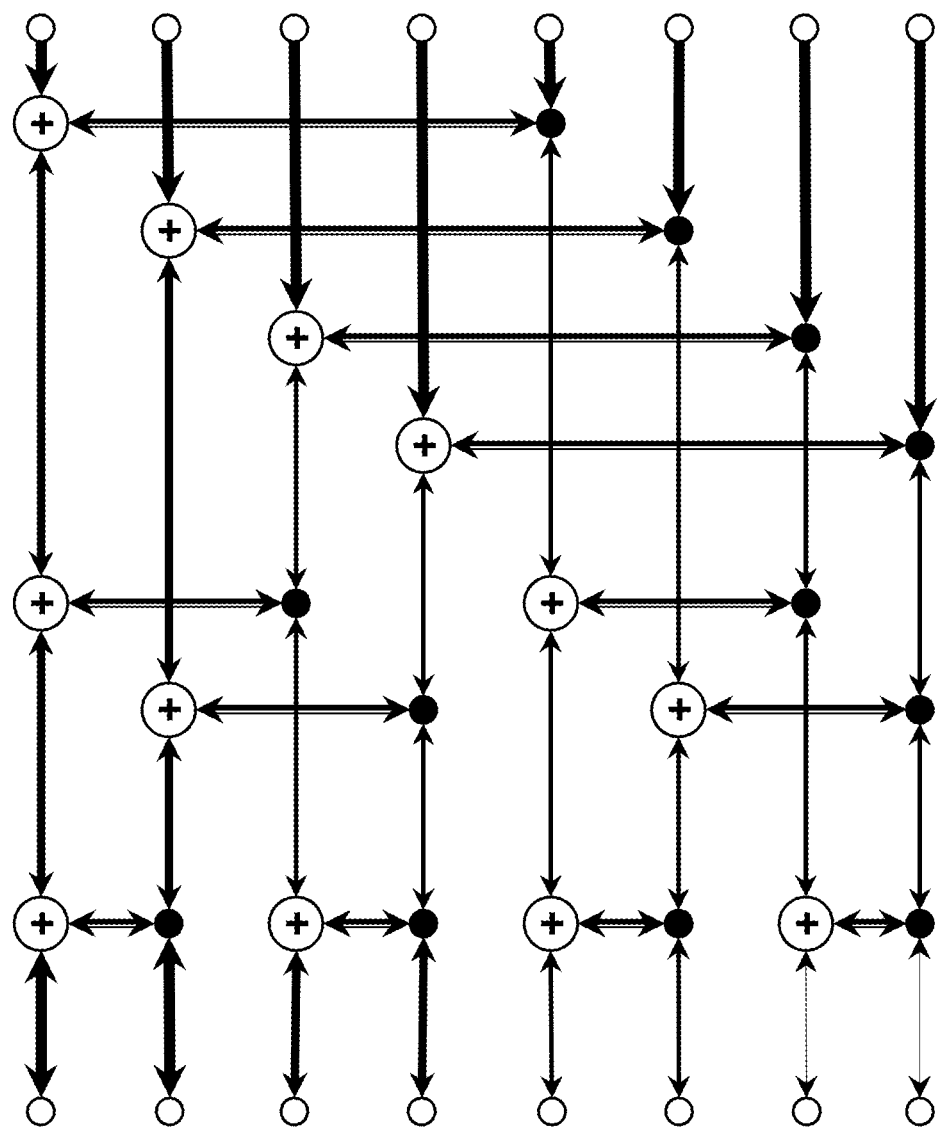
Figure 605B:
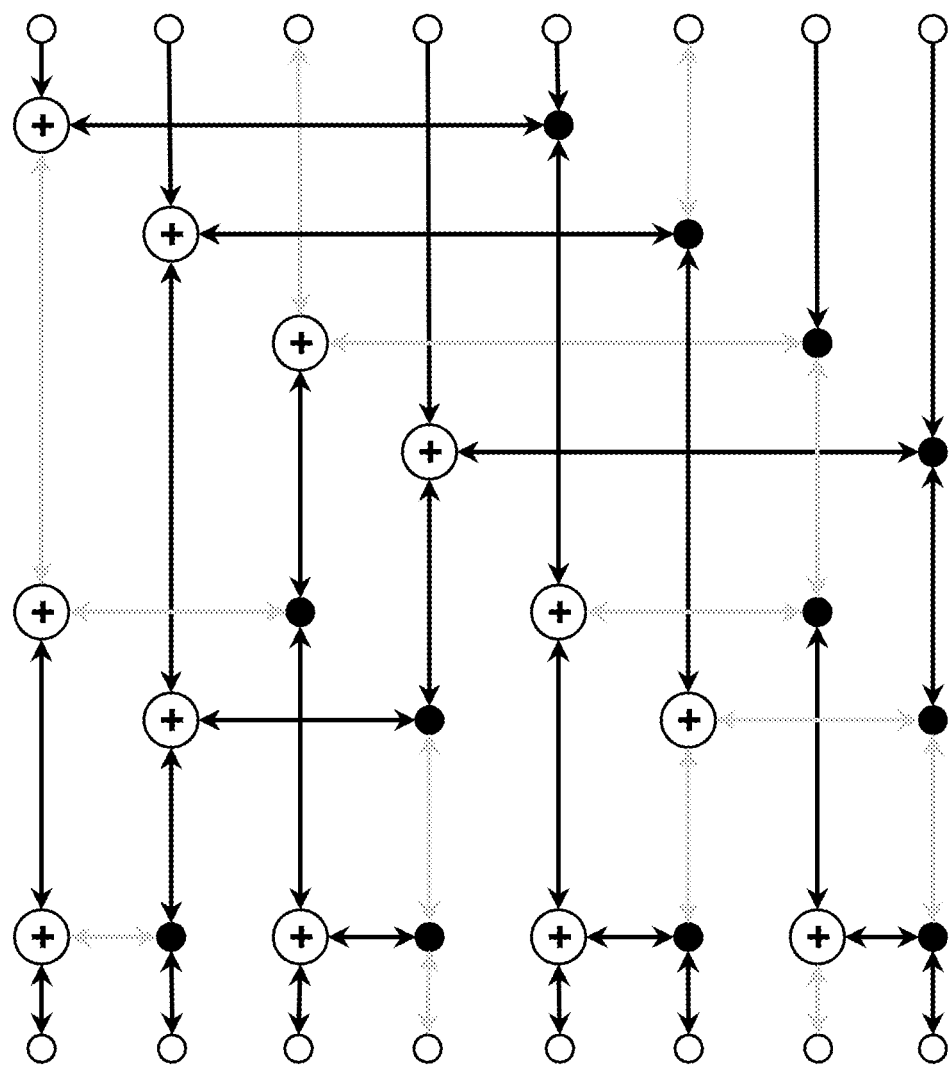

FIGS. 605A-B illustrate factor graph representations according to an exemplary aspect of the present disclosure.

Figure 606:
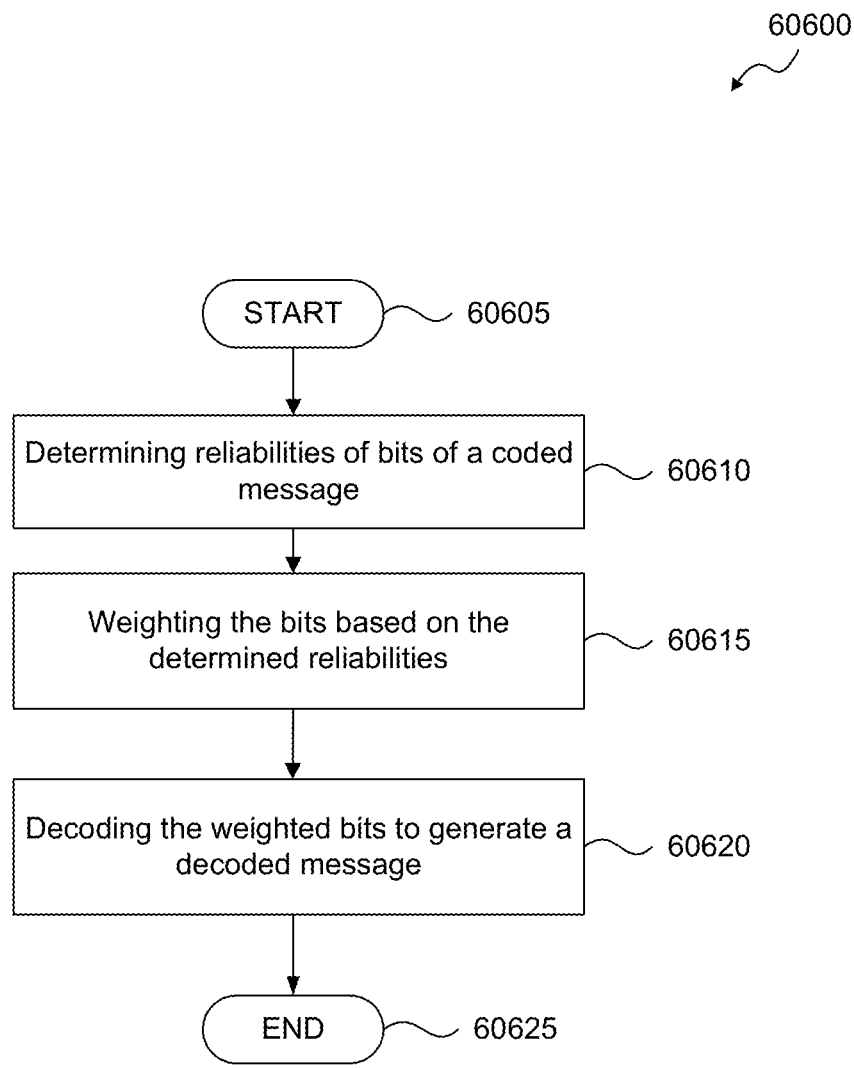

FIG. 606 illustrates flowchart of a decoding method according to an exemplary aspect of the present disclosure.

Figure 701A:
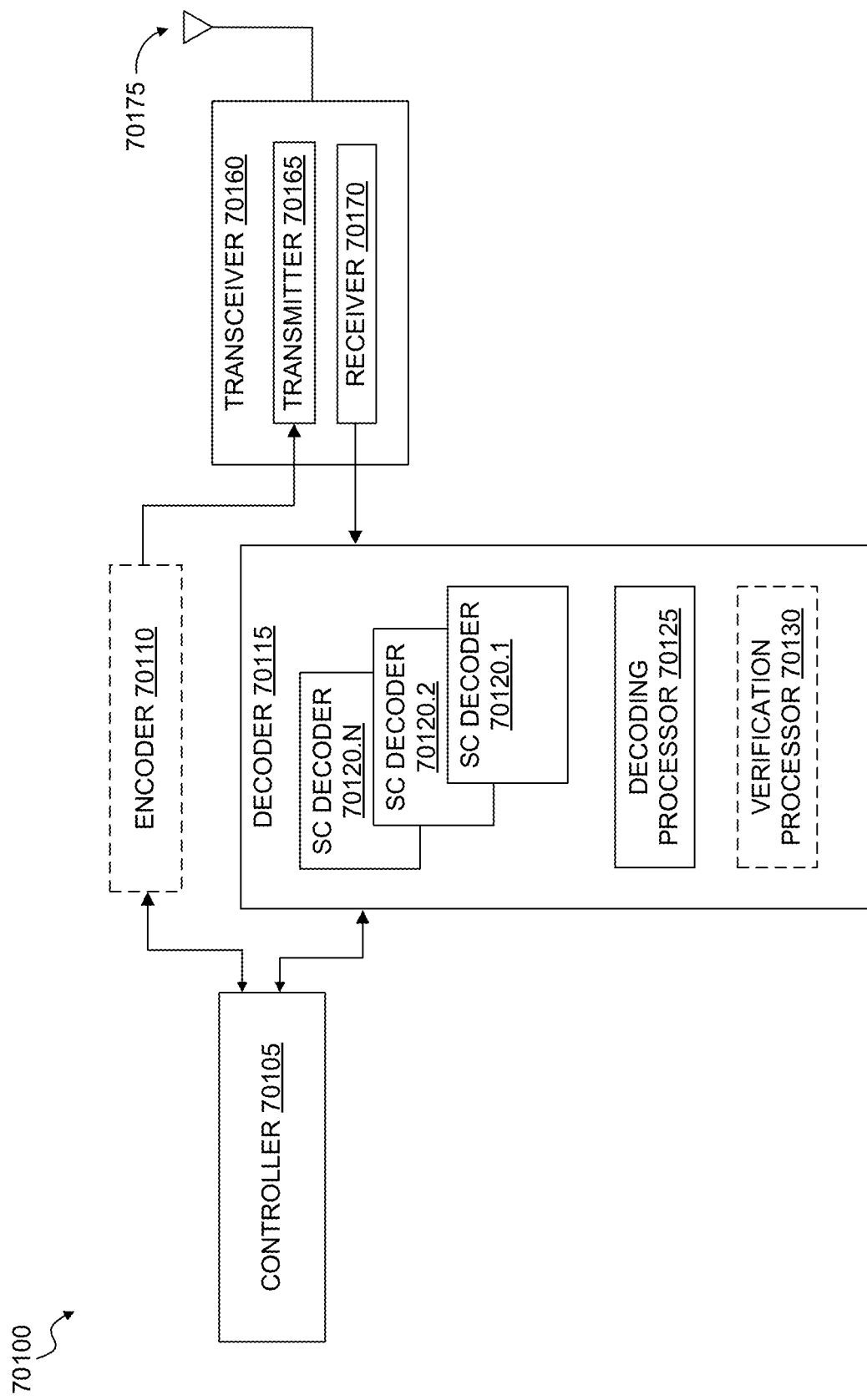
Figure 701B:
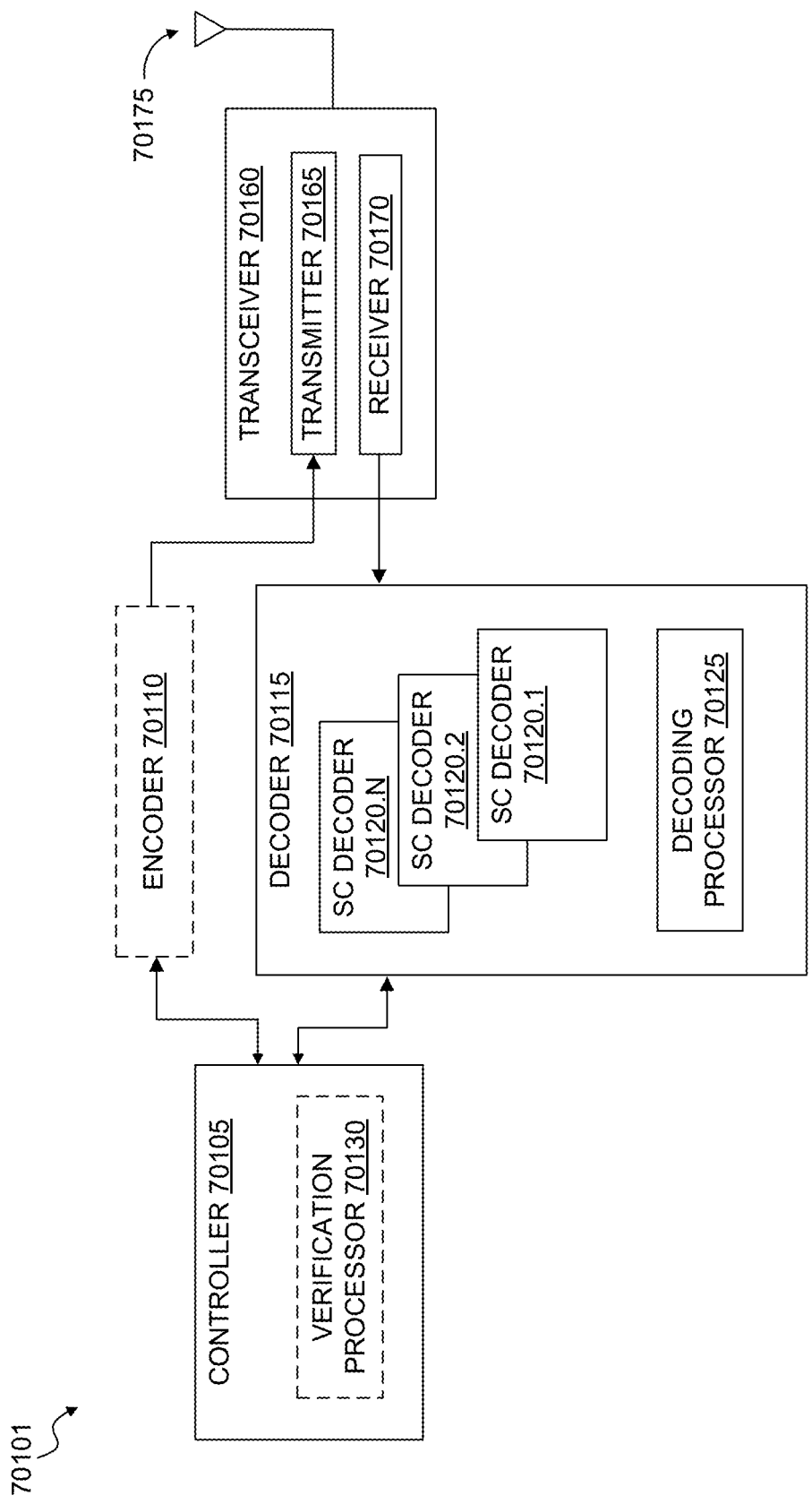
Figure 701C:
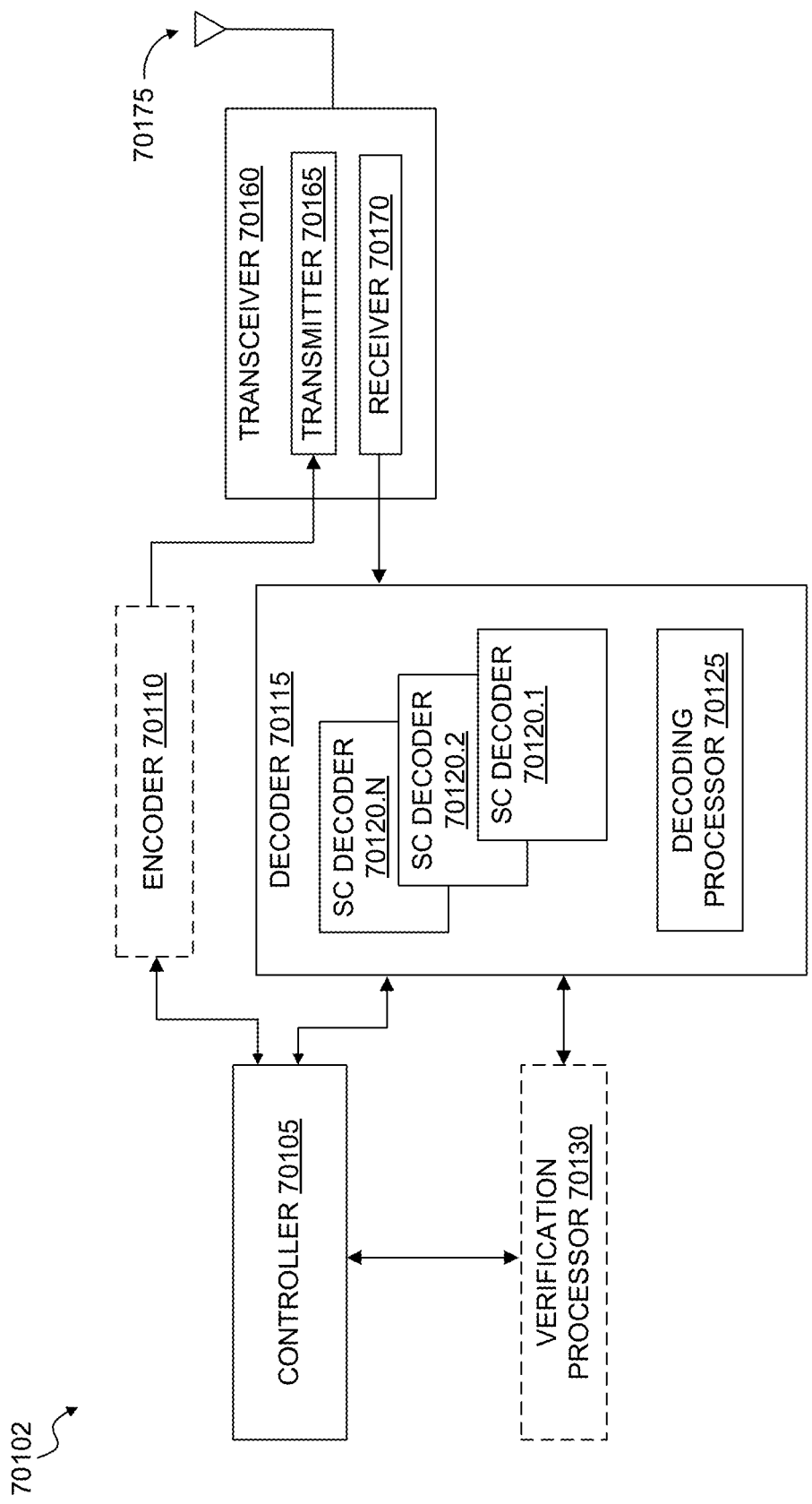

FIGS. 701A-C illustrate decoder systems according to exemplary aspects of the present disclosure.

Figure 702:
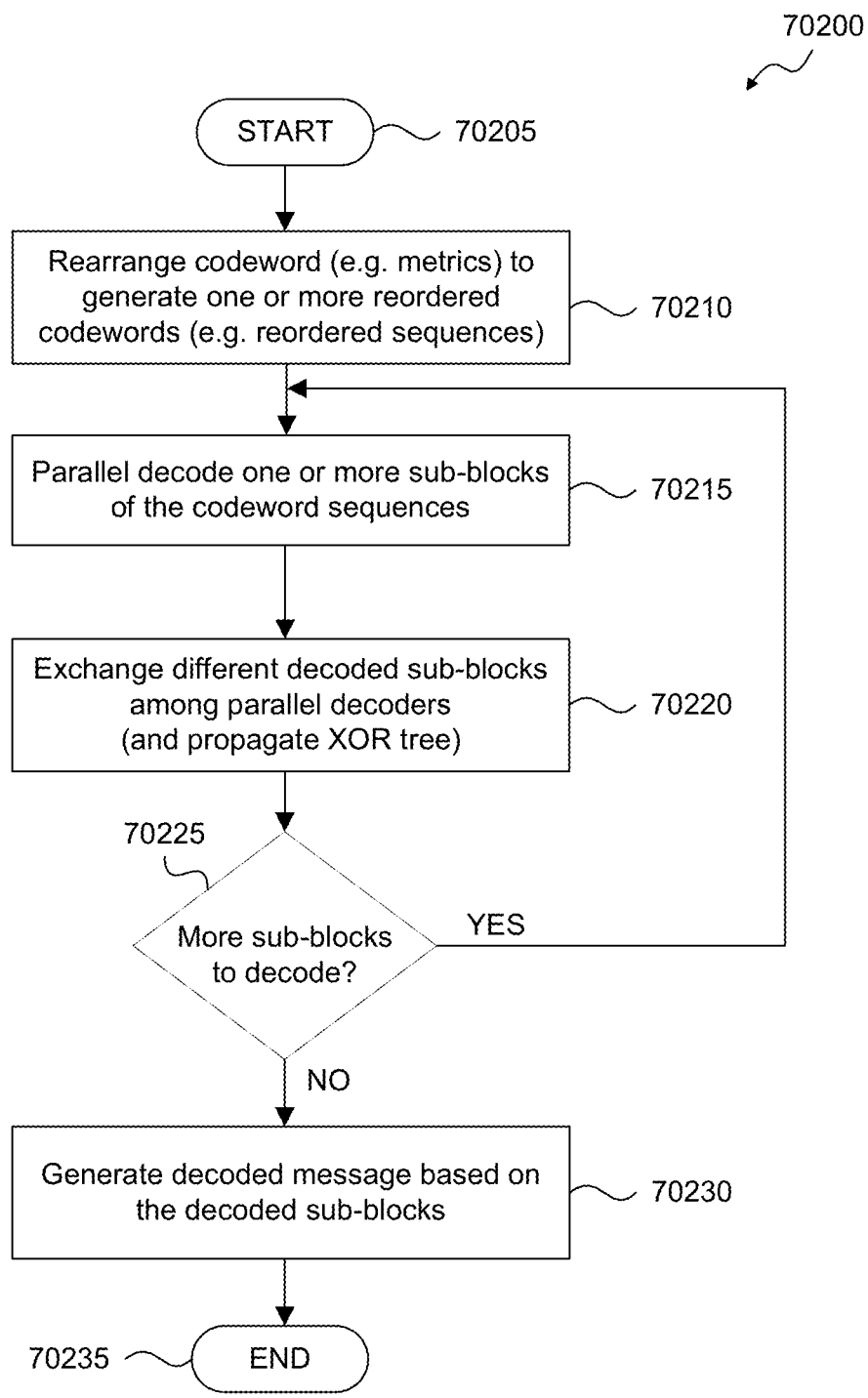

FIG. 702 illustrates a flowchart of a decoding method according to an exemplary aspect of the present disclosure.

Figure 801A:
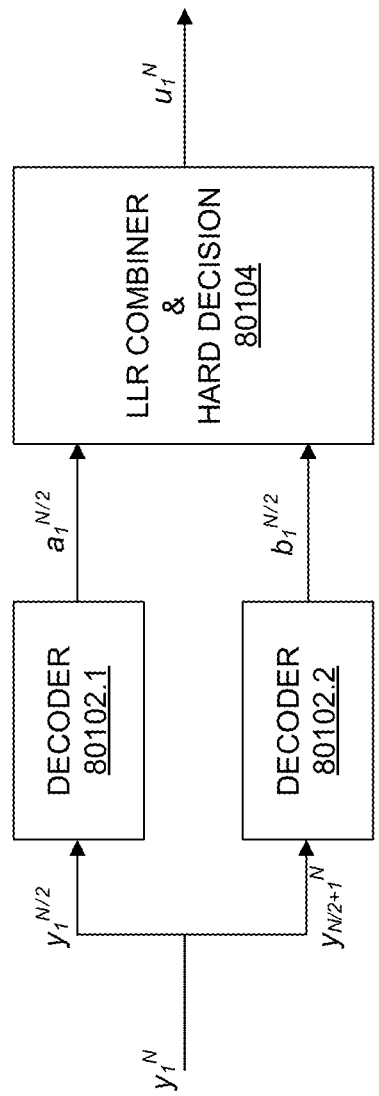
Figure 801B:
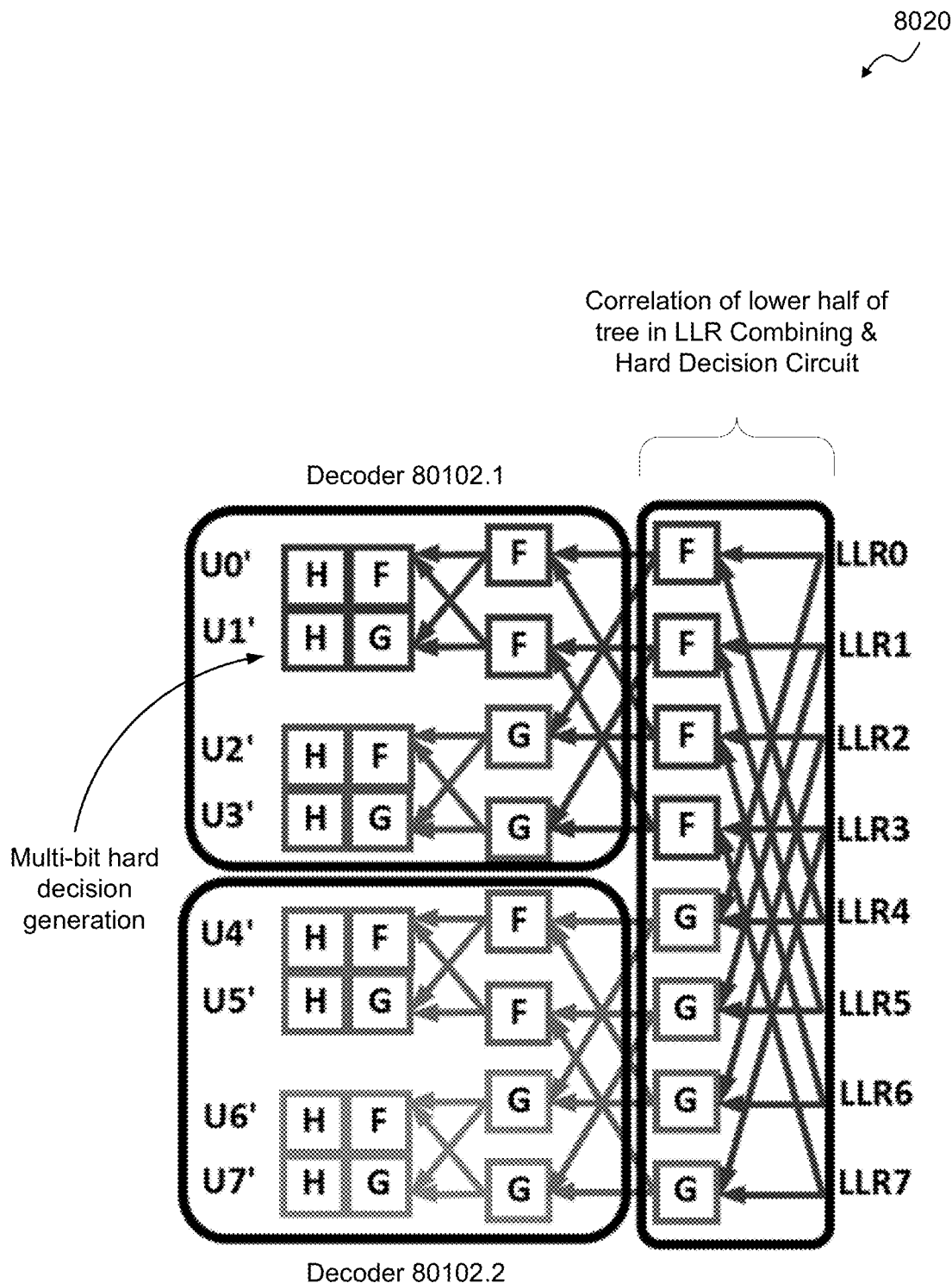

FIGS. 801A-B illustrates a decoder system according to an exemplary aspect of the present disclosure.

Figure 802:
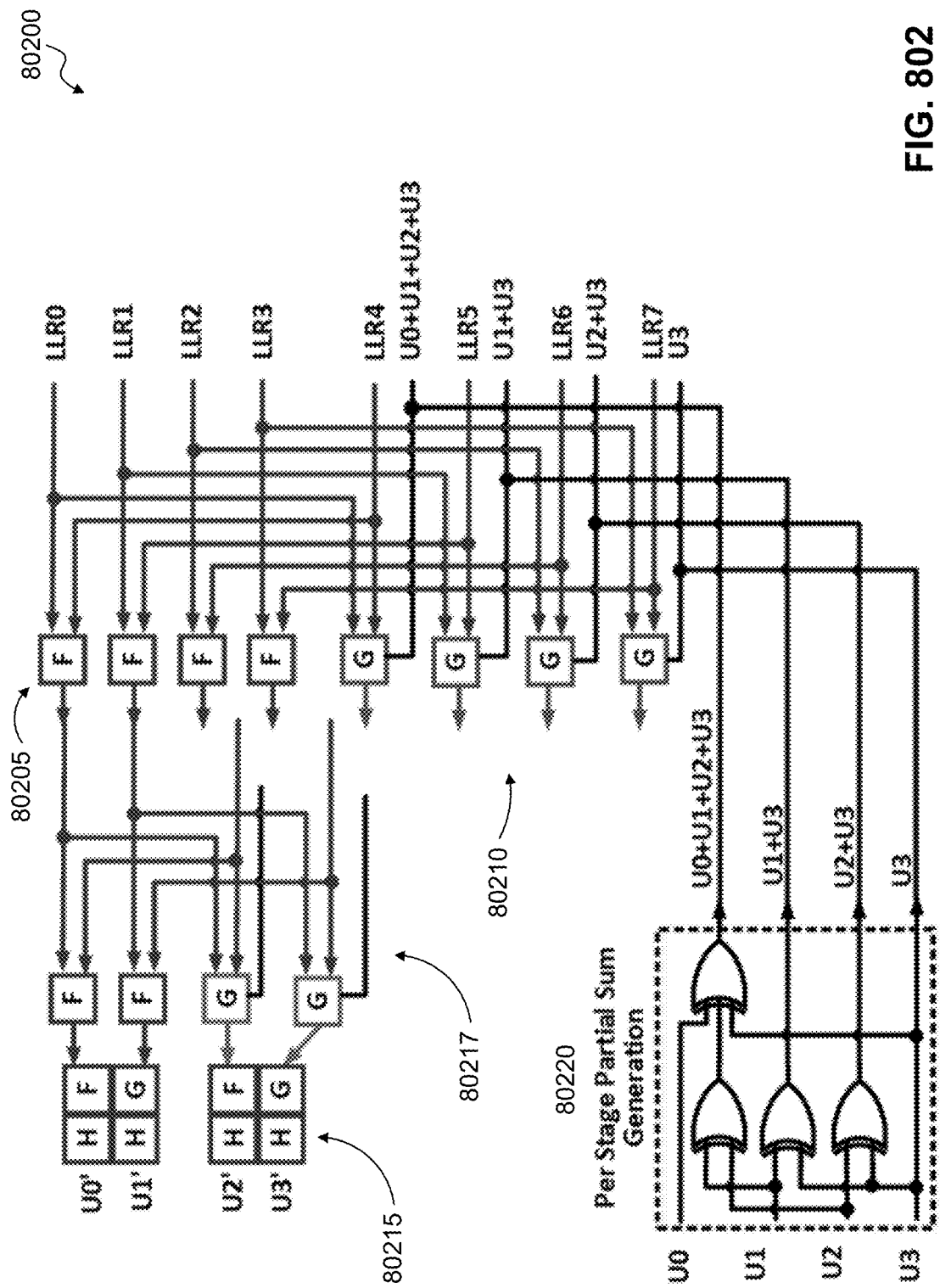

FIG. 802 illustrates a decoder according to an exemplary aspect of the present disclosure.

Figures 803A, 803B:
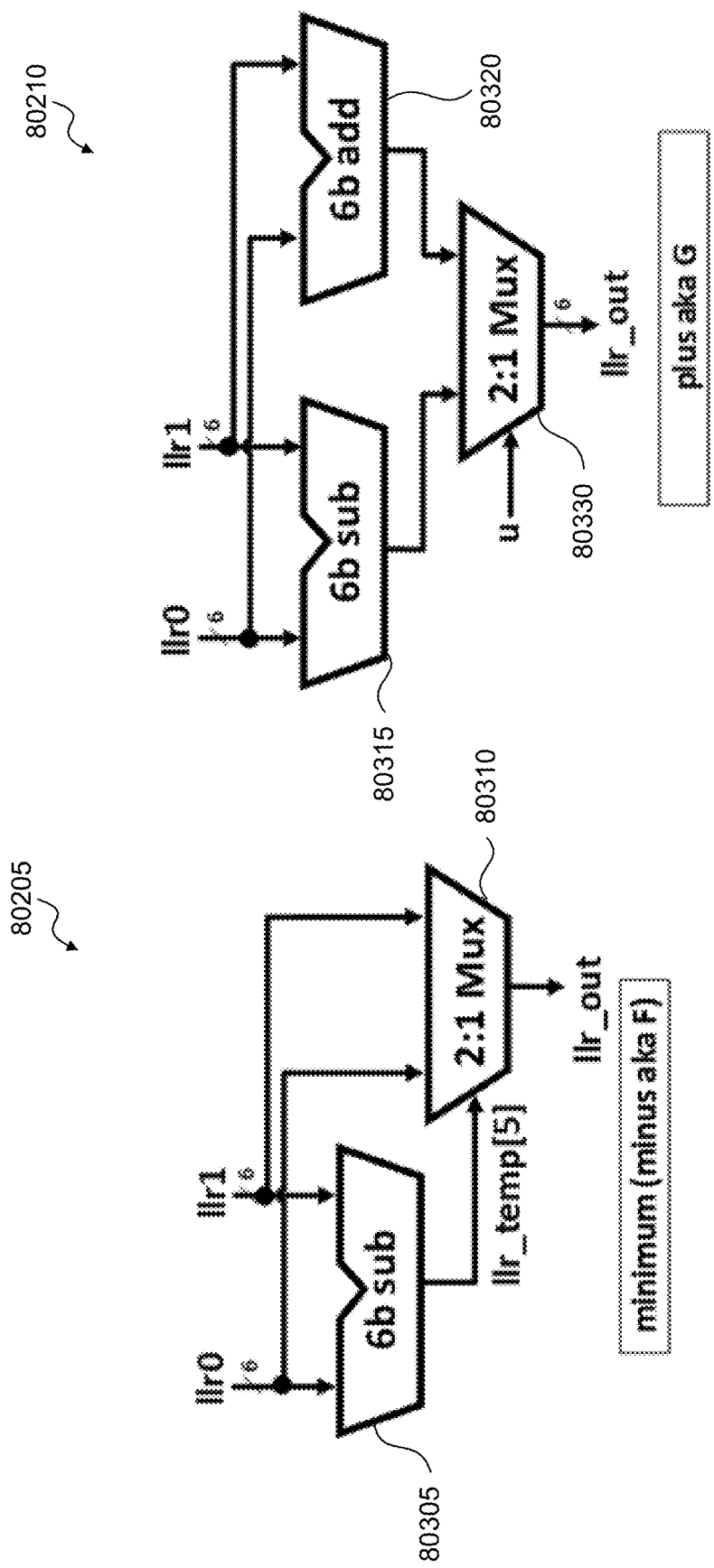

FIGS. 803A-B illustrate F and G circuits according to exemplary aspects of the present disclosure.

Figure 804A:
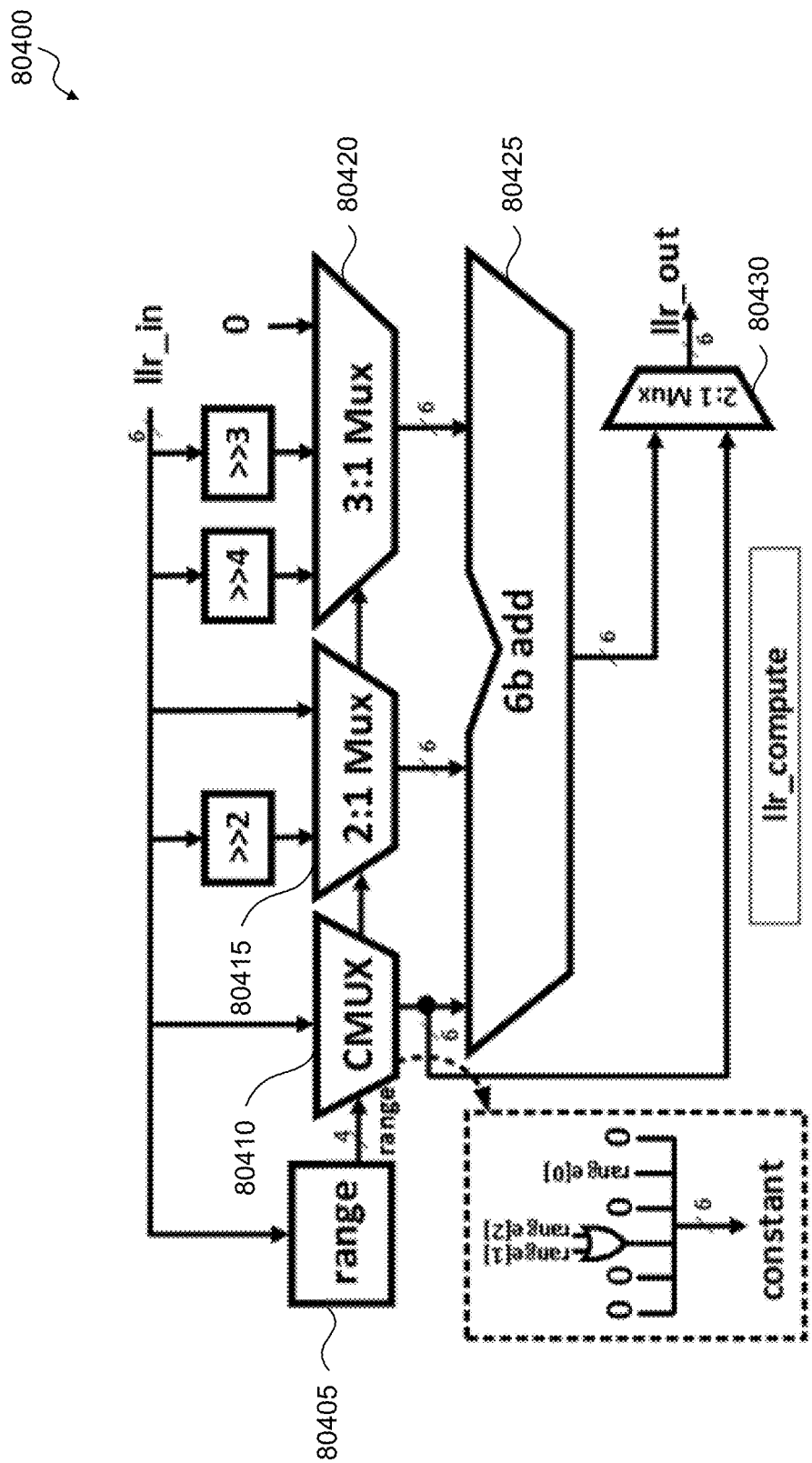
Figure 804B:
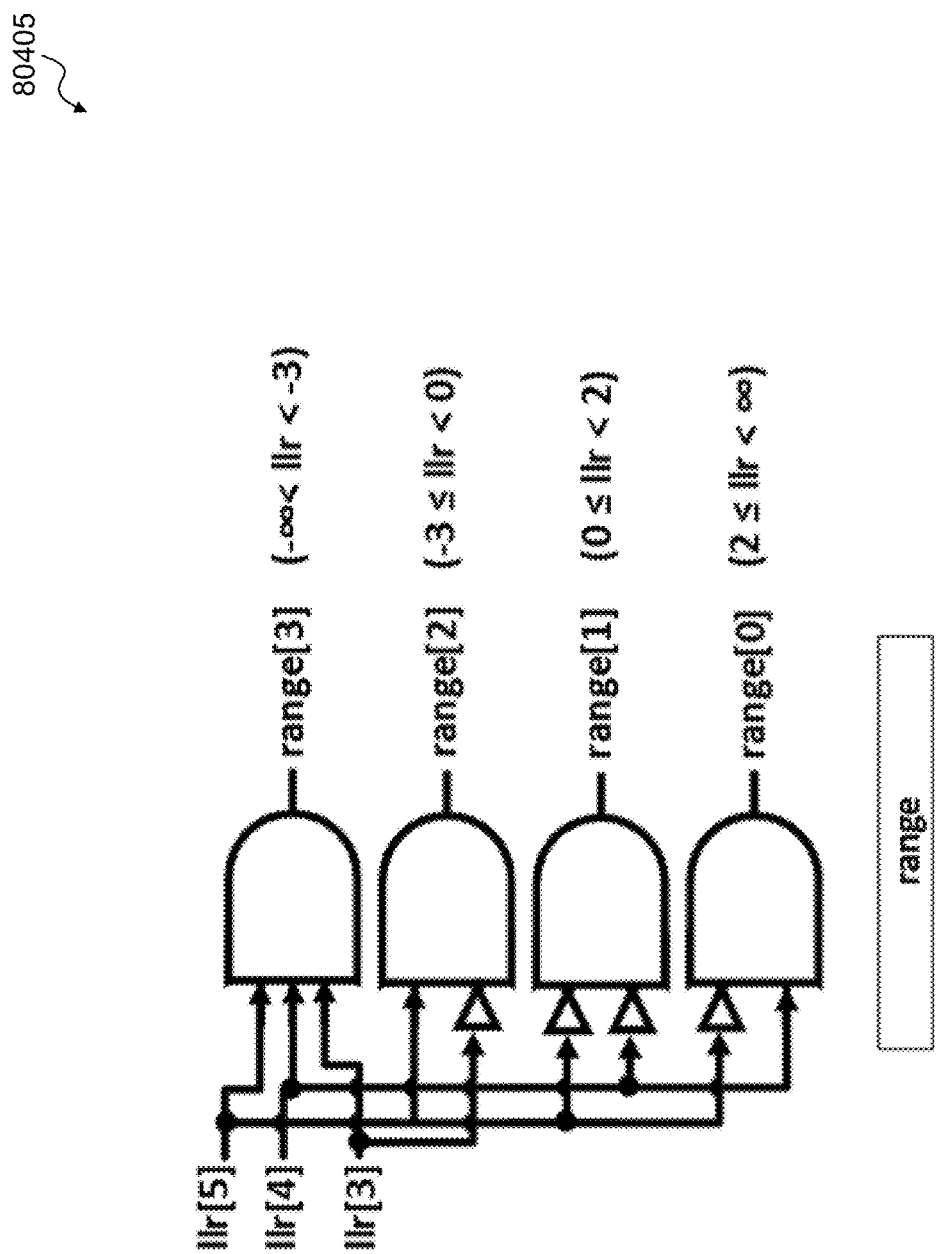

FIGS. 804A-B illustrate an LLR compute circuit according to an exemplary aspect of the present disclosure.

Figure 805:
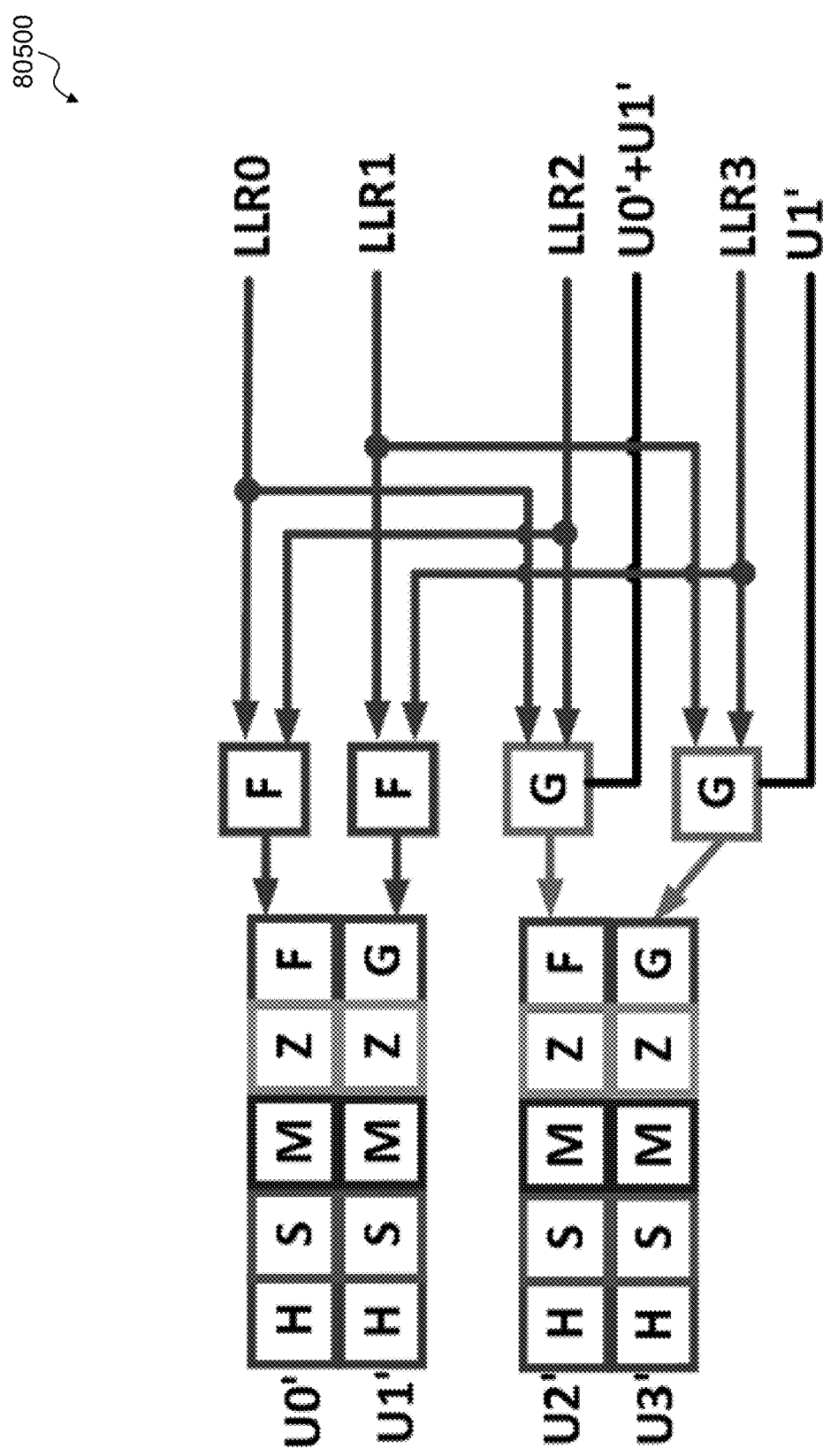

FIG. 805 illustrates a decoder according to an exemplary aspect of the present disclosure.

Figure 806:
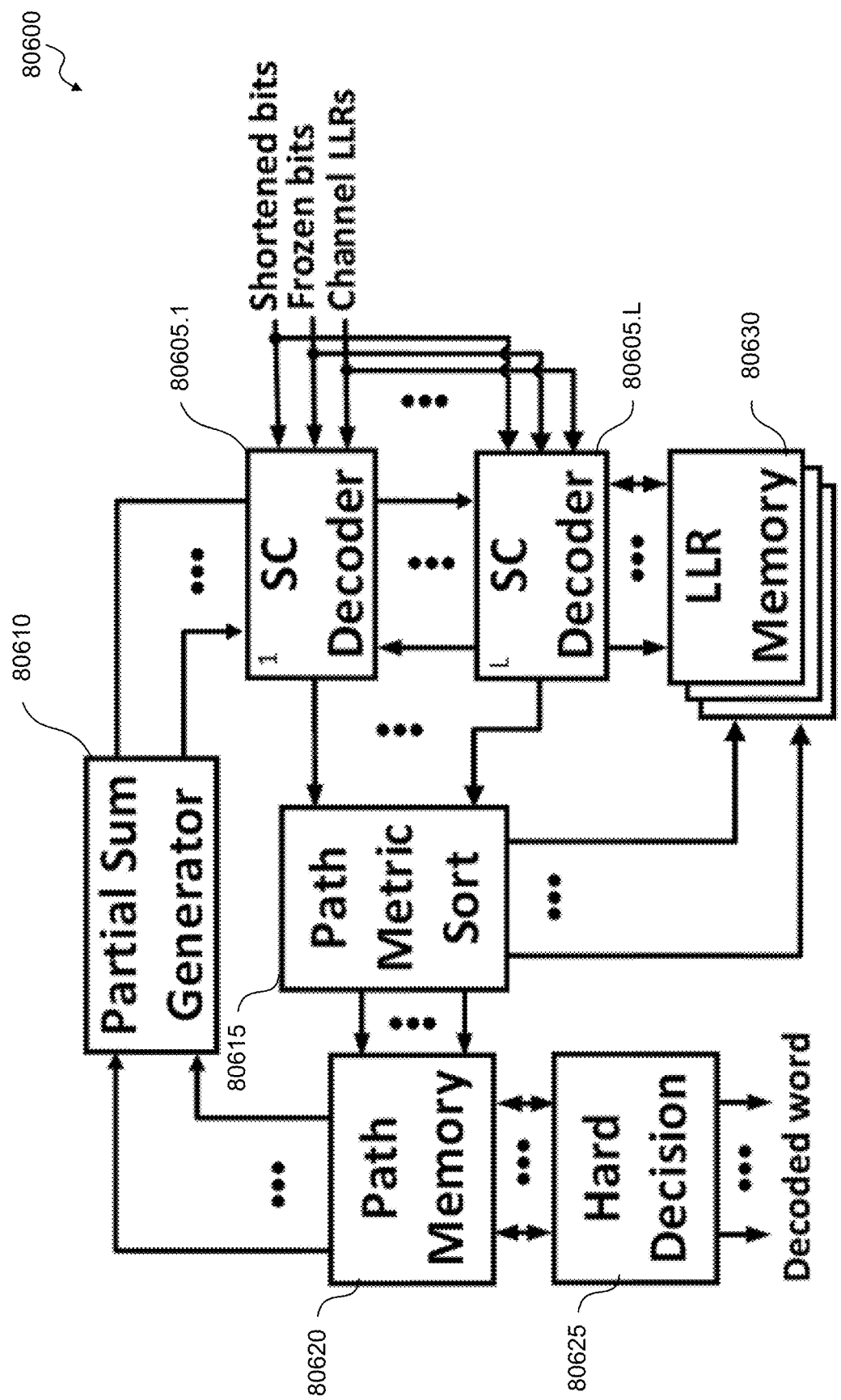

FIG. 806 illustrates a decoding system according to an exemplary aspect of the present disclosure.

Figure 807A:
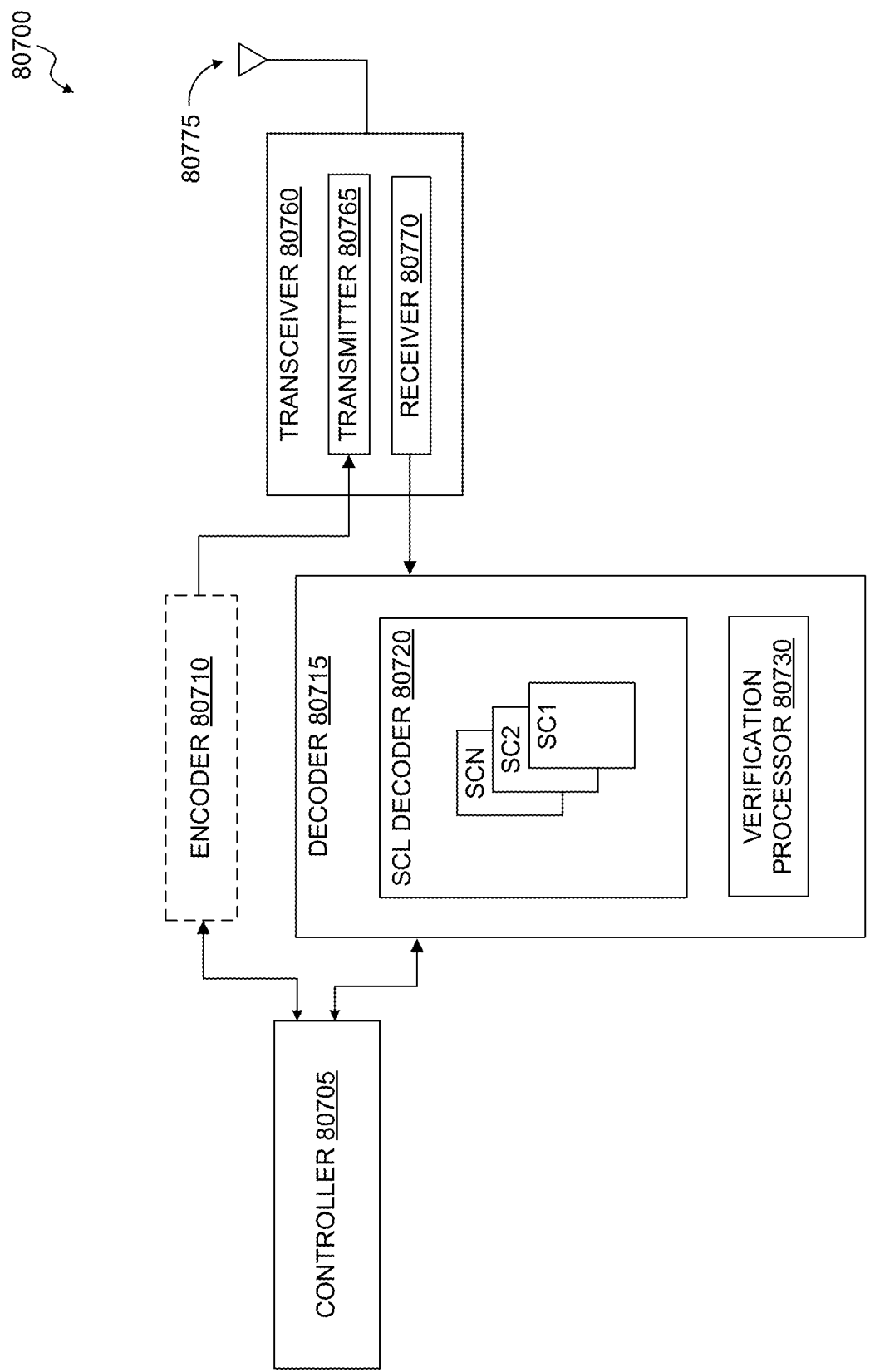
Figure 807B:
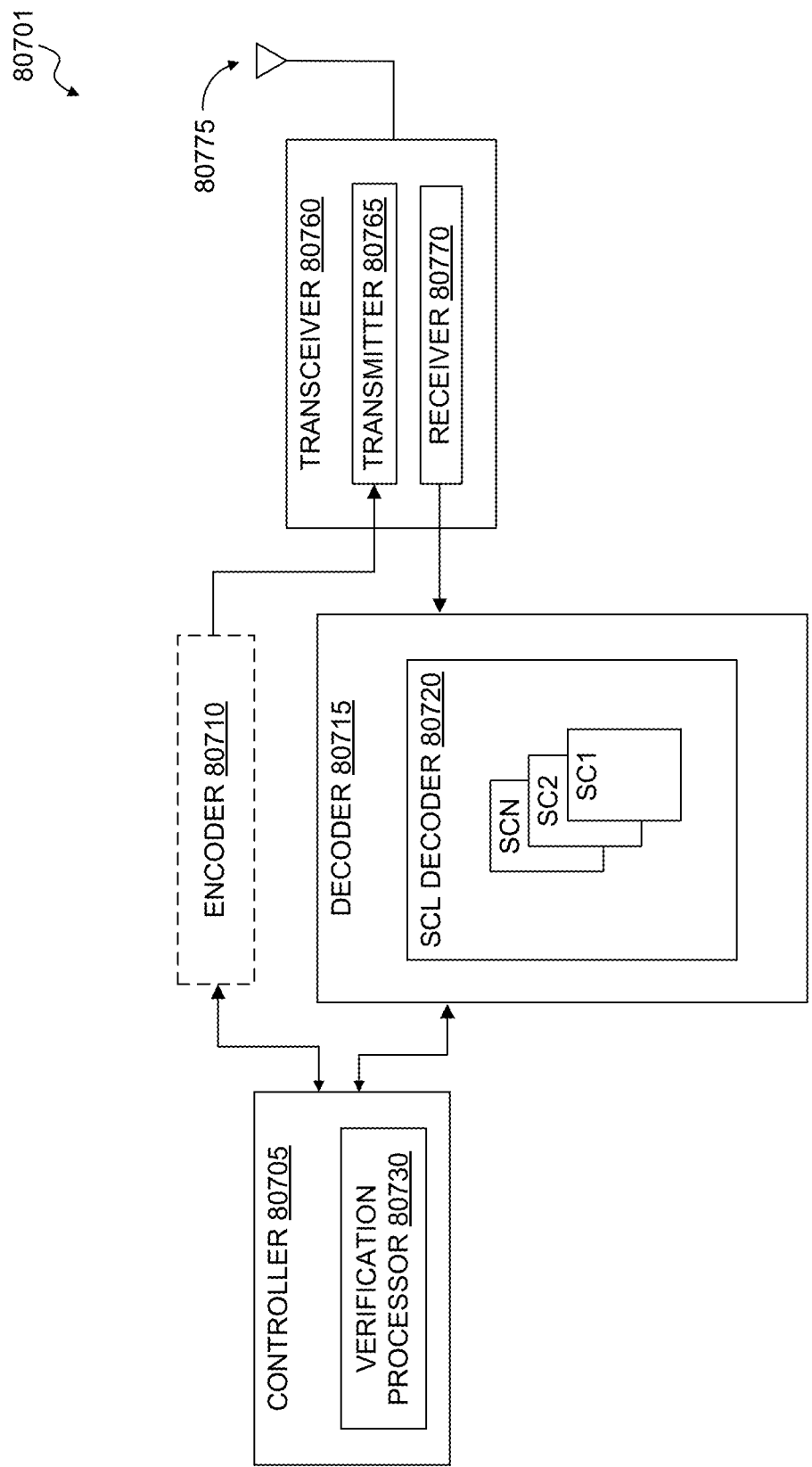
Figure 807C:
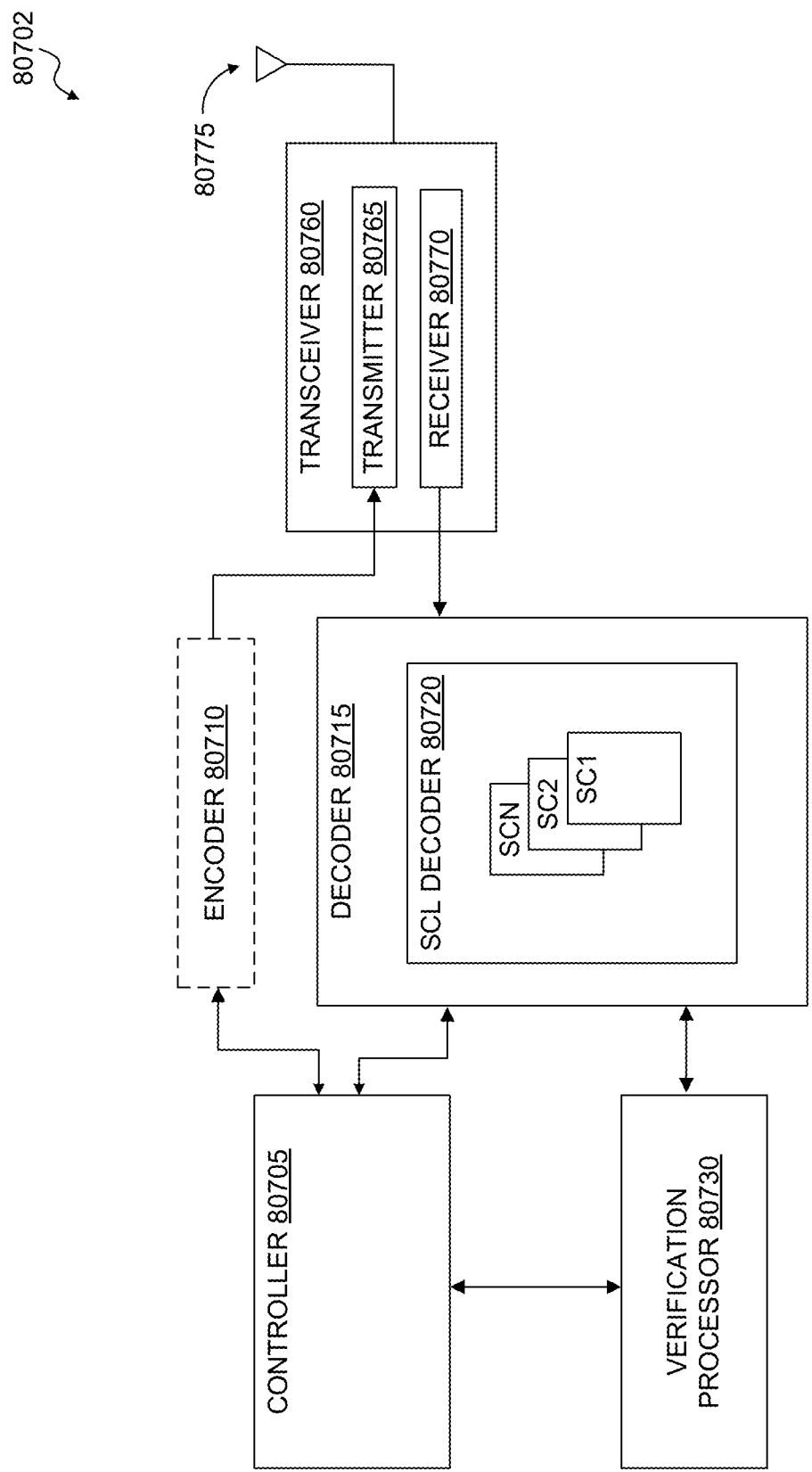

FIGS. 807A-C illustrates decoder systems according to exemplary aspects of the present disclosure.

Figure 808:
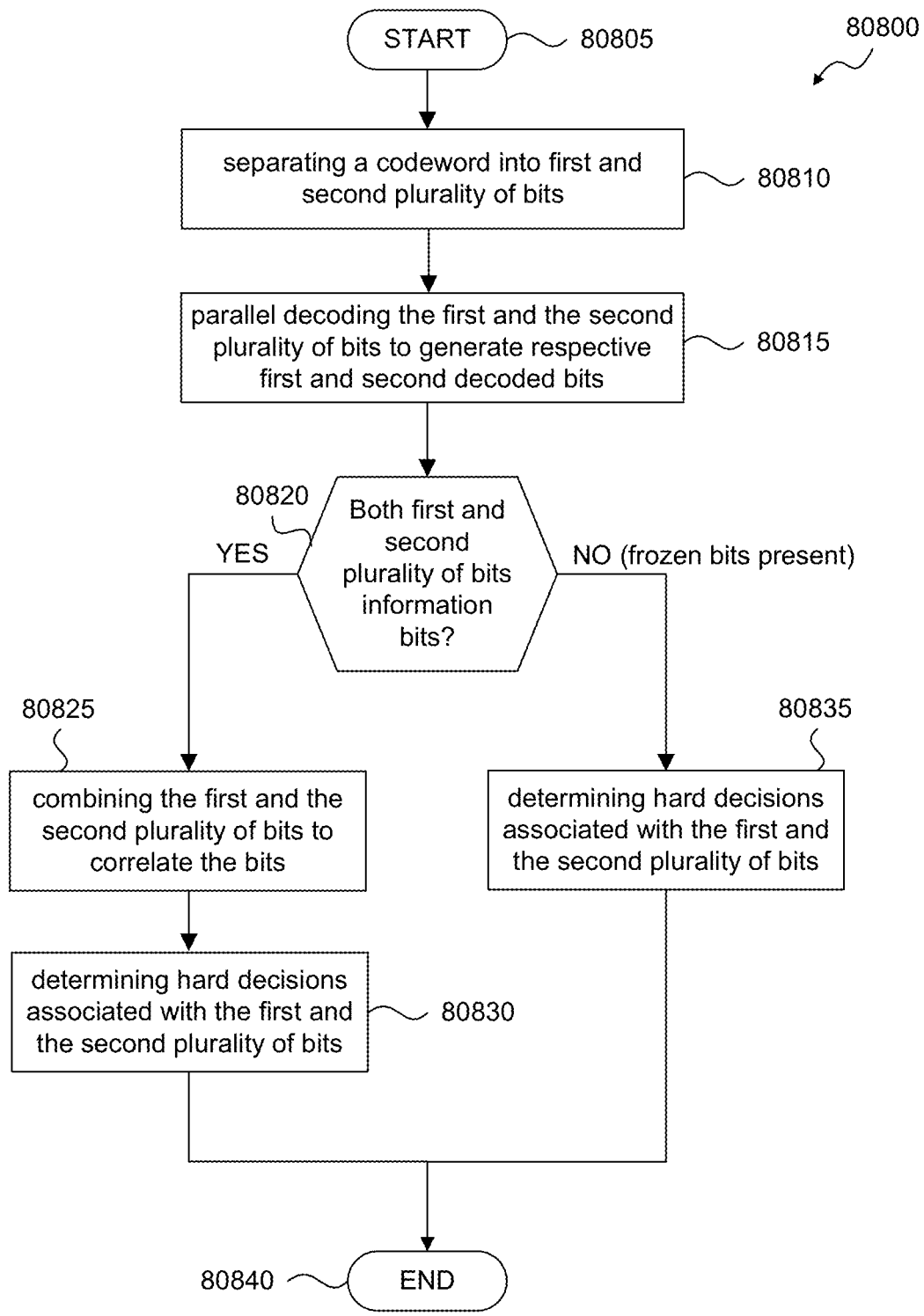

FIG. 808 illustrates a flowchart of a decoding method according to an exemplary aspect of the present disclosure.

Figure 809:
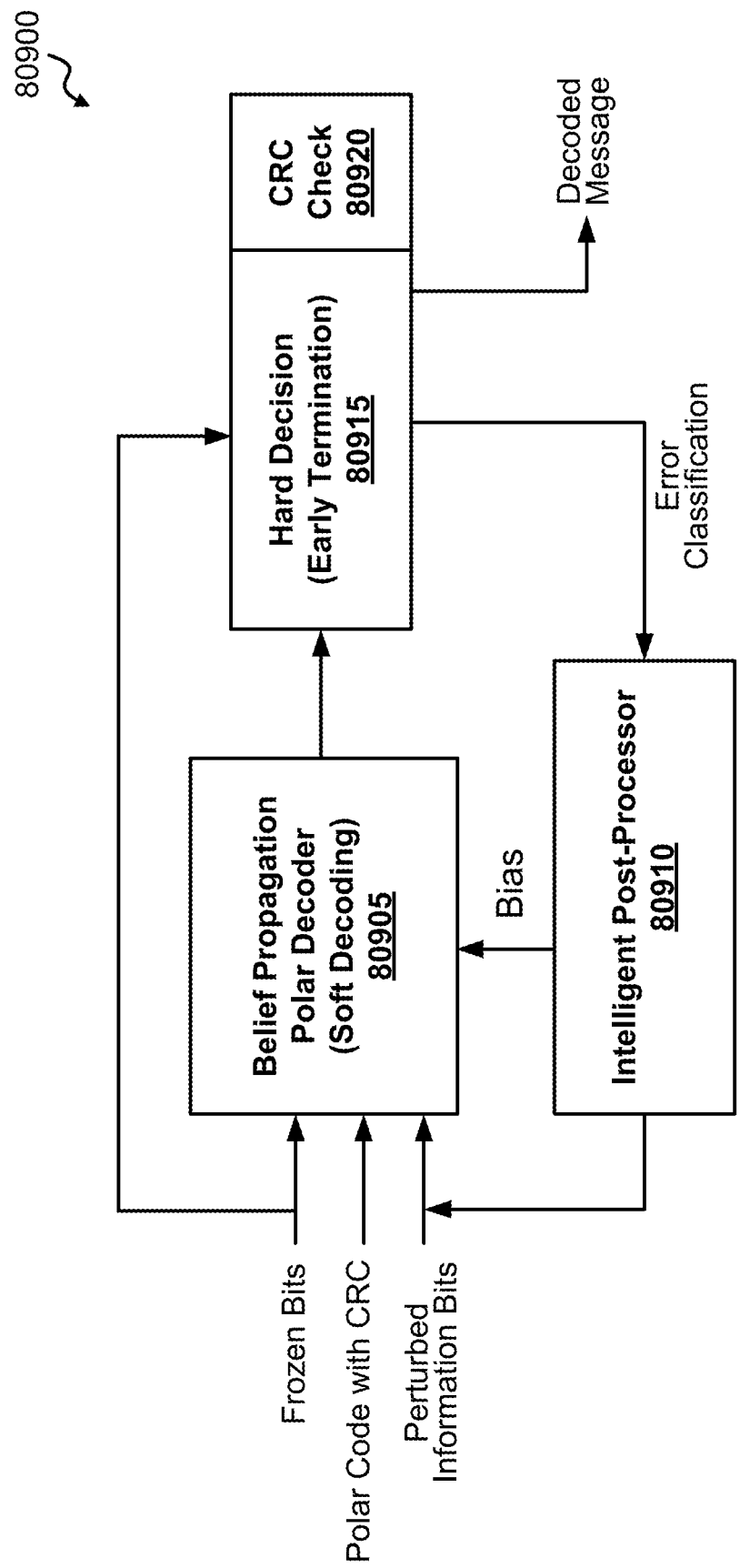

FIG. 809 illustrates a decoding system according to an exemplary aspect of the present disclosure.

Figure 810:
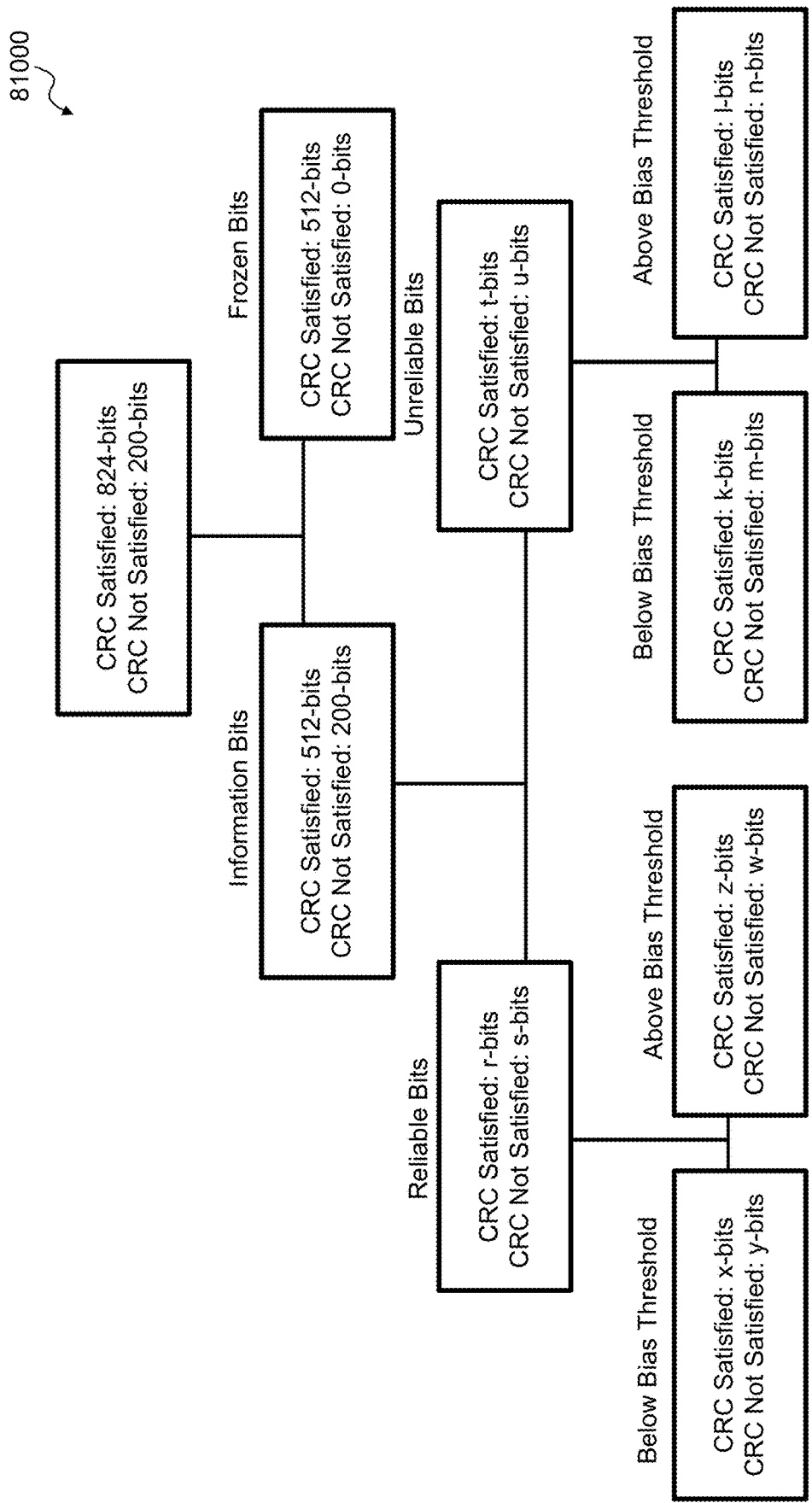

FIG. 810 illustrates a decision tree according to an exemplary aspect of the present disclosure.

Figure 811:
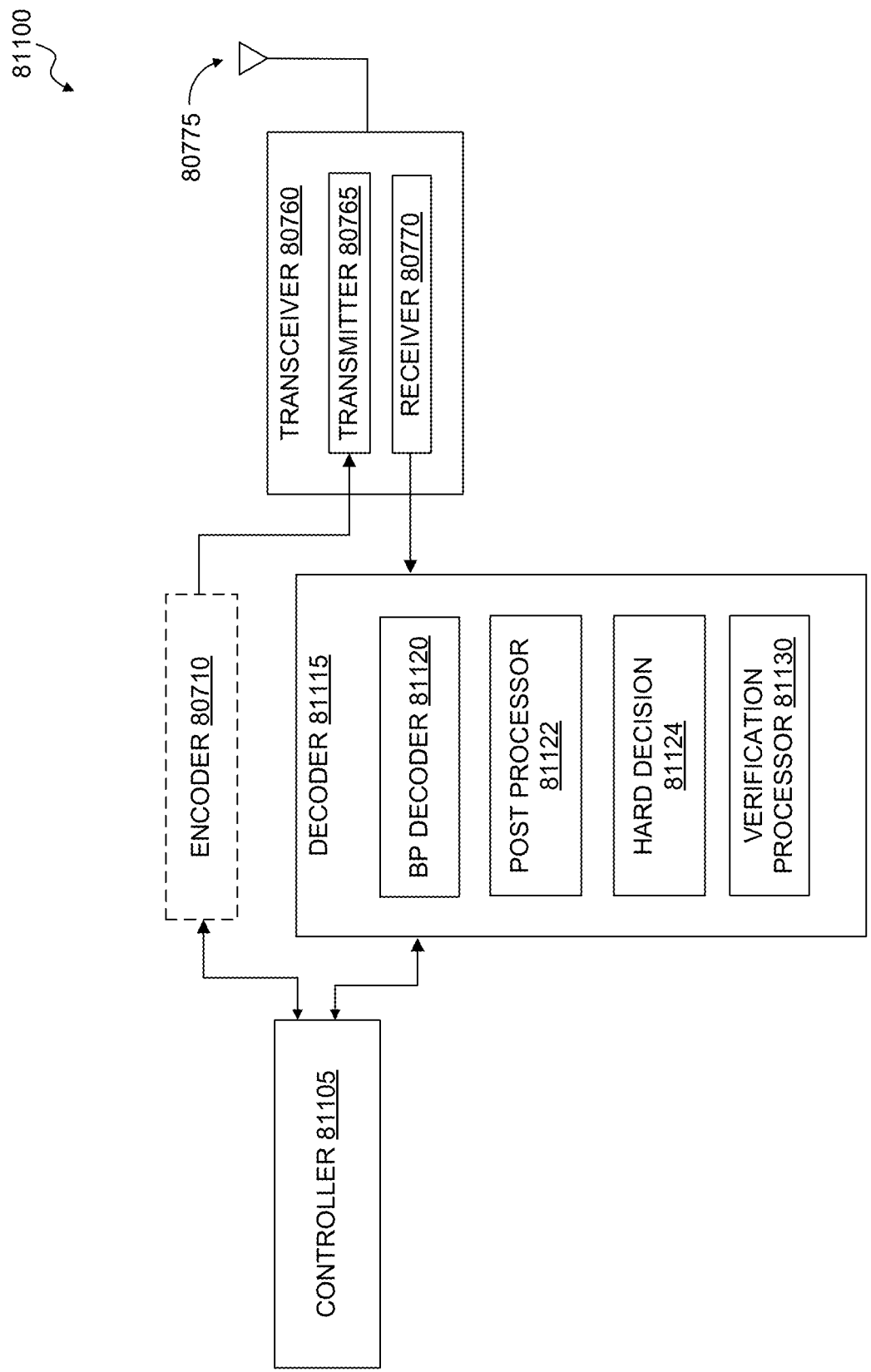

FIG. 811 illustrates a decoding system according to an exemplary aspect of the present disclosure.

Figure 812:
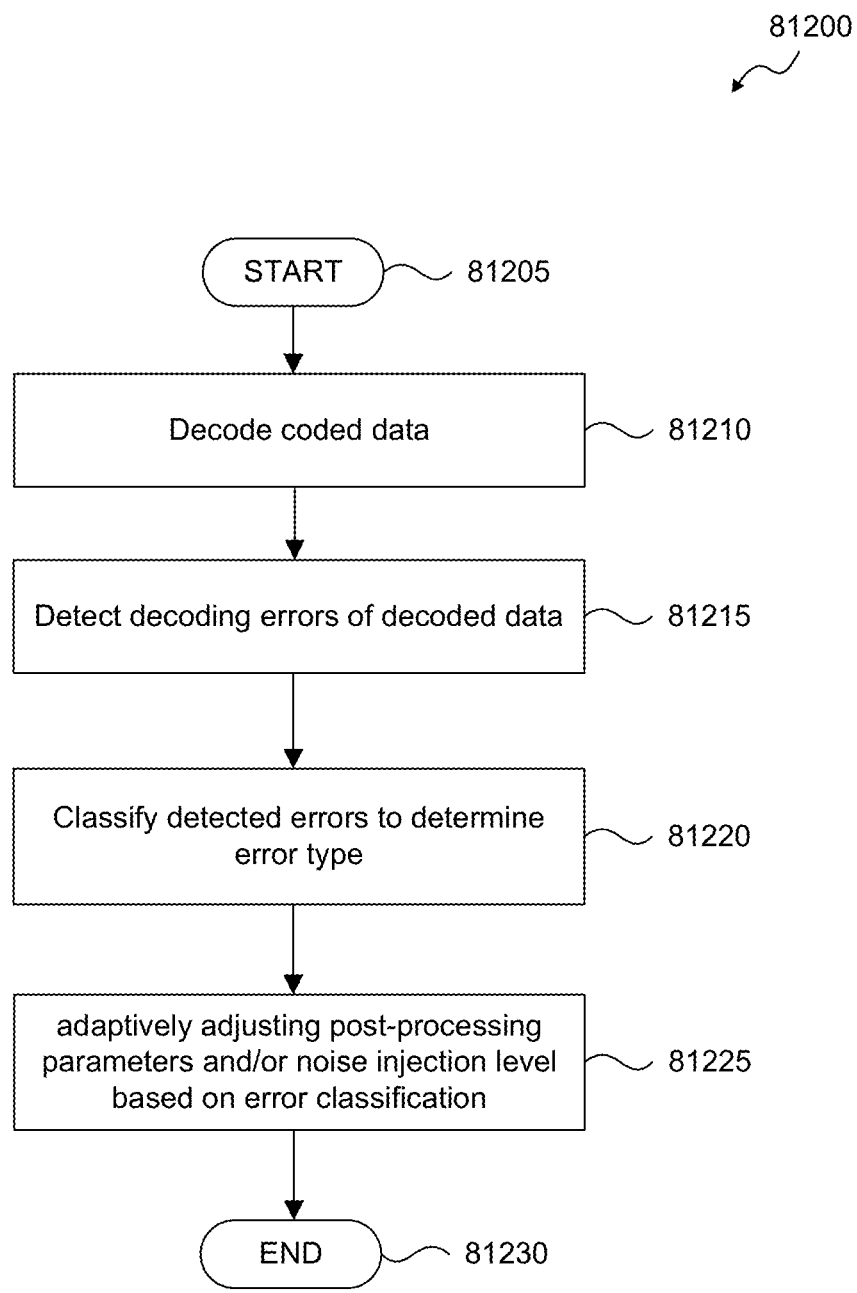

FIG. 812 illustrates a flowchart of a decoding method according to an exemplary aspect of the present disclosure.

FIGS. 901-904 illustrate example coding operations and methodologies applicable to exemplary aspects of the present disclosure.

The exemplary embodiments of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the aspects of the present disclosure. However, it will be apparent to those skilled in the art, that the aspects, including structures, systems, and methods, may be practiced without some of these specific details, or aspects might be combined, or practiced on a higher abstractional level. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

As an overview, information sent over network segments, links or channels from a sender (or transceiver) to a receiver (or transceiver), such as control information or user/service/application data, is susceptible to errors may occur during the travel over such segments, links, or channels, or at the sender, receiver or transceiver side. Causes of errors include, for example, noise, interference, attenuation, and/or by the processing of information at the sender or receiver side.

There can be multiple senders, receivers or transceivers in a communication of information over multiple network segments, links, or channels, including active and passive network components, routers, switches, repeaters, or remote radio heads. Information or parts of information can also travel over different network segments, links or channels at different times, or in the case of aggregation, be split and combined at different network nodes, or in case of redundancy considerations, travel on different routes through the network in at least partially overlapping time, or a combination thereof. Appropriate encoding and decoding of information at sender, receiver or transceiver side can make a significant difference in terms of reducing or correcting errors in a communication and improving throughput. Polar encoding and decoding techniques are an applicable for error reduction and correction, and especially the systems and methods of the exemplary aspects disclosed herein.

Characteristics include the processing complexity, power-efficiency, latency, and closeness to the theoretical Shannon limit of encoding and decoding. Although exemplary aspects are described with respect to polar encoding and decoding, the exemplary aspects are applicable to other encoding and decoding methodologies and techniques as would be understood by one of ordinary skill in the art.

Figure 901:
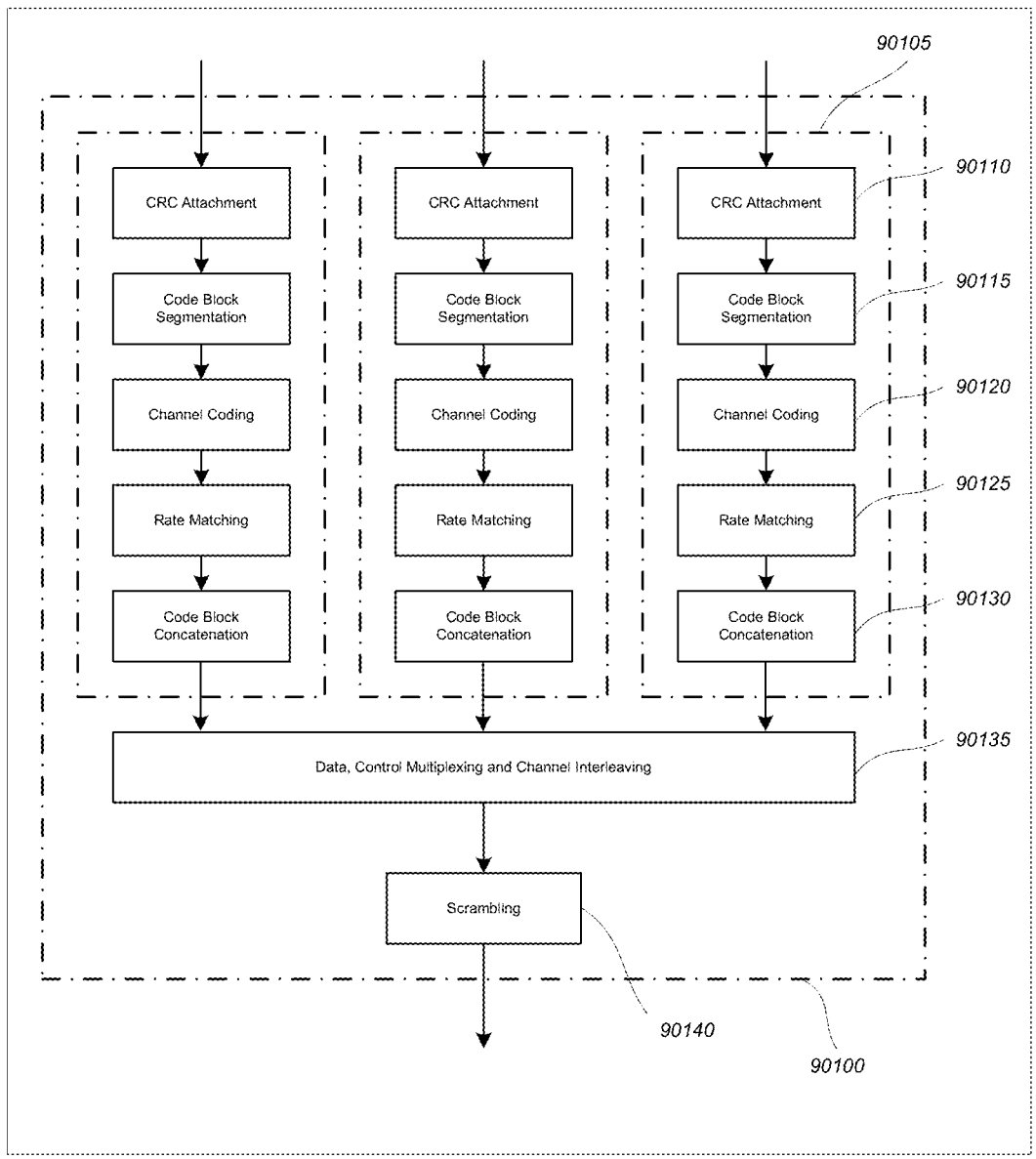

FIG. 901 illustrates an example of coding 90100 that may be used in some aspects. Coding may include one or more physical coding processes 90105 that may be used to provide coding for a physical channel that may encode data or control information. Coding 90100 may also include multiplexing and interleaving 90135 that generates combined coded information by combining information from one or more sources, which may include one of more of data information and control information, and which may have been encoded by one or more physical coding processes 90105. Combined coded information may be input to scrambler 90140 which may generate scrambled coded information.

Physical coding process 90105 may include one or more of CRC attachment 90110, code block segmentation 90115, channel coding 90120, rate matching 90125 and code block concatenation 90130.

CRC attachment block 90110 may calculate parity bits denoted:

$$\{p_0, p_1, \ldots, p_{L-1}\}$$

from input bits denoted:

$$\{a_0, a_1, \ldots, a_{A-1}\}$$

to generate a sequence of output bits:

$$\{b_0, b_1, \ldots, b_{A+L-1}\}$$

such that the polynomial over the finite field GF(2) in the variable D using the output sequence bits as coefficients:

$$b_0 D^{A+L-1} + b_1 D^{A+L-2} + \ldots + b_{A+L-2} D^1 + b_{A+L-1}$$

has a predetermined remainder when divided by a predetermined generator polynomial g(D) of order L. In an example aspect, the predetermined remainder may be zero, L may be 24 and the predetermined polynomial g(D) may be:

$$D^{24} + D^{23} + D^{18} + D^{17} + D^{14} + D^{11} + D^{10} + D^7 + D^6 + D^5 + D^4 + D^3 + D + 1$$

In some aspects, code block segmentation process 90115 may generate one or more segmented code blocks, each containing a portion of the data input to code segmentation process 90115. Code block segmentation process 90515 may have minimum and maximum block size constraints as parameters, determined according to a selected channel coding scheme. Code block segmentation process 90115 may add filler bits to one or more output segmented code blocks, in order to ensure that the minimum block size constraint is met. Code block segmentation process 90115 may divide data input to the process into blocks in order to ensure that the maximum block size constraint is met. In some aspects, code block segmentation process 90115 may append parity bits to each segmented code block. Such appending of parity bits may be determined based on one or more of the selected coding scheme and whether the number of segmented code blocks to be generated is greater than one.

In some aspects, channel coding process 90120 may generate code words from segmented code blocks according to one or more of a number of coding schemes. As an example, channel coding process 90120 may make use of one or more of convolutional coding, tail biting convolutional coding, parallel concatenated convolutional coding (PCCC), which may be referred to as turbo encoding, low density parity check (LDPC) coding, and polar coding.

Figure 902:
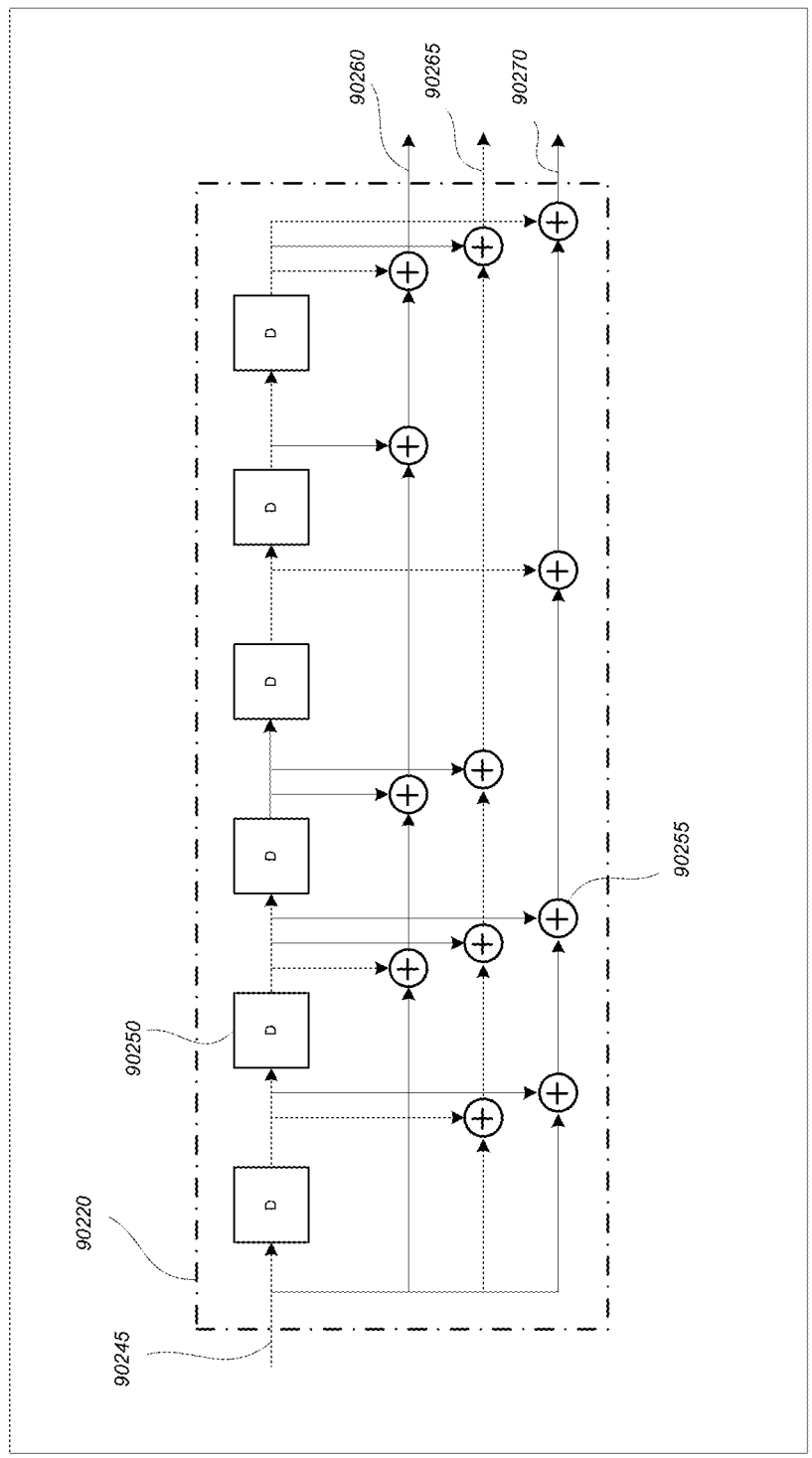

An encoder 90220 that may be used to encode data according to one of a convolutional code and a tail-biting convolutional code according to some aspects is illustrated in FIG. 902.

According to some aspects, input data 90245 may be successively delayed by each of two or more delay elements 90250, generating a data word consisting of elements that include the current input data and two or more copies of the current input data, each copy delayed respectively by a different number of time units. According to some aspects, encoder 90220 may generate one or more outputs 90260, 90265 and 90270, each generated by calculating a linear combination of the elements of a data word generated by combining input data 90245 and the outputs of two or more delay elements 90250.

According to some aspects, the input data may be binary data and the linear combination may be calculated using one or more exclusive or functions 90255. According to some aspects, encoder 90220 may be implemented using software running on a processor and delay elements 90250 may be implemented by storing input data 90245 in a memory.

According to some aspects, a convolutional code may be generated by using convolutional encoder 90220 and initializing delay elements 90250 to a predetermined value, which may be all zeros or any other suitable value. According to some aspects, a tail-biting convolutional code may be generated by using convolutional encoder 90220 and initializing delay elements 90250 to the last N bits of a block of data, where N is the number of delay elements 90250.

Figure 903:
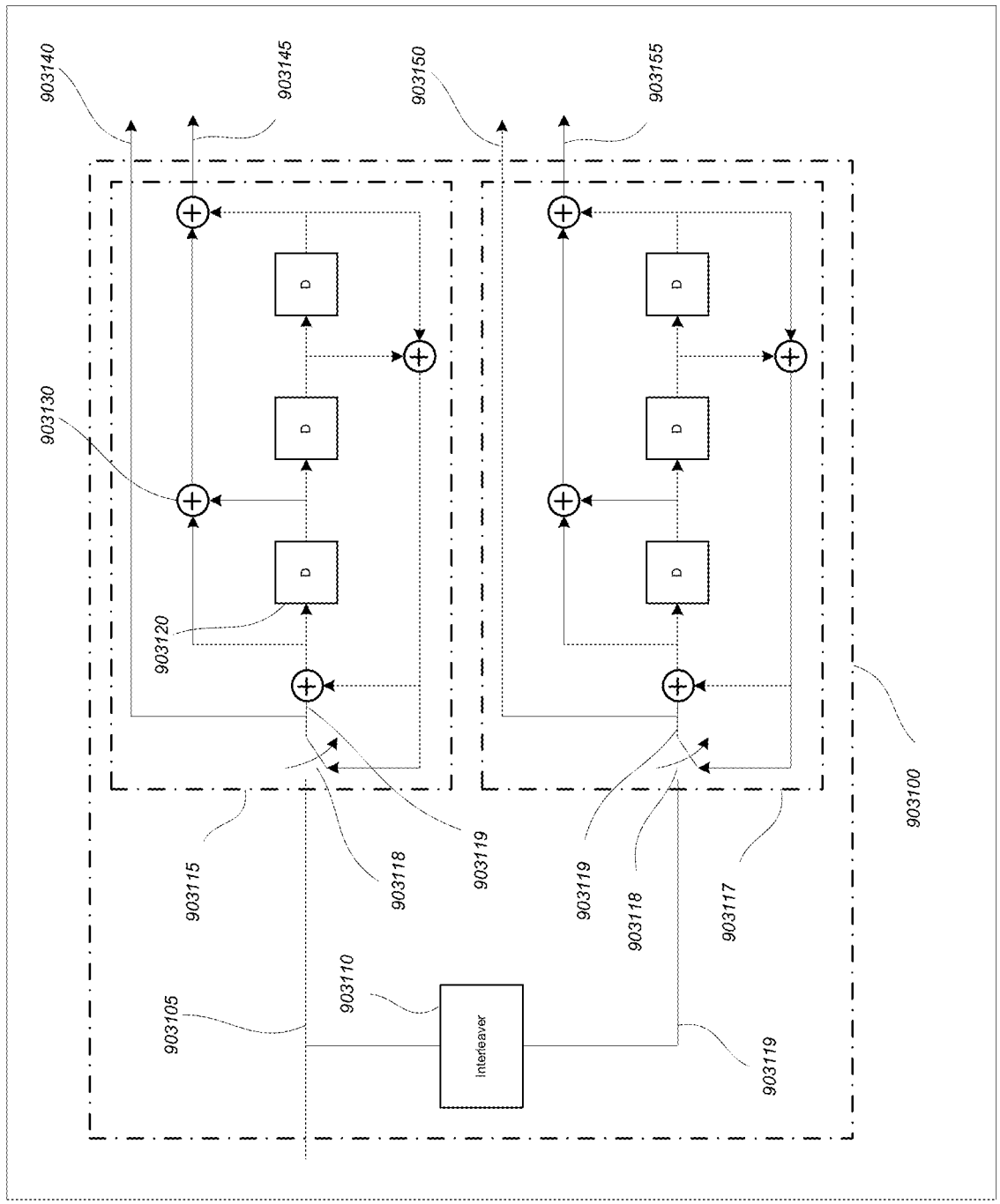

An encoder 903100 that may be used to encode data according to a parallel concatenated convolutional code (PCCC),that may be referred to as a turbo code, according to some aspects is illustrated in FIG. 903.

According to some aspects, encoder 903100 may include interleaver 903110, upper constituent encoder 903115 and lower constituent encoder 903117. According to some aspects, upper constituent encoder 903115 may generate one or more encoded data streams 903140 and 903145 from input data 903105. According to some aspects, interleaver 903110 may generate interleaved input data 903119 from input data 903105. According to some aspects, lower constituent encoder 903117 may generate one or more encoded data streams 903150 and 903155 from interleaved input data 903105.

According to some aspects, interleaver 903110 may output interleaved output data 903119 that has a one to one relationship with the data contained in input data 903105, but with the data arranged in a different time order. According to some aspects, interleaver 903110 may be a block interleaver, taking as input one or more blocks of input data 903105 which may be represented as:

$$\{c_0, c_1, \ldots, c_{K-1}\}$$

where each $c_i$ is an input data bit and K is the number of bits in each block and generating an output corresponding to each of the one or more such input blocks which may be represented as:

$$\{c_{\pi(1)}, c_{\pi(2)}, \ldots, c_{\pi(K-1)}\}$$

where π (i) is a permutation function which may be of a quadratic form and which may be represented by:

$$\pi(i) = (f_1 i + f_2 i^2) \bmod K$$

where f1 and f2 are constants that may be dependent on the value of the block size K.

According to some aspects, each of upper constituent encoder 903115 and lower constituent encoder 903117 may include input bit selector 903118 which may generate a selected input bit stream 903119 that may be selected from one of an encoder input bit stream during a data encoding phase and a linear combination of stored bits during a trellis termination phase. According to some aspects, each of upper constituent encoder 903115 and lower constituent encoder 903117 may store bits in two or more delay elements 903120 arranged to function as a shift register, the input to the shift register consisting of a linear combination of a bit from a selected input bit stream 903119 and previously stored bits, the stored bits being initialized to a predetermined value prior to an encoding phase, and having a predetermined value at the end of a trellis termination phase. According to some aspects, each of upper constituent encoder 903115 and lower constituent encoder 903117 may generate one or more outputs 903140 and 903145, each of which may be one of a selected input bit stream 903119 and a linear combination of stored bits.

According to some aspects, each of upper constituent encoder 903115 and lower constituent encoder 903117 may have a transfer function during an encoding phase that may be represented as:

$$H(z) = \left[1, \frac{1 + z^{-1} + z^{-3}}{1 + z^{-2} + z^{-3}}\right]$$

According to some aspects, encoder 903100 may be implemented as software instructions running on a processor in combination with memory to store data input to interleaver 903110 and stored bits of each of upper constituent encoder 903115 and lower constituent encoder 903117.

Figure 904:
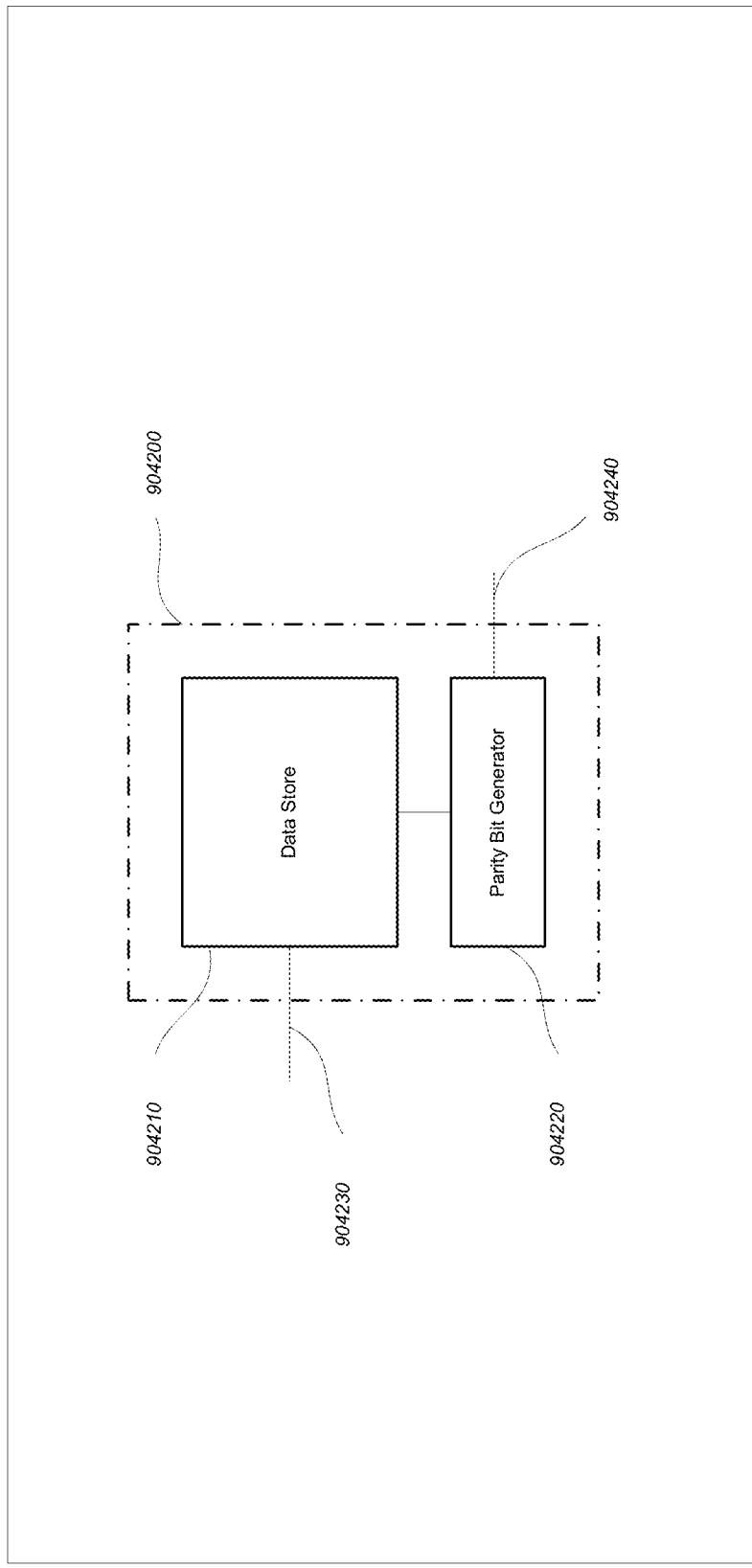

An encoder 904200 that may be used to encode data bits according to a low density parity check (LDPC) code according to some aspects is illustrated in FIG. 904.

According to some aspects, data bits 904230 input to encoder 904200 may be stored in data store 904210, stored data bits may be input to parity bit generator 904220 and encoded bits 904240 may be output by parity bit generator 904220.

According to some aspects, data bits input to LDPC encoder 904200 may be represented as:

$$c = \{c_0, c_1, \ldots, c_{K-1}\}$$

encoded data bits 904240 may be represented as:

$$d = \{c_0, c_1, \ldots, c_{K1}, p_0, p_1, \ldots, p_{D-K-1}\}$$

and parity bits $p_i$ may be selected such that $$H \cdot d^T = 0$$

where H is a parity check matrix, K is the number of bits in the block to be encoded, D is the number of encoded bits and D-K is the number of parity check bits.

According to an aspect, parity check matrix H may be represented as:

$$H = \begin{bmatrix} P^{a_{0,0}} & P^{a_{0,1}} & P^{a_{0,2}} & & P^{a_{0,M-2}} & P^{a_{0,M-1}} \\ P^{a_{1,0}} & P^{a_{1,1}} & P^{a_{1,2}} & \ldots & P^{a_{1,M-2}} & P^{a_{1,M-1}} \\ P^{a_{2,0}} & P^{a_{2,1}} & P^{a_{2,2}} & & P^{a_{2,M-2}} & P^{a_{1,M-1}} \\ & & \vdots & \ddots & & \\ P^{a_{N-1,0}} & P^{a_{N-1,1}} & P^{a_{N-1,2}} & & P^{a_{N-1,M-2}} & P^{a_{N-1,M-1}} \end{bmatrix}$$

where $P^{a_{i,j}}$ is one of a zero matrix or a cyclic permutation matrix obtained from the Z×Z identity matrix by cyclically shifting the columns to the right by $a_{i,j}$, Z is the size of the constituent permutation matrix, the number of encoded bits D is equal to ZM and the number of bits K in the block to be encoded is equal to ZN.

The present disclosure relates to an information or data encoders and information data decoders adapted for Polar Codes having an Order "N" space complexity. As an overview, Polar Codes for forward error correction can be used by the new communication standards, such as Fifth Generation (5G) New Radio (NR) radio standard, but are not limited thereto. Polar encoders can include a fast encoder with $O(N*(1+\log_2(N)))$ space complexity. In exemplary aspects described herein, the encoder advantageously includes an O(N) space complexity. In one or more exemplary aspects, the polar encoder can be configured to utilize a binary progression sequence.

5G so far has adopted Polar Codes for control channels where information or data rates are reduced, e.g. compared to payload/user/application/service-bearing information or data channels. However, aspects of the present disclosure or not limited to control channel applications and are also applicable to other channel (e.g. payload/user/application/service-bearing information and/or data) as would be understood by one of ordinary skill in the art. With the O(N) implementation, the present disclosure significantly reduces area, cost, latency or power requirements for encoding. In exemplary aspects, the encoder can be implemented at least partially in, for example, a hardware implementation such as a field-programmable gate array (FPGA) or an application-specific integrated circuit (ASIC), or digital logic, or a combination thereof, but is not limited thereto. In one or more aspects the encoder is implemented in hardware and/or firmware or software. The encoder can be configured to perform polar encoding for fifth-generation (5G) new radio (NR) communication systems resulting in small size, complexity, low cost, and low power. Although exemplary aspects are described with respect to 5G wireless technologies, the present disclosure is not limited thereto, and aspects can be applied to other communication standards and protocols as would be understood by one of ordinary skill in the relevant arts, such as 3rd Generation Partnership Project's (3GPP) Long Term Evolution (LTE), one or non-cellular technologies (e.g. one or more IEEE's 802.11 protocols), and/or one or more communication technologies/protocols. Further, although polar codes are used for control channel encoding, the present disclosure is also applicable to other channel communications (e.g. bearing payload/user/application/service information or data).

Polar Codes are a linear block code, and can be defined with a generator matrix. For example, the 5G NR radio standard specified in 3GPP TS 38.212 defines the Polar encoding as:

$$d = uG \qquad [1]$$

Where the input row vector "u" and the output row vector "d" may be, for example, vectors of 1,024 elements, and "G" may be a dense matrix of size, for example, 1,024×1,024. Note that with Polar Codes, the size of the code, N, is a binary power, e.g., N=2, 4, 8, 16, 32, etc.

Brute force implementation of equation [1] results in an $O(N^2)$, "Order $N^2$," space complexity. A fast polar encoder (e.g. Arikan's fast encoder) typically $O(N*(1+\log_2(N)))$ space complexity and N bits per clock throughput.

Advantageously, aspects of the present disclosure describe a polar encoder having a O(N) space complexity with 1 bit per clock throughput. With 5G's use of Polar Codes for the control channel, the 1 bit per clock encoding easily exceeds the throughput requirement of the standard while resulting in a great reduction in area and power as well as excellent suitability for FPGA or ASIC implementations. In one or more exemplary aspects, a relationship between Polar Codes and the binary progression sequence can be used to provide a low-resource implementation, including an implementation that is well suited for a 4-input look-up table (LUT) structures found in FPGAs.

In an exemplary aspect, the matrix operations in equation [1] are performed bit-by-bit, with multiplication being defined by AND (Logical And) and addition being defined by XOR (Logical Exclusive-Or). Mathematical operations can be performed using, for example, digital Boolean logic, bit-by-bit, in a Gailos-2 field.

For example, with N=2, equation [1] becomes:

$$[d_1 \quad d_2] = [u_1 \quad u_2]\begin{bmatrix} 1 & 0 \\ 1 & 1 \end{bmatrix} \qquad [2]$$

In this example, $d_1$, $d_2$, $u_1$, and $u_2$ are the elements of the vectors d and u, and the elements are single bits.

Equation [2] can be expanded with the above rules to be:

$$d_1 = (u_1 \text{AND} 1) \text{XOR} (u_2 \text{AND} 1) \qquad [3]$$

$$d_2 = (u_1 \text{AND} 0) \text{XOR} (u_2 \text{AND} 1) \qquad [4]$$

The truth tables for "AND" and "XOR" are defined, in the following tables. The Truth Table for AND:

| "AND" Truth Table for "y = a AND b" | b = 0 | b = 1 |
| --- | --- | --- |
| a = 0 | y = 0 | y = 0 |
| a = 1 | y = 0 | y = 1 |

The Truth Table for XOR is:

| "XOR" Truth Table for "y = a XOR b" | b = 0 | b = 1 |
| --- | --- | --- |
| a = 0 | y = 0 | y = 1 |
| a = 1 | y = 1 | y = 0 |

The generator matrix as described in equation [1] can be generated by taking the Kronecker product of "$G_2$" repeatedly:

$$G_2 = \begin{bmatrix} 1 & 0 \\ 1 & 1 \end{bmatrix} \qquad [5]$$

$$G_4 = G_2 \otimes G_2 \qquad [6]$$

$$G_8 = G_4 \otimes G_2 = G_2 \otimes G_4 \qquad [7]$$

And, so on. In this example generation sequence, ⊗ is commutative.

An example of the Kronecker product operator, ⊗, is shown as follows:

$$C = A \otimes B$$

with $$A = \begin{bmatrix} a_{11} & a_{12} \\ a_{21} & a_{22} \end{bmatrix}$$

and $$B = \begin{bmatrix} b_{11} & b_{12} & b_{13} \\ b_{21} & b_{22} & b_{23} \\ b_{31} & b_{32} & b_{33} \end{bmatrix}$$

The Kronecker product yields:

$$C = \begin{bmatrix} a_{11}b_{11} & a_{11}b_{12} & a_{11}b_{13} & a_{12}b_{11} & a_{12}b_{12} & a_{12}b_{13} \\ a_{11}b_{21} & a_{11}b_{22} & a_{11}b_{23} & a_{12}b_{21} & a_{12}b_{22} & a_{12}b_{23} \\ a_{11}b_{31} & a_{11}b_{32} & a_{11}b_{33} & a_{12}b_{31} & a_{12}b_{32} & a_{12}b_{33} \\ a_{21}b_{11} & a_{21}b_{12} & a_{21}b_{13} & a_{22}b_{11} & a_{22}b_{12} & a_{22}b_{13} \\ a_{21}b_{21} & a_{21}b_{22} & a_{21}b_{23} & a_{22}b_{21} & a_{22}b_{22} & a_{22}b_{23} \\ a_{21}b_{31} & a_{21}b_{32} & a_{21}b_{33} & a_{22}b_{31} & a_{22}b_{32} & a_{22}b_{33} \end{bmatrix}$$

For N=8, $G_8$ is defined as:

$$G_8 = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad [9]$$

Although exemplary aspects of the present disclosure are described for the generator matrix with size N=8, the Polar code size N is not limited and the present disclosure is applicable for all Polar code sizes.

In an exemplary aspect, the encoder includes:
an "Order N," O(N), output stage; and N flip-flops can be used in the output stage.
a binary counter of width $\log_2(N)$ bits for generating "simple decodes" for the output stage enables.
A decoder enable generator configured with a single product term (single AND gate) driving each output stage enable with at most $\log_2(N)$ inputs for each AND gate.

In an exemplary aspect, an encoder 10100 is described with reference to FIGS. 101-104 and Tables 2 and 4. In an exemplary aspect, the encoder 10100 can include a binary counter 10105, a decode enable generator ("simple decode") 10110, and one or more registers (e.g. flip-flops) 10115.

Figure 104:
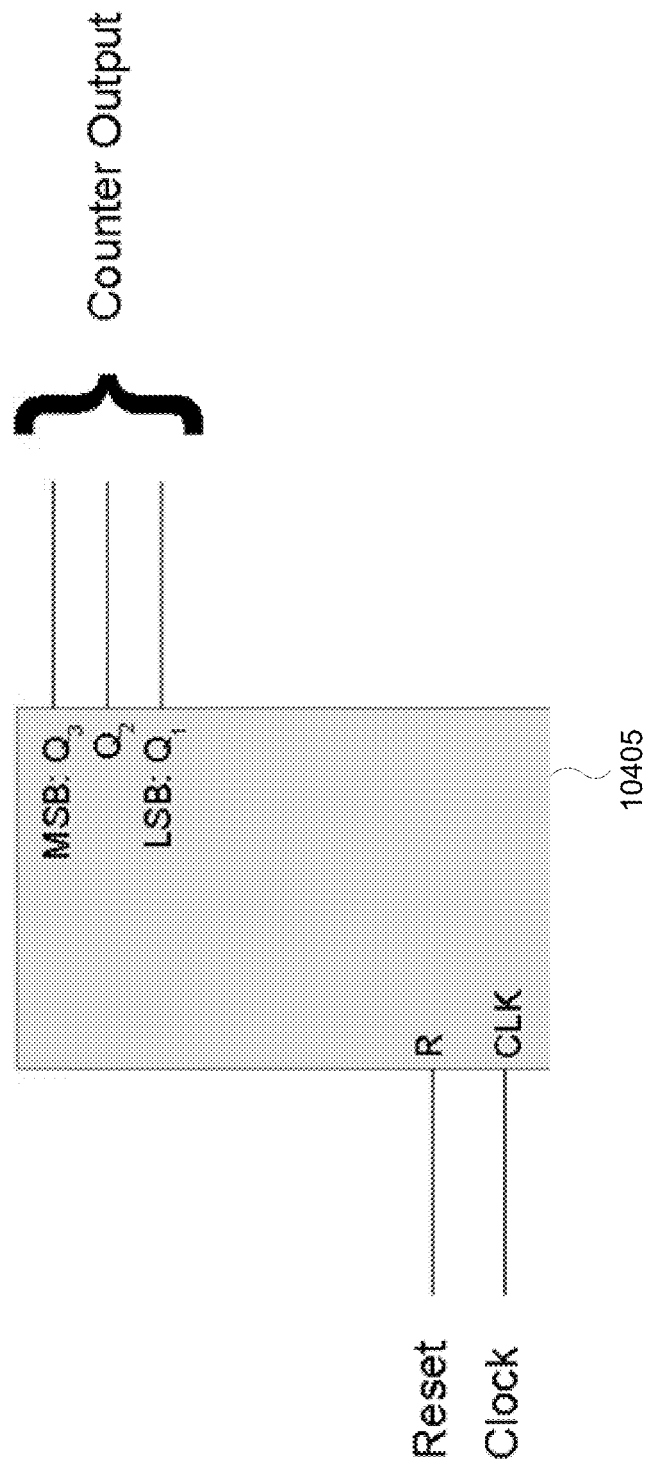
FIG. 104 illustrates a binary counter according to an exemplary aspect of the present disclosure.

The binary counter 10105 can be a $\log_2(N)$ bit binary counter. For example, for N=8, the binary counter 10105 is a 3-bit binary counter. In an exemplary aspect, the binary counter 10105 is configured to generate a multibit output q representing a binary count based on an input clock signal CLK. Exemplary aspects of the binary counter 10105 are illustrated in FIG. 104.

The decode enable generator ("simple decode") 10110 is configured to generate one or more enable signals (e.g. $E_1$ to $E_N$) based on the binary count q received from the binary counter 10105. In an exemplary aspect, the decode enable generator 10110 includes one or more AND (logical AND) gates that are configured to generate a respective enable output based on the binary count output q from the binary counter 10105. An exemplary aspect of the AND gates are shown in FIG. 103. In this example, the first enable signal $E_1$ is always enabled, and the corresponding inputs of the AND gate associated with the first enable signal includes a single input having the value of 1. The operation of the decode enable generator 10110 is described in more detail below.

Figure 101:
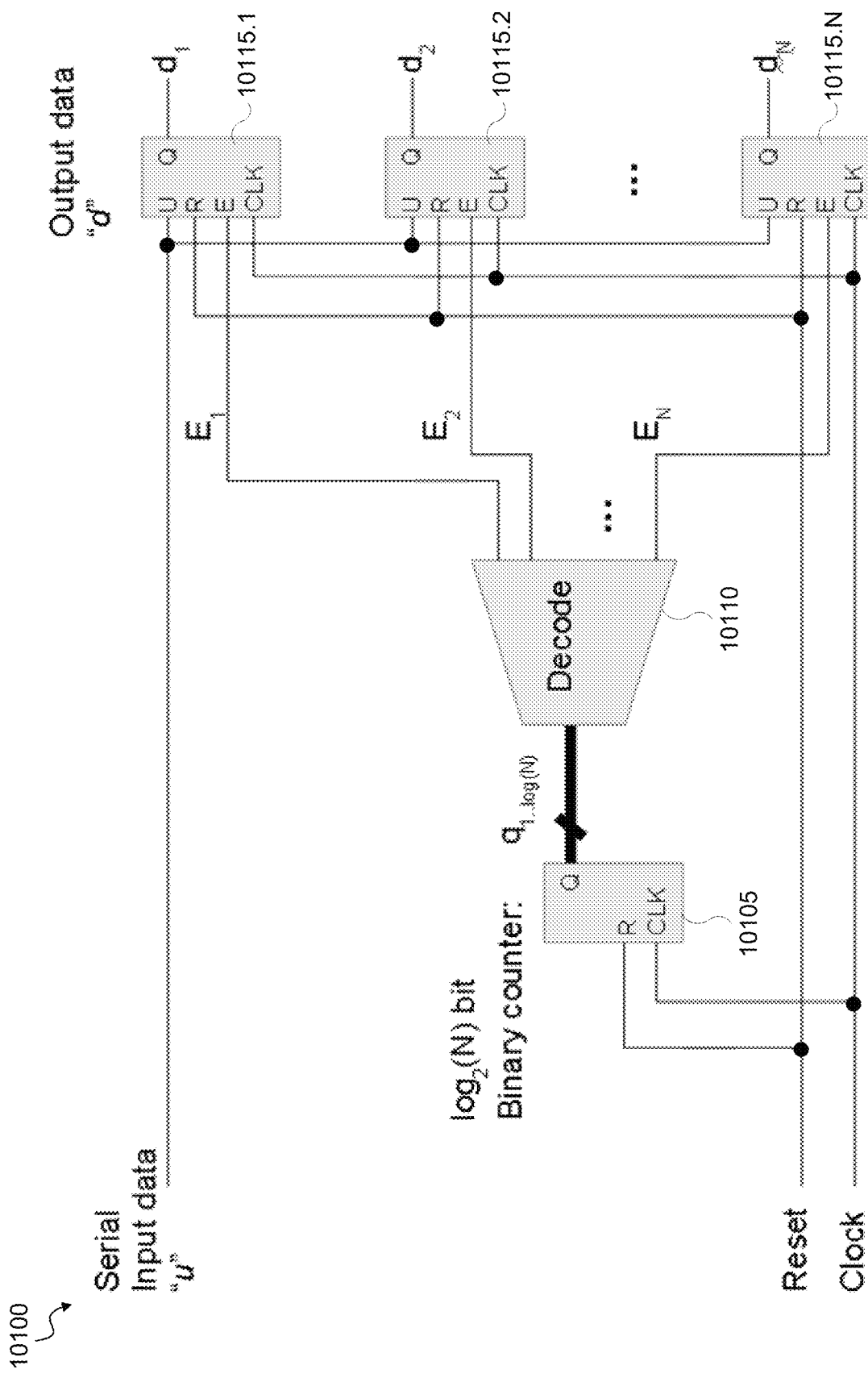
FIG. 101 illustrates an encoder according to an exemplary aspect of the present disclosure.
Figure 102:
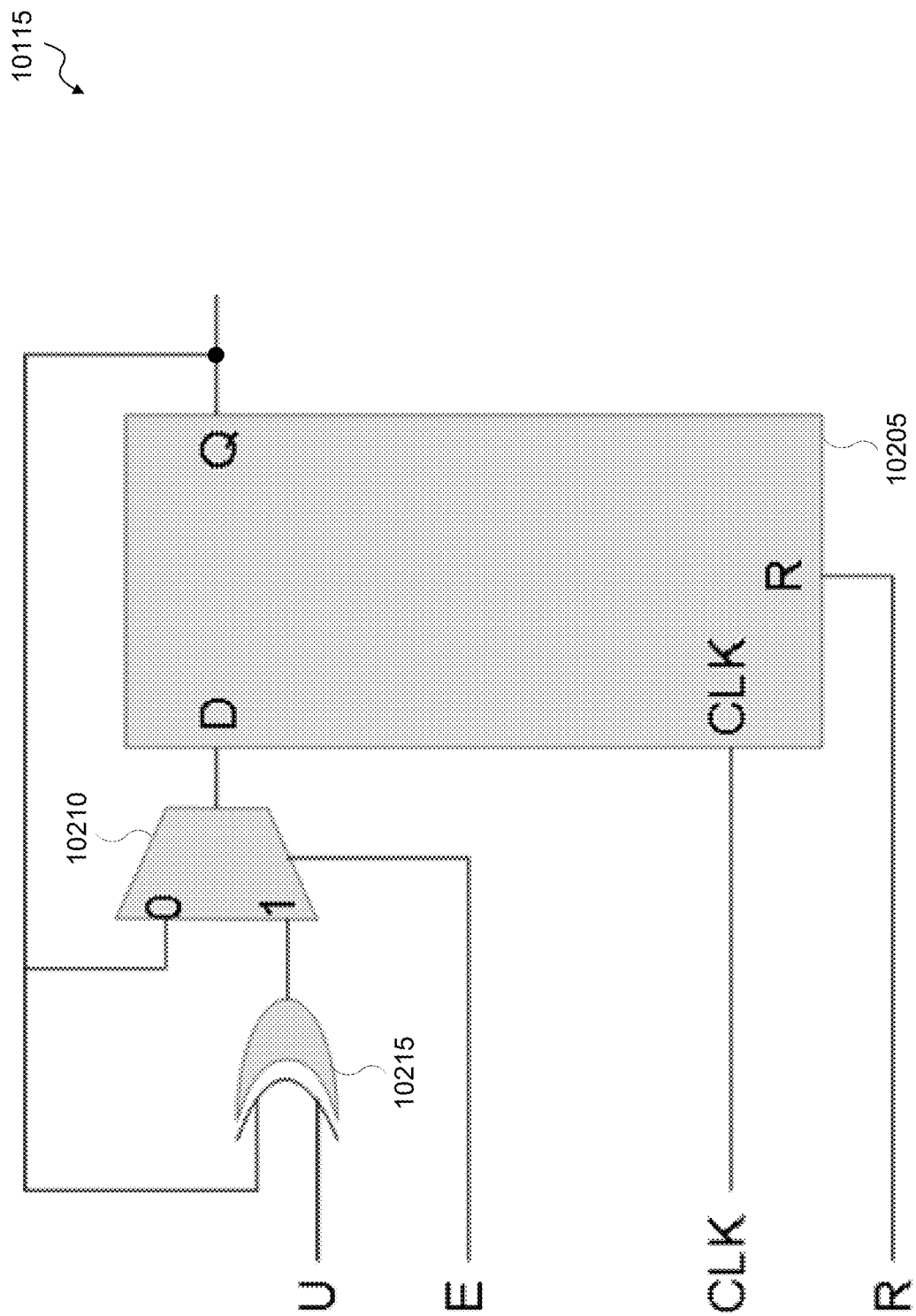
FIG. 102 illustrates an output stage register according to an exemplary aspect of the present disclosure.

FIG. 102 illustrates an exemplary aspect of the registers 10115, which can include a D flip-flop 10205, a multiplexer 10210, and an exclusive OR (logical Exclusive OR) 10215. In operation, the input data u is provided to each of the registers 10115, which generate output d based on corresponding enable signals E from the decode enable generator 10110 and the clock signal CLK. Note that "output d" for register 10115 connects to "output Q" for flip-flip 10205. Table 2 below shows an example operation of the registers 10115.

TABLE 2

| | | | | Old Output: | New Output: |
|---|---|---|---|---|---|
| | Inputs: | | | | |
| | | Signal: | | | |
| CLK | R | E | U | (Old Q) | Q |
| | | | Function: | | |
| Clock | Reset | Enable | Input-data | Output-data feedback | Output-data | Notes: |
| ↑ | 1 | X | X | X | 0 | Reset output |
| ↑ | 0 | 0 | X | 0 | 0 | Hold output |
| ↑ | 0 | 0 | X | 1 | 1 | Hold output |
| ↑ | 0 | 1 | 0 | 0 | 0 | Computation |
| ↑ | 0 | 1 | 0 | 1 | 1 | Computation |
| ↑ | 0 | 1 | 1 | 0 | 1 | Computation |
| ↑ | 0 | 1 | 1 | 1 | 0 | Computation |

With reference to FIG. 103, an exemplary aspect of the decode enable generator 10110 is described. As discussed above, the decode enable generator 10110 can include one or more AND (logical AND) gates that are configured to generate a respective enable output based on the binary count output q from the binary counter 10105. The decode enable generator 10110 shown in FIG. 103 corresponding to a code size of N=8, but is not limited thereto.

Advantageously, the decode enable generator 10110 is configured to generate the enable signals E using a single product term for each enable. That is, each enable is driven from a single corresponding AND gate with up to $\log_2(N)$ inputs as a worst case. The AND gates of the decode enable generator 10110 decode the $\log_2(N)$-bit output of the binary counter 10105 that advances on each clock cycle. As discussed above, decode enable signal generation uses a single product term based on the relationship between Polar Codes and the binary progression sequence.

FIG. 104 illustrates an exemplary aspect of the binary counter 10405. The counter 10405 is an aspect of the counter 10105 shown in FIG. 101. The binary counter 10405 is of width $\log_2(N)$ bits. An example operation of the counter is shown with reference to Table 4 below, with code size N=8, which results in a 3-bit (e.g. $\log_2(N)=3$) counter output Q1, Q2, Q3, with Q1 being the least significant bit (LSB) and Q3 being the most significant bit (MSB).

TABLE 4

Binary Counter for N = 8, $\log_2(N) = 3$.

| Inputs: | | Old Output: | New Output: | |
|---|---|---|---|---|
| | | Signal: | | |
| CLK | R | (Old $Q_3$, $Q_2$, $Q_1$) Function: | $Q_3$, $Q_2$, $Q_1$ | |
| Clock | Reset | Output-data feedback | Output-data | Notes: |
| ↑ | 1 | X | 0, 0, 0 | Reset output |
| ↑ | 0 | 0, 0, 0 | 0, 0, 1 | Increment output |
| ↑ | 0 | 0, 0, 1 | 0, 1, 0 | Increment output |
| ↑ | 0 | 0, 1, 0 | 0, 1, 1 | Increment output |
| ↑ | 0 | 0, 1, 1 | 1, 0, 0 | Increment output |
| ↑ | 0 | 1, 0, 0 | 1, 0, 1 | Increment output |
| ↑ | 0 | 1, 0, 1 | 1, 1, 0 | Increment output |
| ↑ | 0 | 1, 1, 0 | 1, 1, 1 | Increment output |
| ↑ | 0 | 1, 1, 1 | 0, 0, 0 | Increment output |

Figure 105:
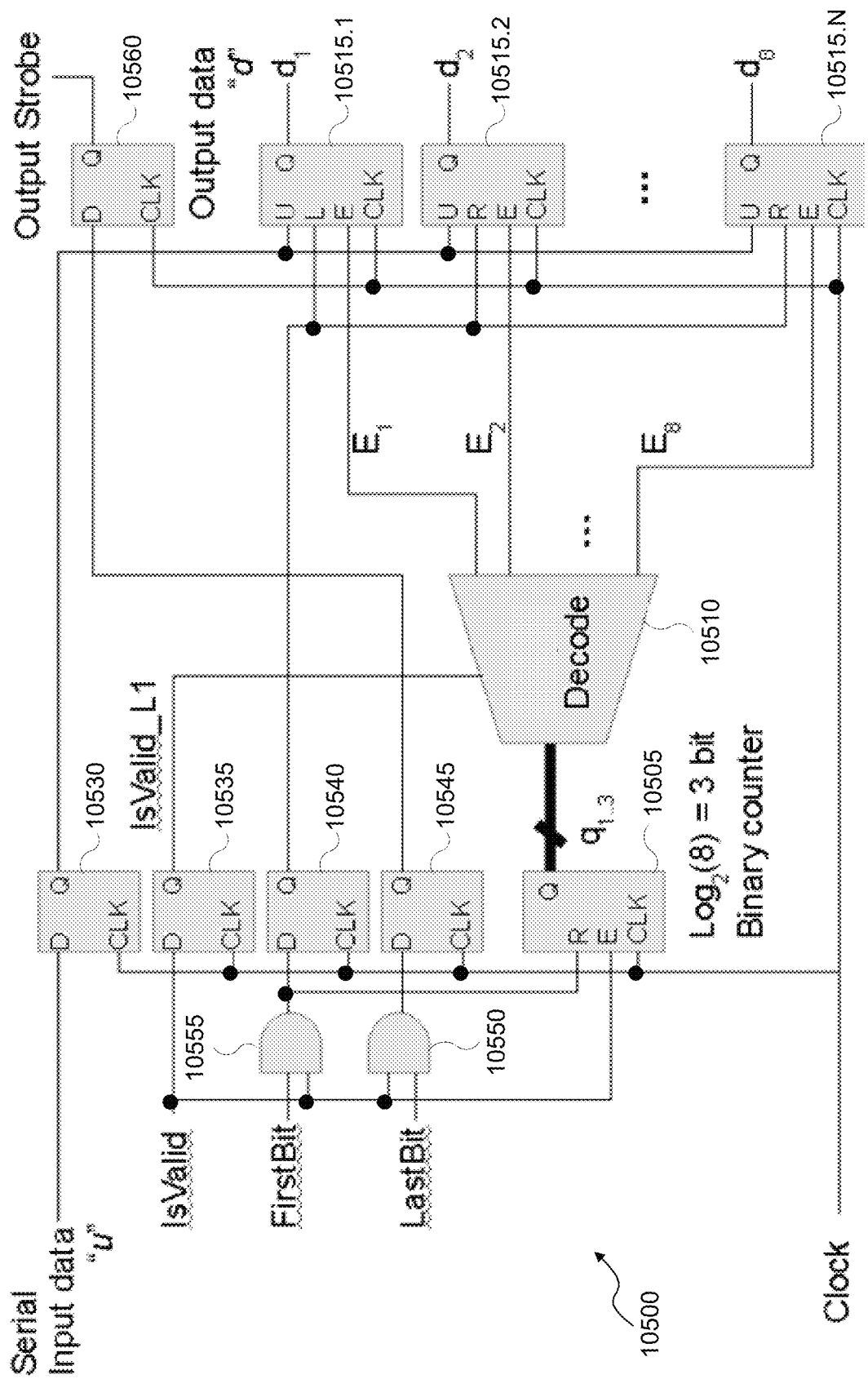
FIG. 105 illustrates an encoder according to an exemplary aspect of the present disclosure.

With reference to FIG. 105, in an exemplary aspect, the encoder:

Requires no reset (but a reset can be added, if desired).

Allows encoding of back-to-back input data (frames) with no dead cycles, even if back-to-back frames are of different sizes.

No ready signal is required, as the encoder can keep up with the full input rate.

additional interface signals for "valid," "first bit," "last bit," and the "Output Strobe."

The "valid" control signal can be used to stall source data. This is useful for situations where the source cannot keep up with the encoder, or where input data to be encoded is "bursty" with idle periods.

The "first bit" can be used to eliminate the requirement of a dead cycle to reset the encoder. For example, the reset function and loading of the first data bit can be done in the same clock cycle—first stage gets a load of the current input data while the remaining stages get reset.

The "last bit" can be used to trigger the "output strobe" to signal to a following component that the output is valid and ready to be picked up. It can also be used to effortlessly support different size frames.

The "Output Strobe" provides a convenient way for a next stage to know the output data is ready. In other aspects that omit the output strobe, the cycle in which the data is ready can be determined by other means since the conversion is deterministic. For example, valid clock cycles can be counted given the input frame size.

With continued reference to FIG. 105, the D-flip-flops 10530-10545 and 10560 can be pipeline registers that simply add one clock of delay. In one or more aspect, the pipeline registers can be removed or modified. For example, the number of pipeline registers may be increased to improve clocking speed, if desired. In an exemplary aspect, the encoder 10500 can stall without concern to the pipeline due to inclusion of the "valid" signal. Advantageously, possible issues with increasing pipeline size can be avoided, including cases where the pipeline must stall.

Figure 106:
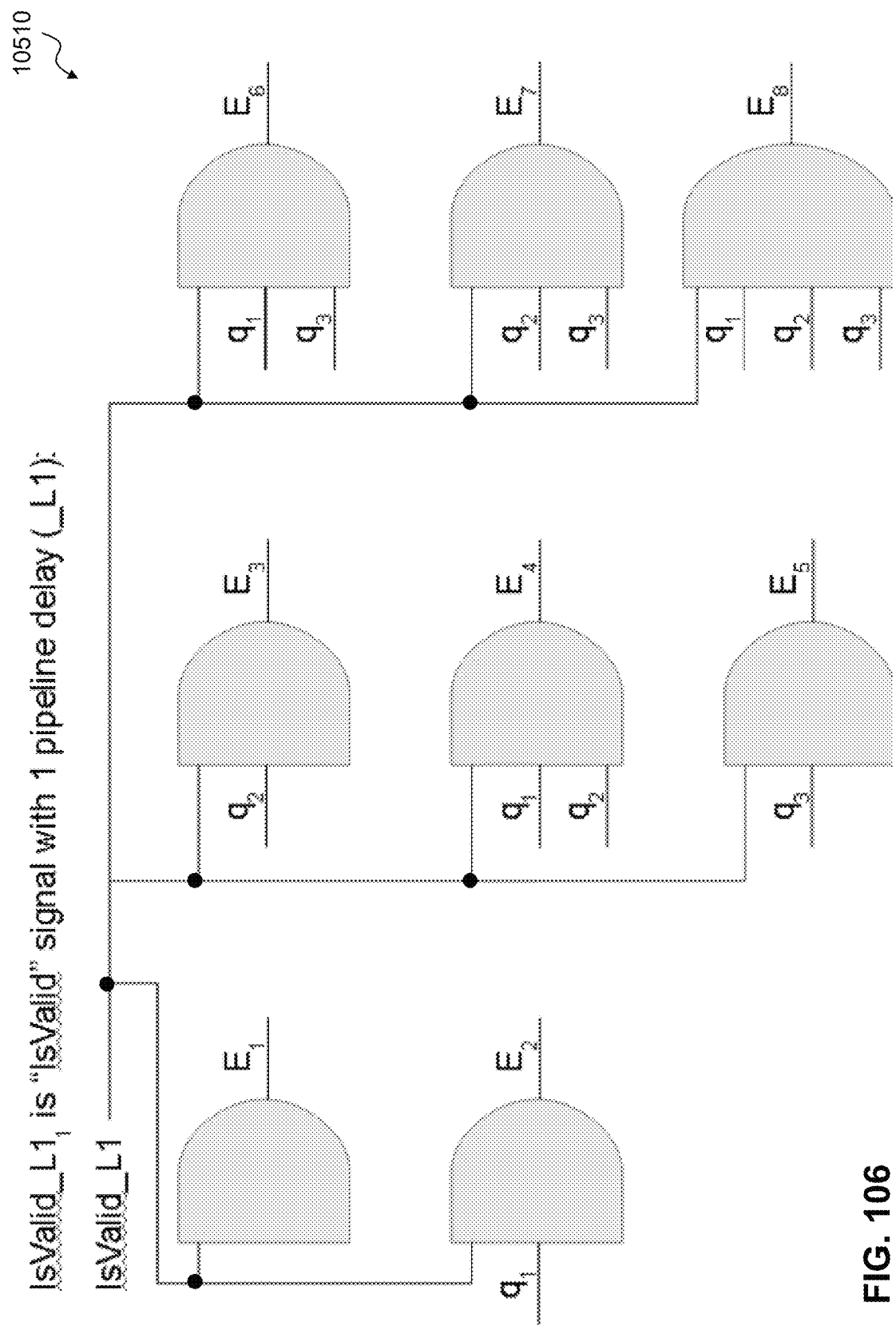
FIG. 106 illustrates a decode enable generator according to an exemplary aspect of the present disclosure.

With reference to FIG. 106, an exemplary aspect of the decode enable generator 10510 is described. The decode enable generator 10510 is similar to the decode enable generator 10110, but includes the input signal (IsValid) having a 1 pipeline delay. The decode enable generator 10510 shown in FIG. 106 is illustrated with a polar code size of N=8, but the polar code size is not limited thereto. The valid signal ("IsValid") permits the encoder to stall by stopping the count from increasing in counter 10505, and by invalidating the enables to the output registers 10515. The stalling can be done at the correct time by using, for example, one or more pipeline registers that require no considerations for stopping or restarting.

Advantageously, the decode enable generator 10510 is configured to generate the enable signals E using a single product term for each enable. That is, each enable is driven from a single corresponding AND gate with up to $\log_2(N)$ inputs as a worst case. The AND gates of the decode enable generator 10510 decode the $\log_2(N)$-bit output of the binary counter 10505 that advances on each clock cycle. As discussed above, decode enable signal generation uses a single product term based on the relationship between Polar Codes and the binary progression sequence.

Figure 107:
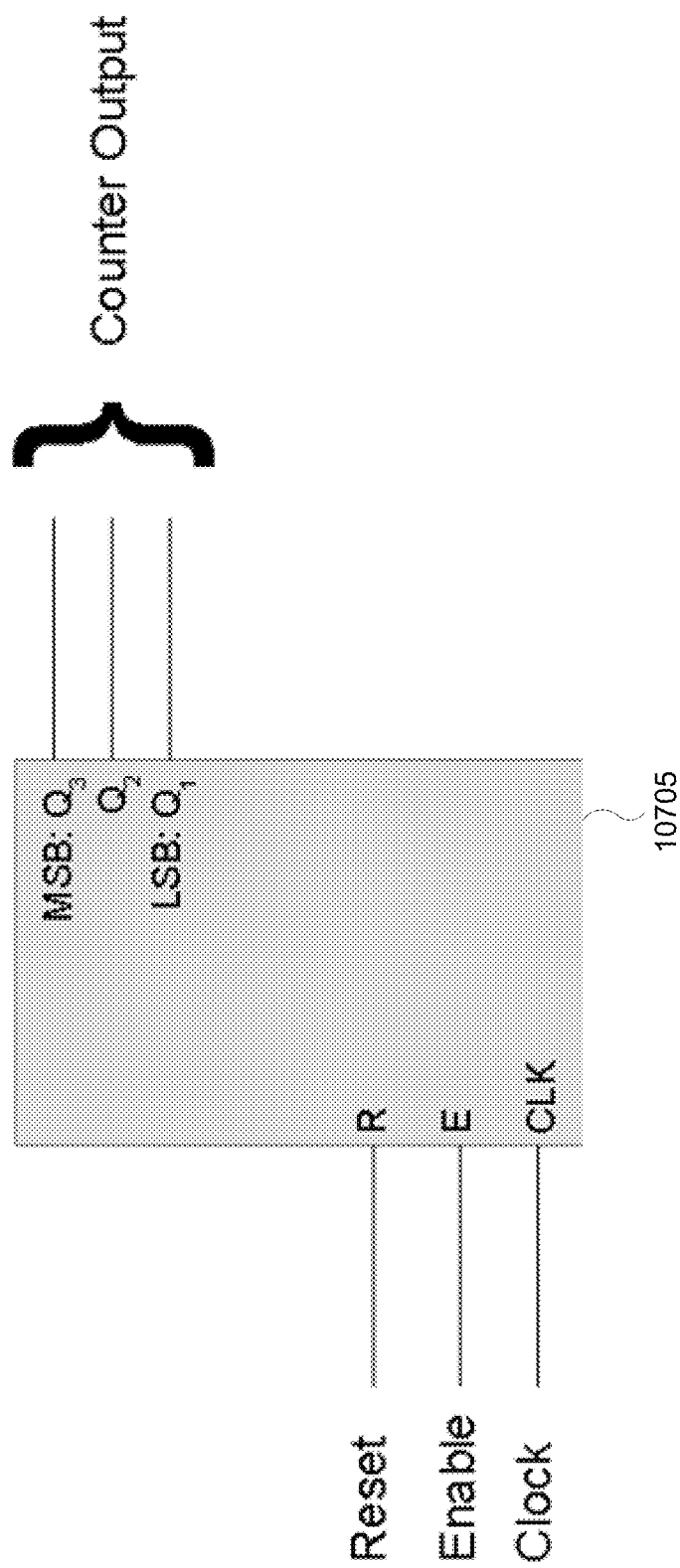
FIG. 107 illustrates a binary counter according to an exemplary aspect of the present disclosure.

The binary counter 10505 is similar to the binary counter 10105, but includes an additional input that receives the valid input signal (IsValid). Operation of the counter 10505 illustrated in Table 7, with reference to FIG. 107.

TABLE 7

Binary Counter with enable input to stall, where N = 8, $\log_2(N) = 3$.

| Inputs: | | | Old Output: | New Output: | |
|---|---|---|---|---|---|
| | | | Signal: | | |
| CLK | R | E | (Old $Q_3$, $Q_2$, $Q_1$) Function: | $Q_3$, $Q_2$, $Q_1$ | |
| Clock | Reset | Enable | Output-data feedback | Output-data | Notes: |
| ↑ | 1 | X | X, X, X | 0, 0, 0 | Reset output |
| ↑ | 0 | 0 | 0, 0, 0 | 0, 0, 0 | Hold output |
| ↑ | 0 | 1 | 0, 0, 0 | 0, 0, 1 | Increment output |
| ↑ | 0 | 0 | 0, 0, 1 | 0, 0, 1 | Hold output |
| ↑ | 0 | 1 | 0, 0, 1 | 0, 1, 0 | Increment output |
| ↑ | 0 | 0 | 0, 1, 0 | 0, 1, 0 | Hold output |
| ↑ | 0 | 1 | 0, 1, 0 | 0, 1, 1 | Increment output |
| ↑ | 0 | 0 | 0, 1, 1 | 0, 1, 1 | Hold output |
| ↑ | 0 | 1 | 0, 1, 1 | 1, 0, 0 | Increment output |
| ↑ | 0 | 0 | 1, 0, 0 | 1, 0, 0 | Hold output |
| ↑ | 0 | 1 | 1, 0, 0 | 1, 0, 1 | Increment output |
| ↑ | 0 | 0 | 1, 0, 1 | 1, 0, 1 | Hold output |
| ↑ | 0 | 1 | 1, 0, 1 | 1, 1, 0 | Increment output |
| ↑ | 0 | 0 | 1, 1, 0 | 1, 1, 0 | Hold output |
| ↑ | 0 | 1 | 1, 1, 0 | 1, 1, 1 | Increment output |
| ↑ | 0 | 0 | 1, 1, 1 | 1, 1, 1 | Hold output |
| ↑ | 0 | 1 | 1, 1, 1 | 0, 0, 0 | Increment output |

In an exemplary aspect, as shown in Table 7, the reset signal has higher priority than the enable signal. As shown in FIG. 105, the counter reset of the counter 10505 is driven qualified with "valid" (e.g. AND of IsValid and FirstBit). Therefore, the priority of reset and enable is not restricted. For example, a counter can be selected with enable priority higher than reset priority. Depending on the actually implemented counter reset and enable priority, one can eliminate redundant qualifications.

In an exemplary aspect, the encoder 10500 can include a register (flip-flop) 10515.1 having a loading input. With the loading input, the flip-flop 10515.1, the reset operation can be performed coincident with the loading of the first data bit.

Figure 108:
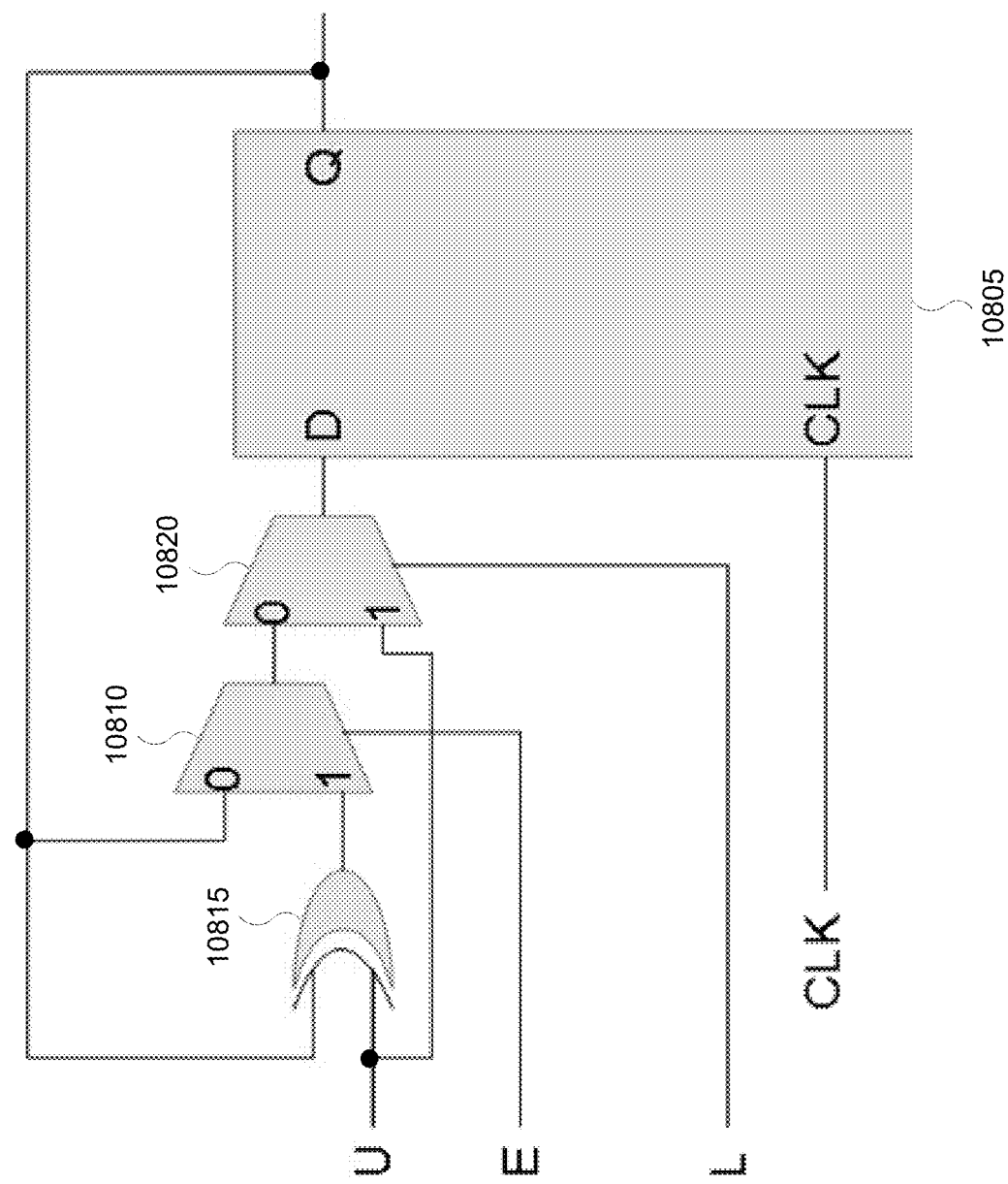
FIG. 108 illustrates an output stage register according to an exemplary aspect of the present disclosure.

This permits back-to-back frames with no dead cycles. FIG. 108 illustrates an exemplary aspect of the flip-flop 10515.1 having the loading input L. The operation of this flip-flop 10515.1 is shown in Table 8.

TABLE 8

Flip-flop having Loading Input, Output $d_1$.

| Inputs: | | | | Old Output: | New Output: |
|---|---|---|---|---|---|
| Signal: | | | | | |
| CLK | L | E | U | (Old Q) | Q |
| Function: | | | | | |
| Clock | Load | Enable | Input-data | Output-data feedback | Output-data | Notes: |
|---|---|---|---|---|---|---|
| ↑ | 1 | X | 0 | X | 0 | Load U input |
| ↑ | 1 | X | 1 | X | 1 | Load U input |
| ↑ | 0 | 0 | X | 0 | 0 | Hold output |
| ↑ | 0 | 0 | X | 1 | 1 | Hold output |
| ↑ | 0 | 1 | 0 | 0 | 0 | Computation |
| ↑ | 0 | 1 | 0 | 1 | 1 | Computation |

TABLE 8-continued

Flip-flop having Loading Input, Output $d_1$.

| Inputs: | | | | Old Output: | New Output: |
|---|---|---|---|---|---|
| Signal: | | | | | |
| CLK | L | E | U | (Old Q) | Q |
| Function: | | | | | |
| Clock | Load | Enable | Input-data | Output-data feedback | Output-data | Notes: |
|---|---|---|---|---|---|---|
| ↑ | 0 | 1 | 1 | 0 | 1 | Computation |
| ↑ | 0 | 1 | 1 | 1 | 0 | Computation |

With reference to Table 9 below, an example encoding operation is shown. The encoding is of source data into Polar codes. In this example, 5 frames are encoded with optional stalling and different size frames:

The first frame encodes hexadecimal source data 0x21 to Polar code 0x32 for N=8. The second frame encodes source data 0x21 to Polar code 0x32, but with optional stalling. The third frame encodes an N=4 frame with source data 0xd to Polar code 0xb. The fourth frame encodes 0x8f to Polar code 0xf7. The fifth frame encodes 0xdd to Polar code 0xb0.

TABLE 9

Clock by clock example of an encoder with additional signals, stalling, and different frame sizes

| Inputs | | Optional Inputs | | Internal Signals | | | Outputs | |
|---|---|---|---|---|---|---|---|---|
| CLK | U | IsValid | FirstBit | LastBit | Q3...1 | E8...1 | Strobe | D8...1 | Notes |
| ↑ | X | 0 | X | X | XXX | 00000000 | 0 | XXXXXXXX | "Cycle 0" |
| ↑ | 1 | 1 | 1 | 0 | XXX | 00000000 | 0 | XXXXXXXX | LSB data bit, 1$^{st}$ frame |
| ↑ | 0 | 1 | 0 | 0 | 000 | 00000001 | 0 | XXXXXXXX | |
| ↑ | 0 | 1 | 0 | 0 | 001 | 00000011 | 0 | 00000001 | |
| ↑ | 0 | 1 | 0 | 0 | 010 | 00000101 | 0 | 00000001 | |
| ↑ | 0 | 1 | 0 | 0 | 011 | 00001111 | 0 | 00000001 | |
| ↑ | 1 | 1 | 0 | 0 | 100 | 00010001 | 0 | 00000001 | |
| ↑ | 0 | 1 | 0 | 0 | 101 | 00110011 | 0 | 00000001 | "Cycle 7" |
| ↑ | 0 | 1 | 0 | 1 | 110 | 01010101 | 0 | 00000001 | MSB of 1$^{st}$ frame |
| ↑ | 1 | 1 | 1 | 0 | 111 | 11111111 | 0 | 00110010 | Start of 2$^{nd}$ frame, LSB |
| ↑ | 0 | 1 | 0 | 0 | 000 | 00000001 | 1 | 00110010 | 0x21 => 0x32, ready! |
| ↑ | X | 0 | X | X | 001 | 00000011 | 0 | 00000001 | Source stalls |
| ↑ | 0 | 1 | 0 | 0 | 001 | 00000000 | 0 | 00000001 | "Cycle 12" |
| ↑ | 0 | 1 | 0 | 0 | 010 | 00000101 | 0 | 00000001 | "Cycle 13" |
| ↑ | X | 0 | X | X | 011 | 00001111 | 0 | 00000001 | Source stalls |
| ↑ | 0 | 1 | 0 | 0 | 011 | 00000000 | 0 | 00000001 | "Cycle 15" |
| ↑ | 1 | 1 | 0 | 0 | 100 | 00010001 | 0 | 00000001 | |
| ↑ | 0 | 1 | 0 | 0 | 101 | 00110011 | 0 | 00000001 | "Cycle 17" |
| ↑ | X | 0 | X | X | 110 | 01010101 | 0 | 00000001 | Source stalls |
| ↑ | 0 | 1 | 0 | 1 | 110 | 00000000 | 0 | 00110010 | MSB of 2$^{nd}$ frame |
| ↑ | X | 0 | X | X | 111 | 11111111 | 0 | 00110010 | Source stalls |
| ↑ | 1 | 1 | 1 | 0 | 111 | 00000000 | 1 | 00110010 | 0x21 => 0x32 ready!; Start of 3$^{rd}$ frame, LSB |
| ↑ | 0 | 1 | 0 | 0 | 000 | 00000001 | 0 | 00110010 | "Cycle 22" |
| ↑ | 1 | 1 | 0 | 0 | 001 | 00000011 | 0 | 00000001 | "Cycle 23" |
| ↑ | 1 | 1 | 0 | 1 | 010 | 00000101 | 0 | 00000001 | MSB (N = 4) of 3$^{rd}$ frame |
| ↑ | 1 | 1 | 1 | 0 | 011 | 00001111 | 0 | 00000100 | Start of 4$^{th}$ frame, LSB |
| ↑ | 1 | 1 | 0 | 0 | 000 | 00000001 | 1 | 00001011 | 0xd => 0xb, ready! |
| ↑ | 1 | 1 | 0 | 0 | 001 | 00000011 | 0 | 00000001 | "Cycle 27" |
| ↑ | 1 | 1 | 0 | 0 | 010 | 00000101 | 0 | 00000010 | |
| ↑ | 0 | 1 | 0 | 0 | 011 | 00001111 | 0 | 00000111 | |
| ↑ | 0 | 1 | 0 | 0 | 100 | 00010001 | 0 | 00001000 | |
| ↑ | 0 | 1 | 0 | 0 | 101 | 00110011 | 0 | 00001000 | "Cycle 31" |
| ↑ | 1 | 1 | 0 | 1 | 110 | 01010101 | 0 | 00001000 | MSB of 4$^{th}$ frame |
| ↑ | 1 | 1 | 1 | 0 | 111 | 11111111 | 0 | 00001010 | Start of 5$^{th}$ frame, LSB |
| ↑ | 0 | 1 | 0 | 0 | 000 | 00000001 | 1 | 11110111 | 0x8f => 0xf7, ready! |
| ↑ | 1 | 1 | 0 | 0 | 001 | 00000011 | 0 | 00000001 | "Cycle 35" |
| ↑ | 1 | 1 | 0 | 0 | 010 | 00000101 | 0 | 00000001 | |
| ↑ | 1 | 1 | 0 | 0 | 011 | 00001111 | 0 | 00000100 | |
| ↑ | 0 | 1 | 0 | 0 | 100 | 00010001 | 0 | 00001011 | |
| ↑ | 1 | 1 | 0 | 0 | 101 | 00110011 | 0 | 00011010 | "Cycle 39" |
| ↑ | 1 | 1 | 0 | 1 | 110 | 01010101 | 0 | 00011010 | MSB of 5$^{th}$ frame |

TABLE 9-continued

Clock by clock example of an encoder with additional signals, stalling, and different frame sizes

| Inputs | | Optional Inputs | | Internal Signals | | Outputs | | |
|---|---|---|---|---|---|---|---|---|
| CLK | U | IsValid | FirstBit | LastBit | Q3...1 | E8...1 | Strobe | D8...1 | Notes |
| ↑ | X | 0 | X | X | 111 | 11111111 | 0 | 01001111 | "Cycle 41" |
| ↑ | X | 0 | X | X | 111 | 00000000 | 1 | 10110000 | 0xdd => 0xb0, ready! |

An example operation of the decode enable generator 10110, 10510 is described in detail below. For reasons of space and simplicity, N=8 will be discussed, but the present disclosure is not limited by code size.

The Polar encoding for N=8 are:

$$d_1 = [u_1 \text{XOR} u_2 \text{XOR} u_3 \text{XOR} u_4 \text{XOR} u_5 \text{XOR} u_6 \text{XOR} u_7 \text{XOR} u_8] \quad [10]$$

$$d_2 = [u_2 \text{XOR} u_4 \text{XOR} u_6 \text{XOR} u_8] \quad [11]$$

$$d_3 = [u_3 \text{XOR} u_4 \text{XOR} u_7 \text{XOR} u_8] \quad [12]$$

$$d_4 = [u_4 \text{XOR} u_8] \quad [13]$$

$$d_5 = [u_5 \text{XOR} u_6 \text{XOR} u_7 \text{XOR} u_8] \quad [14]$$

$$d_6 = [u_6 \text{XOR} u_8] \quad [15]$$

$$d_7 = [u_7 \text{XOR} u_8] \quad [16]$$

$$d_8 = [u_8] \quad [17]$$

In this example, Equations 10-17 correspond to the rows of the transpose of the generator matrix shown in Equation 9, as the equations come from the columns of G, and d=u G. In an exemplary aspect, the columns of the generator matrix provide equations for the output of a Polar encoder based on how matrix multiplication is defined, and each "1" in the generator matrix column creates a corresponding "u" term to include in the calculation.

In an exemplary aspect, the decoder includes an output stage of N bits. For each bit in the output stage, when it is enabled, the output state will perform the XOR function of its current output data with the input data that is being broadcast to all bits in the output stage. In this example, the decode enable generator 10110, 10510 instructs each bit in the output stage when to perform its accumulation.

For this example with N=8, we have $\log_2(N)=3$. Therefore the counter 10105, 10505 is a 3-bit binary counter: $q_1$, $q_2$, and $q_3$. The output bits from the binary counter are supplied to the decode enable generator 10110, 10510 and used as the input to AND gates to drive the enable signals to a bit in the output stage.

In an exemplary aspect, to determine which bits should be selected to form the product term, properties of a fictitious 3-bit binary counter (not counters 10105, 10505) can be used. In this example, the relationship between counting in binary and Polar codes is utilized to generate the corresponding enable bits.

In this example, let $b_1$, $b_2$, and $b_3$ be the outputs of this fictitious 3-bit binary counter, with $b_1$ being the least significant bit (LSB). The term "fictitious" is used to identify that this counter is not real and uses no resources. The fictitious counter is merely used to generate a binary progression sequence that will be used to determine which real counter bits to incorporate to create the real product term. In operation, if this counter is reset and allowed to count, it creates the binary progression sequence [000, 001, 010, ..., 110, 111]. Note that in this sequence, the LSB, $b_1$, is the right most bit. For example, "110" means $b_3=1$, $b_2=1$, and $b_1=0$.

Using this binary progression sequence for the counter, we will count from minimum (000) to maximum (111). The advancing of the count will be associated with selecting the next enable signal for the decode enable generator 110, 510. The counting will start at 000 for the first enable signal, $E_1$, and will advance to the next count, 001, for $E_2$, and then to 010 for $E_3$, and so on until the last enable signal with the last count, $E_8$ with count 111.

For each count of b, we make note of which bits in the count contain a "1." For example, for the count "110" we note that "bit 3" and "bit 2" are "1" while "bit 1" is a "0." We will use bits with a "1" to determine which counter bits to include to generate the enable product term. As discussed above, in an exemplary aspect, an exception will be made for the first enable, $E_1$, which is always 1.

In the discussion below, when describing the count of the counter, the nomenclature "_____ binary count of b" is used. The "first binary count of b" corresponds to "000." The "second binary count of b" corresponds to "001." The "third binary count of b" corresponds to "010," and so on.

In an exemplary aspect, For N=8, the enables to compute each "$d_i$" corresponding to Equations 10-17 are as follows:

For the first enable term, used to compute Equation 10:

$$E_1 = \text{'1'}; [q_3, q_2, q_1] \Leftrightarrow \{000, 001, 010, 011, 100, 101, 110, 111\}$$

All counts.

Here, all counts are selected to generate an always on enable signal. Concisely summarized, the logic equation for the first enable is "$E_1 = \text{'1'}$."

For the second enable term, used to compute Equation 11:

$$E_2 = q_1; [q_3, q_2, q_1] \Leftrightarrow \{00\mathbf{1}, 01\mathbf{1}, 10\mathbf{1}, 11\mathbf{1}\}$$

In this example, Second, Fourth, Sixth, and Eighth counts are selected. This selection is based on the relationship between the second binary count and the second enable signal $E_2$. For example, each binary count from the sequence of 000, 001, 010, 011, 100, 101, 110, 111 having a 1 in the LSB is selected. In this example, the Second, Fourth, Sixth, and Eighth counts have a 1 in the LSB ($b_1$ bit) as shown by the red and bold "1" values in the $b_1$ bit, and are selected for the $q_1$ enable signal. In operation, the second register 10115.2 is enabled for the Second, Fourth, Sixth, and Eighth clock cycles as the "$q_1$" term is based on the "second binary count of b"=001. That is, the enable signal $E_2$ is active (e.g. value of 1) for count values of the counter 105 that have a 1 in the LSB (e.g. Second, Fourth, Sixth, and Eighth counts). Concisely summarized, since the "second binary count of b"=001, then logic equation for the second enable is "$E_2 = q_1$."

For the third enable term, used to compute Equation 12:

$$E_3 = q_2; [q_3, q_2, q_1] \Leftrightarrow \{0\mathbf{1}0, 0\mathbf{1}1, 1\mathbf{1}0, 1\mathbf{1}1\}.$$

Here, the Third, Fourth, Seventh, and Eighth counts are selected. In this example, the "$q_2$" term is derived from the "third binary count of b"=010. For example, each binary count from the sequence of 000, 001, 010, 011, 100, 101, 110, 111 having a 1 in the $b_2$ bit is selected. In operation, the third register 115.3 is enabled for the Third, Fourth, Seventh, and Eighth clock cycles as the "$q_2$" term is based on the "third binary count of b"=010. That is, the enable signal $E_3$ is active (e.g. value of 1) for count values of the counter 105 that have a 1 in the middle bit (e.g. Third, Fourth, Seventh, and Eighth counts). Concisely summarized, since the "third binary count of b"=010, then logic equation for the third enable is "$E_3=q_2$."

For the fourth enable term, used to compute Equation 13:

$$E_4=q_2\&q_1;[q_3,q_2,q_1] \Leftrightarrow \{0\mathbf{1}\mathbf{1},1\mathbf{1}\mathbf{1}\}.$$

In this example, Fourth, and Eighth counts are selected based on the "fourth binary count of b"=011. In particular, because enable $E_4$ corresponds to counts having a value of "1" in the $b_2$ and $b_1$ bits, the enable $E_4$ corresponds to the logical AND of the "$q_2 \& q_1$" terms. Concisely summarized, since the "fourth binary count of b"=011, then logic equation for the fourth enable is "$E_4=q_2 \& q_1$."

For the fifth enable term, used to compute Equation 14:

$$E_5=q_3;[q_3,q_2,q_1] \Leftrightarrow \{\mathbf{1}00,\mathbf{1}01,\mathbf{1}10,\mathbf{1}11\}.$$

In this example, Fifth, Sixth, Seventh, and Eighth counts are selected based on the "fifth binary count of b"=100. In particular, because enable $E_5$ corresponds to counts having a value of "1" in the $b_3$ bit, the enable $E_5$ corresponds to the binary counts from the sequence of 000, 001, 010, 011, 100, 101, 110, 111 having a 1 in the $b_3$ bit. Concisely summarized, since the "fifth binary count of b"=100, then logic equation for the fifth enable is "$E_5=q_3$."

For the sixth enable term, used to compute Equation 15:

$$E_6=q_3\&q_1;[q_3,q_2,q_1] \Leftrightarrow \{\mathbf{1}0\mathbf{1},\mathbf{1}1\mathbf{1}\}.$$

In this example, Sixth, and Eighth counts are selected based on the "sixth binary count of b"=101. In particular, because enable $E_6$ corresponds to counts having a value of "1" in the $b_3$ and $b_1$ bits, the enable $E_6$ corresponds to the logical AND of the "$q_3 \& q_1$" terms. Concisely summarized, since the "sixth binary count of b"=101, then logic equation for the sixth enable is "$E_6=q_3 \& q_1$."

For the seventh enable term, used to compute Equation 16:

$$E_7=q_3\&q_2;[q_3,q_2,q_1] \Leftrightarrow \{\mathbf{1}\mathbf{1}0,\mathbf{1}\mathbf{1}1\}.$$

In this example, Seventh and Eighth counts are selected based on the "seventh binary count of b"=110. In particular, because enable $E_7$ corresponds to counts having a value of "1" in the $b_3$ and $b_2$ bits, the enable $E_7$ corresponds to the logical AND of the "$q_3 \& q_2$" terms. Concisely summarized, since the "seventh binary count of b"=110, then logic equation for the seventh enable is "$E_7=q_3 \& q_2$."

For the eighth enable term, used to compute Equation 17:

$$E_8=q_3\&q_2\&q_1;[q_3,q_2,q_1] \Leftrightarrow \{\mathbf{1}\mathbf{1}\mathbf{1}\}.$$

In this example, the Eighth count is selected based on the "eighth binary count of b"=111. In particular, because enable $E_8$ corresponds to counts having a value of "1" in the $b_3$, $b_2$, and $b_1$ bits, the enable $E_8$ corresponds to the logical AND of the "$q_3 \& q_2 \& q_1$" terms. Concisely summarized, since the "eighth binary count of b"=111, then logic equation for the eighth enable is "$E_8=q_3 \& q_2 \& q_1$."

The exemplary operation described above applied to a Polar code of any size N (where N is a binary power). That is, the first term is the exception, and always enabled with no counter terms required. The second through $N^{th}$ terms use the position of the "1's" from the binary progression sequence as explained above.

The encoder according to exemplary aspects of the present disclosure includes an output stage that scales as O(N), a decode enable generator that scales as O(N), and a counter that scales as O($\log_2$(N)). Therefore, the encoder of the present disclosure scales as O(N).

The exemplary aspects of the present disclosure have a performance of 1 bit per clock which is more than sufficient to meet the required performance for 5G base station or handset use. In addition, the exemplary aspects result in an implementation that is small in size with a structure that reduces area, cost, and power.

FPGAs can use a 4-input LUT structure as the basic combinatorial element. The exemplary aspects include output structures shown in FIGS. 102 and 108 that meet this 4-input requirement, and thus pack optimally and do not waste FPGA resources.

Furthermore, FPGAs may have acceleration for binary counters (fast carry and the carry chain). Because the binary counter is of size $\log_2$(N) instead of N, the binary counter used in the exemplary aspects is small and fast.

In one or more exemplary aspects, the decode enable generator includes one or more AND gates, the decode enable generator can be implemented using an ASIC implementation, and is an easy fit for the FPGA as far as compared to typical combinatorial functions.

The exemplary aspects allow full throughput with no dead cycles, back-to-back frames of different sizes, easy stalling, and easy pipelining.

FIGS. 109A-B illustrate communication systems 10900 and 10901, respectively. The communication system 10900 is an example wireless communication system in which communications are transmitted via a wireless link 10918. The communication system 10901 is an example wired communication system in which communication are transmitted via a wired link 10935.

The encoder 10905 is configured to encode input data to coded data (e.g. a coded signal), which is then transmitted by the transmitter 10910 via the antenna 10915 along the wireless link 10918. The transmitted coded signal is received by the receiver 10925 via antenna 10920. The received coded signal is then decoded by the decoder 10930. In an exemplary aspect, the encoder 10905 is an exemplary aspect of one or more of the encoders 10100, 10500.

In an exemplary aspect, the encoder 10905 is at least partially implemented with digital circuitry. For example, the digital circuitry may be the digital circuity illustrated in FIGS. 101 and 105. The digital circuity can include, for example, an FPGA, ASIC, or discrete digital logic. The digital circuitry implementation can be configured to perform any of the digital logic functions described herein. In one or more aspects, one or more logic functions can be performed by one or more processors or digital signal processors configured to execute a program to implement any logic defined herein.

In an exemplary aspect, the encoder 10905 and transmitter 10910 can be included in a communication device or network node, and the communication device can be configured to perform one or more encoding operations of one or more of the exemplary aspects described herein. The communication device can also include a corresponding receiver 10925 and decoder 10930, and the communication device can be configured to perform corresponding decoding operations. Examples of the communication device can include (but are not limited to) a mobile computing device—such as a laptop computer, a tablet computer, a mobile telephone or smartphone, a "phablet," a personal digital assistant (PDA), and mobile media player; an internet of things (TOT) device, and a wearable computing device—such as a computerized wrist watch or "smart" watch, and computerized eyeglasses. Examples of a network node can include (but are not limited to) a router, switch, repeater or radio-head. In one or more aspects of the present disclosure, the communication device 900 may be a stationary device, including, for example, a base station, access point, a personal computer (PC), a desktop computer, a computerized kiosk, an automotive/aeronautical/maritime in-dash computer terminal (stationary in relation to vehicle which can move), and/or a smart device/appliance—such as, for example, smart lighting device, smart door lock, smart home security system, smart refrigerator, etc. In one or more aspects of the present disclosure, the communication device 900 may be a non-stationary device, including, for example, a vehicle (e.g., automobiles, nautical vessels, aircraft, motorcycles, bicycles, etc.), drones, robots, balloons, satellites The transmitter 10910 and receiver 10925 can each include processor circuitry that is configured for transmitting/receiving wireless communications conforming to one or more wireless protocols, or in the wired configuration, configured for transmitting/receiving wired communications conforming to one or more wired protocols.

In exemplary aspects, the transmitter 10910 and receiver 10925 can each include (but are not limited to) a digital signal processor (DSP), modulator and/or demodulator, a digital-to-analog converter (DAC) and/or an analog-to-digital converter (ADC), and/or a frequency converter (including mixers, local oscillators, and filters) that can be utilized in transmitting and/or receiving of wireless communications. Further, those skilled in the relevant art(s) will recognize that antennas may include an integer array of antennas, and that the antennas may be capable of both transmitting and receiving wireless communication signals.

In decoding systems, there can be a tradeoff between different parameters, e.g.

performance is weighed against latency. For example, decoding algorithms can provided high performance with a cost to latency, throughput or power. Alternatively, algorithms can provide low-latency and high throughput at the cost of performance. The Belief propagation (BP) algorithm provides low-latency as well as high throughput. However, the performance of polar codes when decoded by the BP decoding algorithm is generally less than when compared to low-density parity-check (LDPC) codes. Successive cancellation list (SCL) decoding provide increases in performance but result in high latency and relatively low throughput due to the successive nature of the algorithm.

With SCL decoding, the list size can be limited (e.g. 8, 16, 32, etc.). In this example, the metrics maintained for the various paths are pruned (e.g. reduced) so that only the number of best metrics corresponding to the list size are kept. With SCL decoding, the execution time scales linearly with the list size and also includes time due to the list administration.

In exemplary aspects, one or more decoding algorithms are combined with error detection and/or correction algorithms, such as checksums, parity bits, cyclic redundancy checking (CRC), or one or more other error checking/correction algorithms as would be understood by of ordinary skill in the arts.

Exemplary aspects of the present disclosure include a variable multi-bit (m-bit) decoding system configured to perform node classification. For example, the decoder can be configured to perform multi-bit decoding and variable rate-node classification, which advantageously reduces the latency by approximately 80% compared to that of a conventional SCL decoder of the same list size and code size.

In an example, where 'm' is fixed, the whole codeblock is divided into smaller nodes each of size 'm' bits. For decoding each of these nodes, the last log 2(m) 'LLR update' stages can be combined so that it could be done in 1 cycle. This results in reduction of latency from 2N-2 clock cycles to 3N/m clock cycles. In this example, with larger value of 'm' to reduce the decoding latency, the Path Metric (PM) computation complexity and sorting block complexity increase exponentially.

In an exemplary aspect, the decoding system is configured to divide the code block into several smaller nodes of different types and sizes (i.e. 'm' bits is not fixed) based on the Polar code construction (frozen bit pattern). In this example, nodes of different types have different PM computation/sorting complexities. Advantageously, the decoding system according to exemplary aspects include the allocation of an increased node size (e.g. the maximum node size) to a node type that has the least PM computation/sorting complexity. In this example, the decoding system realizes a decoding of that node with a significantly lower latency and hardware cost (also possibly lower power requirements) when compared to the fixed m-bit decoding approach.

Table 1 shows a comparison of decoding latency (in clock cycles) for different code block sizes of the basic SCL decoder, modified SCL decoder, and the decoder according to exemplary aspects.

TABLE 1

| | Comparison of Decoding Latency numbers | | |
|---|---|---|---|
| Code size (N) | Basic SCL-8 (in clock cycles) | Modified SCL (in clock cycles) | Present Disclosure (in clk cycles) |
| 128 | 510 | 105 | 113 |
| 256 | 1022 | 245 | 194 |
| 512 | 2046 | 423 | 346 |

Turning to FIGS. 201A-C, decoding systems 20100-20102 according to exemplary aspects of the present disclosure are illustrated.

The decoding system 20100 can include decoder 20115 communicatively coupled to a transceiver 20160 and controller 20105. The decoder 20115 can be configured to decode encoded/coded data (e.g. coded message, such as a polar code) received by the decoding system 20100 to generate decoded data. The coded data is received via the transceiver 20160. The decoded data can then be provided to the controller 20105. In an exemplary aspect, the decoding systems 20100-20102 components of a communication device, such a mobile device (e.g. user equipment), a base station, access point, or other wireless communication device as would be understood by one of ordinary skill in the art.

In an exemplary aspect, the transceiver 20160 includes processor circuitry that is configured to transmit and/or receive wireline communications and/or wireless communications via one or more wireless technologies, such as one or more 5th Generation (5G) wireless protocols, one or more cellular technologies (e.g. 3rd Generation Partnership Project's (3GPP) Long Term Evolution (LTE), one or non-cellular technologies (e.g. one or more IEEE's 802.11 protocols), and/or one or more communication technologies/ protocols as would be understood by one of ordinary skill in the art.

The transceiver 20160 can include one or more transmitters 20165 and one or more receivers 20170 that are configured to transmit and receive, respectively, wireline communications or wireless communications via one or more antennas 20175. Those skilled in the relevant art(s) will recognize that the transceiver 20160 can also include (but is not limited to) a digital signal processor (DSP), modulator and/or demodulator, a digital-to-analog converter (DAC) and/or an analog-to-digital converter (ADC), a frequency converter (including mixers, local oscillators, and filters), Fast-Fourier Transform (FFT), precoder, and/or constellation mapper/de-mapper that can be utilized in transmitting and/or receiving of wireless communications. Further, those skilled in the relevant art(s) will recognize that the antenna 20150 may include an integer array of antennas, and that the antenna 20175 may be capable of both transmitting and receiving wireless communication signals.

In an exemplary aspect, the decoder 20115 is configured to perform one or more decoding operations, including one or more successive cancellation list (SCL) decoding operations. The decoder 20115 is configured to decode polar codes, but is not limited thereto.

In an exemplary aspect, the SCL decoder 20115 includes one or more successive cancellation (SC) decoders 20120.1 to 20120.N as shown in FIGS. 201A-C. In an exemplary aspect, each of the SC decoders 20120.1 to 20120.N is configured to perform one or more SC decoding operations to decode encoded data (e.g. decode a coded message) and generate decoded data (e.g. message) corresponding to the encoded data (coded message). The number of SC decoders 20115 corresponds to the list size of the SCL decoder 20115. For example, if the SCL decoder 20115 is configured to include a list size of 8, the SCL decoder 20115 includes 8 or more SC decoders 20120. With a list size of 1, the SCL decoder 20115 is configured to function as an SC decoder. In one or more aspects, the SCL decoder 20115 is configured to selectively activate any number of the SC decoders 20120 to dynamically adjust the list size of the SCL decoder 20115.

In an exemplary aspect, the decoder 20115 (including one or more components of the decoder 20115) includes processor circuitry that is configured to perform one or more decoding operations to decode encoded data and generate decoded data corresponding to the encoded data. For example, the decoder can include or be implemented by one or more processors, such as a processor configured to perform Single instruction, multiple data (SIMD) processing.

In an exemplary aspect, the SCL decoder 20115 can be configured to perform decoding using one or more additional or alternative decoding methodologies, such as belief propagation (BP) decoding, fast simple successive cancellation (FSSC) decoding, maximum likelihood (ML) decoding, convolution decoding, low-density parity-check (LDPC) decoding, tail-biting convolution decoding, turbo decoding, Viterbi decoding, and/or one or more other decoding methodologies as would be understood by one of ordinary skill in the art.

In an exemplary aspect, the decoding systems 20100-20102 are configured to as variable multi-bit (m-bit) decoding systems configured to perform node classification to divide the code block into several smaller nodes of different types and sizes (i.e. 'm' bits is not fixed) based on the Polar code construction (frozen bit pattern). As described above the node types can include different path metric (PM) computation and/or sorting complexities. In an exemplary aspect, the code construction defines one or more frozen bit patterns within the codeword. In this example, the code construction includes the number of frozen bits and the number of information bits. The code construction can also include the specific location of the frozen bits with respect to the information bits.

FIG. 203B illustrates an exemplary codeword (e.g. 64 bit codeword), which includes frozen bits and information bits. In an exemplary aspect, the decoder 20115 is configured to analyze the code construction to classify or otherwise determine node types included in the codeword. In an exemplary aspect, the node types include: rate0 (all frozen bits), rate1 (all info bits), 1-info bit, 2-info bit and 3-info bit node, and/or one or more other node types as would be understood by one of ordinary skill in the relevant arts. In an exemplary aspect, the rate1 and 3-info bit node types are limited to node sizes of 4 bits. In an exemplary aspect, nodes have a minimum node size of, for example, 4 bits and a maximum node size of, for example, 32 bits, but is not limited thereto.

In an exemplary aspect, the separating/dividing/splitting of the codeword into the multi-bit sub-blocks includes allocating bits of the codeword into multi-bit sub-blocks based on path metric computation complexities of node types of the code construction. In an exemplary aspect, the bits to the codeword are allocated into the multi-bit sub-blocks such that more bits are allocated to those node types that have lower path metric and/or sorting computation complexities. For example, the decoder 20115 is configured to allocate the maximum number of bits to sub-blocks that correspond to node types that have the lower (or the lowest) complexities. With this allocation, the larger number of bits can be decoded in lower complexity decoding operations to thereby increase the performance of the decoder while reducing latency. In an exemplary aspect, a maximum number of bits are allocated to a node type having a minimum (metric and/or sorting) computation complexity.

In an exemplary aspect, the decoder 20115 further includes a decoding processor 20125 that is configured to perform node classification and divide/separate/split/allocate the codeword/codeblock into two or more sub-blocks. In exemplary aspects, the sub-blocks have different bit sizes (e.g. 'm' is not fixed), but is not limited thereto. In some aspects, the sub-blocks can have the same bit size. In an exemplary aspect, the decoding processor 20125 includes processor circuitry that is configured to perform node classification and/or codeword/codeblock division/separation/splitting.

In an exemplary aspect, the decoder 20115 further includes a verification processor 20130 that is configured to perform one or more error detection and/or error correction operations to detect one or more errors in decoded information and/or correct one or more errors in the decoded information. In an exemplary aspect, the verification processor 20130 is configured to perform one or more error detection and/or correction algorithms, such as a checksum, parity bit, cyclic redundancy checking (CRC), or one or more other error checking/correction algorithms as would be understood by of ordinary skill in the arts. For example, the verification processor 20130 can be configured to perform a cyclic redundancy check (CRC) on the decoded data. In an exemplary aspect, the verification processor 20130 includes processor circuitry that is configured to perform one or more error detection and/or error correction operations, including performing one or more other error checking/correction algorithms, to verify the integrity of the decoded data. Additionally or alternatively, although FIG. 201A shows the verification processor 20130 implemented within the decoder 20115, the verification processor 20130 can be implemented within the controller 20105 as shown in FIG. 201B and/or implemented a separate component separate from the controller 20105 and the decoder 20115 as shown in FIG. 201C.

In an exemplary aspect, the controller 20105 is configured to control the overall operation of the decoding system 20100/20101/20102, including controlling one or more operations of the component(s) of the decoding system (e.g. decoder 20115, transceiver 20160, etc.). In an exemplary aspect, the controller 20105 is configured to receive decoded data from the decoder 20115 and to perform one or more further processing operations on the decoded data. In aspects where the controller 20105 includes the verification processor 20130 (FIG. 201B), the controller 20115 is configured to perform one or more error detection and/or error correction operations, including performing one or more other error checking/correction algorithms, to verify the integrity of the decoded sub-block 20105. These error detection and/or correction operations can be performed in place of such operations being performed by the decoder 20115, or in connection with similar operations being performed by the decoder 20115.

In an exemplary aspect, the controller 20105 is configured to perform node classification and divide (and/or control the decoding processor 20125 and/or the decoder 20115 to divide) the codeword/codeblock into two or more sub-blocks. In an exemplary aspect, the controller 20105 is configured to cooperatively perform these operations with the decoding processor 20115, or can perform these functions instead of the decoding processor 20115. When the controller 20125 is configured to solely perform the classification and dividing operations, the decoder 20115 can omit the decoding processor 20125. In an exemplary aspect, the decoding processor 20125 is included in the controller 20105 instead of, or in additionally to the decoder 20115.

In an exemplary aspect, the controller 20105 includes processor circuitry that is configured to perform one or more operations and/or functions of the controller 20105, including controlling one or more components of the decoding system, and/or performing the classification and dividing operations.

In aspects where the system includes an encoder 20110, the controller 20105 can be configured to provide data to the encoder 20110. In this example, the encoder 20110 can be configured to encode the received data to generate encoded data. The encoder 20110 can then provide the encoded data to the transceiver 20160 for subsequent transmission. In an exemplary aspect, the encoder 20110 includes processor circuitry that is configured to perform one or more operations and/or functions of the encoder 20110. These operation(s) and/or function(s) can include operation(s)/function(s) that are the corresponding inverse operations and/or functions performed by the decoder 20115.

Turning to FIG. 202, a decoding system 20200 according to an exemplary aspect of the present disclosure is illustrated. The decoding system 20200 can be an aspect of the decoding systems 20100-20102.

In an exemplary aspect, the decoder system 20200 includes SC decoders 20120.1 to 20120.N (similar to those in decoding systems 20100-20102), a sorter 20250, and decoder finite state machine (FSM) 20255. In an exemplary aspect, the sorter 20250 and/or the decoder FSM 20255 are aspects of the decoding processor 20125.

In an exemplary aspect, one or more of the SC decoders 20120 include one or more processors (e.g. bank of processor engines, cores or threads) 20205, processor scheduler 20210, LLR memory 20215, pointer manager 22220, node-size-bit processor 20225, and path history memory 20245. In an exemplary aspect, the node-size-bit processor 20225 includes one or more lookup tables (LUTs) 20230, a penalty calculator 20235, and a sorter 20240. In operation, channel LLRs are received by the SC decoder(s) 20120, which are configured to determine decoded bits based on the LLRs.

With reference to FIG. 203A, an LLR update diagram according to an exemplary aspect is illustrated. In operation, the channel LLRs (e.g. from the demodulator) are provided input to the stage 0. In this example, a SC decoder includes $n=\log_2(N)$ 'LLR update' stages (excluding stage 0 which is the channel LLRs). Each stage consists of N/2 LLR processing units/elements, where each of them implement either f-function or g-function on two input LLRs to produce one LLR. In this example, $u_{sum}$ is the partial sum of the previously decoded bit estimates corresponding to the particular g-function. For every bit decoding, one updated LLR value would be coming out of the final stage and a hard decision would be made based on this LLR value to decode that bit. In an exemplary aspect, F and G functions satisfy the following the equations:

$$f(LLR1, LLR2) = \text{sign}(LLR1) * \text{sign}(LLR2) * \min(\text{abs}(LLR1), \text{abs}(LLR2))$$

$$g(LLR1, LLR2) = \begin{cases} LLR2 + LLR1, & \text{if } u_{sum} = 0 \\ LLR2 - LLR1, & \text{otherwise} \end{cases}$$

In the LLR update block, a stage s is activated $2^s$ times during the decoding process. When stage s is activated, a maximum of $2^{n-s}$ operations (either for g function computations) would be performed simultaneously. If one time step is assumed per stage activation and full parallelism for PE processing within each stage, the total number of time steps required to complete the computations of the f and g functions and LLRs are $$\sum_{s=1}^{n} 2^s = 2N - 2$$

SCL decoding has an increased performance compared to SC decoding. With SCL decoding, the channel LLRs are used to compute Path Metrics (PMs) which are used as the survival criteria for the candidate paths (bit sequence). The Path Metric (PM) for a candidate path 'l' at level/bit 'i' is computed as follows:

$$PM_l^{(i)} = \begin{cases} PM_l^{(i-1)}, & \hat{u}_i = \frac{1}{2}(1 - \text{sign}(L_n^{(i)}[l])) \\ PM_l^{(i-1)} + |L_n^{(i)}[l]|, & \text{otherwise} \end{cases}$$

In this example, at level i, if the l-th path does not follow the direction suggested by the LLR $L_n^{(i)}[l]$, it will be penalized by $|L_n^{(i)}[l]|$.

At any point during the decoding, candidate paths which having the lowest 'L' PMs can be chosen to be the surviving paths. At the end of decoding, the candidate path with the lowest PM is chosen to be the decoded bit sequence.

To reduce the latency, exemplary aspects include multi-bit decoding with node classification. For example, m-bit decoding according to the exemplary aspects, reduces the number of LLR update stages to log(N)-log(m). In an exemplary aspect, the 'm' LLR values are generated by the SC decoders 21020 and provided to the sorter 20250. The sorter 20250 can be configured to perform path metric computations for the different possible hypothesis of each survived paths (e.g. at most $2^m$ hypotheses per list/survived path) to determine the best 'L' candidate paths for subsequent decoding. In an exemplary aspect, the sorter 20250 includes a ML decoder that is configured to perform ML determinations to identify the best 'L' candidate paths.

In an exemplary aspect, the sorting operation of $2^m$L hypotheses based on PMs is done in two stages. The first stage of sorting is an "intra-list sorting" where all the hypotheses from the same list/parent survived path are sorted based on their respective path metrics (PMs). The second stage of sorting is an "inter-list sorting" which sorts $2^m$L hypotheses of all lists from the first stage sorter. The top 'L' hypotheses of the second stage sorter 20250 are selected by the sorter 20250 to be the surviving paths for next level of decoding. In an exemplary aspect, the node-size-bit processor 22025 (e.g. full radix sorter 20240) is configured to perform one or more sorting operations to sort all the hypotheses from the same list/parent survived path (e.g. intra-list sorting).

In an exemplary aspect, the total number of time steps to complete the LLR updates in the multi-bit parallel decoding case using full parallelism is $$\sum_{s=1}^{n-\log_2 m} 2^s + \frac{N}{m} = \frac{3N}{m} - 2$$

In this example, the second term N/m accounts for the PM computation (assuming 1 time step) for all possible hypotheses for each list/path.

In an exemplary aspect, latency of LLR update block may be reduced by using larger value for 'm' at a cost for increased complexity for the first stage and second stage sorting as the number of hypotheses to be sorted increases exponentially with respect to 'm'. In an exemplary aspect, m has a value of 4, but is not limited thereto.

In an exemplary aspect, using full parallelism for LLR update results in reduced utilization efficiency as most of the N/2 processors 20205 (e.g. bank of Pes) would be unused during the entire decoding. In this example, the number of processor 20205 required reduces exponentially as the decoding progresses from the first stage to the last stage. In an exemplary aspect, the number of processors 20205 is therefore reduced to P, where P<<N/2. In this example, although latency may increase, any increase would be insignificant.

In an exemplary aspect, the total number of time steps required to complete the LLR updates in the multi-bit parallel decoding case using only 'P' processors 20205 is:

$$\frac{3N}{m} + \frac{N}{P} * \log_2\left(\frac{N}{4P}\right).$$

In this example, the increase in latency $$\frac{N}{P} * \log_2\left(\frac{N}{4P}\right)$$

is insignificant with appropriate values of 'P'. In particular, the value of P determines the amount of trade-off between the PE utilization efficiency and latency.

Exemplary operations of the decoding systems 20100-20102 and 20200 are illustrated with reference to FIG. 204, which illustrates a flowchart of a decoding method according to an exemplary aspect of the present disclosure. The flowchart 20200 is described with continued reference to FIGS. 201-201C. The operations of the method are not limited to the order described below, and the various operations may be performed in a different order. Further, two or more operations of the method may be performed simultaneously with each other.

The method of flowchart 20200 begins at operation 20205 and transitions to operation 20210, where a code construction of a codeword is determined.

After operation 20210, the flowchart transitions to operation 20215, where node types within the codeword are determined based on the code construction of the codeword.

After operation 20215, the flowchart transitions to operation 20220, where computation complexities of node types are determined.

After operation 20220, the flowchart transitions to operation 20225, where bits of the codeword are allocated as multi-bit sub-blocks based on the computation complexities.

After operation 20235, the flowchart transitions to operation 20230, where decoding the sub-blocks to generate a decoded message corresponding to the codeword.

After operation 20230, the flowchart transitions to operation 20235 where the flowchart ends. The method can be repeated for a next codeword to be decoded.

Exemplary aspects include a flexible (scalable) low-latency, area-efficient and power-efficient polar encoder. In an exemplary aspect, the encoder can be used for uplink control information in User Equipment as well for downlink control/broadcast information in the base station (e.g. gNodeB). The encoder to one or more aspects is applicable for uplink control information encoding (e.g. over NR-PUCCH, over NR-PUSCH), downlink control information encoding (e.g. over NR-PDCCH), and/or downlink broadcast information encoding (e.g. over NR-PBCH), but is not limited thereto. These example applications are applicable for both uRLLC as well as eMBB services envisioned in Fifth Generation (5G) New Radio (NR).

In an exemplary aspect, the encoder is configured for variable amounts (e.g.

chunks/blocks) of input data and different code sizes. In this example, the encoder includes one or more re-usable primitives, where each primitive has a parametrizable number of XOR-bypass-flop pairs.

In an exemplary aspect, the encoder includes $N_{max}/2$ base primitives (e.g. primitives 20600 in FIG. 206), where $N_{max}$ is a maximum code size (e.g. 1024 bits, 512 bits, but not limited thereto). In exemplary aspects, the encoder is configured to reuse primitives by reconfiguring inputs and outputs of each of the primitives for each encoding stage. In this example, the reconfiguration based on the stage of encoding results in the reuse of the same Flops/XOR gates within the various primitives for every stage of the encoding process. With $N_{max}$ being parametrizable, the encoder according to exemplary aspects is scalable to support any code size, N (where N is a power of 2) that is less than or equal to $N_{max}$. In an exemplary aspect, $N_{max}$ is 1024 bits (e.g. when the encoder is implemented in a UE), 512 bits (e.g. when the encoder is implemented in a base station), or another bit size as would be understood by one of ordinary skill in the relevant arts.

The configurability and scalability of the primitive-based encoder advantageously increases area efficiency by reducing flops and gates (e.g. XOR) compared to conventional encoders as shown below in the following table, where N is the code size:

|  | # of flops | # of XOR gates |
|---|---|---|
| Conventional Polar encoder | $(N)*\log_2(N)$ | $(N/2)*\log_2(N)$ |
| Encoder of exemplary aspects | N | N/2 |

In an exemplary aspect, the encoder of the present disclosure includes an area efficiency improvement for the fifth generation (5G) new radio (NR) User Equipment (e.g. having $N_{max}$=1024) of 90% over the conventional encoder (e.g. $1-1/(\log_2(1024))*100=90\%$). Similarly, the encoder of the present disclosure includes an area efficiency improvement for the 5G NR base stations (gNodeB) (e.g. having $N_{max}$=512) of 88.9% over the conventional encoder (e.g. $1-1/(\log_2(512))*100=88.9\%$)

The primitive-based encoder of exemplary aspects also advantageously reduces latency compared to conventional encoders as shown in the following table. In this example, Latency (Clock Cycles)=$1+\log_2 N$, where N is the code size (1 corresponds to the number of clocks to get the input information bits, and $\log_2(N)$ corresponds to number of clocks to complete the polar encoding operation).

|  | Latency | |
|---|---|---|
| Code Size (N) | (# of Clocks) | microseconds @ 1 GHz Clock |
| 1024 | 11 | 0.011 |
| 512 | 10 | 0.010 |
| 256 | 9 | 0.009 |
| 128 | 8 | 0.008 |
| 64 | 7 | 0.007 |
| 32 | 6 | 0.006 |
| 16 | 5 | 0.005 |

FIG. 205 illustrates an encoding system according to an exemplary aspect of the present disclosure. In an exemplary aspect, the encoding system 20500 includes an encoder 20510 communicatively coupled to a transceiver 20560 and controller 20505. The encoding system 20500 can also include a decoder 20515 in one or more aspects. In an exemplary aspect, the transceiver 20560 is similar to the transceiver 20160 of FIGS. 201A-C. Further, the decoder 20515 can be an aspect of the decoder 20115 of the decoding systems 20100-21002 of FIGS. 201A-C.

The encoder 20510 can be configured to encode data (e.g. a message) to generate encoded data, such as a coded message (e.g. polar code). The coded data can be transmitted via the transceiver 20560. The data can be provided to the encoder 20510 by the controller 20505 and/or one or more other components of a system (e.g. communication device, such as a base station, access point, mobile device). In an exemplary aspect, the encoding system 20500 is a component of a communication device, such a mobile device (e.g. user equipment), a base station, access point, or other wireless communication device as would be understood by one of ordinary skill in the art.

In an exemplary aspect, the transceiver 20560 includes processor circuitry that is configured to transmit and/or receive wireline communications and/or wireless communications via one or more wireless technologies (similar to transceiver 20160).

The transceiver 20560 can include one or more transmitters 20565 and one or more receivers 20570 that are configured to transmit and receive, respectively, wireline communications and/or wireless communications via one or more antennas 20575.

In an exemplary aspect, the encoder 20510 is configured to perform one or more encoding operations to encode data, such as an input word, to generate encoded data (e.g. codeword). In an exemplary aspect, the encoder 20510 is configured to encode polar codes, but is not limited thereto. The encoder 20510 can be configured to encode data using one or more encoding methodologies, such as successive cancellation (SC) encoding, successive cancellation list (SCL) encoding, belief propagation (BP) encoding, fast simple successive cancellation (FSSC) encoding, maximum likelihood (ML) encoding, convolution encoding, low-density parity-check (LDPC) encoding, tail-biting convolution encoding, turbo encoding, Viterbi encoding, and/or one or more other encoding methodologies as would be understood by one of ordinary skill in the art.

In an exemplary aspect, the encoder 20510 includes processor circuitry that is configured to perform one or more encoding operations to encode data and generate encoded data corresponding to the un-encoded data. For example, the encoder 20510 can be configured to generate a codeword (e.g. polar code) corresponding to data provided to the encoder 20510 (e.g. from the controller 20505.

In an exemplary aspect, the encoder 20510 is configured for variable amounts (e.g. chunks/blocks) of input data and different code sizes. In this example, the encoder 20510 includes one or more re-usable primitives 20600 (FIG. 206), where each primitive 20600 has a parametrizable number of XOR-bypass-flop pairs.

In an exemplary aspect, the encoder 20510 includes $N_{max}/2$ base primitives (e.g. primitives 20600 in FIG. 206), where $N_{max}$ is a maximum code size (e.g. 1024 bits, 512 bits, but not limited thereto). In exemplary aspects, the encoder 20510 is configured to reuse primitives by reconfiguring inputs and outputs of each of the primitives 20600 for each encoding stage of the encoder 20510. In this example, the encoding stage corresponds to the stages of the code diagram (e.g. see FIG. 203A).

In an exemplary aspect, the reconfiguration based on the stage of encoding results in the reuse of the same Flops/XOR gates within the various primitives for every stage of the encoding process. With $N_{max}$ being parametrizable, the encoder 20510 according to exemplary aspects is scalable to support any code size, N (where N is a power of 2) that is less than or equal to $N_{max}$. In an exemplary aspect, $N_{max}$ is 1024 bits (e.g. when the encoder is implemented in a UE), 512 bits (e.g. when the encoder is implemented in a base station), or another bit size as would be understood by one of ordinary skill in the relevant arts.

In an exemplary aspect, the controller 20505 is configured to control the overall operation of the encoding system 20500, including controlling one or more operations of the component(s) of the decoding system (e.g. encoder 20510, transceiver 20560, etc.). In an exemplary aspect, the controller 20505 is configured to generate control signals to control the operation of the multiplexers 70610, 70620 (FIG. 206), such as to control the selection between external and feedback inputs. In an exemplary aspect, the controller 20505 is configured to control the reconfiguration of the inputs and outputs of the primitives 20600, as well as reordering of bits to generate the codeword.

In an exemplary aspect, the controller 20505 is configured to provide data to the encoder 20510 to be encoded. In an exemplary aspect, the controller 20505 includes processor circuitry that is configured to perform one or more operations and/or functions of the controller 20505, including controlling one or more components of the encoding system.

In aspects where the system includes a decoder 20515, the controller 20505 can be configured to receive decoded data that is decoded by the decoder 20515, as well as preform one or more further processing operations on the decoded data. In an exemplary aspect, the decoder 20515 includes processor circuitry that is configured to perform one or more operations and/or functions of the decoder 20515. These operation(s) and/or function(s) can include operation(s)/function(s) that are the corresponding inverse operations and/or functions performed by the encoder 20510.

FIG. 206 illustrates a primitive 20600 according to an exemplary aspect of the present disclosure. In an exemplary aspect, the primitive 20600 includes a first multiplexer 20610, second multiplexer 20620, first D-flip-flop (DFF) 20615, second D-flip-flop (DFF) 20625, and exclusive OR (XOR) logic gate 20605 (referred to as "XOR 20605" hereinafter).

The XOR 20605 is configured to receive a first feedback input and a second feedback input, and to XOR the inputs to generate an XOR output. The XOR output is provided to the '0' input of the multiplexer 20610. The second feedback input is coupled to the '0' input of the multiplexer 20620. The '1' input of each of the multiplexers 20610, 20620 is respective coupled to first and second external inputs. The multiplexers 20610, 20620 are each configured to multiplex their respective first ('0') and second ('1') inputs to generate a multiplexed output. The multiplexing of the first and seconds is controlled based on a control signal. The multiplexed outputs of the multiplexers 20610, 20620 are respectively provided to first and second DFFs 20615, 20625. The first and second DFFs 20615, 20625 are configured to captures the value of the D-input (respective multiplexed output) and output the captured input. In an exemplary aspect, the DFFs 20615, 20625 are configured to hold the output until a next captured valued. In an exemplary aspect, the DFFs 20615, 20625 can be referred to as a memory cell, a zero-order hold, or a delay line. In this example, the DFFs 20615, 20625 are configured as a delay flip-flop.

FIG. 207 illustrates an encoder 20700 according to an exemplary aspect of the present disclosure. The encoder 20700 can be an exemplary aspect of the encoder 20510.

In an exemplary aspect, the encoder 20700 includes two or more primitives 20600.1 to 20600.P, a finite state machine (FSM) 20710, and an input 20705. In this example, P has a maximum value of $N_{max}/2$.

The input 20705 (e.g. Polar Code Constructed Encoder Input) can be configured to receive data to be encoded, and to provide the data to the external inputs of corresponding primitives 20600.

The FSM 20710 is configured to receive the outputs of the primitives 20600, and dynamically provide the outputs as feedback information to selected feedback inputs of the primitives 20600. In an exemplary aspect, the FSM 20710 is configured to dynamically switch (reconfigure) couplings/connections between the outputs of the primitives 20600 and the feedback inputs of the primitives 20600. FIGS. 208A-D show an exemplary switch of various connections, which will be discussed in more detail below. That is, the connections/coupling shown in FIG. 207 are only one of many connection configurations.

In an exemplary aspect, the FSM 20710 is configured to reconfigure feedback inputs and outputs of each of the primitives 20600 based on the encoding stage of the encoder 20700. As the encoding stage changes, the FSM 20710 is configured to reconfigure the feedback inputs and outputs of each of the primitives 20600. In this example, the FSM 20710 reconfigures the intermediate outputs as input based on the encoding stage number (e.g. as the decoding traverses the code diagram or binary tree.

In an exemplary aspect, the FSM 20710 is a circuit, such as a digital circuit. In an exemplary aspect, the FSM 20710 is a programmable logic device, such as a programmable logic controller. In this example, FSM 20710 includes one or more logic gates, flip flops, and/or or relays. In an exemplary aspect, the FSM 20710 includes a register to store state variables, combinational logic that is configured to determine the state transition and determine the output of the FSM 20710. In an exemplary aspect, the FSM 20710 is a Richards controller, but is not limited thereto. In an exemplary aspect, the FSM 20710 includes processor circuitry that is configured to perform the functions and/or operations of the FSM 20710. In an aspect, the FSM 20710 is embodied in the controller 20505; the encoder 20510; or distributed between both the controller 20505 and the encoder 20510, where the segments cooperatively perform the functions of the FSM 20710.

In another aspect, the FSM 20710 includes software (e.g. computer code and/or instructions) that when executed by a processor (e.g. processor of controller 20505, and/or processor within encoder 20510) controls the processor to perform the functions and operations of the FSM 20710.

In an exemplary aspect, as illustrated in FIG. 207, the encoder 20700 is configured to reuse the same Flops/XOR gates within the primitives 20600 for every stage of the encoding process by reconfiguring the inputs to the primitives 20600 based on the stage of encoding.

FIGS. 208A-D illustrate a reconfiguration method of the primitives according to an exemplary aspect. In this non-limiting example, N=8 so that the encoder 20700 is configured with 4 (e.g. N/2) primitives. As will be understood, the encoder 20700 is not limited to N=8 and 4 primitives.

Figure 208A:
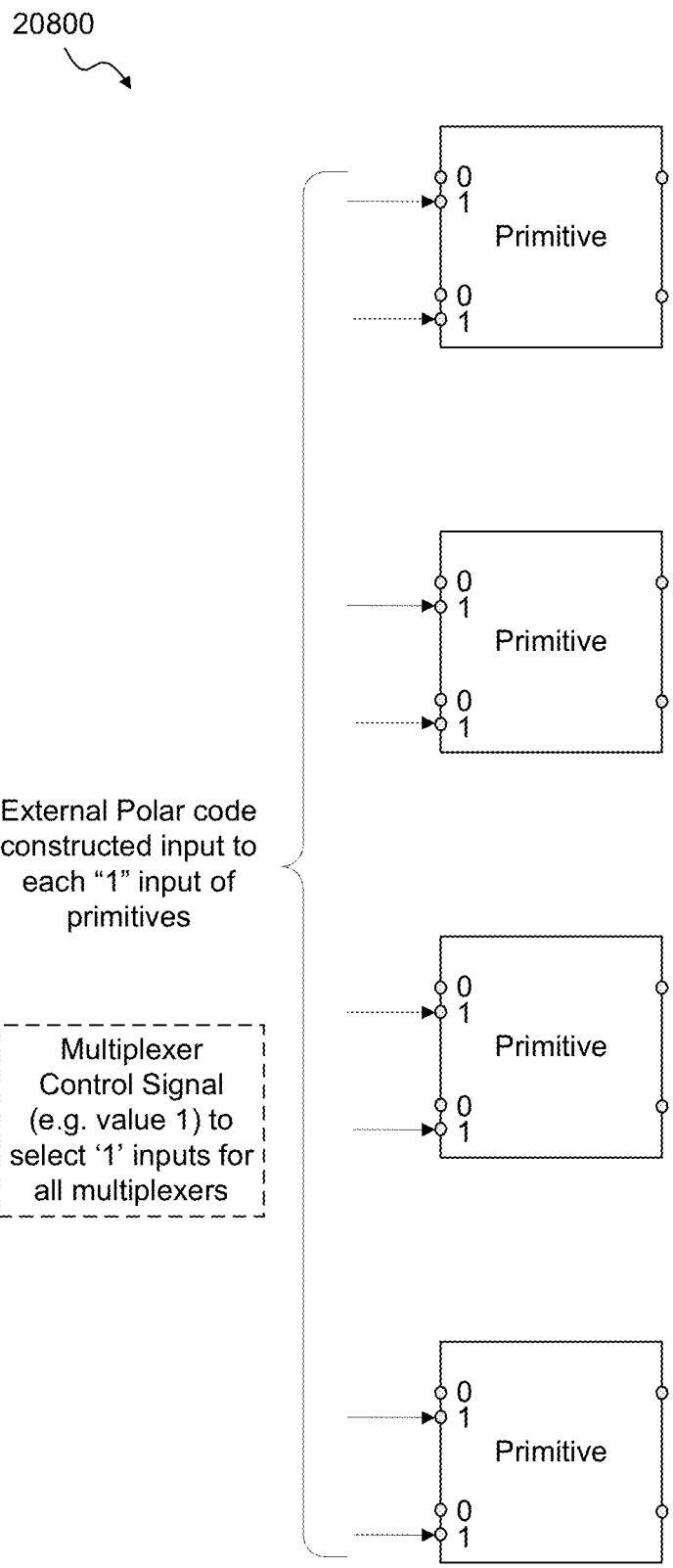

In an initial configuration 20800 shown in FIG. 208A, when the polar code constructed encoder $N_{max}$ sized input is ready, encoder 20700 (e.g. FSM 20710) is configured to detect the available input and set the multiplexer control signal to select the external inputs (e.g. input '1'). The external inputs are then passed to the DFF 20615, 20625 of the corresponding primitives 20600. The DFF 20615, 20625 captures the external polar code constructed encoder input in a single clock cycle. In an exemplary aspect, the FSM 20710 is configured to control all the storage flops based on the code size (N) to be encoded. Therefore, when N<$N_{max}$, The FSM 20710 is configured to activate only N relevant flops to be updated with the external input.

In a next configuration 20805 (e.g. Stage 1) shown in FIG. 208B, the FSM 20710 configures the primitives 20600 such that the output of the DFF 20615, 20625 spaced 1 bit ($2^{(stage-1)}=2^0$) apart are connected to the feedback input of each primitive. In this example, once the DFF 20615, 20625 have been populated with the N inputs, the FSM 20710 performs the $\log_2(N)$ stages of polar encoding by re-directing the primitive 20600 outputs from monotonically increasing pairs spaced $2^{(stage-1)}$ apart (where stage $\in [1, \log_2(N)]$) to the inputs of the primitives 20600. After the Stage 1 processing is complete, the output bits of the primitives 20600 are stored back into the DFF 20615, 20625.

In a next configuration 20810 (e.g. Stage 2) shown in FIG. 208C, the FSM 20710 configures the primitives 20600 such that the output of the DFF 20615, 20625 spaced 2 bits ($2^{(stage-1)}=2^1$) apart are connected to the feedback input of each primitive 20600. After the Stage 2 processing is complete, the output bits of the primitives 20600 are stored back into the DFF 20615, 20625.

Figure 208D:
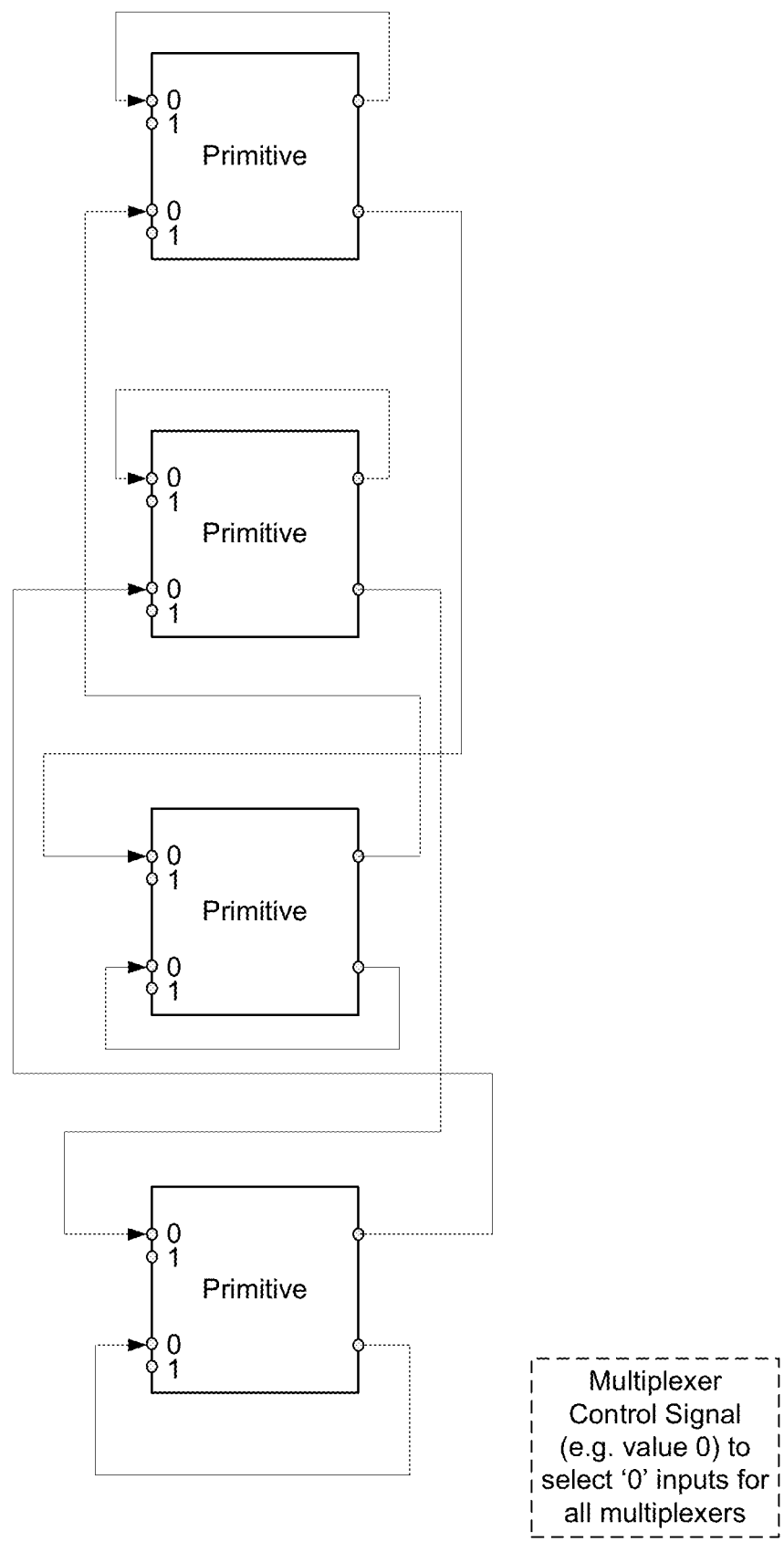

In a next configuration 20815 (e.g. Stage 3) shown in FIG. 208D, the FSM 20710 configures the primitives 20600 such that the output of the DFF 20615, 20625 spaced 4 bits ($2^{(stage-1)}=2^2$) apart are connected to the feedback input of each primitive 20600. After the Stage 3 processing is complete, the output bits of the primitives 20600 are stored back into the DFF 20615, 20625.

After the $\log_2(N)$ stages (e.g. $\log_2(8)=3$) of encoding is complete, the stored bits are in the order 0, N/2, 1, N/2+1, . . . N/2−1, N−1 due to the bit shift operations executed while reconfiguring the primitive 20600 inputs at each stage of encoding. In an exemplary aspect, the FSM 20710 is configured to reorder the bits to the natural bit order by grouping bits corresponding to all the even bit locations together followed by the odd bit locations. This reordering ensures that the final encoded bit stream output is again in the natural order. In an exemplary aspect, the bit shift operations at any of these stages of encoding as well as this output reordering stage do not require any additional hardware gates.

In encoding systems, code construction costs is the area (e.g. gates) weighed against the latency (in clock cycles). In operation, increased area results in lower latency, while latency increases at the cost of reducing area.

The polar code construction costs (Area (gates) and latency (in clock cycles)) for several configurations are summarized in the table below.

TABLE

Polar Code Construction - Comparison of Latency and Area numbers

| Code size (N) | Configuration 1 | | Configuration 2 | | Configuration 3 | |
|---|---|---|---|---|---|---|
| | Latency (Clock Cycles) | Area (kGates) | Latency (Clock Cycles) | Area (kGates) | Latency (Clock Cycles) | Area (kGates) |
| 128 | 293 | ~1000 | 1024 | ~130 | 43 | 75 |
| 256 | 562 | ~1000 | 2304 | ~130 | 47 | 75 |
| 512 | 1089 | ~1000 | 5120 | ~130 | 55 | 75 |
| 1024 | 2130 | ~1000 | 11264 | ~130 | 71 | 75 |

In a first configuration, moderate latency is achieved at the expense of an increased area impact. In an exemplary aspect, two sets of indices are generated: a first set of indices based on the reliability sequence and a second set of indices associated with the sub-block interleaver sequence based on the rate-matching scheme. In an exemplary aspect, the indices from the first set are compared against the second set. If present, those indices are removed. In an exemplary aspect, the removal operation is a set subtraction operation which takes '2*N' clock cycles and '2*N' bits of memory, where N is the code size (e.g. maximum value of N is 1024). In an exemplary aspect, the resulting set of indices are sorted in the order of reliability, and the 'k' most reliable indices are selected. This operation uses $$\left(\log\left(\frac{N}{2}\right)*\left(\log\left(\frac{N}{2}\right)+1\right)\right)/2$$

clock cycles in worst case and approximately 1 million gates (for N/2 element sorter). In an exemplary aspect, the 'k' most reliable bit indices are then sorted again to obtain a final set of indices. This final set of indices can be used to map the information bits to the polar encoder input. In this example, the worst case latency of this approach is $$2*N + \left(\log\left(\frac{N}{2}\right)*\left(\log\left(\frac{N}{2}\right)+1\right)\right)$$

clocks and requires 1 million gates.

In a second configuration according to an exemplary aspect, area is reduced, while resulting in an increase in latency. Initially, the same set subtraction operation as discussed in configuration can be performed. In an exemplary aspect, instead of a full parallel sorter, a serial sorter can be used of reduced areas, which would need at least $$\left(\frac{N}{2}\right)*\log\left(\frac{N}{2}\right)$$

clock cycles but requires reduced logic and memory. In this example, to sort the indices in terms of their reliability, LUT of 1024 10-bit entries can be used, which will add to the overall area. In this example, the worst case latency of this approach is $$N*\left(2+\log\left(\frac{N}{2}\right)\right)$$

clock cycles and requires 130 k gates approximately.

In an exemplary aspect, the latency is reduced while advantageously maintaining a reduced area. For example, as shown in the above Table, 71 clock cycles (worst case) and 75 k gates approximately to determine the polar code construction. The advantages of this configuration are summarized below:

| Configuration 3 Vs: | Relative Area savings (%) | Relative Latency savings (%) |
|---|---|---|
| Configuration 1 | 92.5 | 96.7 |
| Configuration 2 | 42.3 | 99.37 |

In an exemplary aspect, the polar code construction is dependent upon the reliability sequence, sub-block interleaver pattern and the rate-matching scheme. This ensures that the input bit indices of the polar encoder corresponding to the punctured/shortened output bits indices are set to 0. The setting of the bits to zero is referred to as bit pre-freezing.

FIG. 209 illustrates a polar encoding and rate-matching operation according to an exemplary aspect. In an exemplary aspect, the input bits are polar encoded (by the polar encoder 20915) based on the polar code construction 20910. The output of the polar encoder 20915 (e.g. the coded output) is provided to a sub-block interleaver 20920 that is configured to interleave the coded output to generate an interleaved output.

In an exemplary aspect, the rate matcher 20925 is configured to puncture/shorten the coded output. In an exemplary aspect, rate matching schemes include puncturing or shortening. With puncturing, the first few bits are dropped off. With shortening, the last few bits are dropped. In an exemplary aspect, the corresponding encoder output bit indices that are punctured/shortened (and hence the pre-frozen input bit indices) are determined based on the sub-block interleaver pattern.

FIG. 210 illustrates a rate matching operation 21000 using a puncturing scheme according to an exemplary aspect. In an exemplary aspects, the pre-frozen bits (PFBs) are identified. In this example, the polar encoder 20915 is configured to identify the PFBs. Based on the PFB identification, the sub-block interleaver 21020 can be configured to interleave the bits so that the PFBs are punctured (or shortened in a shortened scheme) by the rate matcher 21025. As shown in FIG. 210, the punctured bits are sorted to a first portion of the bit sequence so that the PFBs are captured within the bits dropped by the rate matcher 21025 in the puncturing operation.

In an exemplary aspect, based on the determined set of pre-frozen indices, the polar code is constructed by choosing the 'k' most reliable bit indices (using the reliability sequence) which are not included pre-frozen indices set. In this example, k is the number of payload bits. The payload bits are then mapped on to these 'k' input bit indices and encoded.

In an exemplary aspect, the polar encoder 20915, sub-block interleaver 20920, and rate matcher 20925 are implemented in encoder 20510 of FIG. 205. In this example, the encoder 20510 is configured to expand the frozen bit set to include puncture/shortened locations.

FIG. 211 illustrates a flowchart of an encoding method according to an exemplary aspect of the present disclosure. The flowchart 21100 is described with continued reference to FIGS. 205-210. The operations of the method are not limited to the order described below, and the various operations may be performed in a different order. Further, two or more operations of the method may be performed simultaneously with each other.

In describing the encoding method, the following non-limiting example parameters are used to illustrate the various operations of the encoding method, but the encoding method is not limited thereto.

In this example, K=8, E=22, N=32, payload bits={u0, u1, u2, u3, u4, u5, u6, u7}. The reliability sequence from lowest reliability to highest reliability is: Rel(n)=[0, 1, 2, 4, 8, 16, 3, 5, 9, 6, 17, 10, 18, 12, 20, 24, 7, 11, 19, 13, 14, 21, 26, 25, 22, 28, 15, 23, 27, 29, 30, 31]. The Sub-block Interleaver pattern J(n): [0, 1, 2, 4, 3, 5, 6, 7, 8, 16, 9, 17, 10, 18, 11, 19, 12, 20, 13, 21, 14, 22, 15, 23, 24, 25, 26, 28, 27, 29, 30, 31]. The interleaved bit indices that have not been punctured/shortened: J'(n) [20, 24, 19, 13, 14, 21, 26, 25, 22, 28, 15, 23, 27, 29, 30, 31]. N-E corresponds to the number of punctured/shortend bits.

The method of flowchart 21000 begins at operation 21005 and transitions to operation 21010, where a first bit mask is created. In an exemplary aspect, the first bit mask is created based on the payload size (k), code size (N), and rate matched output size (E). In an exemplary aspect, the first bit mask includes 1-values at the k+N−E most reliable indices as defined by the reliability sequence rel(n). The first mask can be referred to as "relBitMask." In an example, relBitMask=00000001000101110001111111111111.

At operation 21015, a second bit mask is created. In an exemplary aspect, the second bit mask is created based on interleaved bit indices that have not been punctured/shortened (e.g. J'(n)). The second bit mask can be reffered to as "rmMask." In an example, rmMask=00000000000001110001111111111111. In an exemplary aspect, the operations 21110 and 21115 are performed simultaneously. In other aspects, the operations 21110 and 21115 are performed sequentially.

After operation 21015, the flowchart transitions to operation 21020, where a composite bit mask based on the first and second bit masks are determined. In an exemplary aspect, the composite bit mask ("compMask") is determined based on a bitwise-AND operation of the first (relBitMask) and second (rmMask) bit masks. In this example, the compMask=00000000000001110001111111111111.

After operation 21020, the flowchart transitions to operation 21025, where the composite bit mask is reordered to generate a reordered composite bit mask ("compMask_reordered"). In an exemplary aspect, the composite bit mask is reordered based on the increasing order of reliability. In this example, compMask_reordered=00000000000000110011111111111111.

After operation 21025, the flowchart transitions to operation 21030, where the reordered composite mask is adjusted based on the payload size 1'. In an exemplary aspect, the values of the reordered composite mask are set to 0s for all 1-valued bit indices starting from (k+1)th 1-valued bit index counting from LSB to MSB to generate an adjusted composite mask "compMaskAdj."

In this example, the compMaskAdj=00000000000000000000000011111111.

After operation 21030, the flowchart transitions to operation 21035, the bits of compMaskAdj are translate from the reliability index order to the linear index order. In an exemplary aspect, the bits of compMaskAdj are re-permutated (re-ordered) to translate from the reliability index order to the linear index order ("compMask_linear_ordered"). In this example, compMask_linear_ordered=00000000000000010000001100011111.

After operation 21035, the flowchart transitions to operation 21040, where the polar encoder input is generated. In an exemplary aspect, the polar encoder input is generated by populating the 1-valued bit locations with the actual payload bits in linear order. In this example, Polar encoder input=000000000000000u0000000u1u2000u3u4u5u6u7.

After operation 21040, the flowchart transitions to operation 21045, where the flowchart ends.

The present disclosure relates to a data encoder and/or data decoder adapted for Polar Codes having an Order "N" space complexity. As an overview, Polar Codes for can be used by the new 5G NR radio standard, but are not limited thereto. Polar encoders can include a fast encoder and/or decoder with $O(N*(1+\log_2(N))$ time complexity.

5G has adopted Polar Codes for error correction codes for the control channel where data rates are reduced. In one or more aspects the encoder and/or decoder is implemented in hardware and/or software. In exemplary aspect, the encoder and/or decoder can be implemented in, for example, a hardware implementation such as a field-programmable gate array (FPGA) or an application-specific integrated circuit (ASIC), but is not limited thereto. The encoder and/or decoder can be configured to perform polar encoding for fifth-generation (5G) new radio (NR) communication systems resulting in small size, low cost, and low power. Although exemplary aspects are described with respect to 5G wireless technologies, the present disclosure is not limited thereto and is applicable to other communication standards and protocols as would be understood by one of ordinary skill in the relevant arts. Further, although polar codes are used for control channel encoding, the present disclosure is also applicable to data or other channel communications.

Polar Codes are a linear block code, and can be defined with a generator matrix. For example, the 5G NR radio standard specified in 3GPP TS 38.212 defines the Polar encoding as:

$$d = uG$$

Where the input row vector "u" and the output row vector "d" may be, for example, vectors of 1,024 elements, and "G" may be a dense matrix of size, for example, 1,024×1,024. Note that with Polar Codes, the size of the code, N, is a binary power, e.g., N=2, 4, 8, 16, 32, etc.

Brute force implementation of this equation results in an $O(N^2)$, "Order $N^2$," space and time complexity. A fast polar encoder (e.g. Arikan' s fast encoder) typically $O(N*(1+\log_2(N))$ time complexity and $O(N)$ space complexity.

Successive cancellation (SC) and its variant list version, Successive cancellation List (SCL) are some of the decoder methodologies for decoding polar codes. The complexity of SC decoder is $O(N \log_2(N))$ and the frame error rate is upper bounded by $o(2^{-\sqrt{N}+o(\sqrt{N})})$, where N is code size. With SC decoders, there can be a long delay because the decoder decodes bit by bit in a successive order. Aspects of the present disclosure reduce the latency to improve polar code decoding to provide a reduced latency decoder that complies with the stringent latency requirements of 5G.

In the present disclosure, the structure of polar codes can be modeled using a decoding or binary tree. In this tree structure, leaf nodes in the tree corresponds to the uncoded bits to be estimated by the decoder. In the tree structure, known data bits are referred to as frozen bits. With reference to FIG. 301, in aspects of the disclosure, special subsets of bits are identified as special nodes and decoded simultaneously (e.g. in parallel). For example, a non-leaf nodes of the binary tree whose children leaf nodes are all data bits can be identified as a Rate-1 node 30110. Similarly, a node whose descending leaf nodes are all known frozen bits can be identified as a Rate-0 node 30105. If all but one bits of the descending leaf nodes are frozen bits, the node can be identified as a Repetition node 30120. Further, a node whose descending leaf nodes include only one frozen bit can be identified as a single parity code (SPC) node 30115.

In operation, the bits in these special nodes (Rate-1, Rate-0, repetition and SPC) can be decoded together and the need to transverse sub-tree rooted at the node in a depth-first way can be avoided, which reduces the decoding time.

In an exemplary aspect, to further reduce the decoding time, additional special nodes (FIG. 302) can be identified that improve the parallelism of the decoder. For example, the additional special nodes can increase the parallelism of the polar decoder having, for example, a Single instruction, multiple data (SIMD) configuration.

As shown in FIG. 302, in an exemplary aspect, additional special nodes are identified. The nodes include Rate 1/4 node 30205, Rate 3/8 node 30210, Rate 1/2 node 30215, Rate 3/4 node 30220, and Rate 5/8 node 30225. In an exemplary aspect, polar codes are constructed by a single mother sequences. In this example, Rate¼ node 30205 includes two variations T0, T1; Rate 3/8 node 30210 includes three variations T0, T1, T2; Rate 1/2 node 30215 includes two variations T0, T1; and Rate 3/4 node 30220 includes two variations T0, T1. In an exemplary aspect, the nodes are identified at layer M-3, three layers up to the leaf nodes, but are not limited thereto.

In an exemplary aspect, the additional special nodes can be decoded in parallel by, for example a fully parallel maximum likelihood (ML) decoder. With the nodes being defined at a higher layer (e.g. at layer M-3: three layers up from the leaf nodes), the number of parallel processing by the parallel decoder is increased (e.g. 8 log-likelihood ratios (LLRs) can be computed in parallel). In contrast, with a node defined at layer M-1 (one layer from the leaf nodes), the parallel processing is limited to only two LLRs. With the increased parallelism (e.g. number of parallel operations), the decoding can be performed with reduced latency and higher throughput. That is, with the special nodes, there is no need to traverse the binary/decoding tree down to the bottom three layers in a depth first manner.

In an exemplary aspect, the decoder is configured to perform maximum likelihood (ML) decoding, including parallel ML decoding on the special nodes at the last third layer from the bottom (e.g. instead of SC/SCL decoding), which provides improved error performance. For example, the ML decoding according to aspects of the disclosure for an 8-bit fixed point implementation provides better performance than a double precision floating point simulation. For example, Table 1 shows decoder performance metrics using the decoder according to the aspects of the present disclosure.

TABLE 1

| Performance Metrics of Polar Decoder | | | | |
|---|---|---|---|---|
| CPU Frequency | 2.00E+09 | 2.00E+09 | 2.00E+09 | 2.00E+09 |
| code size | 1024 | 512 | 256 | 128 |
| code rate | 0.50 | 0.50 | 0.50 | 0.50 |
| decoder(cycle) | 12159 | 5595 | 3357 | 1775 |
| decoder through-put(bits/s) | 84217452.09 | 91510277.03 | 76258564.19 | 72112676.06 |

In an exemplary aspect, a polar code of length N is composed of two polar code of length N/2, so a binary/decoding tree can be used to represent the polar code as illustrated in FIGS. 303 and 306. For example, FIG. 306 shows a (16, 12) polar code represented as a binary/decoding tree. In this example, the white circles represent frozen bit, the black circles represent data bit.

The input to each node is the log-likelihood ratios (LLRs) LLR, and the corresponding outputs are the metrics. In each node of the decoding tree, the decoder (e.g. decoder 30415) is configured to perform various LLR calculations to obtain the estimated metrics. For example, the LLR calculations ($\alpha$) produce a corresponding metric ($\beta$). For the LLR calculations, calculations are performed from an upper node to a lower node, which produce a corresponding metric $\beta$ that is provided from the lower node of the tree to the upper node. This process is shown in FIG. 306. In an exemplary aspect, the $\alpha$ corresponds to a soft information vector (e.g. LLR vector) while the $\beta$ is the corresponding metric (e.g. codeword).

In an exemplary aspect, the decoder is configured to calculate the LLRs in the following sequence, which is described with respect to node 30605 in FIG. 306: calculate $\alpha_l$ and then calculate $\beta_l$ based on $\alpha_l$ in left branch. After finishing the left branch calculation, calculate $\alpha_r$ based on $\beta_l$ and $\alpha_v$, and then calculate $\beta_r$ in the right branch based on $\alpha_r$. Finally calculating $\beta_v$ based on $\beta_l$ and $\beta_r$. Similar operations are performed to obtain node 30610. Nodes 30605 and 30610 are then used to obtain node 30615.

In an exemplary aspect, the decoder 30415 is configured to perform a Successive-Cancellation Decoding for $\alpha_l$, $\alpha_r$, $\beta_v$. This calculation can be used in a fast simple successive cancellation plus maximum likelihood (FSSC+ML) decoding operation.

In an exemplary aspect, $\alpha_l$ in left branch is calculated using the following equation (min-sum algorithm):

$$\alpha_l[i]=\text{sgn}(\alpha_v[i])\text{sgn}(\alpha_v[i+N_v/2])\min\{\alpha_v[i],\alpha_v[i+N_v/2]\}$$

Where $i=1\sim(N_v/2)$, $N_v=2^{log2(N)-m}$, m is the layer index of decoding tree start counting from the layer of the root node. We have m=0 and $\log_2(N)-1$ for the root node and leaf nodes respectively.

In an exemplary aspect, $\alpha_r$ is calculated using the following equation:

$$\alpha_r[i]=\alpha_v[i+N_v/2]+(1-\beta_l[i])\alpha_v[i]$$

In an exemplary aspect, $\beta_v$ is calculated based on the following equation:

$$\beta_v[i] = \begin{cases} \beta_l[i] \oplus \beta_r[i] & \text{if } i < N_v/2 \\ \beta_r[i - N_v/2] & \text{else} \end{cases}$$

As shown in FIG. 304, the decoding system 30400 can include decoder 30415 communicatively coupled to a transceiver 30430 and controller 30405. The decoder 30415 can be configured to decode encoded data received by the decoding system 30400 via the transceiver 30430 to generate decoded data, which can be provided to the controller 30405.

In an exemplary aspect, the transceiver 30430 includes processor circuitry that is configured to transmit and/or receive wireline communications and/or wireless communications via one or more wireless technologies The transceiver 30430 can include one or more transmitters 30435 and one or more receivers 30440 that are configured to transmit and receive wireless communications, respectively, via one or more antennas 30450.

In an exemplary aspect, the decoder 30415 is configured to perform one or more fast simple successive cancellation plus maximum likelihood (FSSC+ML) decoding operations. The decoding operations are discussed in more detail below with reference to FIGS. 303-306. In an exemplary aspect, the decoder 30415 includes a maximum likelihood (ML) decoder 30420 and/or a fast simple successive cancellation (FSSC) decoder 30425 as shown in FIG. 304. The ML decoder 30420 can be configured to perform one or more ML decoding operations to decode encoded data and generate decoded data corresponding to the encoded data. The FSSC decoder 30425 can be configured to perform one or more FSSC decoding operations to decode encoded data and generate decoded data corresponding to the encoded data.

In an exemplary aspect, the decoder 30415 includes processor circuitry that is configured to perform one or more decoding operations to decode encoded data and generate decoded data corresponding to the encoded data. For example, the decoder can include or be implemented by one or more processors, such as a processor configured to perform Single instruction, multiple data (SIMD) processing. In an exemplary aspect, the decoder 30415 can be further configured to perform decoding using one or more additional or alternative decoding methodologies, such as successive cancellation list decoding, successive cancellation decoding, belief propagation (BP) decoding, convolution decoding, tail-biting convolution decoding, turbo decoding, Viterbi decoding, and/or one or more other decoding methodologies as would be understood by one of ordinary skill in the art.

In an exemplary aspect, the controller 30405 is configured to control the overall operation of the decoding system 30400, including controlling one or more operations of the component(s) of the decoding system 30400 (e.g. decoder 30415, transceiver 30430, etc.). In an exemplary aspect, the controller 30405 is configured to receive decoded data from the decoder 30415 and to perform one or more further processing operations on the decoded data. In aspects where the system includes an encoder 30410, the controller 30405 can be configured to provide data to the encoder 30410. In this example, the encoder 30410 can be configured to encode the received data to generate encoded data. The encoder 30410 can then provide the encoded data to the transceiver 30430 for subsequent transmission. In an exemplary aspect, the encoder 30410 includes processor circuitry that is configured to perform one or more operations and/or functions of the encoder 30410. These operation(s) and/or function(s) can include operation(s)/function(s) that are the corresponding inverse operations and/or functions performed by the decoder 30415.

In an exemplary aspect, the controller 30405 is configured to model the one or more polar codes to represent the polar codes as a corresponding decoding or binary tree. With reference to FIG. 301, the controller 30405 can be configured to identify one or more subsets of bits as a special node. For example, the controller 30405 can be configured to identify: non-leaf nodes of the binary tree whose children leaf nodes are all data bits as a Rate-1 node 30110, a node whose descending leaf nodes are all known frozen bits as a Rate-0 node 30105, and/or a Repetition node 30120 that includes a structure where all but one bits of the descending leaf nodes are frozen bits. Further, a node whose descending leaf nodes include only one frozen bit can be identified as a single parity code (SPC) node 30115.

In an exemplary aspect, to further reduce the decoding time by the decoder 30415, the controller 30405 is configured to identify one or more additional special nodes as shown in FIG. 302. This identification improves the parallelism of the decoder 30415. With continued reference to FIG. 302, in an exemplary aspect, the controller 30405 is configured to identify one or more additional special nodes that include: a Rate 1/4 node 30205, a Rate 3/8 node 30210, a Rate 1/2 node 30215, a Rate 3/4 node 30220, and/or a Rate 5/8 node 30225. In an exemplary aspect, the nodes are identified at layer M-3, three layers up to the leaf nodes.

In an exemplary aspect, the Rate 1/4 node 30205, Rate 3/8 node 30210, Rate 1/2 node 30215, Rate 3/4 node 30220, and Rate 5/8 node 30225 respectively correspond to polar codes in which 1/4, 3/8, 1/2, 3/4, and 5/8 of the leaf nodes are data bits. For example, as shown in FIG. 302, with polar codes that include 8 leaf nodes, 2 of the 8 (i.e. $1/4^{th}$) leaf nodes are data bits. Although the disclosure describes the polar codes with 8 leaf nodes, the exemplary aspects are not limited thereto and are applicable for polar codes of size $2^N$.

By identifying the special nodes, the complexity of the polar decoding/binary tree can be reduced as shown in FIG. 303. The reduction in complexity can also be referred to as the pruning of the (binary) tree. As illustrated, the special nodes 30310-30335 of the binary tree 30300 are identified by the controller 30405 to generate a reduced binary tree 30305. Similarly, as shown in FIG. 306, nodes 30605 and 30610 of the decoding tree 30600 are identified as Rate 1/4 and Rate 1 nodes, respectively. The decoder 30415 is configured to perform fast simple successive cancellation (FSSC) decoding on the node 30605 to calculate the metrics $\beta_v$ for node 30605. The decoder 30415 then performs parallel maximum likelihood (ML) decoding on the node 30610 to calculate the metrics $\beta_v$ for node 30610 to provide the reduced/pruned tree 30650. The decoder 30415 is then configured to perform FSSC decoding on the respective metrics $\beta_v$ for nodes 30605 and 30610 to calculate the metric $\beta_v$ for node 30615, which is used to determine the decoded data.

In an exemplary aspect, the decoder 30415 is configured to decode the identified nodes in parallel by, for example, a parallel maximum likelihood (ML) decoder 30420. In this example, the identified nodes (FIG. 302) are defined at a higher layer (e.g. at layer M-3: three layers up from the leaf nodes). Therefore, the ML decoder 30420 can increase the number of parallel processing operations that are performed by the ML decoder 30420. That is, in an exemplary aspect, the higher the layer up from the leaf nodes, the larger number of parallel processes that can be performed. For example, the amount of paralleled calculations decreases as the location within the decoding tree advances down the binary tree towards the leaf nodes. As shown in FIG. 306, the top of the binary tree is referred to as Layer 0, with the layer number increasing for each node down into the tree towards the leaf nodes (bottom of tree). That is, with each layer increase, the number of parallel processes performable by the decoder decreases. Given this characteristic, it has been advantageously realized that the higher up tree the identified special node is defined, the more parallel processing operations can be performed by the decoder. For example, the paralleled calculation amount of Layer 1's node 30605 is 8, while the paralleled calculation amount is 4 in Layer 2, and 2 in Layer 3.

Advantageously, by identifying the special nodes (FIG. 302) that are defined at increased layers within the binary tree, the parallelism of the ML decoder 30420 increases, which reduces latency and increases throughput of the decoder 30415. In this example, by employing the identified special nodes in the decoding operations, there is no need to traverse the binary/decoding tree down to the bottom three layers in a depth first manner.

FIG. 305 illustrates the operation of the ML decoder 30420 according to an exemplary aspect. In particular, FIG. 305 shows the operations performed by the decoder 30415, and more specifically the ML decoder 30420, in parallel ML decoding encoded data.

The operation of the ML decoder 30420 and corresponding decoder 30415 are described with reference to the decoding tree example in FIG. 306. In an exemplary aspect, an identified special node (e.g. nodes in FIG. 302) are provided from the controller 30405 to the decoder 30415 (more particularly to the ML decoder 30420). The ML decoder 30420 is configured to perform parallel ML decoding on the identified node (e.g. node 30610 in FIG. 306) to calculate the metrics $\beta_v$ for node 30610. The calculation is shown in an expanded view, which illustrates that eight ML decoding calculations corresponding to eight possible bit sequences of the four data bits on the leaf nodes branching from node 30610 are performed in parallel possibilities (e.g. calculations $D_1^{N_v}$ as provided below). In this example, there are 16 possibilities of the four data bits ($2^4$ possibilities). The other eight possibilities ($-D_0$ to $-D_7$) are opposite values of the first eight possible bit sequences ($D_0$ to $D_7$) as shown in FIG. 306.

In an exemplary aspect, the decoder 30415 is configured to perform parallel maximum likelihood (ML) decoding on the node 30610 to calculate indices $D_0$-$D_7$ of the bits. In this example, the parallel ML decoding includes 8 ML parallel processes (e.g. in a single instruction).

The decoder 30415 is configured to determine respective additive inverse pairs $-D_0$ to $-D_7$ of each of the indices $D_0$ to $D_7$. In an exemplary aspect, the decoder 30415 then determines a maximum index value $D_{max}$ from the indices and their respective additive inverses $\{D_0, -D_0, D_1, -D_1, D_2, -D_2 \ldots D_7, -D_7\}$. In an exemplary aspect, the decoder 30415 is configured to determine the metric $\beta_v$ for node 30610 based maximum index value $D_{max}$. In an exemplary aspect, the decoder 30415 is configured to determine the metric $\beta_v$ using a look-up table (LUT) that includes predetermined metrics $\beta$ and corresponding index values. In this example, the decoder 30415 can include a memory that stores the LUT, and/or the decoder 30415 accesses an external memory storing the LUT. In other aspects, the controller 30405 can include an internal memory and/or is configured to access an external memory to obtain the LUT values.

In an exemplary aspect, the decoder 30415 (FSSC decoder 30425) then performs FSSC decoding based on the metric $\beta_v$ for node 30605 and the metric $\beta_v$ for node 30615 to determine the decoded data.

In an exemplary aspect, the metrics $\beta$ are calculated based on the following equations for corresponding special nodes.

Repetition node (REP):

$$\beta_v[i] = \begin{cases} 0 & \text{if } \sum_{i=0}^{N_v-1} \alpha_v[i] \geq 0 \\ 1 & \text{else} \end{cases}$$

Single parity check node (SPC):

$$i_{min} = \arg(\min(|\alpha_i|))$$

$$\gamma = \bigoplus_{i=0}^{N_v} \left(\frac{1}{2}(1 - \text{sgn}(\alpha_i))\right)$$

$$\beta_v[i] = \begin{cases} \frac{1}{2}(1 - \text{sgn}(\alpha_i)) \oplus \gamma & \text{if } i = i_{min} \\ \frac{1}{2}(1 - \text{sgn}(\alpha_i)) & \text{else} \end{cases}$$

Rate 1/4, Rate 3/8, Rate 1/2, Rate 5/8's maximum likelihood (ML):

$$E_{min} = \min D_1^{N_v} \beta[i] = \{0,1\}, i \in \Omega$$

$$D_1^{N_v} = \sum_{i=1}^{N_v} (\alpha[i] - (1 - 2\beta[i]))^2$$

Where $\beta[I]$ is the polar encoder's output of special node.

FIG. 307 illustrates a decoding method according to an exemplary aspect of the present disclosure. The flowchart 30700 is described with continued reference to FIGS. 301-306. The operations of the method are not limited to the order described below, and the various operations may be performed in a different order. Further, two or more operations of the method may be performed simultaneously with each other.

The method of flowchart 30700 begins at operation 30705 and transitions to operation 30710, where a special node of encoded data is identified to prune decoding tree. In an exemplary aspect, the controller 30405 is configured to identify one or more special nodes (e.g. nodes in FIGS. 301, 302) and to prune the decoding/binary tree.

After operation 30710, the flowchart transitions to operation 30715, where the data bits of the special node are parallel maximum likelihood (ML) decoded to determine respective ML index values of the data bits. In an exemplary aspect, the ML decoder 30420 (of the decoder 30415) is configured to perform the parallel maximum likelihood (ML) decoding.

After operation 30715, the flowchart transitions to operation 30720, where respective additive inverse values are calculated of each of the ML index values to determine a set of ML index values. In an exemplary aspect, the ML decoder 30420 (of the decoder 30415) is configured to calculate the additive inverse values based on the ML index values.

After operation 30720, the flowchart transitions to operation 30725, where a maximum index value is calculated based on the set of ML index values. In an exemplary aspect, the ML decoder 30420 is configured to calculate the maximum index value by determining the largest index value within the set of index values.

After operation 30725, the flowchart transitions to operation 30730, where respective metric (($\beta$)) is determined based on the maximum index value. In an exemplary aspect, the ML decoder 30420 is configured to determine the metric based on the maximum index value. For example, the ML decoder 30420 can look up the metric in a LUT based on the maximum index value.

After operation 30730, the flowchart transitions to operation 30735, where it is determined if the decoding tree includes one or more additional special nodes. If so (YES at operation 30735), the flowchart transitions to operation 30740 where the determined metric is stored in memory. In exemplary aspect, the controller 30405 and/or the encoder 30415 determines if the decoding tree includes one or more additional special node. After the metric is stored, the flowchart returns to operation 30710, where the operations 30710 to 30730 are repeated on a next special node.

If the decoding tree does not includes one or more additional special nodes (NO at operation 30735), the flowchart transitions to operation 30745 where the stored metric (s) are successively decoded (e.g. FSSC) to determine decoded data. In an exemplary aspect, the FSSC decoder 30425 (of the decoder 30415) is configured to decode the stored metrics to determine the decoded data corresponding to the encoded data.

After operation 30745, the flowchart transitions to operation 30750 where the flowchart ends. The flowchart may be repeated for one or more next decoding operations.

In decoding systems, there can be a tradeoff between different parameters, e.g. performance is weighed against latency. For example, decoding algorithms can provided high performance with a cost to latency, throughput or power. Alternatively, algorithms can provide low-latency and high throughput at the cost of performance. The Belief propagation (BP) algorithm provides low-latency as well as high throughput. However, the performance of polar codes when decoded by the BP decoding algorithm is generally less than when compared to low-density parity-check (LDPC) codes. Successive cancellation list (SCL) decoding provide increases in performance but result in high latency and relatively low throughput due to the successive nature of the algorithm.

In exemplary aspects, one or more decoding algorithms are combined with error detection and/or correction algorithms, such as checksums, parity bits, cyclic redundancy checking (CRC), or one or more other error checking/correction algorithms as would be understood by of ordinary skill in the arts.

With SCL decoding, the list size can be limited (e.g. 8, 16, 32, etc.). In this example, the metrics maintained for the various paths are pruned (e.g. reduced) so that only the number of best metrics corresponding to the list size are kept. With SCL decoding, the execution time scales linearly with the list size and also includes time due to the list administration. Exemplary aspects reduce the execution time to thereby increase performance by reducing, for example, power dissipation, battery consumption, and/or latency.

In some decoding operations, successful decodes can be achieved with successive cancellation (i.e. with list size of 1). The corresponding success probability can be quantified by the block error rate (BLER) of the successive cancellation polar decoder.

Exemplary aspects take advantage of these properties to speed up decoding. For example, in an exemplary operation, a first decoding can be performed with, for example, a list size 1 (i.e., SC decoding). If this SC decoding fails (e.g. a verification such as a cyclic redundancy checking (CRC) fails), the list size is increased to, for example, 2. If the SCL decoding (list size=2) fails, the list size is further increased to, for example, 4, and the SCL decoding (list size=4) is performed. This decoding, verifying, and list size adjustment can be iteratively performed until the SCL decoding is successful. Thus, each time the decoder fails, its list size is adjusted (e.g. increased, such as doubled) for a new decode attempt. In some aspects, the list size can be limited to a maximum list size, such as 16, but is not limited thereto.

In one or more aspects, starting list size is set to list size of 1 (SC decoding), but is not limited thereto. For example, the starting list size can be set to a larger list size based on error/failure rates, channel conditions, and/or other characteristics as would be understood by one of ordinary skill in the relevant arts. For example, the decoding operation can be optimized, if the decoding increasingly fails with a list size of 1, to start at a higher list size so that a decoding (list size=1) is not unnecessarily performed given the likelihood that such decoding would be unsuccessful.

In an exemplary aspect, a metric can be maintained by, for example, observing the behavior of the error events. The metric can be used to estimate which lowest list size is most likely needed for successful decoding. With that knowledge the first decoding is done with a greater list size, thus avoiding unnecessary lower list sizes.

Turning to FIGS. 401A-C, decoding systems 40100-40102 according to exemplary aspects of the present disclosure are illustrated.

The decoding system 40100 can include decoder 40115 communicatively coupled to a transceiver 40160 and controller 40105. The decoder 40115 can be configured to decode encoded/coded data received by the decoding system 40100 to generate decoded data. The coded data is received via the transceiver 40160. The decoded data can then be provided to the controller 40105.

In an exemplary aspect, the transceiver 40160 includes processor circuitry that is configured to transmit and/or receive wireline communications and/or wireless communications via one or more wireless technologies The transceiver 40160 can include one or more transmitters 40165 and one or more receivers 40170 that are configured to transmit and receive wireless communications, respectively, via one or more antennas 40175.

In an exemplary aspect, the decoder 40115 is configured to perform one or more decoding operations, including successive cancellation (SC) decoding and/or successive cancellation list (SCL) decoding.

In an exemplary aspect, the decoder 40115 includes a successive cancellation list (SCL) decoder 40120 as shown in FIGS. 401A-C. In an exemplary aspect, the SCL decoder 40125 is configured to perform one or more SCL decoding operations to decode encoded data and generate decoded data corresponding to the encoded data. With a list size of 1, the SCL decoder 40125 is configured to function as an SC decoder.

In an exemplary aspect, the decoder 40115 can be configured to perform decoding using one or more additional or alternative decoding methodologies, such as belief propagation (BP) decoding, fast simple successive cancellation (FSSC) decoding, maximum likelihood (ML) decoding, convolution decoding, low-density parity-check (LDPC) decoding, tail-biting convolution decoding, turbo decoding, Viterbi decoding, and/or one or more other decoding methodologies as would be understood by one of ordinary skill in the art.

In an exemplary aspect, the decoder 40115 includes processor circuitry that is configured to perform one or more decoding operations to decode encoded data and generate decoded data corresponding to the encoded data. For example, the decoder can include or be implemented by one or more processors, such as a processor configured to perform Single instruction, multiple data (SIMD) processing.

In an exemplary aspect, the decoder 40115 further includes a verification processor 40130 that is configured to perform one or more error detection and/or error correction operations to detect one or more errors in decoded information and/or correct one or more errors in the decoded information. In an exemplary aspect, the verification processor 40130 is configured to perform one or more error detection and/or correction algorithms, such as a checksum, parity bit, cyclic redundancy checking (CRC), or one or more other error checking/correction algorithms as would be understood by of ordinary skill in the arts. For example, the verification processor 40130 can be configured to perform a cyclic redundancy check (CRC) on the decoded data. In an exemplary aspect, the verification processor 40130 includes processor circuitry that is configured to perform one or more error detection and/or error correction operations, including performing one or more other error checking/correction algorithms, to verify the integrity of the decoded data. Additionally or alternatively, although FIG. 401A shows the verification processor 40130 implemented within the decoder 40115, the verification processor 40130 can be implemented within the controller 40105 as shown in FIG. 401B and/or implemented a separate component separate from the controller 40105 and the decoder 40115 as shown in FIG. 401C.

In an exemplary aspect, the controller 40105 is configured to control the overall operation of the decoding system 40100, including controlling one or more operations of the component(s) of the decoding system 40100 (e.g. decoder 40115, transceiver 40160, etc.). In an exemplary aspect, the controller 40105 is configured to receive decoded data from the decoder 40115 and to perform one or more further processing operations on the decoded data. In aspects where the controller 40105 includes the verification processor 40130 (FIG. 401B), the controller 40115 is configured to perform one or more error detection and/or error correction operations, including performing one or more other error checking/correction algorithms, to verify the integrity of the decoded sub-block 40105. These error detection and/or correction operations can be performed in place of such operations being performed by the decoder 40115, or in connection with similar operations being performed by the decoder 40115.

In an exemplary aspect, the controller 40105 is configured to control the SCL decoder 40120 to adjust the list size used by the SCL decoder 40120 and/or configured to adjust the list size used by the SCL decoder 40120 and provide the SCL decoder 40120 with the adjusted list size. In an exemplary aspect, the controller 40105 is configured to control the SCL decoder 40120 to adjust the list size and/or adjust the list size based on the verification of the decoded data. For example, the list size can be adjusted if the verification of the decoded data indicates that the decoded data is invalid. In an exemplary aspect, the controller 40105 includes processor circuitry that is configured to perform one or more operations and/or functions of the controller 40105, including performing one or more error detection and/or error correction operations, controlling the SCL decoder 40120 to adjust the list size used by the SCL decoder 40120 and/or adjusting the list size used by the SCL decoder 40120 and providing the SCL decoder 40120 with the adjusted list size.

In an exemplary aspect, the decoding, verifying, and adjustment of the list size is iteratively (e.g. repeatedly) performed until the coded data is successfully decoded. For example, the SCL decoder 40120 can be configured to set an initial list size (e.g. list size having a valve of 1) and perform an SCL decoding on the coded data. In an exemplary aspect, the initial list size can be set based on error/failure rates, channel conditions, and/or other characteristics as would be understood by one of ordinary skill in the relevant arts. For example, the decoding operation can be optimized if the decoding increasing fails with a list size of 1 to start at a higher list size so that a decoding (list size=1) is not unnecessarily performed given the likelihood that such decoding would be unsuccessful. In this example, the SCL decoder 40120 and/or the controller 40105 determines the initial list size based on error/failure rates of previous decoding operations, previous, current, and/or estimated future channel conditions, and/or other characteristics as would be understood by one of ordinary skill in the relevant arts.

The controller 40105 (e.g. verification processor 40130 implemented within the controller 40105 as shown in FIG. 401B), the SCL decoder 40120 (e.g. verification processor 40130 implemented within the SCL decoder 40120 as shown in FIG. 401A), and/or a separate verification processor 40130 (FIG. 401C) can be configured to perform one or more error detection operations on the decoded data to detect one or more errors in decoded data to determine if the coded data has been successfully decoded. If the coded data was unsuccessful decoded, the controller 40105 can be configured to adjust the list size used by the SCL decoder 40120 and provide the SCL decoder 40120 with the adjusted list size. In an exemplary aspect, the controller 40105 is configured to control the SCL decoder 40120 to adjust the list size and/or adjust the list size based on the verification of the decoded data. For example, the list size can be adjusted if the verification of the decoded data indicates that the decoded data is invalid.

In an exemplary aspect, the controller 40105 is configured to control the SCL decoder 40120 to adjust the list size and/or adjust the list size after a portion of the coded data is decoded. For example, the coded data can include two or more portions, where after the first portion is decoded, the list size can be adjusted to a different list size. In this example, the controller 40105, SCL decoder 40120, and/or verification processor 40130 can determine whether the decoded data can be successfully decoded after a first portion of the decoded data has been decoded. In an exemplary aspect, metrics (e.g. log-likelihood ratios (LLRs)) of the decoded first portion can be analyzed (e.g. by the controller 40105 and/or SCL decoder 40120) to determine if the decoded data will likely be successfully decoded. For example, if differences between the metrics is below a threshold value, the list size can be adjusted (e.g. increased). If the difference between the metrics is above the threshold value, the list size can be adjusted (e.g. reduced) or kept the same. In these examples, the metrics can indicate the reliability of the decoding operations. In an exemplary aspect, the decoder 40115 (e.g. SCL decoder 40120) is configured to adjusted the list size. This adjustment can be independent of the controller 40115 or in cooperation with the controller 40115.

In an exemplary aspect, if it is determined that the complete decoded data will be unsuccessfully decoded, the list size can be adjusted (e.g. increased) for the decoding of the second and later portions of the coded data to increase the likelihood of a successful decoding of the decoded data. In this example, the metrics can be used to estimate which lowest list size is most likely needed for successful decoding. With that knowledge the first decoding is done with a greater list size, thus avoiding unnecessary lower list sizes.

In an exemplary aspect, the probability of a successful decoding can be quantified based on the block error rate (BLER) of the successive cancellation polar decoder.

In aspects where the system includes an encoder 40110, the controller 40105 can be configured to provide data to the encoder 40110. In this example, the encoder 40110 can be configured to encode the received data to generate encoded data. The encoder 40110 can then provide the encoded data to the transceiver 40160 for subsequent transmission. In an exemplary aspect, the encoder 40110 includes processor circuitry that is configured to perform one or more operations and/or functions of the encoder 40110. These operation(s) and/or function(s) can include operation(s)/function(s) that are the corresponding inverse operations and/or functions performed by the decoder 40115.

Exemplary operations of the decoding systems 40100-40102 are illustrated with reference to FIG. 402, which illustrates a flowchart of a decoding method according to an exemplary aspect of the present disclosure. The flowchart 40200 is described with continued reference to FIGS. 401-401C. The operations of the method are not limited to the order described below, and the various operations may be performed in a different order. Further, two or more operations of the method may be performed simultaneously with each other.

The method of flowchart 40200 begins at operation 40205 and transitions to operation 40210, where an initial (e.g. starting) list size is determined and/or otherwise set.

In an exemplary aspect, the SCL decoder 40120 and/or the controller 40105 is configured to set an initial list size ($L_S$), such as a list size of a valve of 1). The initial list size can be set based on error/failure rates, channel conditions, and/or other characteristics as would be understood by one of ordinary skill in the relevant arts.

After operation 40210, the flowchart transitions to operation 40215, where the received message (coded data) is decoded using an SCL decoding with the initial list size Ls to generate a decoded data corresponding to the coded data.

In an exemplary aspect, the decoder 40115 is configured to perform one or more SCL decoding operations to generate the decoded data. For example, the SCL decoder 40120 of the decoder 40115 performs the one or more SCL decoding operations with the initial list size $L_S$ to decode the encoded data to generate the decoded data.

After operation 40215, the flowchart transitions to operation 40220, where one or more error detection operations on the decoded data to determine if the coded data has been successfully decoded. That is, the validity/integrity of the decoded data is verified.

In an exemplary aspect, the controller 40105 (e.g. verification processor 40130 implemented within the controller 40105 as shown in FIG. 401B), the SCL decoder 40120 (e.g. verification processor 40130 implemented within the SCL decoder 40120 as shown in FIG. 401A), and/or a separate verification processor 40130 (FIG. 401C) is configured to perform one or more error detection operations on the decoded data (to detect one or more errors in decoded data) to determine if the coded data has been successfully decoded. If the data is successfully decoded (e.g. the decoded data is valid) (YES at operation 40225), the flowchart transitions to operation 40245 where the flowchart ends. The method can be repeated to decode additional coded data.

If the data is unsuccessfully decoded (e.g. the decoded data is invalid) (NO at operation 40225), the flowchart transitions to operation 40230, where the list size is adjusted (e.g. increased). The list size ($L_S$) is adjusted to an adjusted list size ($L_{ADJ}$). The adjusted list size ($L_{ADJ}$) can be larger or smaller than the list size ($L_S$).

In an exemplary aspect, the controller 40105 can be configured to adjust the list size used by the SCL decoder 40120 and provide the SCL decoder 40120 with the adjusted list size. In another aspect, the controller 40105 is configured to control the SCL decoder 40120 to adjust the list size and/or adjust the list size based on the verification of the decoded data. In another aspect, the decoder 40115 is configured to adjust the list size based on the verification of the decoded data.

After operation 40230, the flowchart transitions to operation 40235, where the coded data is decoded using an SCL decoding with the adjusted list size ($L_{ADJ}$) to generate a decoded data corresponding to the coded data.

After operation 40235, the flowchart returns to operation 40220, where one or more error detection operations are performed on the decoded data to determine if the coded data has been successfully decoded using the adjusted list size ($L_{ADJ}$). In an exemplary aspect, the operations 40220 to 40235 are iteratively performed until the coded data is successfully decoded. In one aspect, the operations are iteratively performed until either the coded data is successfully decoded or the list size is adjusted to a maximum list size.

Advantageously, the decoding system 40100-40102 and the corresponding decoding method 40200 improve the performance of the decoder 40115 by increasing the overall decoded speed by only using larger list size for SCL decoding if the lower list size(s) fail to successfully decode the coded data.

In decoding systems, there can be a tradeoff between different parameters, e.g. performance is weighed against latency. For example, decoding algorithms can provided high performance with a cost to latency, throughput or power. Alternatively, algorithms can provide low-latency and high throughput at the cost of performance. The Belief propagation (BP) algorithm provides low-latency as well as high throughput. However, the performance of polar codes when decoded by the BP decoding algorithm is generally less than when compared to low-density parity-check (LDPC) codes. Successive cancellation list (SCL) decoding provide increases in performance but result in high latency and relatively low throughput due to the successive nature of the algorithm.

In exemplary aspects, one or more decoding algorithms are combined with error detection and/or correction algorithms, such as checksums, parity bits, cyclic redundancy checking (CRC), or one or more other error checking/correction algorithms as would be understood by of ordinary skill in the arts.

With SCL decoding, the list size can be limited (e.g. 8, 16, 32, etc.). In this example, the metrics maintained for the various paths are pruned (e.g. reduced) so that only the number of best metrics corresponding to the list size are kept. With SCL decoding, the execution time scales linearly with the list size and also includes time due to the list administration. Exemplary aspects enhance list bifurcation and pruning of a decoding/binary tree to reduce processing time (e.g. CPU cycles) and overall latency of the decoding operation. In one or more aspects, conditional code is reduced in the decoder to reduce the CPU cycles and/or the pruning of metrics reduces or avoids the sorting of metrics to reduce CPU cycles.

In an exemplary aspect, to avoid the need for specialized hardware accelerators for decoding, the decoder can include an efficient software configuration. In this example, the software configuration can be fully flexible where the code parameters will be known at run-time only. In an exemplary aspect, to increase the efficiency, the decoder is configured to use as few CPU clock-cycles as possible.

With SCL decoding, a list-N decoding implies that up to N decoding processes are run concurrently. At each binary bit decision, a list of length L is bifurcated into length 2L. Once 2L exceeds N, the bifurcated list is pruned back from 2L entries back to N. In an exemplary aspect, the pruning is performed according to a metric for each path in the list that indicates the likelihood of the list member being correct. The top N likelihoods (e.g. metrics with the lowest values) are retained, while the lower L likelihoods (e.g. metric with the highest values) are "pruned." In an exemplary aspect, the metrics correspond to a "distance" to the most likely codeword, where the "closer" to the codeword is represented by the smaller metric values.

Exemplary aspects reduce or avoid the use of conditional execution (e.g. characterized by "if . . . else . . . end") that is slower in execution. For example, a decoder according to one or more aspects avoids the bifurcation altogether and is initialized with N lists which speeds up execution. With list pruning, a sorting process to select the best metrics consumes a significant number of CPU cycles. By reducing or avoiding the sorting of the metrics, the decoder according to exemplary aspects advantageously realizes a faster execution.

In an exemplary aspect, to overcome the initial bifurcation conditional execution (and allow a more streamlined template meta-program), an exemplary aspect includes a decoder configured to treat every step as though the list was completely filled to depth N.

In an exemplary aspect, the decoder includes or is implemented by one or more processors, such as a processor configured to perform Single instruction, multiple data (SIMD) processing and/or a graphics processing unit (GPU). Advantageously, the decoder (e.g. SIMD processor) reduces or incurs no cycle penalties. Further, the decoder can be configured to prune based on metrics that do not require a sorting to advantageously reduce the cycle-count.

FIG. 501A illustrates a decoding/binary tree according to an exemplary aspect. In particular, the tree 50100 includes a ½-rate length 16 (order-4) polar code, but is not limited thereto. The bits shaded in grey ($u_0$, $u_1$, $u_2$, $u_3$, $u_4$, $u_5$, $u_6$, $u_8$) are "frozen bits" with a known message value of binary 0. The remaining bits contain the codeword bits. In this example, the first and second sets of 8 leaf nodes have also been identified as a "repetition node" and a "single parity check node" for use in, for example, a Fast Simplified Successive Cancellation decoder.

In operation, a list-decoding will start at the first non-frozen bit $u_7$. In this example, there would be two possible (e.g. binary) choices: a '0' and a '1'. That is, at the first decoding operation, there are two entries in the list. Each entry will have a metric associated with it. In an exemplary aspect, a low metric implies a more likely path.

The formation of the metric can be implementation specific. In an exemplary aspect, the bifurcation is two binary choices:

"Correct" (true) decision—as determined by the bit-to-LLR (Log-Likelihood Ratio) mapping rule (e.g. as defined by the particular standard). For example, in 3GPP systems, a positive LLR maps to a binary '0'. The path metric for these decisions is not incremented. That is, the metric for the path is incremented by zero.

"Incorrect" (false) decision—This is the logical inverse of the "correct" decision, and the metric for this path is incremented by, for example, the absolute value of the LLR (e.g. $|LLR_x|$ or $abs(LLR_x)$).

An example list bifurcation is illustrated below with reference to FIG. 501A.

At $u_7$, there are two possible entries in the list:
{true}: metric=0
{false}: metric=$|LLR_7|$ At $u_9$ another binary decision is made. Here, the list already contains the two entries from $u_7$. After the bifurcation, there are four possible entries in the list:
{true, true}: metric=0
{true, false}: metric=$|LLR_7|$
{false, true}: metric=$|LLR_9|$
{false, false}: metric=$|LLR_7|+|LLR_9|$ After bit $u_{10}$ has been computed, there are eight possible list members:
{true, true, true}: metric=0
{true, true, false}: metric=$|LLR_7|$
{true, false, true}: metric=$|LLR_9|$
{true, false, false}: metric=$|LLR_7|+|LLR_9|$
{false, true, true}: metric=$0+|LLR_{10}|$
{false, true, false}: metric=$|LLR_7|+|LLR_{10}|$
{false, false, true}: metric=$|LLR_9|+|LLR_{10}|$
{false, false, false}: metric=$|LLR_7|+|LLR_9|+|LLR_{10}|$ After bit $u_{11}$ has been computed, there would be 16 possible list members.
{true, true, true, true}: $metric_0$=0
{true, true, true, false}: $metric_1$=$|LLR_7|$
{true, true, false, true}: $metric_2$=$|LLR_9|$
{true, true, false, false}: $metric_3$=$|LLR_7|+|LLR_9|$
{true, false, true, true}: $metric_4$=$0+|LLR_{10}|$
{true, false, true, false}: $metric_5$=$|LLR_7|+|LLR_{10}|$
{true, false, false, true}: $metric_6$=$|LLR_9|+|LLR_{10}|$
{true, false, false, false}: $metric_7$=$|LLR_7|+|LLR_9|+|LLR_{10}|$
{false, true, true, true}: $metric_8$=$0+|LLR_{11}|$
{false, true, true, false}: $metric_9$=$|LLR_7|+|LLR_{11}|$
{false, true, false, true}: $metric_{10}$=$|LLR_9|+|LLR_{11}|$
{false, true, false, false}: $metric_{11}$=$|LLR_7|+|LLR_9|+|LLR_{11}|$
{false, false, true, true}: $metric_{12}$=$0+|LLR_{10}|+|LLR_{11}|$
{false, false, true, false}: $metric_{13}$=$|LLR_7|+|LLR_{10}|+|LLR_{11}|$
{false, false, false, true}: $metric_{14}$=$|LLR_9|+|LLR_{10}|+|LLR_{11}|$ {false, false, false, false}: $metric_{15}=|LLR_7|+|LLR_9|+|LLR_{10}|+|LLR_{11}|$ In an exemplary aspect, N=8 so that the list of 16 is pruned back to a total length of 8 (e.g. max list depth $L_{DMAX}=8$). The pruning operation can include the formation of an ordered list of the metrics from lowest value to highest value, and a selection of the best (e.g. lowest) N metrics (e.g. the lowest 8 metrics in this example). The paths associated with the best metrics would then be chosen.

In an exemplary aspect, a bifurcation process from L=2 to 2N and pruning process is combined in a unified approach. For example, the bifurcation process followed by pruning stages can be replaced by one unified SIMD approach using one or more SIMD processors. With a SIMD configuration, reference is made to FIG. 502, which illustrates an LLR matrix according to an exemplary aspect. In this example, the vector of LLRs are converted into an array for SIMD operation. In an exemplary aspect, the decoder input LLRs are replicated by repeating the LLRs N-times. Here, N is the required list-depth. This converts the vector of LLRs into an array for SIMD operation resulting in the matrix 50200. Note that in FIG. 502, the SIMD depth is the same as the list-depth, but is not limited thereto. In an exemplary aspect, to increase efficiency, a list-depth (N) equal to an integer multiple of the SIMD width of the processor device is used, but is not limited thereto.

FIGS. 503A-503C illustrate a combined bifurcation and metric selection operation according to an exemplary aspect of the present disclosure. The bifurcation and selection operation is discussed with reference to the example codeword and decoding/binary tree shown in FIG. 501B. In this example, N=8 using list-8 SCL decoders. The SCL list of L=8 is bifurcated to 2L=16, and L (e.g. 8) indices of the bifurcated list (e.g. of 16) are selected using one or more fixed masked patterns. In an aspect with N=8 (list-8 decoders, three initial list selection masks are used. In an exemplary aspect, the number of initial masks satisfies the following equation:

Number of Masks=$\log_2 N$

In an exemplary aspect, three fixed mask patterns 50400, 50401, and 50402 (FIG. 504) are used to select the indices from the bifurcated list. Exemplary aspects are not limited to this example list size and number of decoders, and the present disclosure is adaptable to any $2^X$ (i.e. any integer power-of-2) list and decoder sizes. Here, the number of initial masks is X.

The combined bifurcation and pruning operation begins at the position of the first (unfrozen) codeword bit, which is $u_6$ in the example codeword shown in FIG. 501B.

For the first indices selection, the initial fixed mask #0 pattern 50400 is used to select indices with a {true, true, true, true, false, false, false, false} pattern as shown in FIG. 504.

For the second indices selection, the initial fixed mask #1 pattern 50401 is used to select indices with a {true, true, false, false, true, true, false, false} pattern as shown in FIG. 504.

For the third indices selection, the initial fixed mask #2 pattern 50402 is used to select indices with a {true, false, true, false, true, false, true, false} pattern as shown in FIG. 504.

Returning to FIG. 503A, for the indices selection, the surviving list indices of the SCL list of L=8 is bifurcated to 2L=16 to form new list indices 0-15. The new list indices are then selected using the initial fixed mask #0 pattern 50400 (i.e. MASK #0) to generate a masked list of the 8 best metrics that are selected based on the mask pattern. In this example, the masked list of 8 best metrics includes indices 0, 1, 2, 3, 12, 13, 14, and 15.

In an exemplary aspect, the indices selection includes merging of the lists and the associated metric and bit sequences, where each node is merged as decisions are propagated up the decoding/binary tree. In operation, the upper branch generates its own list and the lower branch generates its own list. The merging of the lists can satisfy the following equation:

LIST=LIST1(LIST2)

In an exemplary aspect, in merging of the lists, the left branch of the tree can return a sequence of bits that were generated from the incoming LIST. In generating these bits, generally, some of the incoming LIST entries were pruned away or retained with alternate bit-decisions.

An example of the list merging operation is provided as follows: The left branch will return, for example, LIST1=[0 1 2 3 3 4 4 7]. In this example, the survivor bits were taken from the incoming LIST at positions 0, 1, 2, 3, 3, 4, 4, 7. Positions 5 & 6 are pruned away and have fallen out of the list. The right branch will return, for example, LIST2=[0 0 1 1 2 2 3 3]. Here, the right branch's initial LIST input is LIST1. This correspond to the surviving list being LIST1 (LIST2).

In this example, LIST1(LIST2) is the vector LIST1=[0 1 2 3 3 4 4 7] but taken at the indices indicated by LIST2=[0 0 1 1 2 2 3 3]. That is, LIST1(LIST2) is LIST1 at position LIST2(0). An expanded merging example is provided below, where numerals 1-8 correspond to the order of the new merged list:

1. LIST(0): value of LIST1 at position 0 because LIST2(0)=0 =>0;
2. LIST(1): value of LIST1 at position 0 again because LIST2(1)=0 =>0;
3. LIST(2): value of LIST1 at position 1 because LIST2(2)=1 =>1;
4. LIST(3): value of LIST1 at position 1 again because LIST2(3)=1 =>1;
5. LIST(4): value of LIST1 at position 2 because LIST2(4)=2 =>2;
6. LIST(5): value of LIST1 at position 2 again because LIST2(5)=2 =>2;
7. LIST(6): value of LIST1 at position 3 because LIST2(6)=3 =>3;
8. LIST(7): value of LIST1 at position 3 again because LIST2(7)=3 =>3;

In this example, the surviving merged LIST is [0 0 1 1 2 2 3 3] as shown in the right most column. This surviving LIST is propagated up to the start of the next Left branch.

In an exemplary aspect, as illustrated in FIGS. 503A-503C, the list merging is based on the MOD(Ldmax). In this example, the MOD(Ldmax) function is used to prune the lists. For example, at the start of pruning, there may be 2Ldmax entries, where Ldmax is the maximum list depth (e.g. 8). The 2Ldmax list entries, before pruning, have been arranged such that entries 0 . . . 7 have been derived from entries 0 . . . 7 of the input list. They are the "true" decisions. Entries 8 . . . 15 have also been derived from entries 0 . . . 7 of the input list. They are the "false" decisions. When the indexes of the survivors have been computed (e.g. by the thresholding function), the origin of the survivors in the input list can be determined. For example, the modulo of the index with, for example, 8 (in this example). For example, if the index 9 was a survivor, then it originated from the input list at position 1 (e.g. 9 mod 8 is 1). Also, if index 8 was a survivor, then it originated from the input list at position 0 (e.g. 8 mod 8 is 0), etc.

In an exemplary aspect, the SCL decoder is recursive. In this example, at the bottom of the recursion, the lists are merged.

Based on the merged lists, a new list of surviving indices is generated.

Turning to FIG. 503B, the surviving list indices generated (from the process in FIG. 503A) are again bifurcated to 2L=16 to form new list indices 0-15. The new list indices are then selected using the initial fixed mask #1 pattern 50401 (i.e. MASK #1) to generate a masked list of the 8 best metrics that are selected based on the mask pattern. In this example, the masked list of 8 best metrics includes indices 0, 1, 10, 11, 4, 5, 14, and 15.

Again, merging of the lists and the associated metric and bit sequences is performed, where each node is merged as decisions are propagated up the decoding/binary tree. Based on the merged lists, a new list of surviving indices is generated.

Turning to FIG. 503C, the surviving list indices generated (from the process in FIG. 503B) are again bifurcated to 2L=16 to form new list indices 0-15. The new list indices are then selected using the initial fixed mask #1 pattern 50402 (i.e. MASK #2) to generate a masked list of the 8 best metrics that are selected based on the mask pattern. In this example, the masked list of 8 best metrics includes indices 0, 9, 2, 11, 4, 13, 6, and 15.

Again, merging of the lists and the associated metric and bit sequences is performed, where each node is merged as decisions are propagated up the decoding/binary tree. Based on the merged lists, a new list of surviving indices is generated.

FIG. 507 illustrates a flowchart of a combined bifurcation and metric selection method according to an exemplary aspect of the present disclosure. The flowchart 50800 is described with continued reference to FIGS. 501A-506C. The operations of the method are not limited to the order described below, and the various operations may be performed in a different order. Further, two or more operations of the method may be performed simultaneously with each other.

The method of flowchart 50700 begins at operation 50705 and transitions to operation 50710, where one or more initial fixed mask patterns are determined.

In an exemplary aspect, the SCL decoder 50620 and/or the controller 50605 (as shown in FIGS. 506A-C) is configured to determine one or more initial fixed mask patterns, such as the initial fixed mask patterns as shown in FIG. 504.

After operation 50710, the flowchart transitions to operation 50715, where the indices are selected based on a first of the determined masks.

In an exemplary aspect, the SCL decoder 50620 and/or the controller 50605 is configured to select the indices based on the first determined mask.

After operation 50715, the flowchart transitions to operation 50720, where the lists and the associated metric and bit sequences are merged, where each node is merged as decisions are propagated up the decoding/binary tree.

In an exemplary aspect, the SCL decoder 50620 and/or the controller 50605 is configured to merge of the lists and the associated metric and bit sequences.

After operation 50720, the flowchart transitions to operation 50725, where it is determined if there are additional mask(s). In an exemplary aspect, the SCL decoder 50620 and/or the controller 50605 is configured to determine if there are additional masks that have been determined.

If there are additional masks that have been determined (YES at operation 50725), the flowchart returns to operation 50710. Otherwise (NO at operation 50725), the flowchart transitions to operation 50730, where metrics are pruned based on a pruning threshold.

In an exemplary aspect, the SCL decoder 50620 and/or the controller 50605 is configured to prune the metrics based on the pruning threshold value (e.g. mean value of a subset of the metrics). In an exemplary aspect, the pruning of the metrics is performed based on the pruning method illustrated in FIG. 508.

After operation 50730, the flowchart transitions to operation 50735, where the flowchart ends. The flowchart can be repeated for one or more additional codewords.

In an exemplary aspect, with the selection using fixed mask patterns 50400, 50401, and 50402 reproduce the first 8 possible bit-decisions from a bifurcation and pruning operation. Advantageously, the selection of indices with the fixed mask patterns reduce or avoid the use of conditional execution (e.g. characterized by "if . . . else . . . end") that is slower in execution and/or reduces or incurs no cycle penalties to thereby reduce the cycle-count.

In an exemplary aspect, with reference to FIG. 505, after the initialization and selection of indices using the initial fixed mask patterns 50400, 50401, and 50402 a pruning operation that omits the sorting of the metrics to advantageously realizes a faster execution a reduction in cycle-count.

In an exemplary aspect, the pruning operation can include a bifurcation of the indices based on a forth pruning mask (e.g. mask #03) that includes L (e.g. 8) true decisions followed by L (e.g. 8) false decisions. In an exemplary aspect, the fourth pruning mask (i.e. Mask 3 in FIG. 505) is used for all subsequent pruning operations after the initial pattern masks for the codeword. In this example, the initial pattern masks are also applied to the bifurcated metrics 8-15 as shown in FIG. 505. In operation, the metrics are grown based on the false decisions patterns of the masks. The growth is illustrated as weights in the right-most column in FIG. 505. For example, the weight of the first row is 0 because the first row includes 0 false metric states (i.e. all 4 metrics are true metric states), the weight of the second row is 1 because the second row includes 1 false metric state, the weight of the third row is 1 because the third row includes 1 false metric state, the weight of the fourth row is 2 because the fourth row includes 2 false metric state, and so on. In this example, the number of false metric states for rows 0-7 corresponds to the number of "1" values within a 3-bit binary count from 0-7 (e.g. 000, 001, 010, 011, 100, 101, 110, 111).

In an exemplary aspect, once 2L exceeds N, the pruning from 2L metrics to N metrics is based on a pruning threshold value. In an exemplary aspect, the pruning threshold value is the mean of the accumulated weighted metrics as follows:

$$\text{Pruning Threshold Value} = \frac{1}{2L}\sum_{r=0}^{2L} W_r$$

Where W is the metric weight of the corresponding row r and L is the maximum list depth.

In an exemplary aspect, the pruning threshold value is the mean of a subset of the accumulated (e.g. 2L=16) weighted metrics. For example, the pruning threshold value can be the mean of L (e.g. 8) weighted metrics. The subset is not limited to L weighted metrics and can be another subset of weighted metrics as would be understood by one of ordinary skill in the art.

In an exemplary aspect, the pruning threshold value is the mean of a subset of the accumulated weighted metrics as follows:

$$\text{Pruning Threshold Value} = \frac{1}{L}\sum_{r=0}^{L-1} W_r$$

Where W is the metric weight of the corresponding row r and L is the maximum list depth.

Although the above equation calculates the mean of the weighted metrics from rows 0-7, the mean value can be calculated on any subset (e.g. any 8) of the weighted metrics.

In an exemplary aspect, the pruning threshold value is the mean of weighted metrics for entries (rows) 1-9 out of rows 0-15. In this example, the first row (row 0) is skipped and the mean is calculated by the next eight rows 1-9. Stated differently, the mean is calculated based on a second metric to an L+1 metric in a sequence of 0-2L metrics, where L is the SCL list size. In an exemplary aspect the pruning threshold value is the mean of the accumulated weighted metrics as follows:

$$\text{Pruning Threshold Value} = \frac{1}{L}\sum_{r=1}^{L+1} W_r$$

Where W is the metric weight of the corresponding row r and L is the maximum list depth.

FIG. 508 illustrates a flowchart of a combined bifurcation and metric selection method according to an exemplary aspect of the present disclosure. The flowchart 50800 is described with continued reference to FIGS. 501A-506C. The operations of the method are not limited to the order described below, and the various operations may be performed in a different order. Further, two or more operations of the method may be performed simultaneously with each other.

The method of flowchart 50800 begins at operation 50805 and transitions to operation 50810, where a pruning threshold value is determined based on the weighted metrics (e.g. a subset of the metrics).

In an exemplary aspect, the pruning from 2L metrics to L metrics is based on the pruning threshold value. In an exemplary aspect, the pruning threshold value is the mean of the accumulated weighted metrics. In an exemplary aspect, the pruning threshold value is the mean of a subset of the accumulated weighted metrics. For example, the pruning threshold value can be the mean of L (e.g. 8) weighted metrics. In an exemplary aspect, the pruning threshold value is the mean of weighted metrics for entries (rows) 1-9.

In an exemplary aspect, the SCL decoder 50620 and/or the controller 50605 is configured to determine the pruning threshold value based on the weighted metrics.

After operation 50810, the flowchart transitions to operation 50815, where P weighted metrics are selected that are less than the pruning threshold value. In an exemplary aspect, the selection is started from position 0 of the metrics. In an exemplary aspect, the SCL decoder 50620 and/or controller 50605 is configured to select the weighted metrics.

If P is equal to N (YES at operation 50820), where N is the required list depth (e.g. 8), the P metrics are selected and the flowchart transitions to operation 50840 and the flowchart ends. Otherwise (NO at operation 50820) the flowchart transitions to operation 50825.

At operation 50825, if is determined if the P metrics is greater than N. In this example, it is determine if more than N metrics have been selected. If P is greater than N (YES at operation 50825), the first N metrics are selected and the flowchart transitions to operation 50840 and the flowchart ends.

In an exemplary aspect, the selection of the indexes uses a likely distribution of the metric weights. Advantageously, by selecting the indexes based on the mean of the metrics as discussed herein (instead of the median value of the metrics), low-weight metrics are selected without requiring the metrics to be sorted (e.g. as is used for a threshold determined based on the median of the metrics). This advantageously realizes a faster execution a reduction in cycle-count.

Turning to FIGS. 506A-C, decoding systems 50600-50602 according to exemplary aspects of the present disclosure are illustrated. In one or more exemplary aspects, the decoding systems 50600-50602 are configured to perform the indices selection and pruning operations as described herein.

The decoding system 50600 can include decoder 50615 communicatively coupled to a transceiver 50660 and controller 50605. The decoder 50615 can be configured to decode encoded/coded data (e.g. codeword) received by the decoding system 50600 to generate decoded data. The coded data is received via the transceiver 50660. The decoded data can then be provided to the controller 50605. In an exemplary aspect, the decoder 50615 includes one or more input/output (I/O) interfaces, where the decoder 50615 is communicatively coupled to the transceiver 50660 and the controller 50605 via a respective I/O interface.

In an exemplary aspect, the transceiver 50660 includes processor circuitry that is configured to transmit and/or receive wireline communications and/or wireless communications via one or more wireless technologies The transceiver 50660 can include one or more transmitters 50665 and one or more receivers 50670 that are configured to respectively transmit and receive wireline communications and/or wireless communications via one or more antennas 50675.

In an exemplary aspect, the decoder 50615 is configured to perform one or more decoding operations, including successive cancellation (SC) decoding and/or successive cancellation list (SCL) decoding.

In an exemplary aspect, the decoder 50615 includes a successive cancellation list (SCL) decoder 50620 as shown in FIGS. 506A-C. In an exemplary aspect, the SCL decoder 50625 is configured to perform one or more SCL decoding operations to decode encoded data and generate decoded data corresponding to the encoded data. With a list size of 1, the SCL decoder 50625 is configured to function as an SC decoder. In an exemplary aspect, the decoder 50615 (or SCL decoder 50620) is configured to determine one or more fixed mask patterns, such as fixed mask patterns 50400, 50401, and 50402. In an exemplary aspect, the decoder 50615 (or SCL decoder 50620) is further configured to select the indices from the bifurcated list based on the determined fixed mask patterns as illustrated in FIGS. 503A-C. In an exemplary aspect, the decoder 50615 (or SCL decoder 50620) is configured to merge the lists and the associated metric and bit sequences, where each node is merged as decisions are propagated up the decoding/binary tree. In one or more aspect, the controller 50606 is configured to alternatively perform the determination of the fixed mask pattern(s), selection of the indices from the bifurcated list based on the determined fixed mask patterns, and/or the merging of the lists and the associated metric and bit sequences. In another aspect, the controller 50606 is configured cooperatively perform one or more of these operation with the decoder 50615.

In an exemplary aspect, the decoder 50615 can be configured to perform decoding using one or more additional or alternative decoding methodologies, such as convolutional-list decoding, Reed-Solomon list decoding, successive cancellation decoding, belief propagation (BP) decoding, fast simple successive cancellation (FSSC) decoding, maximum likelihood (ML) decoding, convolution decoding, low-density parity-check (LDPC) decoding, tail-biting convolution decoding, turbo decoding, Viterbi decoding, and/or one or more other decoding methodologies as would be understood by one of ordinary skill in the art.

In an exemplary aspect, the decoder 50615 includes processor circuitry that is configured to perform one or more decoding operations to decode encoded data and generate decoded data corresponding to the encoded data. For example, the decoder can include or be implemented by one or more processors, such as a processor configured to perform Single instruction, multiple data (SIMD) processing. In an exemplary aspect, the decoder 50615 includes a memory that stores instructions, where the processor is configured to execute one or more of the instructions to perform one or more decoding operations. For example, the processor is configured to, based on the instruction(s) accessed from the memory, perform the determination of the fixed mask pattern(s), selection of the indices from the bifurcated list based on the determined fixed mask patterns, and/or the merging of the lists and the associated metric and bit sequences. In an exemplary aspect, the processor is a SIMD processor.

In an exemplary aspect, the decoder 50615 further includes a verification processor 50630 that is configured to perform one or more error detection and/or error correction operations to detect one or more errors in decoded information and/or correct one or more errors in the decoded information. In an exemplary aspect, the verification processor 50630 is configured to perform one or more error detection and/or correction algorithms, such as a checksum, parity bit, cyclic redundancy checking (CRC), or one or more other error checking/correction algorithms as would be understood by of ordinary skill in the arts. For example, the verification processor 50630 can be configured to perform a cyclic redundancy check (CRC) on the decoded data. In an exemplary aspect, the verification processor 50630 includes processor circuitry that is configured to perform one or more error detection and/or error correction operations, including performing one or more other error checking/correction algorithms, to verify the integrity of the decoded data. Additionally or alternatively, although FIG. 506A shows the verification processor 50630 implemented within the decoder 50615, the verification processor 50630 can be implemented within the controller 50605 as shown in FIG. 506B and/or implemented a separate component separate from the controller 50605 and the decoder 50615 as shown in FIG. 506C.

In an exemplary aspect, the controller 50605 is configured to control the overall operation of the decoding system 50600, including controlling one or more operations of the component(s) of the decoding system 50600 (e.g. decoder 50615, transceiver 50660, etc.). In an exemplary aspect, the controller 50605 is configured to receive decoded data from the decoder 50615 and to perform one or more further processing operations on the decoded data. In aspects where the controller 50605 includes the verification processor 50630 (FIG. 506B), the controller 50615 is configured to perform one or more error detection and/or error correction operations, including performing one or more other error checking/correction algorithms, to verify the integrity of the decoded sub-block 50605. These error detection and/or correction operations can be performed in place of such operations being performed by the decoder 50615, or in connection with similar operations being performed by the decoder 50615.

In one or more aspect, the controller 50606 is configured to perform the determination of the fixed mask pattern(s), selection of the indices from the bifurcated list based on the determined fixed mask patterns, and/or the merging of the lists and the associated metric and bit sequences. In another aspect, the controller 50606 is configured cooperatively perform one or more of these operation with the decoder 50615. In an exemplary aspect, the controller 50605 is configured to control the SCL decoder 50620 to perform the determination of the fixed mask pattern(s), selection of the indices from the bifurcated list based on the determined fixed mask patterns, and/or the merging of the lists and the associated metric and bit sequences.

In aspects where the system includes an encoder 50610, the controller 50605 can be configured to provide data to the encoder 50610. In this example, the encoder 50610 can be configured to encode the received data to generate encoded data. The encoder 50610 can then provide the encoded data to the transceiver 50660 for subsequent transmission. In an exemplary aspect, the encoder 50610 includes processor circuitry that is configured to perform one or more operations and/or functions of the encoder 50610. These operation(s) and/or function(s) can include operation(s)/function(s) that are the corresponding inverse operations and/or functions performed by the decoder 50615.F FIG. 601 illustrates a message structure of a message 60100 according to an exemplary aspect of the present disclosure. In an exemplary aspect, the message 60100 includes one or more sub-blocks 60105. The sub-block 60105 can include symbols $U_1, \ldots, U_M$. In an exemplary aspect, the message 60100 can further include one or more checksums 60110. In an exemplary aspect, each sub-blocks 60105 includes a respective checksum 60110. As illustrated in FIG. 601, the corresponding checksum 60110 trails the sub-block 60105. In other aspects, the checksum 60110 precedes the sub-block 60105 or is including within its respective sub-block 60105. The location of the checksum 60110 can be segmented and located before, after, and/or within the sub-block 60105.

In an exemplary aspect, the checksum 60110 is an error detection and/or correction algorithms, such as a checksum, parity bit, cyclic redundancy checking (CRC), or one or more other error checking/correction algorithms as would be understood by of ordinary skill in the arts. Although examples are described with respect to CRCs, the present disclosure is not limited thereto. As shown in FIG. 601, each group 60105 of M symbols/information bits are protected by a separate checksum (e.g. CRC) 60110.

FIGS. 602A-B illustrate decoding systems 60200 and 60201 according to exemplary aspects of the present disclosure.

The decoding system 60200 can include decoder 60215 communicatively coupled to a transceiver 60260 and controller 60205. The decoder 60215 can be configured to decode encoded data received by the decoding system 60200 via the transceiver 60260 to generate decoded data, which can be provided to the controller 60205.

In an exemplary aspect, the transceiver 60260 includes processor circuitry that is configured to transmit and/or receive wireline communications and/or wireless communications via one or more wireless technologies.

The transceiver 60260 can include one or more transmitters 60265 and one or more receivers 60270 that are configured to respectively transmit and receive wireline communications and/or wireless communications via one or more antennas 60275.

In an exemplary aspect, the decoder 60215 is configured to perform one or more decoding operations, including successive cancellation (SC) decoding, successive cancellation list (SCL) decoding, and/or belief propagation (BP) decoding.

In an exemplary aspect, the decoder 60215 includes a belief propagation (BP) decoder 60220 and/or a successive cancellation list (SCL) decoder 60225 as shown in FIGS. 602A-B. The BP decoder 60220 can be configured to perform one or more BP decoding operations to decode encoded data and generate decoded data corresponding to the encoded data. The SCL decoder 60225 can be configured to perform one or more SCL decoding operations to decode encoded data and generate decoded data corresponding to the encoded data. With a list size of 1, the SCL decoder 60225 is configured to function as an SC decoder.

In an exemplary aspect, the decoder 60215 can be configured to perform decoding using one or more additional or alternative decoding methodologies, such as fast simple successive cancellation (FSSC) decoding, maximum likelihood (ML) decoding, convolution decoding, tail-biting convolution decoding, turbo decoding, Viterbi decoding, and/or one or more other decoding methodologies as would be understood by one of ordinary skill in the art.

In an exemplary aspect, the decoder 60215 includes processor circuitry that is configured to perform one or more decoding operations to decode encoded data and generate decoded data corresponding to the encoded data. For example, the decoder can include or be implemented by one or more processors, such as a processor configured to perform Single instruction, multiple data (SIMD) processing.

In an exemplary aspect, the decoder further includes a verification processor 60230 that is configured to perform one or more error detection and/or error correction operations to detect one or more errors in decoded information and/or correct one or more errors in the decoded information. In an exemplary aspect, the verification processor 60230 is configured to perform one or more error detection and/or correction algorithms, such as a checksum, parity bit, cyclic redundancy checking (CRC), or one or more other error checking/correction algorithms as would be understood by of ordinary skill in the arts. For example, the verification processor 60230 can be configured to perform a cyclic redundancy check (CRC) on the decoded sub-block 60105 based on the corresponding checksum 60110. In an exemplary aspect, the verification processor 60230 includes processor circuitry that is configured to perform one or more error detection and/or error correction operations, including performing one or more other error checking/correction algorithms, to verify the integrity of the decoded sub-block 60105. Although FIG. 602A shows the verification processor 60230 implemented within the decoder 60215, the verification processor 60230 can be implemented within the controller 60205 as shown in FIG. 602B in addition to, or alternatively to the decoder 60215.

In an exemplary aspect, the controller 60205 is configured to control the overall operation of the decoding system 60200, including controlling one or more operations of the component(s) of the decoding system 60200 (e.g. decoder 60215, transceiver 60260, etc.). In an exemplary aspect, the controller 60205 is configured to receive decoded data from the decoder 60215 and to perform one or more further processing operations on the decoded data. In aspects where the controller 60205 includes the verification processor 60230 (FIG. 602B), the controller 60215 is configured to perform one or more error detection and/or error correction operations, including performing one or more other error checking/correction algorithms, to verify the integrity of the decoded sub-block 60105. These error detection and/or correction operations can be performed in place of such operations being performed by the decoder 60215, or in connection with similar operations being performed by the decoder 60215.

In aspects where the system includes an encoder 60210, the controller 60205 can be configured to provide data to the encoder 60210. In this example, the encoder 60210 can be configured to encode the received data to generate encoded data. The encoder 60210 can then provide the encoded data to the transceiver 60260 for subsequent transmission. In an exemplary aspect, the encoder 60210 includes processor circuitry that is configured to perform one or more operations and/or functions of the encoder 60210. These operation(s) and/or function(s) can include operation(s)/function(s) that are the corresponding inverse operations and/or functions performed by the decoder 60215.

In an exemplary aspect, the controller 60205 and/or the decoder 60215 is configured to model one or more codes (e.g. polar codes). For example, the controller 60205 and/or decoder 60215 can be configured to model the code as a factor/decoding graph, and/or as a decoding/binary tree.

Exemplary operations of the decoding systems 60200/60201 are illustrated with reference to FIG. 603, which illustrates a flowchart of a decoding method according to an exemplary aspect of the present disclosure. The flowchart 60300 is described with continued reference to FIGS. 601-602B. The operations of the method are not limited to the order described below, and the various operations may be performed in a different order. Further, two or more operations of the method may be performed simultaneously with each other.

The method of flowchart 60300 begins at operation 60305 and transitions to operation 60310, where a received message is decoded using a first decoding process (e.g. BP decoding) to generate decoded sub-blocks.

In an exemplary aspect, the decoder 60215 is configured to perform one or more belief propagation (BP) decoding operations to generate decoded sub-blocks. For example, the BP decoder 60220 of the decoder 60215 performs the one or more BP decoding operations to decode encoded message to generate the decoded sub-blocks.

After operation 60310, the flowchart transitions to operation 60315 where one or more invalid decoded sub-blocks of the decoded sub-blocks are determined. That is, the validity/integrity of the decoded sub-blocks is verified.

In an exemplary aspect, the decoder 60215 is configured to perform one or more error detection and/or error correction operations to detect one or more errors in decoded sub-block(s) and/or correct one or more errors. In an exemplary aspect, the decoder includes a verification processor 60230 that is configured to perform the one or more error detection and/or error correction operations to detect one or more errors in decoded information and/or correct one or more errors.

In an exemplary aspect, the verification processor 60230 is configured to perform one or more error detection and/or correction algorithms, such as a checksum, parity bit, cyclic redundancy checking (CRC), or one or more other error checking/correction algorithms as would be understood by of ordinary skill in the arts. For example, the verification processor 60230 performs a cyclic redundancy check (CRC) on the decoded sub-block 60105 based on the corresponding checksum 60110. In other aspects, the controller 60205 includes the verification processor 60230 as shown in FIG. 602B in addition to, or alternatively to the decoder 60215.

If one or more invalid decoded sub-blocks are detected (e.g. error(s) are detected (YES at operation 60320), the flowchart transitions to operation 60330, where a second decoding process is performed on sub-block(s) of the message corresponding to the invalid decoded sub-block(s).

In an exemplary aspect, the decoder 60215 is further configured to perform one or more successive cancellation list (SCL) decoding operations on the sub-block(s) of the message corresponding to the invalid decoded sub-block(s) to generate decoded sub-blocks. For example, the SCL decoder 60225 of the decoder 60215 can perform the one or more SCL decoding operations to decode the sub-blocks 60105 of the message 60100 that fail to pass the CRC check.

In an exemplary aspect, if the BP decoding results in errors (e.g. the CRC check detects error(s) in the decoded sub-blocks), the corresponding coded sub-blocks of the message can be decoded again using a different decoding algorithm (e.g. SCL decoding). In this example, the second decoding stops once the symbols $U_1, \ldots, U_M$ (out of the K information symbols of the message) are decoded. That is, the SCL decoding outputs $\widehat{U_1}, \ldots, \widehat{U_M}$ given the sequential nature of the SCL decoding. The SCL decoding constructs a list by considering symbols sequentially, and a CRC check is performed on the paths that are on the list. Here, the paths correspond to $U_1, \ldots, U_M$.

In aspects where a checksum is not available, partial SCL decoding can be performed. In this example, the SCL decoder 60225 is configured to choose the most likely path on the list, without filtering paths that do not pass the CRC check. In an exemplary aspect, $2^M \geq L$, where L is the list size, but is not limited thereto.

In an exemplary aspect, the block length (message length) can be, for example, 1024 and the rate can be, for example, ½. In this example, the first, for example, 10 information bits $U_1, \ldots, U_{10}$ are protected by $CRC_1$. If an error is detected (operation 60315) after performing BP decoding (operation 60310), the SCL decoder 60225 decodes only those 10 bits (out of the 512 information bits) (operation 60330). In this example, the SCL decoder 60225 is configured to stop and choose the most likely path (of symbols $U_1, \ldots, U_{10}$) on the list that passes the parity check of $CRC_1$.

After operation 60330, the flowchart transitions to operation 60335, where the message 60100 is updated based on the sub-blocks decoded in the second (e.g. SCL) decoding. For example, the corresponding coded sub-blocks of the message are replaced with the decoded sub-blocks generated from the SCL decoding. In an exemplary aspect, the decoder 60215 (e.g. decoder 60220 and/or decoder 60225) is configured to replace corresponding coded sub-blocks of the message with the sub-blocks decoded by the second (e.g. SCL) decoding. In this example, the sub-blocks decoded by the SCL decoder 60225 correspond to the sub-blocks of the message in which the BP decoding was unsuccessful (e.g. the sub-blocks that did not pass the verification using the CRC). In an exemplary aspect, the decoder 60215 replaces information bits of message 60100 corresponding to the invalid decoded sub-block(s) with the decoded sub-block generated by the SCL decoder 60225 to update the message.

In an exemplary aspect, updating of the message 60100 includes replacing information bits of message 60100 corresponding to the determined invalid decoded sub-block(s) with the decoded sub-block(s) generated by the SCL decoder 60225 in the SCL decoding process. In this example, the replacing of information bits can include adding decisions of the decoded sub-block generated by the SCL decoder 60225 to the message 60100 as frozen bits.

With reference to FIG. 601, in an exemplary aspect, after decoding $\widehat{U_1}, \ldots, \widehat{U_M}$, the symbols $U_1, \ldots, U_M$ are removed from the set of information bits, and the decisions $\widehat{U_1}, \ldots, \widehat{U_M}$ are added to the set of frozen bits to update the message 60100.

In an exemplary aspect, the controller 60205 is configured to update the message 60100 based on the decoded information (e.g. decoded sub-block(s)) generated by the decoding performed by the SCL decoder (operation 60330). In one or more aspects, the controller 60205, the decoder 60215, or a combination of the controller 60205 and decoder 60215 are configured to update the message.

After operation 60335, the flowchart transitions to operation 60340, where the updated message is decoded using the first decoding process (e.g. BP decoding) to generate a decoded message corresponding to the coded message.

In an exemplary aspect, the decoder 60215 is configured to perform one or more belief propagation (BP) decoding operations to generate decoded sub-blocks corresponding to the decoded message. For example, the BP decoder 60220 of the decoder 60215 can perform the one or more BP decoding operations. In an exemplary aspect, the BP algorithm processes the coded message with the new frozen bits pattern obtained by the updating of the message (operation 60335). With the updated (increased) frozen bits in the message, the number of information bits of the message 60100 to be decoded is reduced, which reinforces the BP algorithm and boosts its performance.

In an exemplary aspect, the block length (message length) can be, for example, 1024 and the rate can be, for example, ½. In this example, the first, for example, 10 information bits $U_1, \ldots, U_{10}$ are protected by $CRC_1$. If an error is detected after performing BP decoding, the SCL decoder 60225 decodes only those 10 bits (out of the 512 information bits) and then stops and chooses the most likely path (of symbols $U_1, \ldots, U_{10}$) on the list that passes the parity check of $CRC_1$. The frozen bits pattern is updated and fed back to the BP decoder 60220, which decodes the entire sequence of information bits. When the BP decoder 60220 iterates over the factor graph (e.g. 30 times or so and the number of levels is 10), employing the partial SCL algorithm leads to a reduced latency (e.g. a latency on the same order as the one of the BP algorithm).

After operation 60340, the flowchart transitions to operation 60345, where the flowchart ends.

If no invalid decoded sub-blocks are detected (NO at operation 60320), the flowchart transitions to operation 60325, where the decoded sub-blocks generated by the initial BP decoding of the message (operation 60310) are provided as the decoded message. In this example, the BP decoding correctly decodes the message 60100 and the decoded information correctly corresponds to the coded message. After operation 60325, the flowchart transitions to operation 60345, where the flowchart ends.

Advantageously, the decoding system 60200 and the corresponding decoding method 60300 improve the performance of the BP decoder while maintaining the worst case latency within the same order as a conventional BP decoder. That is, the latency is decreased and the performance is increased. These benefits are provided by multi-CRC allows the SCL decoder 60225 to perform partial SCL decoding on part of the code to decode a subset of the information bits. The subset of information bits are used to freeze the decoded bits and running the BP decoder 60220 on the code with the new pattern of information bits. This advantageously boosts the performance.

FIGS. 604A-B illustrate decoding systems 60400 and 60401 according to exemplary aspects of the present disclosure. The decoding systems 60400 and 60401 are similar to the decoding systems 60200 and 60201, but further include a weighting processor 60405. Discussion of the common components may have been omitted for brevity. In one or more aspects, the decoding systems 60400 and 60401 may omit one or more components of the decoding systems 60200 and 60201.

In an exemplary aspect, the controller 60205 and/or the decoder 60215 is configured to model one or more codes (e.g. polar codes). For example, the controller 60205 and/or decoder 60215 can be configured to model the code as a factor/decoding graph, and/or as a decoding/binary tree. For example, FIGS. 605A and 605B illustrate a code modeled as factor graphs 60500 and 60501, respectively.

In an exemplary aspect, the weighting processor 60405 is configured to weight the coded message. For example, the weighting processor 60405 is configured to weight bits of the coded message. The bits can be weighted based on, for example, the reliability of the bits and/or one or more criterion as would be understood by one of ordinary skill in the art. In an exemplary aspect, the decoder 60215 is configured to represent the coded message as a factor graph, and the weighting processor 60405 weights the edges of the factor graph. FIG. 605A shows an example of a factor graph representation of the coded message. In this example, the heavier weighted edges are represented with thicker line weights of the factor graph.

In an exemplary aspect, the weighting processor 60405 is configured to weight the edges of the factor graph of polar codes to compensate for small cycles in the graph and to attain better flow of information. The weighting advantageously improves performance and provides low-latency and high-throughput.

In an exemplary aspect, the decoder 60215 (e.g. BP decoder 60220) is configured to perform one or more weighted BP decoding operations. The weighted BP decoding operations advantageously mitigates the effect of short cycles on the performance of polar codes under iterative decoding. Further, low-latency and high throughput are realized. Further, the weighted BP decoding operations modifies the propagation of information from less-reliable bits, such that their effect on the performance under BP decoding is reduced. In an exemplary aspect, the weighting processor 60405 is configured to adaptively adjust the weights between iterations.

In an exemplary aspect, the weighting processor 60405 of the decoder 60215 is configured to determine corresponding reliabilities of the edges (e.g. bits) of the coded message. In this example, weighting processor 60405 is then configured to weight the edges based on the corresponding reliabilities of the edges. In this example, the more reliable edges are weighted with a larger weight than less reliable edges, but is not limited thereto.

In an exemplary aspect, the weighting processor 60405 is configured to selectively weight the edges with equal weights, binary weights, or soft weights. In aspects where the edges are equally weighted, the decoder 60215 functions as a BP decoder that performs one or more BP decoding operations. In aspects where the edges are binary weighted (i.e. edges are weighted either with a weight of "0" or "1"), the decoder 60215 functions as a SC decoder that performs one or more SC decoding operations. In an exemplary aspect, the equal and binary weights modes function as bounds of the decoder 60215. For example, the soft weights selectively configure the decoder 60215 to perform one or more decoding operations to function as a combination that includes partial BP decoder functionality and partial SC decoder functionality. In an exemplary aspect, the decoder 60215 is configured to selectively weight the edges with soft weights that are determined based on the reliability of the edges. For example, more reliable edges are weighted heavier while less reliable edges are weighted less. In an exemplary aspect, a priori information about the reliability is collected from polar code data bit design based on the SC decoder.

In an exemplary aspect, the weighting processor 60405 is configured to select the weights randomly, select the weights based on a pattern of binary weights (e.g. a random pattern), by modeling the factor graph as a neural network, by training the weighting based on previously iterations (e.g. observations), based on a successive relaxation, or one or more other criterion as would be understood by one of ordinary skill in the relevant arts. FIG. 605B illustrates factor graph 60501 having edges that are weighted with a binary pattern. That is, some edges are turned off ("0" weight) represented by the light grey paths, while others are turned on ("1" weight) represented by solid black paths. As discussed above, the binary pattern can be determined, for example, randomly or based on one or more other criterion. In an exemplary aspect, the pattern can be adaptively adjusted over back and forth iterations of the BP decoding algorithm. In an exemplary aspect, the pattern can be determined to increase (e.g. maximize) the girth factor of the graph and reduce (e.g. avoid) short loops within the factor graph.

In an exemplary aspect, as shown in FIG. 604A, the weighting processor 60405 is included in the decoder 60215. In other aspects, the weighting processor 60405 is included in the controller 60205. In other aspects, both the decoder 60215 and the controller 60255 include the weighting processor 60405, where the weighting processors 60405 of the controller and decoder are collectively configured to perform the operations of the weighting processor 60405. In an exemplary aspect, the weighting processor 60405 includes processor circuitry that is configured to perform one or more functions and/or operations of the weighting processor 60405, including determine one or more reliabilities of the edges of the factor graph and to weight the edges based on one or more determined weights. The weights can be determined based on the determined reliabilities.

FIG. 606 illustrates a decoding method according to an exemplary aspect of the present disclosure. The flowchart 60600 is described with continued reference to FIGS. 601-605B. The operations of the method are not limited to the order described below, and the various operations may be performed in a different order. Further, two or more operations of the method may be performed simultaneously with each other.

The method of flowchart 60600 begins at operation 60605, and transitions to operation 60610, where reliabilities of edges of a coded message are determined. In an exemplary aspect, the decoder 60215 determined the reliabilities of the edges of the factor graph of the coded message. For example, the weighting processor 60405 is configured to determine the reliabilities.

After operation 60610, the flowchart transitions to operation 60615, where the edges are weighted based on the determined reliabilities. In an exemplary aspect, the weighting processor 60405 is configured to determine the weights based on the reliabilities.

After operation 60615, the flowchart transitions to operation 60620, where the weighted edges are decoded to generate a decoded message. In an exemplary aspect, the decoder 60215 is configured to decode the weighted edges to generate the decoded message.

After operation 60620, the flowchart transitions to operation 60625 where the flowchart ends. The flowchart may be repeated for one or more next decoding operations.

With SCL decoding, the list size can be limited (e.g. 8, 16, 32, etc.). In this example, the metrics maintained for the various paths are pruned (e.g. reduced) so that only the number of best metrics corresponding to the list size are kept. With SCL decoding, the amount of computation scales linearly with the list size and also increases due to the list administration.

In exemplary aspects, one or more decoding algorithms are combined with error detection and/or correction algorithms, such as checksums, parity bits, cyclic redundancy checking (CRC), or one or more other error checking/correction algorithms as would be understood by of ordinary skill in the arts.

In an exemplary aspect, parallel decoding is performed on several different orderings of the starting metrics of a coded message. Using the different orderings of the starting metrics, segments of the original (decoded) input bit sequence can be solved in parallel.

Exemplary aspects reduce the decoding execution time to thereby increase performance by reducing, for example, power dissipation, battery consumption, and/or latency. For example, latency is reduced compared to variants of successive cancellation (SC). Aspects of the present disclosure are also applicable to SCL decoding, and can also reduce latency on SCL while using additional parallel decoders.

In an exemplary aspect, the reordering of portions (e.g. starting metrics) of the coded message are SC decoded as an initial fast decode. A verification (e.g. CRC) of the SC decoding process can then be performed. If the decoded message fails verification, an SCL decoding (or other higher performance decoding) can be performed. This allows the parallel decoders to be used in the reordered SC decoding as well as in a subsequent SCL decoding operation (if necessary).

In an exemplary aspect, a codeword size of $2^{(N+3)}$ bits is listed in 8 groups of $2^N$ bits. Given this codeword size, an example relationship of an input word and the corresponding encoded codeword is described below.

The encoding operation of an input word of "u" to an encoded word "x" is denoted by "=>", and shown below, where u0-u7 is encoded as x0-x7.

(0) [u0, u1, u2, u3, u4, u5, u6, u7]=>[x0, x1, x2, x3, x4, x5, x6, x7]

With this relationship, the following reordered arrangements are also valid:

(1) Swap A: u2-u3 and u4-u5:
[u0, u1, u4, u5, u2, u3, u6, u7]=>[x0, x1, x4, x5, x2, x3, x6, x7]

In the reordering "Swap A," the codeword can be divided into 4 groups, where the second group (u2, u3) is swapped with the third group (u4, u5).

(2) Swap B: u1 and u2, u5 and u6:
[u0, u2, u1, u3, u4, u6, u5, u7]=>[x0, x2, x1, x3, x4, x6, x6, x7]

In the reordering "Swap B," the codeword can be divided into 8 groups, where in each subset of 4, the second and third groups (u1, u2 in the first subset of 4 groups & u5, u6 in the second subset of 4 groups) are swapped.

(3) Swap A, then Swap B:
[u0, u4, u1, u5, u2, u6, u3, u7]=>[x0, x4, x1, x5, x2, x6, x3, x7]

(4) Swap B, then Swap A:
[u0, u2, u4, u6, u1, u3, u5, u7]=>[x0, x2, x4, x6, x1, x3, x5, x7]

(5) Swap B, then Swap A, then Swap B:
[u0, u4, u2, u6, u1, u5, u3, u7]=>[x0, x4, x2, x6, x1, x5, x3, x7]

These reordering operations are also applicable to decoding operations.

In an exemplary aspect, received metrics for a codeword are reordered/rearranged according to sequences 0-5 and parallel decoded. In an exemplary aspect, the reordered metrics are decoded using successive cancellation (SC) decoding. In an exemplary aspect, sequences 0, 3, and 4 can be determined and decoded. In another aspect, sequences 1, 2, and 5 are determined and decoded. In an exemplary aspect, 3 parallel decoders are used to decode the sequences. In the following examples, "y" denotes the received metrics:

Decoder 1—normal (0) sequence: [y0, y1, y2, y3, y4, y5, y6, y7]

Decoder 2—sequence (3): [y0, y4, y1, y5, y2, y6, y3, y7]

Decoder 3—sequence (4): [y0, y2, y4, y6, y1, y3, y5, y7]

In an exemplary aspect, the parallel decoding of the first (y0) and second (y1, y4, y2) sub-blocks are decoded. In this example, all 3 decoders will have the same result for the first sub-block u0. The sub-blocks u1, u4, u2 have also been determined, one in each decoder. At this point, the u1, u2, and u4 values are exchanged/shared amongst the decoders. In this example, the XOR-tree is propagated so that each decoder can jump to decoding the $4^{th}$ sub-block in each respective sequence. In the fourth sub-block, metrics y3, y5, and y6 are decoded to obtain decoded sub-blocks u3, u5, and u6 in the 3 respective decoders. Again, the decoders exchange/share the decoded sub-blocks u3, u5, and u6. The XOR-tree is then propagated so that each decoder can jump to decoding the last sub-block y7 to obtain the decoded sub-block u7. Advantageously, the decoding and exchanging of sub-blocks among the decoders increases by, for example, a factor of 2.

In this example, the decoding operations have a delay of a 1-3-3-1 pattern in time when the sub-blocks are decoded. That is, in the first cycle, 1 sub-block (u0) is decoded, three sub-blocks (u1, u2, u4) in the second cycle, three sub-blocks (u3, u5, u6) in the third cycle, and one sub-block (u7) in the fourth cycle.

Although the above example is described using a codeword of 8 sub-blocks, any power of two sub-blocks can be used. For example, 16 sub-blocks has a 1-4-6-4-1 pattern for the sequence of when sub-blocks are decoded and use 6 parallel decoders. On the other hand, with 4 sub-blocks, a 1-2-1 pattern results using 2 parallel decoders. In an exemplary aspect, the pattern follows a Pascal's triangle. Advantageously, the overall latency will vary from approximately 35% of non-parallel latency (16 sub-blocks, simplified approach) to approximately 80% of non-parallel latency (e.g. 4 sub-blocks, straight SC).

Turning to FIGS. 701A-C, decoding systems 70100-70102 according to exemplary aspects of the present disclosure are illustrated.

The decoding system 70100 can include decoder 70115 communicatively coupled to a transceiver 70160 and controller 70105. The decoder 70115 can be configured to decode encoded/coded data (e.g. coded message, such as a polar code) received by the decoding system 70100 to generate decoded data. The coded data is received via the transceiver 70160. The decoded data can then be provided to the controller 70105.

In an exemplary aspect, the transceiver 70160 includes processor circuitry that is configured to transmit and/or receive wireline communications and/or wireless communications via one or more wireless technologies.

The transceiver 70160 can include one or more transmitters 70165 and one or more receivers 70170 that are configured to transmit and receive wireline communications and/or wireless communications via one or more antennas 70175.

In an exemplary aspect, the decoder 70115 is configured to perform one or more decoding operations, including one or more successive cancellation (SC) decoding operations. The decoder 70115 is configured to decode polar codes, but is not limited thereto.

In an exemplary aspect, the decoder 70115 includes one or more successive cancellation (SC) decoders 70120.1 to 70120.N as shown in FIGS. 701A-C. In an exemplary aspect, each of the SC decoders 70120.1 to 70120.N is configured to perform one or more SC decoding operations to decode encoded data (e.g. decode a coded message) and generate decoded data (e.g. message) corresponding to the encoded data (coded message). With a list size of 1, the SCL decoder 70125 is configured to function as an SC decoder.

In an exemplary aspect, the decoder 70115 (including one or more components of the decoder 70115) includes processor circuitry that is configured to perform one or more decoding operations to decode encoded data and generate decoded data corresponding to the encoded data. For example, the decoder can include or be implemented by one or more processors, such as a processor configured to perform Single instruction, multiple data (SIMD) processing.

In an exemplary aspect, the decoder 70115 can be configured to perform decoding using one or more additional or alternative decoding methodologies, such as successive cancelation list (SCL) decoding, belief propagation (BP) decoding, fast simple successive cancellation (FSSC) decoding, maximum likelihood (ML) decoding, convolution decoding, low-density parity-check (LDPC) decoding, tail-biting convolution decoding, turbo decoding, Viterbi decoding, and/or one or more other decoding methodologies as would be understood by one of ordinary skill in the art.

In an exemplary aspect, the decoder 70115 is configured to reorder/rearrange sub-blocks (or portions/groups of bits) of the coded message to generate one or more reordered coded message that has a different sequences of sub-blocks (portions/groups) than the coded message. In an exemplary aspect, the decoder 70115 further includes a decoding processor 70125 that is configured to reorder/rearrange the codeword (coded message) into various sequences, as well as control parallel decoding operations (e.g. SC decoders 70120) to exchange information between each other, such as exchange decoded sub-blocks decoded by one parallel decoding operation (e.g. one SC decoder 70120) to one or more other parallel decoding operations (e.g. one or more other SC decoders 70120), which can use the received information to skip/omit decoding of sub-blocks within their respective sequence corresponding to the received information. That is, information (e.g. sub-blocks) decoded by one SC decoder 70120 can be provided to one or more other of the SC decoders 70120 to use in their respective decoding operations so that the corresponding sub-blocks are not again decoded by those SC decoders 70120.

In an exemplary aspect, the decoder 70115 is configured to reorder the coded message to the following arrangements. Although these exemplary sequences include a codeword size of $2^{(N+3)}$ bits listed in 8 groups of $2^N$ bits, the codeword size, number of groups, and number of bits per group are not limited. In the following, metrics "y" for a codeword are reordered/rearranged and parallel decoded to determine the corresponding input word (e.g. decoded codeword). The decoding operation of a codeword (e.g. coded message) to obtain the input word "u" (e.g. decoded message) is denoted by "==>", and shown below, where metrics y0-y7 are used to decoded codeword u0-u7. For example, in sequence "0", the normal order of the metrics is decoded to obtain the input word as shown below.

(0) [y0, y1, y2, y3, y4, y5, y6, y7]==>[u0, u1, u2, u3, u4, u5, u6, u7]

In an exemplary aspect, the decoder 70115 is configured to rearrange the metrics and decode the rearranged sequences to generate the input word (decoded message) as shown in the following sequences:

(1) Swap A: y2-y3 and y4-y5:
[y0, y1, y4, y5, y2, y3, y6, y7]==>[u0, u1, u4, u5, u2, u3, u6, u7]

In the reordering for "Swap A," the metrics can be divided into 4 groups, where the second group (y2, y3) is swapped with the third group (y4, y5).

(2) Swap B: y1 and y2, y5 and y6:
[y0, y2, y1, y3, y4, y6, y5, y7]==>[u0, u2, u1, u3, u4, u6, u6, u7]

In the reordering for "Swap B," the metrics can be divided into 8 groups, where in each subset of 4, the second and third groups (y1, y2 in the first subset of 4 groups & y5, y6 in the second subset of 4 groups) are swapped.

(3) Swap A, then Swap B:
[y0, y4, y1, y5, y2, y6, y3, y7]==>[u0, u4, u1, u5, u2, u6, u3, u7]

(4) Swap B, then Swap A:
[y0, y2, y4, y6, y1, y3, y5, y7]==>[u0, u2, u4, u6, u1, u3, u5, u7]

(5) Swap B, then Swap A, then Swap B:
[y0, y4, y2, y6, y1, y5, y3, y7]==>[u0, u4, u2, u6, u1, u5, u3, u7]

In an exemplary aspect, the decoder 70115 is configured to parallel decode two or more sequences (e.g. reordered/rearranged codewords) to reduce the decoding time compared to a successive decoding operation. The decoder 70115 can exchange information, such as decoded sub-blocks.

In an exemplary aspect, the decoder 70115 is configured to parallel decode the reordered metrics (e.g. sequences) using successive cancellation (SC) decoding. In an exemplary aspect, the decoder 70115 includes successive cancellation (SC) decoders 70120.1 to 70120.N, where the SC decoders 70120 decode a corresponding sequence.

In an exemplary aspect, the decoder 70115 is configured to rearrange the codeword (e.g. metrics) to obtain sequences (3) and (4) as shown above, and perform three respective parallel SC decoding operations on the (0), (3), and (4) sequences. In this example, a first SC decoder 70120.1 is configured to decode the normal (non-reordered) codeword (Sequence (0)), a second SC decoder 70120.2 is configured to decode the rearranged codeword corresponding to Sequence (3), and a third SC decoder 70120.3 is configured to decode the rearranged codeword corresponding to Sequence (4). In another aspect, the three SC decoders can alternatively decode Sequences (1), (2), and (5).

In an exemplary aspect, the parallel SC decoders 70120 decode the sequences as shown below:

SC decoder 70120.1 decodes normal sequence (0): [y0, y1, y2, y3, y4, y5, y6, y7]

SC decoder 70120.2 decodes sequence (3): [y0, y4, y1, y5, y2, y6, y3, y7]

SC decoder 70120.3 decodes sequence (4): [y0, y2, y4, y6, y1, y3, y5, y7]

In an exemplary operation, the first (y0) and second (y1, y4, y2) sub-blocks are decoded by the SC decoders 70120. In an exemplary aspect, all three SC decoder 70120 can decode their respective first and second sub-blocks. In another aspect, because the first sub-blocks are the same across all three sequences, a subset (e.g. 1 or 2) of the SC decoders 70120 can decode the first sub-block (y0) while the other SC decoder(s) 70120 can be idle (or in a reduced power or sleep mode). In this example, the active SC decoder(s) 70120 can share the decoded sub-block u0 to the idle decoders. As a result, the power consumption can be reduced by using a subset of the SC decoders 70120 for sub-blocks that are in the same position across two or more of the sequences.

In this example, all three SC decoders 70120 will have the same result (e.g. u0) for the first sub-block y0. The sub-blocks u1, u4, u2 have also been determined, one in each decoder—SC decoder 70120.1 decodes y1 to obtain u1, SC decoder 70120.2 decodes y4 to obtain u4, and SC decoder 70120.3 decodes y2 to obtain u2. The respective SC decoders 70120 can then exchange the u1, u2, and u4 values between each other (e.g. SC decoder 70120.1 provides the u1 value to SC decoders 70120.2 and 70120.3 and so on).

In an exemplary aspect, the XOR-tree is propagated so that each SC decoder 70120 can jump to decoding the $4^{th}$ sub-block in each respective sequence. In the fourth sub-block, sub-blocks y3, y5, and y6 are decoded to obtain decoded sub-blocks u3, u5, and u6 in the three SC decoder 70120—SC decoder 70120.1 decodes y3 to obtain u3, SC decoder 70120.2 decodes y5 to obtain u5, and SC decoder 70120.3 decodes y6 to obtain u6. Again, the SC decoders 70120 exchange/share the decoded sub-blocks u3, u5, and u6 with each other. In an exemplary aspect, the decoding processor 70125 is configured to manage the decoded sub-blocks decoded by the SC decoders 70120 and to distribute the decoded sub-blocks amongst the SC decoders 70120. The decoding processor 70125 can alternatively or additionally control the SC decoders 70120 to provide their respective decoded sub-blocks to the other SC decoders 70120. In an exemplary aspect, the decoder processor 70125 includes processor circuitry that is configured to perform one or more operations and/or functions of the decoder processor 70125, including manage the decoded sub-blocks to facilitate the exchange of decoded information between the SC decoders 70120.

In an exemplary aspect, the XOR-tree is then propagated so that each SC decoder 70120 can jump to decoding the last (y7) sub-block to obtain the u7 decoded sub-block. Advantageously, the decoding and exchanging of sub-blocks amongst the SC decoders 70120 increases by, for example, a factor of 2.

In this example, the decoding operations exhibit a 1-3-3-1 pattern when the sub-blocks are decoded. That is, in the first cycle, 1 sub-block (u0) is decoded, three sub-blocks are decoded (u1, u2, u4) in the second cycle, three sub-blocks (u3, u5, u6) are decoded in the third cycle, and one sub-block (u7) is decoded in the fourth cycle.

Although the above example is described using a codeword of 8 sub-blocks, any power of two sub-blocks can be used. For example, 16 sub-blocks have a 1-4-6-4-1 pattern and use 6 parallel decoders. Similarly, 32 sub-blocks have a 1-5-10-10-5-1 pattern and use 10 parallel decoders. On the other hand, with 4 sub-blocks, a 1-2-1 pattern results using 2 parallel decoders. In an exemplary aspect, the pattern follows a Pascal's triangle.

In an exemplary aspect when two or more of the sub-blocks are the same across the sequences (e.g. sub-blocks y7), and therefore one or more of the SC decoders 70120 can be deactivated (e.g. idle), the SC decoder(s) 70120 that can be deactivated is configured to begin decoding sub-blocks of a next coded message. For example, in the last sub-block (y7) of the coded message, because the sub-block is the same across all SC decoders 70120, one or two of the SC decoders 70120 can begin decoding the first sub-block (e.g. y0) of the next codeword. Similarly, in an example when the codeword includes 16 sub-blocks having a 1-4-6-4-1 pattern and the decoder 70115 includes six parallel SC decoders 70120, the decoding of a first sub-block of a next codeword could begin during the decoding of the fourth sub-block of the current codeword. In this example, during the decoding of the fourth sub-block of the current codeword, two of the six SC decoders 70120 are idle for the current codeword and can begin decoding the first sub-block of the next codeword. 5

In exemplary aspect, the SC decoders 70120 can be separated into two or more groups, where each of the groups of SC decoders 70120 decodes different codeword. For example, in an aspect where the decoder 70115 includes six SC decoders 70120, three of the SC decoders 70120 can parallel decode a reorganized first codeword, while the other three SC decoders 70120 can parallel decode a reorganized second codeword.

In an exemplary aspect, the decoder 70115 further includes a verification processor 70130 that is configured to perform one or more error detection and/or error correction operations to detect one or more errors in decoded information and/or correct one or more errors in the decoded information. In an exemplary aspect, the verification processor 70130 is configured to perform one or more error detection and/or correction algorithms, such as a checksum, parity bit, cyclic redundancy checking (CRC), or one or more other error checking/correction algorithms as would be understood by of ordinary skill in the arts. For example, the verification processor 70130 can be configured to perform a cyclic redundancy check (CRC) on the decoded data. In an exemplary aspect, the verification processor 70130 includes processor circuitry that is configured to perform one or more error detection and/or error correction operations, including performing one or more other error checking/correction algorithms, to verify the integrity of the decoded data. Additionally or alternatively, although FIG. 701A shows the verification processor 70130 implemented within the decoder 70115, the verification processor 70130 can be implemented within the controller 70105 as shown in FIG.

701B and/or implemented a separate component separate from the controller 70105 and the decoder 70115 as shown in FIG. 701C.

In an exemplary aspect, the reordering of the coded message are parallel SC decoded as described above as an initial fast decode. A verification (e.g. by the verification processor 70130) of the SC decoding process can then be performed. If the decoded message fails verification, an SCL decoding (or other higher performance decoding) can be performed. This allows the parallel decoders to be used in the reordered SC decoding operations as well as in a subsequent, for example, SCL decoding operation (if necessary). In an exemplary aspect, in response to a failed verification, the parallel SC decoders 70120 can be configured to do smaller lists in parallel. For example, if the decoder 70115 included four parallel SC decoders 70120 (e.g. N=4), instead of performing a 4-path SCL, an SCL with a list size of 2 on each quarter section SCL can be performed. In this example, an SCL decoding with L=2 on the first quarter segment, followed by an SCL decoding with L=2 on each of the 2nd and 3rd quarter segments in parallel (i.e. utilizing all 4 decoders), followed by an SCL decoding with L=2 or 4 on the last quarter segment. In this example, with 4 decoders, performance close to SCL decoding with L=2 performance is achieved, but in less time than the traditional SCL (L=2) approach.

In an exemplary aspect, the controller 70105 is configured to control the overall operation of the decoding system 70100/70101/70102, including controlling one or more operations of the component(s) of the decoding system (e.g. decoder 70115, transceiver 70160, etc.). In an exemplary aspect, the controller 70105 is configured to receive decoded data from the decoder 70115 and to perform one or more further processing operations on the decoded data. In aspects where the controller 70105 includes the verification processor 70130 (FIG. 701B), the controller 70115 is configured to perform one or more error detection and/or error correction operations, including performing one or more other error checking/correction algorithms, to verify the integrity of the decoded sub-block 70105. These error detection and/or correction operations can be performed in place of such operations being performed by the decoder 70115, or in connection with similar operations being performed by the decoder 70115.

In an exemplary aspect, the controller 70105 is configured to manage the decoded sub-blocks decoded by the SC decoders 70120 and to distribute the decoded sub-blocks amongst the SC decoders 70120. The controller 70105 can alternatively or additionally control the SC decoders 70120 to provide their respective decoded sub-blocks to the other SC decoders 70120. In an exemplary aspect, the controller 70105 is configured to cooperatively perform these operations with the decoding processor 70125, or can perform these functions instead of the decoding processor 70125. When the controller 70125 is configured to solely perform the management of the decoded sub-blocks, the decoder 70115 can omit the decoding processor 70125. In an exemplary aspect, the decoding processor 70125 is included in the controller 70105 instead of, or in additionally to the decoder 70115

In an exemplary aspect, the controller 70105 includes processor circuitry that is configured to perform one or more operations and/or functions of the controller 70105, including controlling one or more components of the decoding system, and/or managing the decoded sub-blocks to facilitate the exchange of decoded information between the SC decoders 70120.

In aspects where the system includes an encoder 70110, the controller 70105 can be configured to provide data to the encoder 70110. In this example, the encoder 70110 can be configured to encode the received data to generate encoded data. The encoder 70110 can then provide the encoded data to the transceiver 70160 for subsequent transmission. In an exemplary aspect, the encoder 70110 includes processor circuitry that is configured to perform one or more operations and/or functions of the encoder 70110. These operation(s) and/or function(s) can include operation(s)/function(s) that are the corresponding inverse operations and/or functions performed by the decoder 70115.

Exemplary operations of the decoding systems 70100-70102 are illustrated with reference to FIG. 702, which illustrates a flowchart of a decoding method according to an exemplary aspect of the present disclosure. The flowchart 70200 is described with continued reference to FIGS. 701-701C. The operations of the method are not limited to the order described below, and the various operations may be performed in a different order. Further, two or more operations of the method may be performed simultaneously with each other.

The method of flowchart 70200 begins at operation 70205 and transitions to operation 70210, where received metrics for a codeword are reordered/rearranged to generate one or more reordered codewords (e.g. sequence(s) of reordered sub-blocks of the codeword).

In an exemplary aspect, the decoder 70115 reorders/rearranges sub-blocks (or portions/groups of bits) of the coded message to generate one or more reordered coded message that has a different sequences of sub-blocks (portions/groups) than the coded message. In an exemplary aspect, the reordering/rearranging of sub-blocks includes the reordering/rearranging metrics for a codeword to generate one or more sequences of the metrics having a different order than the received metrics of the codeword. In an exemplary aspect, the decoder 70115 further includes a decoding processor 70125 that reorders/rearranges the codeword (coded message) into the various sequences.

After operation 70210, the flowchart transitions to operation 70215, where the codeword (e.g. received message) and one or more reordered codewords are decoded, or two or more reordered codewords are decoded.

In an exemplary aspect, the decoder 70115 parallel decode two or more sequences (e.g. the codeword & reordered/rearranged codeword(s), or two or more reordered/rearranged codewords). In an exemplary aspect, the decoder 70115 parallel decodes the sequences using SC decoding. In an exemplary aspect, the decoder 70115 includes SC decoders 70120.1 to 70120.N, where the SC decoders 70120 decode a corresponding sequence. In an exemplary aspect, the codewords are reordered such that different sub-blocks of the codeword are simultaneously decoded in one or more sub-block decoding cycles. For example, as described above in the decoding example using sequences (0), (3), and (4), second sub-blocks (y1, y4, y2) are decoded in parallel in a cycle (and then exchanged across the decodes), and fourth sub-blocks (y3, y5, and y6) are decoded in parallel in a later cycle (and then exchanged).

After operation 70215, the flowchart transitions to operation 70220, where the decoded sub-blocks are exchanged/shared between the parallel decoders. For example, with reference to the decoding example above, the sub-blocks u1, u4, u2 are determined, one in each decoder—SC decoder 70120.1 decodes y1 to obtain u1, SC decoder 70120.2 decodes y4 to obtain u4, and SC decoder 70120.3 decodes y2 to obtain u2. The respective SC decoders 70120 can then exchange the u1, u2, and u4 values between each other (e.g. SC decoder 70120.1 provides the u1 value to SC decoders 70120.2 and 70120.3. In an exemplary aspect, the XOR-tree is propagated so that each SC decoder 70120 can jump to decoding the 4$^{th}$ sub-block in each respective sequence. In this example, information (e.g. sub-blocks) decoded by one SC decoder 70120 can be provided to one or more other of the SC decoders 70120 to use in their respective decoding operations so that the corresponding sub-blocks are not again decoded by those SC decoders 70120.

After operation 70220, the flowchart transitions to operation 70225, where it is determined if more sub-blocks of the codeword (e.g. more sub-blocks of the sequences) are to be decoded.

If there are more sub-blocks to decode (YES at operation 70225), the flowchart returns to operation 70215 and the additional sub-blocks are decoded and then exchanged in operation 70220. The check at operation 70225 is then performed again. For example, with continued reference to the decoding example using sequences (0), (3), and (4), in the fourth sub-block, sub-blocks y3, y5, and y6 are decoded to obtain decoded sub-blocks u3, u5, and u6 in the three SC decoder 70120—SC decoder 70120.1 decodes y3 to obtain u3, SC decoder 70120.2 decodes y5 to obtain u5, and SC decoder 70120.3 decodes y6 to obtain u6. Again, the SC decoders 70120 exchange/share the decoded sub-blocks u3, u5, and u6 with each other (e.g. the XOR-tree is propagated). In an exemplary aspect, the decoding processor 70125 is configured to manage the decoded sub-blocks decoded by the SC decoders 70120 and to distribute the decoded sub-blocks amongst the SC decoders 70120. The decoding processor 70125 can alternatively or additionally control the SC decoders 70120 to provide their respective decoded sub-blocks to the other SC decoders 70120. In an exemplary aspect, the XOR-tree is then propagated so that each SC decoder 70120 can jump to decoding the last (y7) sub-block to obtain the u7 decoded sub-block.

If there are no additional sub-blocks to decode, the flowchart transitions to operation 70230, where the input word (decoded message) is generated based on the decoded sub-blocks. For example, the decoder 70115 can arrange the decoded sub-blocks in the original order to generate the input word. In an exemplary aspect, the decoding processor 70120 reorders and generates the input word.

After operation 70230, the flowchart transitions to operation 70235, where the flowchart ends. In an exemplary aspect, the flowchart can be repeated for a next codeword. In an exemplary aspect, the flowchart can include an operation to verify the generated input word, such as a CRC check on the input word. If the verification fails, an SCL (or other higher performance decoding) can be performed. This allows the parallel decoders to be used in the reordered SC decoding operations as well as in a subsequent SCL decoding operation (if necessary).

Advantageously, the decoding system 70100-70102 and the corresponding decoding method 70200 improve the performance of the decoder 70115 by increasing the overall decoded speed by parallel decoding and exchanging decoded information, which allows subsequent decoding operations to take advantage of the shared information and omit duplicative decoding operations of information that has previously been decoded by another decoder.

In decoding systems, there can be a tradeoff between different parameters, e.g. performance is weighed against latency. For example, decoding algorithms can provided high performance with a cost to latency, throughput or power. Alternatively, algorithms can provide low-latency and high throughput at the cost of performance. The Belief propagation (BP) algorithm provides low-latency as well as high throughput. However, the performance of polar codes when decoded by the BP decoding algorithm is generally less than when compared to low-density parity-check (LDPC) codes. Successive cancellation list (SCL) decoding provide increases in performance but result in high latency and relatively low throughput due to the successive nature of the algorithm.

BP decoding is implemented using a forward and backward flooding schedule that removes data dependencies which are inherent in polar decoding. Exemplary aspects include post-processing optimizations that improves performance of BP decoding vs. SCL polar decoding. BP error-correcting performance can be improved by bit selection or by concatenating a polar code with an outer code.

Exemplary aspects include the analysis of errors and the classification of the errors into error types, as well as post-processing to perturb error behavior so that convergence is improved. For example, errors can be classified/categorized into, for example, unconverged and oscillation errors. The errors can be mitigated using CRC-based termination.

In one or more exemplary aspects, a post-processing algorithm is configured to perturb error behavior so that convergence is improved. The combination of the analysis and classification of errors and the post-processing to perturb error behavior advantageously increases error rate performance of successive cancellation (SC) decoding, and coming within 0.2-0.5 dB of error rate performance of SCL decoding. Exemplary aspects advantageously close the gap between SCL and BP decoding using intelligent post-processing based on machine learning (ML) algorithms that automatically are invoked based on error type, and post-processing parameters are adjusted intelligently to maintain an increased error rate performance.

In exemplary aspects, one or more decoding algorithms are combined with error detection and/or correction algorithms, such as checksums, parity bits, cyclic redundancy checking (CRC), or one or more other error checking/correction algorithms as would be understood by of ordinary skill in the arts.

With SCL decoding, the list size can be limited (e.g. 8, 16, 32, etc.). In this example, the metrics maintained for the various paths are pruned (e.g. reduced) so that only the number of best metrics corresponding to the list size are kept. With SCL decoding, the execution time scales linearly with the list size and also includes time due to the list administration. Exemplary aspects reduce the execution time to thereby increase performance by reducing, for example, power dissipation, battery consumption, and/or latency.

Parallel decoding approaches can be used to mitigate high latency due to serial nature of the SC and SCL decoding algorithms. For example, the nature of the Kroenecker product can be exploited to split the decoding of an $F^{\otimes n}$ polar code into its component $F^{\otimes n-1}$ codes. That is, a polar code of size N can be decomposed into two sub codes, each of size N/2, where each of the bits are correlated. The sub-code decoding procedure can be parallelized into two parallel SC or SCL decoders and the correlations between the bits in each sub-code can be accounted for. Further, the leaf level nodes can be collapsed to generate multiple-bit hard decisions in a single cycle using combinational logic to generate the hard decision. In exemplary aspects, to increase parallelism, these processes can be combined into a single decoder such that the tree is split in 2 or 4 sections and simplify the correlations, and then in each sub-tree, up to 8-bits can be generated in parallel. Further, in one or more exemplary aspects, the tree can be unevenly split and the number of parallel trees and number of multi-bit hard decisions are parameterizable and configurable.

In an exemplary aspect, the decoder can be configured to split the tree in 2, 4, or K sections and simplify the procedure to take into account correlations and then in each sub-tree we generate up to 8-bits in parallel. In one or more exemplary aspects, the tree is unevenly split and the number of parallel trees (K) and number of multi-bit hard decisions (M) are parameterizable and configurable.

In exemplary aspects, parallelism restrictions are reduced or avoided by splitting the tree in 2 or 4 or K sections and simplify the procedure to take into account correlations and then in each sub-tree we generate up to 8-bits in parallel. Exemplary aspects include the uneven splitting of the tree and making of the number of parallel trees (K) and number of multi-bit hard decisions (M) parameterizable and configurable. For example, an increased level of parallelism (e.g. 8×) is advantageously achieved by splitting the tree up to 4 times and generating more than 2-bits in parallel at the leaf level hard decision stage, while maintaining low area, power and complexity. Further, throughput is increased (e.g. by 8× or more) over SCL decoding as latency is greatly reduced (e.g. by 8× or more).

In an exemplary aspect, the decoder is configured to be parameterizable/configurable such that uneven splitting of the tree is allowed (e.g. 64-bit decoder=32-bit decode+8-bit decode+16-bit decode+8-bit decode). Each sub-tree can generate any number of multiple bit hard decisions (e.g. 8-bit, 2-bit, 4-bit, and 2-bit). In an exemplary aspect, the decoder is configured to selectively operate in an SC and SCL mode. For example, the decoder can remain in SC mode or use the full the SCL mode by turning on/off, for example, the sorting of the SCL decoder.

Turning to FIG. 801A, which illustrates a decoder according to an exemplary aspect of the present disclosure. FIG. 801B illustrates a corresponding mapping to the decoding tree according to an exemplary aspect.

As shown in FIG. 801A, the codeword (e.g. coded data, coded message, etc.) is split and fed to first and second parallel SC decoders 80102.1 and 80102.2. In an exemplary aspect, the SC decoders are each configured to generate 2-bit hard decisions at the leaf level. The log-likelihood ratio (LLR) Combiner and Hard Decision circuit 80104 is configured to correlate the two halves of the tree. In this example, the decoded data $a_1^{N/2}$ and $b_1^{N/2}$ generated by the respective SC decoders 80102.1 and 80102.2 are provided to the LLR Combiner and Hard Decision circuit 80104, which is configured to correlate the decoded data to generate the input word (e.g. decode codeword)

FIG. 801B shows how the decoding tree is split amongst the two SC decoders 80102. In an exemplary aspect, when bits in positions i and N/2+i are information bits, the decoded data $a_i$ and $b_i$ are independent from each other. In this example, the decoded data bits $a_i$ and $b_i$ can bypass LLR combining and the LLR Combiner and Hard Decision circuit 80104 can be configured to determine the hard decisions without LLR combining. Alternatively, when one of the decoded data bits $a_i$ and $b_i$ is a frozen bit, the LLR Combiner and Hard Decision circuit 80104 is configured to perform equal gain combining to determine the hard decision on $a_i$ and $b_i$. The complexity of the equal combining operation increases with increases in parallelism. In an exemplary aspect, to advantageously reduce the complexity of the equal combining operation, the combining the LLR Combiner and Hard Decision circuit 80104 can include one or more exclusive OR (XOR) gates to account for the correlation. In an exemplary aspect, the combination satisfies the following equations:

$$x_1^N = u_1^N = u_1^N B_N F^{\otimes n}$$

$$\left[ v_1^{\frac{N}{2}} B_{\frac{N}{2}} \ v_{\frac{N}{2}+1}^{N} B_{\frac{N}{2}} \right] \times \begin{bmatrix} F^{\otimes(n-1)} & 0 \\ F^{\otimes(n-1)} & F^{\otimes(n-1)} \end{bmatrix}$$

$$x_1^N = \left[ a_1^{\frac{N}{2}} B_{\frac{N}{2}} F^{\otimes(n-1)} b_1^{\frac{N}{2}} B_{\frac{N}{2}} F^{\otimes(n-1)} \right]$$

$$a_2^{\frac{N}{1}} = v_1^{N/2} \oplus v_{\frac{N}{2}+1}^{N}, \ b_1^{\frac{N}{2}} = v_{\frac{N}{2}+1}^{N}$$

From the above equations, $$u_{\frac{N}{2}+1}^{N}$$

and $u_1^{N/2}$ are determined as follows:

$$u_{\frac{N}{2}+1}^{N} = B_{N/2} b_1^{N/2} \text{ and } u_1^{N/2} = B_{\frac{N}{2}} \left( a_1^{\frac{N}{2}} \oplus b_1^{\frac{N}{2}} \right)$$

Where B represents a bit re-ordering to arrive at the correct order of bits in the final result.

In an exemplary aspect, the SC decoders 80102.1 and 80102.2 include the implementation of F, G, and H circuit stages 80205, 80210, 80215, as well as per stage partial sum generator 80220 as shown in FIG. 802. In an exemplary aspect, the partial sum generator 80220 is configured to calculate a next set of LLRs/bits based on the previously decoded bits u0, u1, u2, u3 (U0 to U3 as shown in FIG. 802). In an exemplary aspect, the F circuit 80205 is configured to perform a minimum function, such as the minimum function illustrated in FIG. 803A. The minimum function may also be referred to the "minus" function. The G circuit 80210 is configured to perform an addition function, such as the addition function illustrated in FIG. 803B. The G circuit 80210 is a "plus" function as shown in FIG. 803B, and is configured to select either a subtraction or addition of inputs based on previously decoded bit, u. In this example, the F circuit stage 80205 and G circuit stage 80210 are the "minus" and "plus" compute elements of the SC decoders, respectively. The H circuit stage 80215 is configured to calculate the hard decision. In an exemplary aspect, the H circuit 80215 includes a combinational circuit and is configured as a multi-bit hard decision generator circuit by combining the leaf level F and G circuit stages. In an exemplary aspect, the partial sum at each stage is an XOR circuit. In an exemplary aspect, with continued reference to FIG. 802 and although not shown, the G circuit 80210 is connected to another H circuit 80215 via another circuit 80217 similar to the connection of the F circuit 80205 is connected to H circuit 80215 via circuit 80217 in FIG. 802.

Turning to FIGS. 803A and 803B, exemplary aspects of the F and G circuits are respectively illustrated. In an exemplary aspect, the F circuit stage 80205 includes a subtractor 80305 and a multiplexor (MUX) 80310. The subtractor 80305 is configured to determine the difference between two multi-bit inputs (e.g. LLR0 and LLR1) and generates an output (LLR_temp) based on the determined difference. The MUX 80310 is configured to multiplex (e.g. select between) two or more inputs based on a selection signal to generate an output. In this example, the MUX 80310 is a 2:1 MUX that multiplexes the two multi-bit inputs (e.g. LLR0 and LLR1) also supplied to the subtractor 80305 to generate an LLR output (LLR_out), which are provided to the next stage of F/G/H computations. In an exemplary aspect, the selection signal is the output (LLR_temp) generated by the subtractor 80305. In an exemplary aspect, the F and G functions (e.g. F circuit 80205, G circuit 80210) are a piecewise linear (PWL) LLR compute function required for SCL decoding. In an exemplary aspect, the functions includes coefficients of powers of 2, which advantageously can be suitably implemented in hardware.

With reference to the FIG. 803B, the G circuit stage 80210 includes a subtractor 80315, an adder 80320, and a MUX 80330. The subtractor 80315 is configured to determine the difference between two multi-bit inputs (e.g. LLR0 and LLR1) and generates an output based on the determined difference. The adder 80320 is configured to determine the sum of two multi-bit inputs (e.g. LLR0 and LLR1) and generates an output based on the determined sun. The output of the subtractor 80315 and the adder 80320 are provided as inputs to the MUX 80330, which is configured to multiplex (e.g. select between) two or more inputs based on a selection signal to generate an output. In this example, the MUX 80330 is a 2:1 MUX that multiplexes the outputs of the subtractor 80315 and the adder 80320 to generate an output (LLR_out). In this example, the selection signal is u, which corresponds to the decoded bit.

In an exemplary aspect, the LLR computing and combining operations (e.g. of LLR Combiner and Hard Decision circuit 80104) are performed by an LLR computing circuit 80400 as shown in FIG. 804A. In an exemplary aspect, the LLR computing circuit 80400 includes a range circuit 80405, a constant generation multiplexer (CMUX) 80410, multiplexers 80415, 80420, and 80430, and adder 80425. In operation, the range circuit 80405, CMUX 80410, multiplexer 80415 and multiplexer 80420 receive the LLRs (LRR_in) as inputs. In an exemplary aspect, one of the inputs to multiplexor 80415 is shifted right by 2 bits (e.g. >>2 block in FIG. 804A). Similarly, one of the inputs to multiplexor 80420 is shifted right by 4 bits (e.g. >>4 block in FIG. 804A) and another input is shifted right by 3 bits (e.g. >>3 block in FIG. 804A). In an exemplary aspect, the 6-bit constant output of the CMUX 80410 is a constant added to the PWL representation of the LLR. The output of the range circuit 80405 is provided to CMUX 80410, multiplexer 80415 and multiplexer 80420 as their respective selection signal. The adder 80425 is configured to add together the output generated by the CMUX 80410, multiplexer 80415 and multiplexer 80420 to generate an output. Multiplexer 80430 is configured to multiplex the output of the CMUX 80410 and the output of the adder 80425 to generate the output LLR_out. As shown in FIG. 804A, in an exemplary aspect, the CMUX 80410 is configured to generate a constant output based on the circuit shown within the broken line callout of CMUX 80410. The clever thing we do here is that we can leverage the range[3:0] to generate the constant for the PWL representation. That is what CMUX circuit does.FIG. 804B shows an exemplary aspect of the range circuit 80405. For example, the range circuit 80405 can include four logic AND gates that are configured to generate four range bit values: range[0] (for $2 \leq LLR \leq \infty$), range[1] (for $0 \leq LLR \leq 2$), range[2] (for $-3 \leq LLR \leq 0$), and range[3] (for $-\infty \leq LLR \leq -3$) based on bits 3, 4, and 5 of the LLR input. In an exemplary aspect, the range circuit 80405 is configured to select which constants will be used for the PWL representation of the LLR (e.g. selects the output of the CMUX). In operation, a PWL calculation is used to generate the new LLR based on the incoming LLR value. Advantageously, this reduces computation and latency in SCL decoding. In an exemplary aspect, the range[3:0] is leveraged to generate the constant for the PWL representation. In an exemplary aspect, these four range bit values are provided to the CMUX 80410, multiplexer 80415 and multiplexer 80420 as their respective selection signal.

In an exemplary aspect, the SCL decoder having parallel SC decoders is configured to perform sorting and metric computation in the final leaf level stages. In an exemplary aspect, the SCL decoder is configured to perform Zero forcing, which can improve computational complexity in the final stages. FIG. 805 illustrates a final stage of an SC decoder 80500 according to an exemplary aspect. The SC decoder 80500 can be one of two or more parallel SC decoders in an SCL decoder system.

In an exemplary aspect, the SC decoder 80500 includes one or more metric update circuits M, one or more sorting circuits S, and one or more zero-forcing circuits Z. In an exemplary aspect, the SC decoder 80500 a last state of the SCL decoder that includes zero forcing (Z) and sorting (S) circuits. In an exemplary aspect, the metric update circuits M (also may be referred to as a metric computation circuit) is configured to calculate the likelihoods for different combinations of u2i and u2i+1 for incoming LLR values from the previous stage.

In an exemplary aspect, the Zero forcing circuit is configured to force the metrics of unqualified paths to 0 (e.g. frozen bit paths), which advantageously reduces latency as sorting/pruning is simplified in SCL decoding. After metric computation and zero forcing computation, sorting circuit is configured to compare 2L (i.e. 2×List Size) to select L paths with the larger metrics. In this example, the sorting circuit performs the pruning operation by pruning paths with lower metrics. In an exemplary aspect, the sorting circuit is configured to compare 2L to select L paths using use a bitonic sorting algorithm.

FIG. 806 illustrates a SCL decoder 80600 according to an exemplary aspect. The SCL decoder includes a list size L. In an exemplary aspect, the SCL decoder 80600 includes two or more parallel SC decoders 80605.1 to 80605.L, a partial sum generator 80610, a path metric sorting circuit 80615, a path memory 80620, a hard decision circuit 80625, and LLR memory 80630. In exemplary aspect, the SC decoders 80605.1 to 80605.L are aspects of one or more of the SC decoders described with reference to FIGS. 801A-805. In an exemplary aspect, the partial sum generator 80610 is configured to create the partial combining of LLRs at a specific stage based on previous decoded bits to decode the next set of bits. The path metric sorting circuit 80615 is configured to compare 2L to select L paths with the larger metrics and prunes the remaining paths that have lower metric. Hard decision circuit 80625 is configured to calculate hard decisions to generate the decoded word. Path memory 80620 is configured to store 2L paths and metrics in memory at all times. LLR memory 80630 is configured to store the LLRs for the 2L paths.

Turning to FIGS. 807A-C, decoding systems 80700-80702 according to exemplary aspects of the present disclosure are illustrated.

The decoding system 80700 can include decoder 80715 communicatively coupled to a transceiver 80760 and controller 80705. The decoder 80715 can be configured to decode encoded/coded data received by the decoding system 80700 to generate decoded data. The coded data is received via the transceiver 80760. The decoded data can then be provided to the controller 80705.

In an exemplary aspect, the transceiver 80760 includes processor circuitry that is configured to transmit and/or receive wireline communications and/or wireless communications via one or more wireless technologies.

The transceiver 80760 can include one or more transmitters 80765 and one or more receivers 80770 that are configured to transmit and receive wireline communications and/or wireless communications via one or more antennas 80775.

In an exemplary aspect, the decoder 80715 is configured to perform one or more decoding operations, including successive cancellation (SC) decoding and/or successive cancellation list (SCL) decoding. In an exemplary aspect, the decoder 80715 includes a successive cancellation list (SCL) decoder 80720 that includes parallel SC decoders SCi-SCN as shown in FIGS. 807A-C. In an exemplary aspect, the SCL decoder 80725 is configured to perform one or more SCL decoding operations to decode encoded data and generate decoded data corresponding to the encoded data. With a list size of 1, the SCL decoder 80725 is configured to function as an SC decoder.

In an exemplary aspect, the SCL decoder 80720 and corresponding SC decoders SCi-SC$_N$ are aspects of the SCL and SC decoders, respectively, described with reference to FIGS. 801A-806.

In an exemplary aspect, the SCL decoder 80720 is configured to collapse the leaf level nodes to generate multiple-bit hard decisions in a single cycle using combinational logic to generate the hard decision. For example, the SCL decoder 80720 can be configured such that the tree is split in, for example, 2 or 4 sections and simplify the correlations, and then in each sub-tree, up to 8-bits can be generated in parallel.

In an exemplary aspect, SCL decoder 80720 is configured to split the tree unevenly. Further, the SCL decoder 80720 is configured to dynamically adjust (e.g. configure/parameterize) the number of parallel trees and number of multi-bit hard decisions. The dynamic adjustment can be based on one or more factors, such as BLER, channel conditions, and/or one or more other factors as would be understood by one of ordinary skill in the relevant arts.

In an exemplary aspect, the SCL decoder 80720 is configured to split the tree in 2, 4, or K sections and generate up to, for example 8-bits in parallel based on correlations on the LLRs. For example, the SC decoders of the SCL decoder 80720 generate 2-bit hard decisions at the leaf level. The SCL decoder 80720 is configured to then correlate the two halves of the tree.

In an exemplary aspect, when the bits split between to SC decoders of the SCL decoder 80720 are information bits, the decoded data from the respect SC decoders are independent from each other. In this example, the SCL decoder 80720 is configured to omit LLR combining operations and determine hard decisions without LLR combining. Alternatively, when one of the decoded data bits is a frozen bit, the SCL decoder 80720 is configured to perform equal gain combining to determine the hard decision on respective bits split between the SC decoders.

In an exemplary aspect, the decoder 80715 can be configured to perform decoding using one or more additional or alternative decoding methodologies, such as belief propagation (BP) decoding, fast simple successive cancellation (FSSC) decoding, maximum likelihood (ML) decoding, convolution decoding, low-density parity-check (LDPC) decoding, tail-biting convolution decoding, turbo decoding, Viterbi decoding, and/or one or more other decoding methodologies as would be understood by one of ordinary skill in the art.

In an exemplary aspect, the decoder 80715 includes processor circuitry that is configured to perform one or more decoding operations to decode encoded data and generate decoded data corresponding to the encoded data. For example, the decoder can include or be implemented by one or more processors, such as a processor configured to perform Single instruction, multiple data (SIMD) processing.

In an exemplary aspect, the decoder 80715 further includes a verification processor 80730 that is configured to perform one or more error detection and/or error correction operations to detect one or more errors in decoded information and/or correct one or more errors in the decoded information. In an exemplary aspect, the verification processor 80730 is configured to perform one or more error detection and/or correction algorithms, such as a checksum, parity bit, cyclic redundancy checking (CRC), or one or more other error checking/correction algorithms as would be understood by of ordinary skill in the arts. For example, the verification processor 80730 can be configured to perform a cyclic redundancy check (CRC) on the decoded data. In an exemplary aspect, the verification processor 80730 includes processor circuitry that is configured to perform one or more error detection and/or error correction operations, including performing one or more other error checking/correction algorithms, to verify the integrity of the decoded data. Additionally or alternatively, although FIG. 807A shows the verification processor 80730 implemented within the decoder 80715, the verification processor 80730 can be implemented within the controller 80705 as shown in FIG. 807B and/or implemented a separate component separate from the controller 80705 and the decoder 80715 as shown in FIG. 807C.

In an exemplary aspect, the controller 80705 is configured to control the overall operation of the decoding system 80700, including controlling one or more operations of the component(s) of the decoding system 80700 (e.g. decoder 80715, transceiver 80760, etc.). In an exemplary aspect, the controller 80705 is configured to receive decoded data from the decoder 80715 and to perform one or more further processing operations on the decoded data. In aspects where the controller 80705 includes the verification processor 80730 (FIG. 807B), the controller 80715 is configured to perform one or more error detection and/or error correction operations, including performing one or more other error checking/correction algorithms, to verify the integrity of the decoded sub-block 80705. These error detection and/or correction operations can be performed in place of such operations being performed by the decoder 80715, or in connection with similar operations being performed by the decoder 80715.

In an exemplary aspect, the controller 80705 is configured to control the SCL decoder 80720 to adjust the list size used by the SCL decoder 80720 and/or configured to adjust the list size used by the SCL decoder 80720 and provide the SCL decoder 80720 with the adjusted list size. In an exemplary aspect, the controller 80705 is configured to control the SCL decoder 80720 to adjust the list size and/or adjust the list size based on the verification of the decoded data. For example, the list size can be adjusted if the verification of the decoded data indicates that the decoded data is invalid. In an exemplary aspect, the controller 80705 includes processor circuitry that is configured to perform one or more operations and/or functions of the controller 80705, including performing one or more error detection and/or error correction operations, controlling the SCL decoder 80720 to adjust the list size used by the SCL decoder 80720 and/or adjusting the list size used by the SCL decoder 80720 and providing the SCL decoder 80720 with the adjusted list size.

The controller 80705 (e.g. verification processor 80730 implemented within the controller 80705 as shown in FIG. 807B), the SCL decoder 80720 (e.g. verification processor 80730 implemented within the SCL decoder 80720 as shown in FIG. 807A), and/or a separate verification processor 80730 (FIG. 807C) can be configured to perform one or more error detection operations on the decoded data to detect one or more errors in decoded data to determine if the coded data has been successfully decoded. If the coded data was unsuccessful decoded, the controller 80705 can be configured to adjust the list size used by the SCL decoder 80720 and provide the SCL decoder 80720 with the adjusted list size. In an exemplary aspect, the controller 80705 is configured to control the SCL decoder 80720 to adjust the list size and/or adjust the list size based on the verification of the decoded data. For example, the list size can be adjusted if the verification of the decoded data indicates that the decoded data is invalid.

In aspects where the system includes an encoder 80710, the controller 80705 can be configured to provide data to the encoder 80710. In this example, the encoder 80710 can be configured to encode the received data to generate encoded data. The encoder 80710 can then provide the encoded data to the transceiver 80760 for subsequent transmission. In an exemplary aspect, the encoder 80710 includes processor circuitry that is configured to perform one or more operations and/or functions of the encoder 80710. These operation(s) and/or function(s) can include operation(s)/function(s) that are the corresponding inverse operations and/or functions performed by the decoder 80715.

Exemplary operations of the decoding systems of FIGS. 801A-907C, including decoding systems 80700-80702, are illustrated with reference to FIG. 808, which illustrates a flowchart of a decoding method according to an exemplary aspect of the present disclosure. The flowchart 80800 is described with continued reference to FIGS. 807-807C. The operations of the method are not limited to the order described below, and the various operations may be performed in a different order. Further, two or more operations of the method may be performed simultaneously with each other.

The method of flowchart 80800 begins at operation 80805 and transitions to operation 80810, where a codeword (e.g. $\gamma_1^N$) is separated/divided/split into first (e.g. $\gamma_1^{N/2}$) and second (e.g. $\gamma_{N/2+1}^N$) plurality of bits.

After operation 80810, the flowchart transitions to operation 80815, where the first and the second plurality of bits are parallel decoded to generate respective first (e.g. $a_1^{N/2}$) and second (e.g. $b_1^{N/2}$) decoded bits.

After operation 80815, the flowchart transitions to operation 80820, where it is determined if both the first and second plurality of bits are information bits or if one or both include frozen bits.

If both the first and second plurality of bits are information bits (YES at operation 80820), the flowchart transitions to operation 80825, where the first and the second plurality of bits are combined to correlate the first and the second plurality of bits.

After operation 80825, the flowchart transitions to operation 80830, where hard decision(s) associated with the first and the second plurality of bits are determined to generate an input word corresponding to the codeword.

After operation 80830, the flowchart transitions to operation 80840, where the flowchart ends.

If the first and/or second plurality of bits includes one or more frozen bits (NO at operation 80835), the flowchart transitions to operation 80835, where hard decision(s) associated with the first and the second plurality of bits are determined to generate an input word corresponding to the codeword.

After operation 80835, the flowchart transitions to operation 80840, where the flowchart ends.

In belief propagation (BP) decoding, a forward and backward flooding schedule is used that removes data dependencies inherent in polar decoding. One or more exemplary aspects include post-processing optimizations that improves performance of BP decoding in comparison to SCL polar decoding.

In exemplary aspects, the decoding system includes machine learning to adaptively configure the decoding system to adjust post-processing parameters using an intelligent adaptation. In an exemplary aspect, the decoding system (e.g. transceiver of the system) is configured to sense channel conditions and the difference between a targeted bit error rate (BER)/frame error rate (FER) performance and a current sensed performance of the decoding system. In an exemplary aspect, the adaption is based on the sense channel conditions and the difference between the targeted BER/FER performance and the current sensed performance.

In an exemplary aspect, errors are classified into unconverged, converged, and oscillation errors categories, and each of these error types can be mitigated by injecting a small amount of noise in the system to add a level of perturbation. In an exemplary aspect, the amount of perturbation applied to the system is adaptively configured. In an exemplary aspect, the post-processing parameters and level of noise injection are adaptively adjusted based on channel conditions and/or a comparison of measured performance and desired performance. In an exemplary aspect, concatenation of an SC decoder with a low-iteration post-processing BP decoder, where BP decoder is selectively applied when error-rate performance does not meet targets, can improve throughput, latency, and error-rate performance of SC decoding.

Exemplary aspects include the analysis of errors and the classification of the errors into error types, as well as post-processing to perturb error behavior so that convergence is improved. For example, errors can be classified/categorized into, for example, unconverged and oscillation errors. The errors can be mitigated using CRC-based termination.

In one or more exemplary aspects, a post-processing algorithm is configured to perturb error behavior so that convergence is improved. The combination of the analysis and classification of errors and the post-processing to perturb error behavior advantageously increases error rate performance of successive cancellation (SC) decoding, and coming within 0.2-0.5 dB of error rate performance of SCL decoding. Exemplary aspects advantageously close the gap between SCL and BP decoding using intelligent post-processing based on machine learning (ML) algorithms that automatically are invoked based on error type, and post-processing parameters are adjusted intelligently to maintain an increased error rate performance. In one or more aspects, the intelligent post-processing In an exemplary aspect, a manual modification of parameters for the post-processing algorithms can be performed.

To increase error rate performance and narrow the gap in performance between SCL and BP decoding, exemplary aspects include an intelligent post-processing that automatically adapts based on error type. In an exemplary aspect, the post-processing is based on one or more machine learning (ML) algorithms. In this example, post-processing parameters are adjusted intelligently to maintain an increased error rate performance.

In an exemplary aspect, the decoding system is configured to determine decoding errors. In this example, the post-processing is adapted based on the determined decoding errors.

In an exemplary aspect, the decoding errors can be classified into the following error categories:
(1) unconverged errors—errors that randomly flip between 0 and 1;
(2) falsely converged errors—incorrectly decoded errors; and
(3) oscillation errors—errors that periodically flip between 0 and 1.

In an exemplary aspect, the decoding system (e.g. post-processor 80910) is configured to post-process the errors. In an exemplary aspect, the post-processing is based on a difference between measured performance and desired error-correcting performance, channel conditions and/or one or more other characteristics as would be understood by one of ordinary skill in the art.

In an exemplary aspect, a cyclic redundancy checking (CRC) is used to classify errors.

For example, hard decisions in consecutive iterations can be monitored CRC can be added to the BP decoding. In this example, falsely converged and oscillation errors determine the error-correcting performance of BP decoding at moderate to high SNR. These errors are then post-processed in an intelligent manner to improve BP decoding performance (e.g. by the post-processor 80910.

Post-Processing of Falsely Converged Errors

In an exemplary aspect, the post-processor 80910 is configured to correct falsely converged errors based on a determination of whether the bits are reliable or unreliable bits. For example, the post-processor 80910 can compare the soft decision to a threshold value to determine if the bits are reliable or unreliable. In an exemplary aspect, if the soft decision is greater than the threshold value, the bits are determined to be reliable bits. In an exemplary aspect, reliable bits that are also information bits are gradually frozen. The post processor 80910 can be configured to adaptably freeze the bits to "gradually freeze" the reliable information bits.

In an exemplary aspect, if the soft decision is less than the threshold value, the bits are determined to be unreliable bits. In an exemplary aspect, the post-processor 80910 is configured to bias the unreliable bits in a random direction by a determined (e.g. small) amount. In an exemplary aspect, randomness and number of iterations are automatically adapted by the post-processor 80910 to improve error-rate performance. In an exemplary aspect, the adaption is based on a machine learning algorithm.

Post-Processing of Converged Errors

In an exemplary aspect, the post-processor 80910 is configured to perform a decision tree classification algorithm (e.g. FIG. 810) to gradually classify the number of information bits to be frozen. The classification can be based on the objective function where error-rate performance monotonically increases from the assessed baseline error-rate prior to post-processing until a threshold is reached that represents the gap between assessed error-rate performance and targeted performance.

In an exemplary aspect, a gradient boosting is applied over a decision tree classification scheme that is used to also intelligently adjust the bias on unreliable bits. Advantageously, the number of iterations can also be minimized to improve convergence speed.

Post-Processing of Oscillation Errors

In an exemplary aspect, stable bits which consistently have the same hard decision and are information bits are gradually frozen, while unstable bits which have inconsistent hard decisions are biased in a random direction by, for example, a small amount. In an exemplary aspect, the post-processor 80910 is configured to classify the number of information bits to be frozen based on a decision tree classification algorithm. In an exemplary aspect, the decision tree classification algorithm is adapted based on machine learning. The post-processor 80910 can also be configured to apply gradient boosting the decision tree to intelligently adjust the bias based on an objective function (e.g. error-rate performance monotonically increases from the assessed baseline error-rate prior to post-processing until a threshold is reached that represents the gap between assessed error-rate performance and targeted performance).

FIG. 809 illustrates a decoding system 80900 according to an exemplary aspect of the present disclosure. In an exemplary aspect, the decoding system 80900 includes a belief propagation (BP) decoder 80905, post-processor 80910, and hard decision circuit 80915, verification processor 80920. The verification processor 80920 can be configured to perform CRC operations to verify data (e.g. bits). In this example, the verification processor 80920 can be referred to as CRC check circuit 80920.

In an exemplary aspect, the BP decoder 80905 is configured to receive coded information, which can include frozen bits, one or more codewords (e.g. polar codes) having a CRC), and/or information bits (e.g. perturbed information bits), and to decode the coded information to generate decoded information corresponding to the coded information. The decoded information is provided to the hard decision circuit 80915 for further processing. In an exemplary aspect, the BP decoder is configured to perform one or more decoding operations, including BP decoding, to decode encoded data and generate decoded data corresponding to the encoded data.

In an exemplary aspect, the BP decoder 80905 is not limited to BP decoding and can be configured to perform decoding using one or more additional or alternative decoding methodologies, such as successive cancellation (SC) decoding, successive cancellation list (SCL) decoding, fast simple successive cancellation (FSSC) decoding, maximum likelihood (ML) decoding, convolution decoding, low-density parity-check (LDPC) decoding, tail-biting convolution decoding, turbo decoding, Viterbi decoding, and/or one or more other decoding methodologies as would be understood by one of ordinary skill in the art.

In an exemplary aspect, the hard decision circuit 80915 is configured to perform one or more decoding operations using one or more hard-decision algorithms. For example, the hard decision circuit 80915 can be configured to determine a hard decision on one or more inputs and/or outputs of the hard decision circuit 80915. The verification processor 80920 can be configured to perform CRC operations on hard decisions to classify errors. The error classification is then provided to the post processor 80910.

In an exemplary aspect, the post processor 80910 is configured to correct falsely converged errors based on a determination of whether the bits are reliable or unreliable bits. For example, the post-processor 80910 can compare the soft decision to a threshold value to determine if the bits are reliable or unreliable. In an exemplary aspect, if the soft decision is greater than the threshold value, the bits are determined to be reliable bits. In an exemplary aspect, reliable bits that are also information bits are gradually frozen. The post processor 80910 can be configured to adaptably freeze the bits to "gradually freeze" the reliable information bits.

In an exemplary aspect, if the soft decision is less than the threshold value, the bits are determined to be unreliable bits. In an exemplary aspect, the post-processor 80910 is configured to bias the unreliable bits in a random direction by a determined (e.g. small) amount. In this example, the post-processor 80910 provides the bias signal corresponding to the biasing information to the BP decoder 80905. In an exemplary aspect, the post-processor 80910 is configured to adaptive freeze the information bits based on error classification received from the hard decision circuit 80915 and the verification processor 80920.

In an exemplary aspect, the post-processor 80910 is configured to perform a decision tree classification algorithm (e.g. FIG. 810) to gradually classify the number of information bits to be frozen. The classification can be based on the objective function where error-rate performance monotonically increases from the assessed baseline error-rate prior to post-processing until a threshold is reached that represents the gap between assessed error-rate performance and targeted performance.

In an exemplary aspect, a gradient boosting is applied over a decision tree classification scheme that is used to also intelligently adjust the bias on unreliable bits. Advantageously, the number of iterations can also be minimized to improve convergence speed.

In an exemplary aspect, stable bits which consistently have the same hard decision and are information bits are gradually frozen, while unstable bits which have inconsistent hard decisions are biased in a random direction by, for example, a small amount (e.g. bias the bit towards 0 or 1). In an exemplary aspect, the post-processor 80910 is configured to classify the number of information bits to be frozen based on a decision tree classification algorithm. In an exemplary aspect, the decision tree classification algorithm (See decision tree in FIG. 810) is adapted based on machine learning. The post-processor 80910 can also be configured to apply gradient boosting the decision tree to intelligently adjust the bias based on an objective function (e.g. error-rate performance monotonically increases from the assessed baseline error-rate prior to post-processing until a threshold is reached that represents the gap between assessed error-rate performance and targeted performance).

In an exemplary aspect, the post-processing by the post processor 80910 is considered successful if either CRC is satisfied (e.g. passes verification), indicating correct convergence, or the hard decisions no longer remain consistent per iteration, which can indicate that the decoding is not a false convergence. In an exemplary aspect, post processor 80910 is configured to automatically adjust or adapt the biasing direction and amount unreliable bits are biased and/or the number of iterations to improve error-rate performance. In an exemplary aspect, the adaption is based on a machine learning algorithm. In an exemplary aspect, if the post-processing is not successful in resolving the error, the post processor 80910 can repeat the post processing with adjusted (e.g. increased) enhancement and perturbation (e.g. biasing amount and biasing direction).

Turning to FIG. 811, a decoding system 81100 according to an exemplary aspect of the present disclosure is illustrated. The decoding system 81100 is similar to the decoding systems shown in FIGS. 807A-C, and discussion of similar components may be omitted for brevity.

The decoding system 81100 can include decoder 81115 communicatively coupled to a transceiver 80760 and controller 81105. The decoder 81115 can be configured to decode encoded/coded data received by the decoding system 81100 to generate decoded data. The coded data is received via the transceiver 80760. The decoded data can then be provided to the controller 81105.

In an exemplary aspect, the decoder 81115 is configured to perform one or more decoding operations, including BP decoding. In an exemplary aspect, the decoder 81115 includes a BP decoder 81120 that is configured to perform one or more BP decoding operations to decode encoded data and generate decoded data corresponding to the encoded data.

In an exemplary aspect, the decoder 81115 can be configured to perform decoding using one or more additional or alternative decoding methodologies, such as SC decoding, SCL decoding, fast simple successive cancellation (FSSC) decoding, maximum likelihood (ML) decoding, convolution decoding, low-density parity-check (LDPC) decoding, tail-biting convolution decoding, turbo decoding, Viterbi decoding, and/or one or more other decoding methodologies as would be understood by one of ordinary skill in the art.

In an exemplary aspect, the decoder 81115 includes processor circuitry that is configured to perform one or more decoding operations to decode encoded data and generate decoded data corresponding to the encoded data. For example, the decoder can include or be implemented by one or more processors, such as a processor configured to perform Single instruction, multiple data (SIMD) processing.

In an exemplary aspect, the decoder 81115 further includes a post processor 81122, a hard decision circuit 81124, and verification processor 80730.

In an exemplary aspect, the post processor 81122 is an aspect of the post processor 80910, and is similarly configured to correct falsely converged errors, converged errors and/or oscillation errors as described herein. In an exemplary aspect, the post processor 81122 includes processor circuitry that is configured to perform one or more operations and/or functions of the post processor 81122.

In an exemplary aspect, the hard decision circuit 81124 is an aspect of the hard decision circuit 80915, and is similarly configured to determine one or more hard decisions as described herein. In an exemplary aspect, the hard decision circuit 81124 includes processor circuitry that is configured to perform one or more operations and/or functions of the hard decision circuit 81124.

In an exemplary aspect, the verification processor 81130 is an aspect of the hard verification processor 80920, and is similarly configured to perform one or more verification operations (e.g. CRC) as described herein. In an exemplary aspect, the verification processor 81130 includes processor circuitry that is configured to perform one or more operations and/or functions of the verification processor 81130. In an exemplary aspect, the verification processor 81130 (and/or the verification processor 80920) is configured to perform one or more error detection and/or error correction operations to detect one or more errors in decoded information and/or correct one or more errors in the decoded information. In an exemplary aspect, the verification processor is configured to perform one or more error detection and/or correction algorithms, such as a checksum, parity bit, cyclic redundancy checking (CRC), or one or more other error checking/correction algorithms as would be understood by of ordinary skill in the arts. For example, the verification processor can be configured to perform a cyclic redundancy check (CRC) on the decoded data.

In an exemplary aspect, the controller 81105 is configured to control the overall operation of the decoding system 81100, including controlling one or more operations of the component(s) of the decoding system 81100 (e.g. decoder 81115, transceiver 80760, etc.). In an exemplary aspect, the controller 81105 is configured to receive decoded data from the decoder 81115 and to perform one or more further processing operations on the decoded data.

In aspects where the system includes an encoder 80710, the controller 81105 can be configured to provide data to the encoder 80710. In this example, the encoder 80710 can be configured to encode the received data to generate encoded data. The encoder 80710 can then provide the encoded data to the transceiver 80760 for subsequent transmission. In an exemplary aspect, the encoder 80710 includes processor circuitry that is configured to perform one or more operations and/or functions of the encoder 80710. These operation(s) and/or function(s) can include operation(s)/function(s) that are the corresponding inverse operations and/or functions performed by the decoder 80715.

Exemplary operations of the decoding systems of FIGS. 809-811, including decoding systems 80900 and 81100, are illustrated with reference to FIG. 812, which illustrates a flowchart of a decoding method according to an exemplary aspect of the present disclosure. The flowchart 81200 is described with continued reference to FIGS. 809-811. The operations of the method are not limited to the order described below, and the various operations may be performed in a different order. Further, two or more operations of the method may be performed simultaneously with each other.

The method of flowchart 81200 begins at operation 81205 and transitions to operation 81210, where received coded data is decoded to generate decoded data.

After operation 81210, the flowchart transitions to operation 81215, where decoded data is analyzed to detect decoding errors of the decoded data.

After operation 81215, the flowchart transitions to operation 81220, where the detected errors of the decoded data are classified to determine one or more error types.

After operation 81220, the flowchart transitions to operation 81225, where post-processing parameters and/or noise injection level are adaptively adjusting based on the error classification(s).

After operation 81225, the flowchart transitions to operation 81230, where the flowchart ends. The decoding method can be iteratively performed for additionally decoding operations.

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

One or more of the decoding/encoding systems and decoding/encoding methods according to exemplary aspects may be implemented in a communication device. The communication device may be configured for wireline and/or wireless communications. Non-limiting examples of a wireless communication devices include a base station, access point, user equipment, active and passive network components, routers, switches, repeaters, remote radio heads, and/or another device configured for wireless communications using one or more wireless technologies as would be understood by one of ordinary skill in the art. Other non-limiting examples of a communication include vehicles (e.g., automobiles, nautical vessels, aircraft, motorcycles, bicycles, etc.) configured for wireless communication, such as vehicles that include one or more wireless communication receivers and/or wireless communication receivers transmitters, and/or automotive/aeronautical/maritime in-dash computer terminals; a mobile device—such as a laptop computer, a tablet computer, a mobile telephone or smartphone, a "phablet," a personal digital assistant (PDA), and mobile media player; and a wearable computing device—such as a computerized wrist watch or "smart" watch, and computerized eyeglasses, Internet of Things (IoT) devices—such as a smart home/building devices (e.g., sensors, cameras, lighting, switches, outlets, voice-capable assistants, thermostats, appliances, etc.); robotics; and drones.

For the purposes of this discussion, the term "processor circuitry" shall be understood to be circuit(s), processor(s), logic, or a combination thereof. For example, a circuit includes an analog circuit, a digital circuit, state machine logic, other structural electronic hardware, or a combination thereof. A processor includes a microprocessor, a digital signal processor (DSP), vector processor, graphics processing unit (GPU) or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein. The decoder and/or encoder of one or more exemplary aspects can include processor circuitry that is configured to perform one or more decoding and encoding operations, respectively.

In an exemplary aspect, processor circuitry includes memory that stores data and/or instructions. The memory may be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

In one or more exemplary aspects, the transceiver includes processor circuitry that is configured to transmit and/or receive wireline communications or wireless communications via one or more wireless technologies, such as one or more 5th Generation (5G) wireless protocols, one or more cellular technologies (e.g. 3rd Generation Partnership Project's (3GPP) Long Term Evolution (LTE), one or non-cellular technologies (e.g. one or more IEEE's 802.11 protocols), and/or one or more communication technologies/protocols as would be understood by one of ordinary skill in the art. In one or more aspects, the transceiver includes one or more transmitters and one or more receivers that are configured to transmit and receive wireless communications, respectively, via one or more antennas. Those skilled in the relevant art(s) will recognize that the transceiver may also include (but is not limited to) a digital signal processor (DSP), modulator and/or demodulator, a digital-to-analog converter (DAC) and/or an analog-to-digital converter (ADC), a frequency converter (including mixers, local oscillators, and filters), Fast-Fourier Transform (FFT), precoder, and/or constellation mapper/de-mapper that can be utilized in transmitting and/or receiving of wireless communications. Further, those skilled in the relevant art(s) will recognize that the antenna may include an integer array of antennas, and that the antenna may be capable of both transmitting and receiving wireless communication signals.

Any of the radio links (e.g. wireless communications) may operate according to any one or more of the following radio communication technologies and/or standards including, but not limited to: Fifth Generation (5G) communication technologies, 5G New Radio (NR) communication technologies, a Global System for Mobile Communications (GSM) radio communication technology, a General Packet Radio Service (GPRS) radio communication technology, an Enhanced Data Rates for GSM Evolution (EDGE) radio communication technology, and/or a Third Generation Partnership Project (3GPP) radio communication technology, for example Universal Mobile Telecommunications System (UMTS), Freedom of Multimedia Access (FOMA), 3GPP Long Term Evolution (LTE), 3GPP Long Term Evolution Advanced (LTE Advanced), Code division multiple access 2000 (CDMA2000), Cellular Digital Packet Data (CDPD), Mobitex, Third Generation (3G), Circuit Switched Data (CSD), High-Speed Circuit-Switched Data (HSCSD), Universal Mobile Telecommunications System (Third Generation) (UMTS (3G)), Wideband Code Division Multiple Access (Universal Mobile Telecommunications System) (W-CDMA (UMTS)), High Speed Packet Access (HSPA), High-Speed Downlink Packet Access (HSDPA), High-Speed Uplink Packet Access (HSUPA), High Speed Packet Access Plus (HSPA+), Universal Mobile Telecommunications System-Time-Division Duplex (UMTS-TDD), Time Division-Code Division Multiple Access (TD-CDMA), Time Division-Synchronous Code Division Multiple Access (TD-CDMA), 3rd Generation Partnership Project Release 8 (Pre-4th Generation) (3GPP Rel. 8 (Pre-4G)), 3GPP Rel. 9 (3rd Generation Partnership Project Release 9), 3GPP Rel. 10 (3rd Generation Partnership Project Release 10), 3GPP Rel. 11 (3rd Generation Partnership Project Release 11), 3GPP Rel. 12 (3rd Generation Partnership Project Release 12), 3GPP Rel. 13 (3rd Generation Partnership Project Release 13), 3GPP Rel. 14 (3rd Generation Partnership Project Release 14), 3GPP Rel. 15 (3rd Generation Partnership Project Release 15), 3GPP Rel. 16 (3rd Generation Partnership Project Release 16), 3GPP Rel. 17 (3rd Generation Partnership Project Release 17), 3GPP Rel. 18 (3rd Generation Partnership Project Release 18), 3GPP 5G, 3GPP LTE Extra, LTE-Advanced Pro, LTE Licensed-Assisted Access (LAA), MuLTEfire, UMTS Terrestrial Radio Access (UTRA), Evolved UMTS Terrestrial Radio Access (E-UTRA), Long Term Evolution Advanced (4th Generation) (LTE Advanced (4G)), cdmaOne (2G), Code division multiple access 2000 (Third generation) (CDMA2000 (3G)), Evolution-Data Optimized or Evolution-Data Only (EV-DO), Advanced Mobile Phone System (1st Generation) (AMPS (1G)), Total Access Communication System/Extended Total Access Communication System (TACS/ETACS), Digital AMPS (2nd Generation) (D-AMPS (2G)), Push-to-talk (PTT), Mobile Telephone System (MTS), Improved Mobile Telephone System (IMTS), Advanced Mobile Telephone System (AMTS), OLT (Norwegian for Offentlig Landmobil Telefoni, Public Land Mobile Telephony), MTD (Swedish abbreviation for Mobiltelefonisystem D, or Mobile telephony system D), Public Automated Land Mobile (Autotel/PALM), ARP (Finnish for Autoradiopuhelin, "car radio phone"), NMT (Nordic Mobile Telephony), High capacity version of NTT (Nippon Telegraph and Telephone) (Hicap), Cellular Digital Packet Data (CDPD), Mobitex, DataTAC, Integrated Digital Enhanced Network (iDEN), Personal Digital Cellular (PDC), Circuit Switched Data (CSD), Personal Handy-phone System (PHS), Wideband Integrated Digital Enhanced Network (WiDEN), iBurst, Unlicensed Mobile Access (UMA), also referred to as also referred to as 3GPP Generic Access Network, or GAN standard), Zigbee (e.g., IEEE 802.15.4), Bluetooth®, Worldwide Interoperability for Microwave Access (WiMAX), Wireless Gigabit Alliance (WiGig) standard, mmWave standards in general (wireless systems operating at 10-300 GHz and above such as WiGig, IEEE 802.11ad, IEEE 802.11ay, etc.), technologies operating above 300 GHz and THz bands, (3GPP/LTE based or IEEE 802.11p and other) Vehicle-to-Vehicle (V2V) and Vehicleto-Everything (V2X) and Vehicle-to-Infrastructure (V2I), Infrastructure-to-Vehicle (I2V), Vehicle-to-Device (V2D) communication technologies, 3GPP cellular V2X, IEEE 802.11p based, DSRC (Dedicated Short Range Communications) communication systems such as Intelligent-Transport-Systems and others, etc.

The concepts can also be used in the context of any spectrum management scheme including dedicated licensed spectrum, unlicensed spectrum, (licensed) shared spectrum (such as LSA=Licensed Shared Access in 2.3-2.4 GHz, 3.4-3.6 GHz, 3.6-3.8 GHz and further frequencies and SAS=Spectrum Access System in 3.55-3.7 GHz and further frequencies). Applicable spectrum bands include IMT (International Mobile Telecommunications) spectrum (including 450-470 MHz, 790-960 MHz, 1710-2025 MHz, 2110-2200 MHz, 2300-2400 MHz, 2500-2690 MHz, 698-790 MHz, 610-790 MHz, 3400-3600 MHz, etc.). Note that some bands are limited to specific region(s) and/or countries), IMT-advanced spectrum, IMT-2020 spectrum (expected to include 3600-3800 MHz, 3.5 GHz bands, 700 MHz bands, bands within the 24.25-86 GHz range, etc.), spectrum made available under FCC's "Spectrum Frontier" 5G initiative (including 27.5-28.35 GHz, 29.1-29.25 GHz, 31-31.3 GHz, 37-38.6 GHz, 38.6-40 GHz, 42-42.5 GHz, 57-64 GHz, 71-76 GHz, 81-86 GHz and 92-94 GHz, etc.), the ITS (Intelligent Transport Systems) band of 5.9 GHz (typically 5.85-5.925 GHz) and 63-64 GHz, bands currently allocated to automotive radar applications such as 76-81 GHz, and future bands including 94-300 GHz and above. Furthermore, the scheme can be used on a secondary basis on bands such as the TV White Space bands (typically below 790 MHz) where in particular the 400 MHz and 700 MHz bands are promising candidates. Besides cellular applications, specific applications for vertical markets may be addressed such as PMSE (Program Making and Special Events), medical, health, surgery, automotive, low-latency, drones, etc. applications.

EXAMPLES

The following are examples of the present disclosure:
101. An encoding method, comprising:
generating one or more enable signals based on a binary progression sequence; and
encoding input data based on the one or more enable signals to generate a coded signal.
102. The encoding method according to Example 101, further comprising generating the binary progression sequence based on an incrementing binary count value.
103. The encoding method according to any of Examples 101-102, wherein the binary progression sequence comprises incrementing multibit binary values.
104. The encoding method according to Example 103, wherein the incrementing multibit binary values comprise a $\log_2$ (N) bit size, where N is a code size of the coded signal.
105. The encoding method according to any of Examples 101-104, wherein the generating the one more enable signals comprises preforming one or more logical AND operations on one or more bit values of the binary progression sequence.
106. The encoding method according to any of Examples 101-105, wherein encoding the input data is further based on a valid control signal indicative of a valid clock cycle.
107. The encoding method according to any of Examples 101-106, wherein coded signal is a Polar Coded signal.
108. The encoding method according to any of Examples 101-107, wherein the encoding method comprises a space complexity of O(N), where N is a code size of the coded signal.
109. An encoder, comprising:
a binary counter configured to generate binary count values;
a decode enable generator configured to generate one or more enable signals based on the binary count values and a binary progression sequence; and
one or more output registers configured to encode input data based on the one or more enable signals to generate a coded signal.
110. The encoder according to Example 109, wherein the binary counter is further configured to generate the binary count values based on a clock signal.
111. The encoder according to any of Examples 109-110, wherein the binary progression sequence comprises incrementing multibit binary values.
112. The encoder according to Example 111, wherein the incrementing multibit binary values comprise a $\log_2$ (N) bit size, where N is a code size of the coded signal.
113. The encoder according to any of Examples 111-112, wherein:
the decode enable generator comprise one or more logical AND gates; and
the decode enable generator is configured to preform one or more logical AND operations, using the one or more logical AND gates, on the binary count values and one or more bit values of the incrementing multibit binary values of the binary progression sequence to generate the one more enable signals.
114. The encoder according to any of Examples 109-113, wherein the one or more output registers are further configured to encode the input data based on a valid control signal indicative of a valid clock cycle.
115. The encoder according to any of Examples 109-114, wherein coded signal is a Polar Coded signal.
116. The encoder according to any of Examples 109-115, wherein the encoder has a space complexity of O(N), where N is a code size of the coded signal.
117. An encoder, comprising:
binary counting means for generating binary count values;
decode enable generating means for generating one or more enable signals based on the binary count values and a binary progression sequence; and
output registering means for encoding input data based on the one or more enable signals to generate a coded signal.
118. The encoder according to Example 117, wherein the binary counting means generates the binary count values based on a clock signal.
119. The encoder according to any of Examples 117-118, wherein the binary progression sequence comprises incrementing multibit binary values.
120. The encoder according to Example 119, wherein the incrementing multibit binary values comprise a $\log_2$ (N) bit size, where N is a code size of the coded signal.
121. The encoder according to any of Examples 119-120, wherein:
the decode enable generating means comprises one or more logical AND gates; and
the decode enable generating means preforms one or more logical AND operations, using the one or more logical AND gates, on the binary count values and one or more bit values of the incrementing multibit binary values of the binary progression sequence to generate the one more enable signals.

122. The encoder according to any of Examples 117-121, wherein the output registering means encode the input data based on a valid control signal indicative of a valid clock cycle.
123. The encoder according to any of Examples 117-122, wherein coded signal is a Polar Coded signal.
124. The encoder according to any of Examples 117-123, wherein the encoder has a space complexity of O(N), where N is a code size of the coded signal.
125. An apparatus comprising means to perform the method as described in any of Examples 101-108.
126. A computer-readable storage medium with an executable program stored thereon, when executed, causes a processor to perform the method of any of Examples 101-108.
201. An encoder, comprising:
a plurality of primitives configured to store data bits; and
a controller configured to adjust input-output interconnections of the plurality of primitives based on an encoding stage of an encoding operation to encode the data bits.
202. The encoder according to Example 201, wherein each of the plurality of primitives comprises:
a first input couplable to a first flip-flop via a logic gate; and
a second flip couplable to a second flip-flop and to the first flip-flop via the logic gate.
203. The encoder according to Example 202, wherein the logic gate is an exclusive OR (XOR).
204. The encoder according to Example 201, wherein each of the plurality of primitives is configured store a first data bit and a logic output bit generated based on a logical operation of the first data bit and a second data bit.
205. The encoder according to Example 204, wherein the logical operation is an exclusive OR (XOR) operation.
206. The encoder according to Example 201, wherein the controller includes a state machine that is configured to adjust the input-output interconnections.
207. The encoder according to Example 201, wherein one or more of the input-output interconnections are between primitives of the plurality of primitives.
208. The encoder according to any of Examples 201-207, wherein the adjusting of the input-output interconnections comprises connecting an output of a first of the plurality of primitives to an input of a second of the plurality of primitives.
209. The encoder according to Example 208, wherein the controller is configured to select the first of the plurality of primitives and the second of the plurality of primitives from the plurality of primitives based on the encoding stage.
210. The encoder according to any of Examples 201-207, wherein the encoder is a polar encoder configured to polar encode the data bits to generate a polar code.
211. An encoding method, comprising:
storing data bits using a plurality of primitives; and
adjusting input-output interconnections of the plurality of primitives based on an encoding stage of an encoding operation to encode the data bits.
212. The encoding method according to Example 211, wherein each of the plurality of primitives comprises:
a first input couplable to a first flip-flop via a logic gate; and
a second flip couplable to a second flip-flop and to the first flip-flop via the logic gate.
213. The encoding method according to Example 212, wherein the logic gate is an exclusive OR (XOR).
214. The encoding method according to Example 211, wherein the storing comprises:
storing a first data bit; and
storing a logic output bit generated based on a logical operation of the first data bit and a second data bit.
215. The encoding method according to Example 214, wherein the logical operation is an exclusive OR (XOR) operation.
216. The encoding method according to Example 211, wherein adjusting the input-output interconnections uses a controller.
217. The encoding method according to Example 211, wherein one or more of the input-output interconnections are between primitives of the plurality of primitives.
218. The encoding method according to any of Examples 211-217, wherein the adjusting of the input-output interconnections comprises connecting an output of a first of the plurality of primitives to an input of a second of the plurality of primitives.
219. The encoding method according to Example 218, wherein the adjusting of the input-output interconnections further comprises selecting the first of the plurality of primitives and the second of the plurality of primitives from the plurality of primitives based on the encoding stage.
220. The encoding method according to any of Examples 211-217, wherein the encoding of the data bits is a polar encoding operation.
221. An apparatus comprising means to perform the method as described in any of Examples 211-220.
222. A computer-readable storage medium with an executable program stored thereon, when executed, causes a processor to perform the method of any of Examples 211-220.
223. An encoder, comprising:
primitive means for storing data bits; and
controlling means for adjusting input-output interconnections of the primitive means based on an encoding stage of an encoding operation to encode the data bits.
224. The encoder according to Example 223, wherein each of the primitive means comprise:
a first input couplable to a first flip-flop via a logic gate; and
a second flip couplable to a second flip-flop and to the first flip-flop via the logic gate.
225. The encoder according to Example 224, wherein the logic gate is an exclusive OR (XOR).
226. The encoder according to Example 223, wherein primitive means stores a first data bit and a logic output bit generated based on a logical operation of the first data bit and a second data bit.
227. The encoder according to Example 226, wherein the logical operation is an exclusive OR (XOR) operation.
228. The encoder according to Example 223, wherein the controlling means comprises a state machine that is configured to adjust the input-output interconnections.
229. The encoder according to Example 223, wherein one or more of the input-output interconnections are between separate primitive means.
230. The encoder according to any of Examples 223-229, wherein the adjusting of the input-output interconnections comprises connecting an output of a first of the primitive means to an input of a second of the primitive means.
231. The encoder according to Example 230, wherein the controlling means selects the first of the plurality of primitives and the second of the plurality of primitives from the plurality of primitives based on the encoding stage.

232. The encoder according to any of Examples 223-229, wherein the encoder is a polar encoder configured to polar encode the data bits to generate a polar code.

233. An encoding method, comprising:
  determining a composite bitmask based on first and second bitmasks;
  reordering the composite bitmask to generate a reordered composite bitmask;
  adjusting the reordered composite bitmask to generate an adjusted bitmask; and
  generating an encoder input based on the adjusted bitmask.

234. The encoding method according to Example 233, wherein the composite bitmask is determined based on bitwise-AND operation of the first and the second bitmasks.

235. The encoding method according to Example 233, wherein the composite bitmask is reordered based on an increasing order of reliability.

236. The encoding method according to Example 233, wherein the reordered composite bitmask is adjusted based on a payload size.

237. The encoding method according to Example 236, wherein one-valued bit indices of the reordered composite bitmask are set to zero values to adjust the reordered composite bitmask.

238. The encoding method according to any of Examples 233-237, further comprising translating bits of the adjusted bitmask from a reliability index order to a linear index order to generate a translated bitmask.

239. The encoding method according to Example 238, wherein the encoder input is generated based on the translated bitmask.

240. The encoding method according to Example 233, further comprising populating 1-valued bit locations of the translated bitmask with payload bits.

241. The encoding method according to Example 239, wherein the payload bits are translated in linear order.

242. The encoding method according to Example 233, wherein the first bitmask is determined based on a payload size, code size, and a rate matched output size.

243. The encoding method according to Example 233, wherein bits of the first bitmask are set based on the payload size, the code size, and the rate matched output size and according to a reliability sequence.

244. The encoding method according to Example 233, wherein the second bit mask is determined based on interleaved bit indices.

245. The encoding method according to Example 244, wherein the second bit mask is determined based on non-punctured or non-shortened interleaved bit indices.

246. The encoding method according to Example 233, wherein the encoding method is a polar encoding method.

247. The encoding method according to Example 233, further comprising encoding the encoder input to generate a codeword.

248. The encoding method according to Example 247, wherein the codeword is a polar code.

249. An apparatus comprising means to perform the method as Exampleed in any of Examples 233-248.

250. A computer-readable storage medium with an executable program stored thereon, when executed, causes a processor to perform the method of any of Examples 233-248.

251. A decoding method, comprising:
  determining a code construction of a codeword;
  separating the codeword into multi-bit sub-blocks based on the determined code construction;
  decoding the sub-blocks to generate a decoded message corresponding to the codeword.

252. The decoding method according to Example 251, wherein determining the code construction comprises determining node types within the codeword.

253. The decoding method according to Example 252, wherein the node types include different path metric computation complexities.

254. The decoding method according to Example 252, wherein the node types include different sorting complexities.

255. The decoding method according to Example 252, wherein the node types include different path metric computation complexities and sorting complexities.

256. The decoding method according to Example 251, wherein the multi-bit sub-blocks include two or more sub-blocks of different bit sizes.

257. The decoding method according to Example 251, wherein the code construction defines one or more frozen bit patterns within the codeword.

258. The decoding method according to Example 251, wherein separating the codeword into the multi-bit sub-blocks comprises:
  allocating bits to the multi-bit sub-blocks based on metric computation complexities of node types of the code construction.

259. The decoding method according to Example 258, wherein the allocation of bits to the multi-bit sub-blocks increases as the metric computation complexities of node types decreases.

260. The decoding method according to Example 258, wherein the allocation of bits to the multi-bit sub-blocks comprises allocating a maximum number of bits to a node type of the node types having a minimum metric computation complexity.

261. The decoding method according to any of Examples 251-260, wherein the decoding is successive cancellation list decoding.

262. The decoding method according to any of Examples 251-260, wherein the codeword is a polar code.

263. An apparatus comprising means to perform the method as described in any of Examples 251-262.

264. A computer-readable storage medium with an executable program stored thereon, when executed, causes a processor to perform the method of any of Examples 251-262.

265. A decoding system for decoding a codeword, comprising:
  a decoding processor configured to:
  determine a code construction of the codeword; and
  separate the codeword into multi-bit sub-blocks based on the determined code construction; and
  decoder configured to decode the sub-blocks to generate a decoded message corresponding to the codeword.

266. The decoding system according to Example 265, wherein the determination of the code construction comprises determining node types within the code word.

267. The decoding system according to Example 266, wherein the node types include different path metric computation complexities.

268. The decoding system according to Example 266, wherein the node types include different sorting complexities.

269. The decoding system according to Example 266, wherein the node types include different path metric computation complexities and sorting complexities.
270. The decoding system according to Example 265, wherein the multi-bit sub-blocks include two or more sub-blocks of different bit sizes.
271. The decoding system according to Example 265, wherein the code construction defines one or more frozen bit patterns within the codeword.
272. The decoding system according to Example 265, wherein the decoding processor is configured to allocate bits to the multi-bit sub-blocks based on metric computation complexities of node types of the code construction to separate the codeword into the multi-bit sub-blocks.
273. The decoding system according to Example 272, wherein the allocation of bits to the multi-bit sub-blocks increases as the metric computation complexities of node types decreases.
274. The decoding system according to Example 272, wherein the allocation of bits to the multi-bit sub-blocks comprises allocating a maximum number of bits to a node type of the node types having a minimum metric computation complexity.
275. The decoding system according to any of Examples 265-274, wherein the decoder is a successive cancellation list decoder configured to perform successive cancelation list decoding to decode the sub-blocks.
276. The decoding system according to any of Examples 265-274, wherein the codeword is a polar code.
277. A decoding system for decoding a codeword, comprising:
decoding processing means for determining a code construction of the codeword; and
separating the codeword into multi-bit sub-blocks based on the determined code construction; and
decoding means for decoding the sub-blocks to generate a decoded message corresponding to the codeword.
266. The decoding system according to Example 265, wherein the determination of the code construction comprises determining node types within the code word.
267. The decoding system according to Example 266, wherein the node types include different path metric computation complexities.
268. The decoding system according to Example 266, wherein the node types include different sorting complexities.
269. The decoding system according to Example 266, wherein the node types include different path metric computation complexities and sorting complexities.
270. The decoding system according to Example 265, wherein the multi-bit sub-blocks include two or more sub-blocks of different bit sizes.
271. The decoding system according to Example 265, wherein the code construction defines one or more frozen bit patterns within the codeword.
272. The decoding system according to Example 265, wherein the decoding processing means allocates bits to the multi-bit sub-blocks based on metric computation complexities of node types of the code construction to separate the codeword into the multi-bit sub-blocks.
273. The decoding system according to Example 272, wherein the allocation of bits to the multi-bit sub-blocks increases as the metric computation complexities of node types decreases.
274. The decoding system according to Example 272, wherein the allocation of bits to the multi-bit sub-blocks comprises allocating a maximum number of bits to a node type of the node types having a minimum metric computation complexity.
275. The decoding system according to any of Examples 265-274, wherein the decoding means performs successive cancelation list decoding to decode the sub-blocks.
276. The decoding system according to any of Examples 265-274, wherein the codeword is a polar code.
301. A decoding method, comprising:
identifying one or more nodes of encoded data;
decoding the one or more identified nodes to generate one or more respective decoded nodes of data; and
decoding the one or more decoded nodes of data to generate decoded data corresponding to the encoded data.
302. The decoding method according to Example 301, wherein the decoding of the one or more identified nodes comprises:
performing a plurality of parallel processes on the one or more identified nodes to generate a respective plurality of parallel processed data; and
determining corresponding inverse pairs based the plurality of parallel processed data to generate the one or more decoded nodes of data.
303. The decoding method according to Example 302, further comprising determining a maximum value from the plurality of parallel processed data and corresponding inverse pairs, wherein the one or more decoded nodes of data is generated based on the determined maximum value.
304. The decoding method according to Example 302, wherein the plurality of parallel processes are performed on respective bits of the encoded data of the identified one or more nodes.
305. The decoding method according to Example 301, wherein the decoding of the one or more identified nodes comprises parallel processing of two or more bits of data of the one or more identified nodes to generate the respective one or more decoded nodes of data.
306. The decoding method according to any of Examples 301-305, wherein the identifying comprises:
presenting the encoded data as a decoding tree; and
identifying one or more branches of the decoding tree as the one or more nodes of encoded data.
307. The decoding method according to Example 306, wherein:
the decoding tree comprises a plurality of layers each having one or more data bits forming the decoding tree; and
the one or more nodes of encoded data includes a lower most layer of the plurality of layers up to an upper layer of the plurality of layers that is at least one layer above the lower most layer.
308. The decoding method according to Example 307, wherein the identifying further comprises increasing a number of layers included in the one or more nodes to increase a number of parallel processes that are performed by the decoding of the one or more identified nodes.
309. The decoding method according to any of Examples 306-308, wherein the decoding tree is a binary tree.
310. The decoding method according to Example 301, wherein:
the one or more nodes of encoded data includes a plurality of layers that each include one or more data bits of the encoded data; and
the identifying further comprises increasing a number of layers included in the one or more nodes to increase a number of parallel processes that are performed by the decoding of the one or more identified nodes.

311. The decoding method according to Example 301, wherein the one or more nodes include data bits of the encoded data, the identifying of the one or more nodes including increasing a number the data bits included in the one or more nodes to increase a number of parallel processes performed by the decoding of the one or more identified nodes.

312. The decoding method according to any of Examples 302-305, wherein a number of parallel processes performed by the parallel processing is based on a number of layers of the identified one or more nodes.

313. The decoding method according to Example 312, wherein the number of parallel processes performed by the parallel processing increases as the number of layers of the identified one or more nodes increases.

314. The decoding method according to Example 301, wherein:
the one or more nodes of encoded data includes a plurality of layers that each include one or more data bits of the encoded data; and
the identifying further comprises increasing a number of layers included in the one or more nodes to increase a number of parallel processes that are performed by the decoding of the one or more identified nodes.

315. The decoding method according to any of Examples 301-314, wherein the decoding of the one or more identified nodes comprises a maximum likelihood decoding of the one or more identified nodes to generate the one or more respective decoded nodes.

316. The decoding method according to any of Examples 301-315, wherein the decoding of the one or more decoded nodes comprises a successive cancellation or listing successive cancellation decoding of the one or more decoded nodes to generate the decoded data.

317. The decoding method according to any of Examples 301-316, wherein the encoded data is a polar code.

318. A polar decoding method, comprising:
identifying encoded data bits as a node of the encoded data;
parallel decoding the encoded data bits of the identified node to generate a respective decoded node of data; and
decoding the decoded node of data to generate decoded data bits corresponding to the encoded data bits.

319. The decoding method according to Example 318, wherein the parallel decoding the encoded data bits and the decoding of the decoded node use different decoding technologies.

320. The decoding method according to Example 319, wherein the parallel decoding comprises a parallel maximum likelihood decoding of the encoded data bits and the decoding of the decoded node of data comprises a successive cancellation or listing successive cancellation decoding of the decoded node of data.

321. The decoding method according to any of Examples 318-320, wherein the identifying the encoded data bits comprises increasing a number the encoded data bits included in the node to increase a number of parallel processes performed by the parallel decoding of the encoded data bits.

322. A polar decoding system, comprising:
a controller that is configured identify encoded data bits as a node of the encoded data; and
an encoder coupled to the controller and configured to:
parallel decode the encoded data bits of the identified node to generate a respective decoded node of data; and
decode the decoded node of data to generate decoded data bits corresponding to the encoded data bits.

323. The decoder system according to Example 322, wherein the encoder is configured to perform the parallel decoding of the encoded data bits and the decoding of the decoded node using different decoding technologies.

324. The decoder system according to Example 323, wherein the parallel decoding comprises a parallel maximum likelihood decoding of the encoded data bits and the decoding of the decoded node of data comprises a successive cancellation decoding or listing successive cancellation of the decoded node of data.

325. The decoder system according to any of Examples 322-324, wherein the controller is configured to increase a number the encoded data bits included in the node to increase a number of parallel processes performed by the parallel decoding of the encoded data bits.

326. A polar decoding system, comprising:
a controller that is configured identify encoded data bits as a node of the encoded data; and
an encoder coupled to the controller and configured to:
parallel decode the encoded data bits of the identified node to generate a respective decoded node of data; and
decode the decoded node of data to generate decoded data bits corresponding to the encoded data bits.

327. The decoder system according to Example 326, wherein the encoder is configured to perform the parallel decoding of the encoded data bits and the decoding of the decoded node using different decoding technologies.

328. The decoder system according to Example 327, wherein the parallel decoding comprises a parallel maximum likelihood decoding of the encoded data bits and the decoding of the decoded node of data comprises a successive cancellation decoding or listing successive cancellation of the decoded node of data.

329. The decoder system according to any of Examples 326-328, wherein the controller is configured to increase a number the encoded data bits included in the node to increase a number of parallel processes performed by the parallel decoding of the encoded data bits.

330. An apparatus comprising means to perform the method as described in any of Examples 301-321

331. A computer-readable storage medium with an executable program stored thereon, when executed, causes a processor to perform the method of any of Examples 301-321.

401. A decoding method, comprising:
decoding a message using successive-cancellation list (SCL) decoding with a first list size to generate a first decoded data;
adjusting the first list size, based on the first decoded data, to provide a second list size; and
decoding the message using SCL decoding with the second list size to generate a second decoded data.

402. The decoding method according to Example 401, wherein the second list size is different from the first list size.

403. The decoding method according to Example 401, further comprising:
verifying the first decoded data, wherein the adjusting the first list size is based on verifying the first decoded data.

404. The decoding method according to Example 403, wherein the verifying is based on checksum associated with the message.

405. The decoding method according to Example 404, wherein the checksum is cyclic redundancy check (CRC).

406. The decoding method according to any of Examples 401-405, wherein the second list size is greater than the first list size.

407. The decoding method according to Example 406, wherein the first list size is one so that the SCL decoding using the first list size is a successive-cancellation decoding process.
408. The decoding method according to any of Examples 401-405, wherein the adjusting the first list size comprises increasing the first list size to provide the second list size that is greater than the first list size.
409. The decoding method according to Example 403, further comprising:
providing the first decoded data as a decoded message corresponding to the message if the first decoded data is verified; and
providing the second decoded data as the decoded message corresponding to the message if the verification of the first decoded data indicates the first decoded data is invalid.
410 The decoding method according to Example 409, further comprising:
verifying the second decoded data, wherein the providing the second decoded data as the decoded message is based on verification of the second data.
411. The decoding method according to Example 401, wherein the message is a polar code.
412. A decoding system, comprising:
a successive-cancellation list (SCL) decoder having a first list size and configured to decode a message using SCL decoding to generate a first decoded data; and
a controller configured to, based on the first decoded data:
adjust the first list size to provide a second list size; and
decode the message using SCL decoding with the second list size to generate a second decoded data.
413. The decoding system according to Example 412, wherein the second list size is different from the first list size.
414. The decoding system according to Example 412, wherein the SCL decoder is further configured to verify the first decoded data, wherein the adjusting the first list size is based on the verification of the first decoded data.
415. The decoding system according to Example 414, wherein the verifying is based on checksum associated with the message.
416. The decoding system according to Example 415, wherein the checksum is cyclic redundancy check (CRC).
417. The decoding system according to any of Examples 412-416, wherein the second list size is greater than the first list size.
418. The decoding system according to Example 417, wherein the first list size is one so that the SCL decoding using the first list size is a successive-cancellation decoding process.
419. The decoding system according to any of Examples 412-416, wherein the adjusting the first list size comprises increasing the first list size to provide the second list size that is greater than the first list size.
420. The decoding system according to Example 414, wherein the decoder is further configured to:
provide the first decoded data as a decoded message corresponding to the message if the first decoded data is verified; and
provide the second decoded data as the decoded message corresponding to the message if the verification of the first decoded data indicates the first decoded data is invalid.
421. The decoding system according to Example 420, wherein the decoder is further configured to:
verify the second decoded data, wherein the providing the second decoded data as the decoded message is based on verification of the second data.
422. A decoding method, comprising:
receiving a coded message including first and second portions;
decoding the first portion of the coded message using successive-cancellation list (SCL) decoding with a first list size;
adjusting the first list size to provide a second list size based on the first portion of decoded data; and
decoding the first portion and the second portion of the coded message using SCL decoding with the second list size to generate first and second portions of decoded data.
423. The decoding method according to Example 422, wherein the second list size is different from the first list size.
424. The decoding method according to Example 422, further comprising providing the first and the second portions of the decoded data as decoded representation of the coded message.
425. The decoding method according to Example 422, further comprising: verifying the decoded first portion of the coded message, wherein the adjusting the first list size is based on the verification of the first portion of the coded message.
426. The decoding method according to any of Examples 422-425, wherein the second list size is greater than the first list size.
427. An apparatus comprising means to perform the method as described in any of Examples 401-411 and 422-426.
428. A computer-readable storage medium with an executable program stored thereon, when executed, causes a processor to perform the method of any of Examples 401-411 and 422-426.
429. A decoding system, comprising:
successive-cancellation list (SCL) decoding means having a first list size and for decoding a message using SCL decoding to generate a first decoded data; and
controlling means for, based on the first decoded data:
adjusting the first list size to provide a second list size; and
decoding the message using SCL decoding with the second list size to generate a second decoded data.
430. The decoding system according to Example 412, wherein the second list size is different from the first list size.
431. The decoding system according to Example 412, wherein the SCL decoding means verifies the first decoded data, wherein the adjusting the first list size is based on the verification of the first decoded data.
432. The decoding system according to Example 414, wherein the verifying is based on checksum associated with the message.
433. The decoding system according to Example 415, wherein the checksum is cyclic redundancy check (CRC).
434. The decoding system according to any of Examples 412-416, wherein the second list size is greater than the first list size.
435. The decoding system according to Example 417, wherein the first list size is one so that the SCL decoding using the first list size is a successive-cancellation decoding process.
436. The decoding system according to any of Examples 412-416, wherein the adjusting the first list size comprises increasing the first list size to provide the second list size that is greater than the first list size.

437. The decoding system according to Example 414, wherein the SCL decoding means:
provides the first decoded data as a decoded message corresponding to the message if the first decoded data is verified; and
provides the second decoded data as the decoded message corresponding to the message if the verification of the first decoded data indicates the first decoded data is invalid.

438. The decoding system according to Example 420, wherein the SCL decoding means:
verifies the second decoded data, wherein the providing the second decoded data as the decoded message is based on verification of the second data.

501. A decoding method, comprising:
determining one or more index selection masks;
selecting indices of a codeword based on the one or more index selection masks; and
successive-cancellation list (SCL) decoding the codeword based on the selected indices.

502. The decoding method according to Example 501, wherein a number of the determined one or more index selection masks is based on a SCL list size.

503. The decoding method according to Example 502, wherein the number of the determined one or more index selection masks is based on a logarithmic function the SCL list size.

504. The decoding method according to Example 501, wherein a number of the determined one or more index selection masks is $\log_2 N$, where N is a SCL list size.

505. The decoding method according to Example 501, further comprising merging metrics and bit sequences associated with the selected indices.

506. The decoding method according to Example 501, further comprising pruning metrics associated with the selected indices based on a pruning threshold value.

507. The decoding method according to Example 501, further comprising determining metrics based on the selected indices, wherein the successive-cancellation list (SCL) decoding of the codeword is based on the determined metrics.

508. The decoding method according to Example 507, further comprising pruning the determined metrics based on a pruning threshold value to determine pruned metrics, wherein the successive-cancellation list (SCL) decoding of the codeword is based on the pruned metrics.

509. The decoding method according to any of Examples 506 and 508, wherein the pruning threshold value is determined based on a subset of the determined metrics.

510. The decoding method according to Example 509, wherein the pruning threshold value is a mean of the subset of the determined metrics.

511. The decoding method according to Example 510, wherein the subset of the determined metrics is a second metric to an N+1 metric in a sequence of the determined metrics, where N is the SCL list size.

512. The decoding method according to any of Examples 501-508, wherein the codeword is a polar code.

513. A decoding method, comprising:
determining weighted metrics based on indices of a codeword;
determining a pruning threshold value based on the weighted metrics; and
pruning the weighted metrics based on the pruning threshold value.

514. The decoding method according to Example 513, wherein the pruning threshold value is determined based on a subset of the weighted metrics.

515. The decoding method according to Example 514, wherein the pruning threshold value is a mean of the subset of the weighted metrics.

516. The decoding method according to Example 515, wherein the subset of the weighted metrics is a second metric to an N+1 metric in a sequence of the weighted metrics, where N is a list size.

517. The decoding method according to Example 513, wherein the pruning of the weighted metrics comprises pruning an unsorted sequence of the weighted metrics to generate a pruned sequence of the weighted metrics.

518. The decoding method according to Example 517, further comprising decoding a codeword based on the pruned sequence of the weighted metrics.

519. The decoding method according to Example 513, further comprising decoding a codeword based on the pruned weighted metrics.

520. The decoding method according to any of Examples 513-519, wherein the codeword is a polar code.

521. The decoding method according to any of Examples 518-519, wherein the decoding comprises a successive-cancellation list (SCL) decoding.

522. An apparatus comprising means to perform the method as described in any of Examples 501-521.

523. A computer-readable storage medium with an executable program stored thereon, when executed, causes a processor to perform the method of any of Examples 501-521.

601. A decoding method, comprising:
decoding sub-blocks of a message using a first decoding process to generate decoded sub-blocks;
determining an invalid decoded sub-block of the decoded sub-blocks;
decoding a sub-block of the message corresponding to the invalid decoded sub-block using a second decoding process;
updating the message based on the decoded sub-block; and
decoding the updated message using the first decoding process to generate a decoded message corresponding to the message.

602. The decoding method according to Example 601, wherein:
the message further comprises checksums, each of the sub-blocks having an associated one of the checksums; and
the determining the invalid decoded sub-block is based on the checksum.

603. The decoding method according to Example 602, wherein the checksums are cyclic redundancy checks (CRCs).

604. The decoding method according to any of Examples 601-603, wherein the updating the message comprises replacing information bits of message corresponding to the invalid decoded sub-block with the decoded sub-block generated from the second decoding process.

605. The decoding method according to Example 604, wherein the replacing information bits comprises adding decisions of the decoded sub-block generated from the second decoding process to the message as frozen bits.

606. The decoding method according to any of Examples 601-603, wherein the second decoding process is different from the first decoding process.

607. The decoding method according to any of Examples 601-603, wherein the first decoding process is a belief propagation decoding.

608. The decoding method according to any of Examples 601-603, wherein the second decoding process is a successive cancellation list decoding.

609. The decoding method according to any of Examples 601-603, wherein the first decoding process is a belief propagation decoding and the second decoding process is a successive cancellation list decoding.

610. The decoding method according to Example 609, wherein the updating the message comprises replacing information bits of message corresponding to the invalid decoded sub-block with the decoded sub-block generated from the second decoding process.

611. The decoding method according to Example 604, wherein the replacing information bits comprises adding decisions of the decoded sub-block generated from the second decoding process to the message as frozen bits.

612. The decoding method according to any of Examples 601-603, wherein the message is a polar code.

613. A decoding system, comprising:
a first decoder that is configured to decode sub-blocks of a message to generate decoded sub-blocks;
verification processor that is configured to determine an invalid decoded sub-block of the decoded sub-blocks; and
a second decoder that is configured to decode a sub-block of the message corresponding to the invalid decoded sub-block, wherein the first decoder is further configured to:
update the message based on the decoded sub-block; and
decode the updated message block to generate a decoded message corresponding to the message.

614. The decoding system according to Example 613, wherein:
the message further comprises checksums, each of the sub-blocks having an associated one of the checksums; and
the verification processor is configured to determine the invalid decoded sub-block based on the checksum.

615. The decoding system according to Example 614, wherein the checksums are cyclic redundancy checks (CRCs).

616. The decoding system according to any of Examples 613-615, wherein the first decoder is configured to replace information bits of message corresponding to the invalid decoded sub-block with the decoded sub-block generated by the second decoder to update the message.

617. The decoding system according to Example 616, wherein the replacing information bits comprises adding decisions of the decoded sub-block generated from the second decoding process to the message as frozen bits.

618. The decoding system according to any of Examples 613-615, wherein the first decoder is configured to decode using a first decoding process and the second decoder is configured to decode using a second decoding process different from the first decoding process.

619. The decoding system according to any of Examples 613-615, wherein the first decoder is a belief propagation decoder and configured to decode using a belief propagation decoding and the second decoder is a successive cancellation list decoder and configured to decode using a successive cancellation list decoding.

620. The decoding system according to Example 618, wherein the updating the message comprises replacing information bits of message corresponding to the invalid decoded sub-block with the decoded sub-block generated from the second decoding process.

621. The decoding system according to Example 620, wherein the replacing information bits comprises adding decisions of the decoded sub-block generated from the second decoding process to the message as frozen bits.

622. The decoding system according to any of Examples 601-603, wherein the message is a polar code.

623. A decoding method, comprising:
weighting bits of a coded message; and
decoding the weighted bits to generate a decoded message corresponding to the coded message.

624. The decoding method according to Example 623, further comprising determining corresponding reliabilities of the bits of the coded message, wherein the weighting of the bits is based on the corresponding reliabilities of the bits.

625. The decoding method according to Example 624, wherein more reliable bits are weighted with a larger weight than less reliable bits.

626. The decoding method according to Example 623, wherein the decoding comprises a belief propagation decoding.

627. The decoding method according to Example 626, wherein the weighting of the bits comprises adaptively weighting the bits over iterations of the belief propagation decoding.

628. The decoding method according to Example 623, wherein the weighting of the bits comprises adaptively weighting the bits over iterations of the belief propagation decoding.

629. The decoding method according to Example 623, wherein weighting of the bits comprises:
selecting from one of equal weights, binary weights, and soft weights; and
weighting the bits based on the selected weights.

630. The decoding method according to Example 623, wherein the bits are weighted based on randomly selected weights.

631. The decoding method according to Example 623, wherein the bits are weighted based on a pattern of binary weights.

632. The decoding method according to Example 631, wherein the pattern of binary weights is a random pattern.

633. The decoding method according to any of Examples 631-632, wherein the pattern is adapted over iterations of the decoding.

631. The decoding method according to Example 623, wherein the weighting of the bits comprises weighting edges of a factor graph representation of the coded message.

632. An apparatus comprising means to perform the method as described in any of Examples 601-612 and 623-631.

633. A computer-readable storage medium with an executable program stored thereon, when executed, causes a processor to perform the method of any of Examples 601-612 and 623-631.

634. A decoding system, comprising:
first decoding means for decoding sub-blocks of a message to generate decoded sub-blocks;
verification processing means for determining an invalid decoded sub-block of the decoded sub-blocks; and
second decoding means for decoding a sub-block of the message corresponding to the invalid decoded sub-block, wherein the first decoding means:
updates the message based on the decoded sub-block; and
decodes the updated message block to generate a decoded message corresponding to the message.

635. The decoding system according to Example 613, wherein:
the message further comprises checksums, each of the sub-blocks having an associated one of the checksums; and
the verification processing means determines the invalid decoded sub-block based on the checksum.

636. The decoding system according to Example 614, wherein the checksums are cyclic redundancy checks (CRCs).

637. The decoding system according to any of Examples 613-615, wherein the first decoding means replaces information bits of message corresponding to the invalid decoded sub-block with the decoded sub-block generated by the second decoding means to update the message.

638. The decoding system according to Example 616, wherein the replacing information bits comprises adding decisions of the decoded sub-block generated from the second decoding process to the message as frozen bits.

639. The decoding system according to any of Examples 613-615, wherein the first decoding means decodes using a first decoding process and the second decoding means decodes using a second decoding process different from the first decoding process.

640. The decoding system according to any of Examples 613-615, wherein the first decoding means decodes using a belief propagation decoding and the second decoding means decodes using a successive cancellation list decoding.

641. The decoding system according to Example 618, wherein the updating the message comprises replacing information bits of message corresponding to the invalid decoded sub-block with the decoded sub-block generated from the second decoding process.

642. The decoding system according to Example 620, wherein the replacing information bits comprises adding decisions of the decoded sub-block generated from the second decoding process to the message as frozen bits.

643. The decoding system according to any of Examples 601-603, wherein the message is a polar code.

701. A decoding method for decoding a coded message having sub-blocks, comprising:
reordering the sub-blocks of the coded message to generate a reordered coded message; and
parallel decoding the sub-blocks of the coded message and sub-blocks of the reordered coded message using respective parallel decoding processes to generate a decoded message for the coded message.

702. The decoding method according to Example 701, wherein the parallel decoding comprises exchanging decoded sub-blocks between the parallel decoding processes.

703. The decoding method according to Example 701, wherein the parallel decoding of the sub-blocks of the coded message and the sub-blocks of the reordered coded message comprises:
successively decoding the sub-blocks of the coded message; and
successively decoding the sub-blocks of the reordered coded message in parallel with the successive decoding of the sub-blocks of the coded message.

704. The decoding method according to Example 703, wherein the parallel decoding comprises exchanging decoded sub-blocks between the parallel decoding processes.

705. The decoding method according to Example 704, wherein the successively decoding of the sub-blocks of the coded message omits decoding of one or more sub-blocks of the coded message corresponding to the one or more decoded sub-blocks provided by other parallel decoding processes.

706. The decoding method according to any of Examples 704-705, wherein the successively decoding of the sub-blocks of the reordered coded message omits decoding of one or more sub-blocks of the reordered coded message corresponding to the one or more decoded sub-blocks provided by the other parallel decoding processes.

707. The decoding method according to Example 704, wherein the successive decoding of the sub-blocks of the coded message is based on one or more of the decoded sub-blocks of the reordered coded message.

708. The decoding method according to any of Examples 704 and 707, wherein the successive decoding of the sub-blocks of the reordered coded message is based on one or more of the decoded sub-blocks of the coded message.

709. The decoding method according to Example 701, wherein a number of the parallel decoding processes dynamically changes based on which corresponding sub-block of the coded message or the reordered coded message is currently being decoded.

710. The decoding method according to Example 701, further comprising:
reordering the sub-blocks of the coded message to generate a second reordered coded message having a different order of sub-blocks than the reordered coded message, wherein the parallel decoding comprises parallel decoding the sub-blocks of the coded message, the sub-blocks of the reordered coded message, and the sub-blocks of the second reordered coded message using respective parallel decoding processes to generate the decoded message corresponding to the coded message.

711. The decoding method according to Example 701, wherein the parallel decoding comprises parallel successive cancellation decoding processes.

712. The decoding method according to Example 701, wherein the coded message is a polar code.

713. A decoding system for decoding a coded message having sub-blocks, comprising:
a decoding processor configured to reorder the sub-blocks of the coded message to generate a reordered coded message; and
first and second parallel decoders configured to parallel decode the sub-blocks of the coded message and sub-blocks of the reordered coded message, respectively, to generate a decoded message corresponding to the coded message.

714. The decoding system according to Example 713, wherein the first and the second parallel decoders are configured to exchange decoded sub-blocks with each other.

715. The decoding system according to Example 713, wherein:
the first parallel decoder is configured to successively decode the sub-blocks of the coded message; and
the second parallel decoder is configured to successively decode the sub-blocks of the reordered coded message in parallel with the successive decoding of the sub-blocks of the coded message.

716. The decoding system according to Example 715, wherein the first and the second parallel decoders are configured to exchange decoded sub-blocks with each other.

717. The decoding system according to Example 716, wherein:
the first parallel decoder is configured to omit decoding of a sub-block of the coded message corresponding to an exchanged decoded sub-blocks received from the second parallel decoder in the exchange of decoded sub-blocks; or
the second parallel decoder is configured to omit decoding of a sub-block of the reordered coded message corresponding to an exchanged decoded sub-blocks received from the first parallel decoder in the exchange of decoded sub-blocks.

718. The decoding system according to Example 716, wherein the successive decoding of the sub-blocks of the coded message is based on one or more of the decoded sub-blocks of the reordered coded message.

719. The decoding system according to any of Examples 716 and 718, wherein the successive decoding of the sub-blocks of the reordered coded message is based on one or more of the decoded sub-blocks of the coded message.

720. The decoding system according to Example 713, wherein the first parallel decoder and the second parallel decoder are configured to dynamically switch between an active and idle state based on which respective sub-block of the coded message and the reordered coded message is currently being decoded.

721. The decoding system according to Example 713, wherein:
the decoding processor is further configured to reorder the sub-blocks of the coded message to generate a second reordered coded message having a different order of sub-blocks than the reordered coded message;
the system further comprises a third parallel decoder configured to parallel decode the sub-blocks of the second reordered coded message; and
the decoded message is generated based on the decoded the sub-blocks of the coded message, the decoded the sub-blocks of the reordered coded message, and the decoded the sub-blocks of the second reordered coded message.

722. The decoding system according to Example 713, wherein the parallel decoding comprises parallel successive cancellation decoding processes.

723. The decoding system according to Example 713, wherein the coded message is a polar code.

724. A decoding system for decoding a coded message having sub-blocks, comprising:
decoding processing means for reordering the sub-blocks of the coded message to generate a reordered coded message; and
first and second parallel deocoding means for parallel decoding the sub-blocks of the coded message and sub-blocks of the reordered coded message, respectively, to generate a decoded message corresponding to the coded message.

725. The decoding system according to Example 724, wherein the first and the second parallel decoders are configured to exchange decoded sub-blocks with each other.

726. The decoding system according to Example 724, wherein:
the first parallel decoder is configured to successively decode the sub-blocks of the coded message; and
the second parallel decoder is configured to successively decode the sub-blocks of the reordered coded message in parallel with the successive decoding of the sub-blocks of the coded message.

727. The decoding system according to Example 726, wherein the first and the second parallel decoders are configured to exchange decoded sub-blocks with each other.

728. The decoding system according to Example 727, wherein:
the first parallel decoder is configured to omit decoding of a sub-block of the coded message corresponding to an exchanged decoded sub-blocks received from the second parallel decoder in the exchange of decoded sub-blocks; or the second parallel decoder is configured to omit decoding of a sub-block of the reordered coded message corresponding to an exchanged decoded sub-blocks received from the first parallel decoder in the exchange of decoded sub-blocks.

729. The decoding system according to Example 727, wherein the successive decoding of the sub-blocks of the coded message is based on one or more of the decoded sub-blocks of the reordered coded message.

730. The decoding system according to any of Examples 727 and 729, wherein the successive decoding of the sub-blocks of the reordered coded message is based on one or more of the decoded sub-blocks of the coded message.

731. The decoding system according to Example 724, wherein the first parallel decoder and the second parallel decoder are configured to dynamically switch between an active and idle state based on which respective sub-block of the coded message and the reordered coded message is currently being decoded.

732. The decoding system according to Example 724, wherein:
the decoding processor is further configured to reorder the sub-blocks of the coded message to generate a second reordered coded message having a different order of sub-blocks than the reordered coded message;
the system further comprises a third parallel decoder configured to parallel decode the sub-blocks of the second reordered coded message; and
the decoded message is generated based on the decoded the sub-blocks of the coded message, the decoded the sub-blocks of the reordered coded message, and the decoded the sub-blocks of the second reordered coded message.

733. The decoding system according to Example 724, wherein the parallel decoding comprises parallel successive cancellation decoding processes.

734. The decoding system according to Example 724, wherein the coded message is a polar code.

735. An apparatus comprising means to perform the method as described in any of Examples 701-712.

736. A computer-readable storage medium with an executable program stored thereon, when executed, causes a processor to perform the method of any of Examples 701-712.

801. A decoding method, comprising:
separating a codeword into first and second plurality of bits;
parallel decoding the first plurality of bits and the second plurality of bits to generate respective first and second decoded bits; and
correlating the first and the second decoded bits to generate an input word corresponding to the codeword.

802. The decoding method according to Example 801, wherein the parallel decoding comprises:
a first decoding operation configured to decode the first plurality of bits; and
a second decoding operation configured to decode the second plurality of bits in parallel with the first decoding operation.

803. The decoding method according to Example 802, wherein the first and the second decoding operations include successive cancelation decoding operations.

804. The decoding method according to Example 801, wherein the correlating comprises combining the first plurality of bits and the second plurality of bits.

805. The decoding method according to Example 804, wherein the combining comprises an equal gain combining.

806. The decoding method according to Example 804, further comprising determining hard decisions associated with the first and the second plurality of bits based on the combination of the first and the second plurality of bits.
807. The decoding method according to Example 804, further comprising:
   determining whether the first plurality of bits and the second plurality of bits are information bits; and
   the correlating selectively comprises, based on the determining, combining the first plurality of bits and the second plurality of bits.
808. The decoding method according to Example 807, wherein the correlating comprises combining the first plurality of bits and the second plurality of bits if the first plurality of bits and the second plurality of bits are information bits.
809. The decoding method according to Example 807, further comprising determining hard decisions associated with the first and the second plurality of bits.
810. The decoding method according to Example 809, wherein the determining the hard decisions is based on combining the first and the second plurality of bits if the first plurality of bits and the second plurality of bits are information bits.
811. The decoding method according to Example 804, wherein the combining comprises performing one or more logical exclusive OR operations on the first and the second plurality of bits.
812. The decoding method according to Example 804, wherein the first plurality of bits includes one or more frozen bits and the second plurality of bits are information bits
813. The decoding method according to any of Examples 801-812, wherein the separating the codeword comprises separating the codeword unevenly to generate the first plurality of bits that includes a different number of bits than the second plurality of bits.
814. The decoding method according to any of Examples 801-812, wherein the codeword is a polar code.
815. A decoding method, comprising:
   decoding a codeword to generate decoded data;
   detecting one or more decoding errors of decoded data;
   determining an error type of the one or more detected decoding errors; and
   adjusting post-processing parameters based on the determined error type to adapt decoding of a next codeword.
816. The decoding method according to Example 815, further comprising:
   adjusting a noise injection level based on the determined error type; and
   adapting the decoding of the next codeword based on the adjusted noise injection level.
817. The decoding method according to Example 815, wherein the adjusting the post-processing parameters is based on a difference between measured performance and desired error-correcting performance.
818. The decoding method according to Example 815, wherein the adjusting the post-processing parameters is based on one or more channel conditions or characteristics.
819. The decoding method according to Example 815, wherein the adjusting the post-processing parameters is based on a machine-learning analysis of the adjusted post-processing parameters and adapting the decoding of the next codeword.
820. The decoding method according to Example 815, wherein the error type comprises:
   an unconverged error corresponding to an error that randomly flips between 0 and 1;
   a falsely converged error corresponding to an incorrectly decoded error; and
   an oscillation error corresponding to an error that periodically flips between 0 and 1.
821. The decoding method according to Example 815, wherein the adjusting the post-processing parameters is based on a difference between measured performance and desired error-correcting performance.
822. The decoding method according to Example 815, wherein the adjusting post-processing parameters comprises:
   determining a reliability of the bits of the decoded data; and
   adjusting the post-processing parameters based on the determined reliability.
823. The decoding method according to Example 822, wherein the determining the reliability comprises comparing a soft decision of the decoded data to a threshold value, wherein the reliability is based on the comparison.
824. The decoding method according to Example 823, further comprising adaptively freezing unreliable bits.
825. The decoding method according to Example 823, further comprising adaptively biasing unreliable bits in a random direction.
826. The decoding method according to any of Examples 815-825, wherein the adjusting the post-processing parameters is based on a machine-learning analysis of the adjusted post-processing parameters and adapting the decoding of the next codeword.
827. The decoding method according to any of Examples 815-826, wherein the codeword is a polar code.
828. The decoding method according to any of Examples 815-827, wherein the decoding comprises belief propagation decoding.
829. An apparatus comprising means to perform the method as described in any of Examples 801-828.
830. A computer-readable storage medium with an executable program stored thereon, when executed, causes a processor to perform the method of any of Examples 801-828.

What is claimed is:
1. An encoding method, comprising:
   generating one or more enable signals based on a binary progression sequence; and
   encoding input data based on the one or more enable signals to generate a polar coded signal,
   wherein generating the one or more enable signals comprises generating the one or more enable signals based upon a predetermined relationship between polar codes associated with the polar coded signal and bits of the binary progression sequence.
2. The encoding method according to claim 1, further comprising generating the binary progression sequence based on an incrementing binary count value.
3. The encoding method according to claim 1, wherein the binary progression sequence comprises incrementing multibit binary values.
4. The encoding method according to claim 3, wherein the incrementing multibit binary values comprise a $\log_2(N)$ bit size, where N represents a code size of the polar coded signal.
5. The encoding method according to claim 1, wherein the generating the one more enable signals comprises preforming one or more logical AND operations on one or more bit values of the binary progression sequence.

6. The encoding method according to claim 1, wherein encoding the input data is further based on a valid control signal indicative of a valid clock cycle.

7. The encoding method according to claim 1, wherein the encoding method comprises a space complexity of O(N), where N represents a code size of the polar coded signal.

8. A non-transitory computer-readable storage medium with an executable program stored thereon, when executed, causes a processor to perform the method of claim 1.

9. The encoding method of claim 1, wherein the act of generating the one or more enable signals comprises generating each respective one of the one or more enable signals using a single product term based the predetermined relationship between the polar codes associated with the polar coded signal and the bits of the binary progression sequence.

10. The encoding method of claim 9, wherein the single product term used to generate each respective one of the one or more enable signals comprises a logical AND operation of a different combination of at most $\log_2$ (N) bits of the binary progression sequence, and
wherein N represents a code size of the polar coded signal.

11. An encoder, comprising:
a binary counter configured to generate binary count values;
a decode enable generator configured to generate one or more enable signals based on the binary count values and a binary progression sequence; and
one or more output registers configured to encode input data based on the one or more enable signals to generate a polar coded signal,
wherein the decode enable generator is further configured to generate the one or more enable signals based upon a predetermined relationship between polar codes associated with the polar coded signal and bits of the binary progression sequence.

12. The encoder according to claim 11, wherein the binary counter is further configured to generate the binary count values based on a clock signal.

13. The encoder according to claim 11, wherein the binary progression sequence comprises incrementing multibit binary values.

14. The encoder according to claim 13, wherein the incrementing multibit binary values comprise a $\log_2$ (N) bit size, where N represents a code size of the polar coded signal.

15. The encoder according claim 13, wherein:
the decode enable generator comprise one or more logical AND gates; and
the decode enable generator is configured to preform one or more logical AND operations, using the one or more logical AND gates, on the binary count values and one or more bit values of the incrementing multibit binary values of the binary progression sequence to generate the one more enable signals.

16. The encoder according to claim 11, wherein the one or more output registers are further configured to encode the input data based on a valid control signal indicative of a valid clock cycle.

17. The encoder according to claim 11, wherein the encoder has a space complexity of O(N), where N represents a code size of the polar coded signal.

* * * * *